United States Patent
Hong et al.

(10) Patent No.: US 11,800,801 B2
(45) Date of Patent: *Oct. 24, 2023

(54) ORGANIC LIGHT-EMITTING DEVICE

(71) Applicant: Samsung Electronics Co., Ltd., Suwon-si (KR)

(72) Inventors: Seokhwan Hong, Seoul (KR); Myungsun Sim, Suwon-si (KR); Seungyeon Kwak, Suwon-si (KR); Hyun Koo, Seongnam-si (KR); Sangdong Kim, Seongnam-si (KR); Chul Baik, Suwon-si (KR); Sukekazu Aratani, Hwaseong-si (KR); Sunyoung Lee, Seoul (KR); Sunghun Lee, Hwaseong-si (KR); Shingo Ishihara, Suwon-si (KR); Jeoungin Yi, Seoul (KR); Yuri Cho, Suwon-si (KR); Yasushi Koishikawa, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 482 days.

This patent is subject to a terminal disclaimer.

(21) Appl. No.: 16/993,615

(22) Filed: Aug. 14, 2020

(65) Prior Publication Data

US 2021/0257560 A1 Aug. 19, 2021

(30) Foreign Application Priority Data

Feb. 10, 2020 (KR) .......................... 10-2020-0015834

(51) Int. Cl.
*H10K 85/60* (2023.01)
*C09K 11/06* (2006.01)
*H10K 50/11* (2023.01)
*H10K 50/15* (2023.01)
*H10K 50/16* (2023.01)
*H10K 101/40* (2023.01)
*H10K 101/30* (2023.01)

(52) U.S. Cl.
CPC .......... *H10K 85/6576* (2023.02); *C09K 11/06* (2013.01); *H10K 50/11* (2023.02); *H10K 85/636* (2023.02); *H10K 85/6572* (2023.02); *H10K 85/6574* (2023.02); *H10K 50/15* (2023.02); *H10K 50/16* (2023.02); *H10K 2101/30* (2023.02); *H10K 2101/40* (2023.02)

(58) Field of Classification Search
CPC .. H10K 85/6576; H10K 50/11; H10K 85/636; H10K 85/6572; H10K 85/6574; H10K 2101/40; H10K 50/15; H10K 50/16; H10K 2101/30; H10K 2101/90; H10K 85/346; H10K 2101/10; H10K 50/12; H10K 50/14; H10K 85/331; H10K 50/805; C09K 11/06
USPC .......................................................... 428/690
See application file for complete search history.

(56) References Cited

U.S. PATENT DOCUMENTS

| | | | |
|---|---|---|---|
| 7,504,163 B2 | 3/2009 | Jarikov | |
| 8,148,891 B2 | 4/2012 | Tung et al. | |
| 10,141,515 B2 | 11/2018 | Noh et al. | |
| 11,495,758 B2 * | 11/2022 | Kim | H10K 85/346 |
| 2007/0075631 A1 | 4/2007 | Tung et al. | |
| 2015/0021585 A1 * | 1/2015 | Yu | H10K 85/40 257/40 |
| 2016/0111650 A1 | 4/2016 | Noh et al. | |
| 2016/0240800 A1 * | 8/2016 | Ma | C07F 15/0086 |
| 2018/0013078 A1 | 1/2018 | Lee et al. | |
| 2018/0301638 A1 | 10/2018 | Ahn et al. | |
| 2018/0374409 A1 * | 12/2018 | Lee | G09G 3/3225 |
| 2019/0006608 A1 * | 1/2019 | Koo | H10K 50/131 |
| 2019/0081244 A1 | 3/2019 | Noh et al. | |
| 2020/0115406 A1 * | 4/2020 | Yi | C09K 11/06 |
| 2021/0009616 A1 | 1/2021 | Kim et al. | |
| 2022/0059781 A1 * | 2/2022 | Yi | H10K 85/342 |
| 2023/0025356 A1 * | 1/2023 | Lee | C09K 11/06 |

FOREIGN PATENT DOCUMENTS

| | | |
|---|---|---|
| KR | 1020160045567 A | 4/2016 |
| KR | 1020160076461 A | 6/2016 |
| KR | 1020180116502 A | 10/2018 |
| KR | 1020210002984 A | 1/2021 |

OTHER PUBLICATIONS

CAS reg. No. 2411987-10-3, Mar. 17, 2020. (Year: 2020).*

* cited by examiner

*Primary Examiner* — Douglas J McGinty
(74) *Attorney, Agent, or Firm* — CANTOR COLBURN LLP

(57) ABSTRACT

An organic light-emitting device comprising: a first electrode; a second electrode facing the first electrode; and an organic layer disposed between the first electrode and the second electrode, wherein the organic layer comprises an emission layer, the emission layer comprises a first host and a dopant, the dopant is an organometallic compound including platinum, the organic light-emitting device satisfies a condition of: HOMO(D)−HOMO(Host 1)≥0.2 electron volts, HOMO(D) is a highest occupied molecular orbital (HOMO) energy level of the dopant in electron volts, HOMO(Host 1) is a HOMO) energy level of the first host in electron volts, and HOMO(D) and HOMO(Host 1) are each measured using a photoelectron spectrometer in an ambient atmosphere.

18 Claims, 5 Drawing Sheets

ORGANIC LIGHT-EMITTING DEVICE

CROSS-REFERENCE TO RELATED APPLICATION

This application claims priority to and the benefit of Korean Patent Application No. 10-2020-0015834, filed on Feb. 10, 2020, in the Korean Intellectual Property Office, and all the benefits accruing therefrom under 35 U.S.C. § 119, the content of which is incorporated herein in its entirety by reference.

BACKGROUND

1. Field

Disclosed is an organic light-emitting device.

2. Description of Related Art

Organic light-emitting devices (OLEDs) are self-emission devices, which have improved characteristics in terms of viewing angles, response times, brightness, driving voltage, and response speed, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

SUMMARY

Provided is an organic light-emitting device (OLED) that includes an organometallic compound satisfying a predetermined parameter, including platinum, and having a long lifespan.

Additional aspects will be set forth in part in the description which follows and, in part, will be apparent from the description, or may be learned by practice of the presented exemplary embodiments of the disclosure.

According to an aspect, provided is an organic light-emitting device including a first electrode, a second electrode facing the first electrode, and an organic layer disposed between the first electrode and the second electrode, wherein the organic layer includes an emission layer,
the emission layer includes a first host and a dopant,
the dopant is an organometallic compound including platinum (Pt),
the organic light-emitting device satisfies a condition of HOMO(D)−HOMO(Host 1)≥0.2 electron volts (eV),
HOMO(D) is a highest occupied molecular orbital (HOMO) energy level of the dopant in eV,
HOMO(Host 1) is a HOMO energy level of the first host in eV, and
HOMO(D) and HOMO(Host 1) are each measured using a photoelectron spectrometer in an ambient atmosphere.

According to another aspect, provided is an organic light-emitting device, wherein the emission layer further includes a second host,
the first host is a hole transport host, and
the second host is an electron transport host including an electron transport moiety.

According to another aspect, provided is an organic light-emitting device including a first electrode,
a second electrode facing the first electrode,
m emission units stacked between the first electrode and the second electrode and including at least one emission layer, and
m−1 charge generating layers disposed between two adjacent emission units, wherein the emission units are the m emission units, wherein each of the charge generating layers includes a n-type charge generating layer and a p-type charge generating layer,
wherein m is an integer of 2 or more,
a maximum emission wavelength of light emitted from at least one first emission unit among the m emission units is different from a maximum emission wavelength of light emitted from at least one second emission unit among the other emission units,
the emission layer includes a first host and a dopant,
the dopant is an organometallic compound including platinum (Pt),
the organic light-emitting device satisfies a condition of HOMO(D)−HOMO(Host 1)≥0.2 eV,
HOMO(D) is a HOMO energy level of the dopant in eV,
HOMO(Host 1) is a HOMO energy level of the first host in eV, and
HOMO(D) and HOMO(Host 1) are each measured using a photoelectron spectrometer in an ambient atmosphere.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
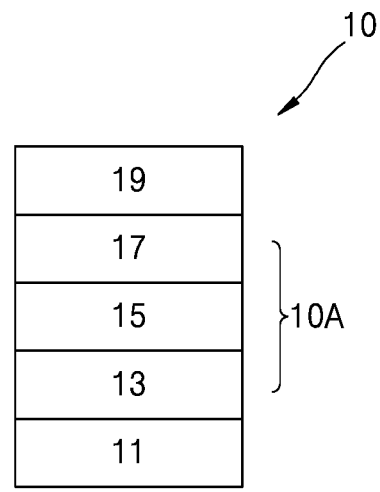
FIG. 1 is a schematic cross-sectional view of an organic light-emitting device according to one or more embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 30%, 20%, 10%, 5% of the stated value.

Description of FIG. 1

The organic light-emitting device 10 of FIG. 1 includes a first electrode 11, a second electrode 19 facing the first electrode 11, and an organic layer 10A disposed between the first electrode 11 and the second electrode 19.

The organic layer 10A includes an emission layer 15, a hole transport region 13 is located between the first electrode 11 and the emission layer 15, and an electron transport region 17 is disposed between the emission layer 15 and the second electrodes 19.

A substrate may be additionally disposed under the first electrode 11 or above the second electrode 19. As used herein, "under the first electrode 11" means the substrate is disposed on a side of the first electrode 11 that is opposite of the second electrode 19. As used herein, "above the second electrode 19" means the substrate is disposed on a side of the second electrode 19 that is opposite of the first electrode 11. The substrate may be a glass substrate or a plastic substrate, each having excellent mechanical strength, thermal stability, transparency, surface smoothness, ease of handling, and water resistance.

First Electrode 11

The first electrode 11 may be formed by depositing or sputtering a material for forming the first electrode 11 on the substrate. When the first electrode 11 is an anode, the material for forming the first electrode 11 may be selected from materials with a high work function to facilitate hole injection.

The first electrode 11 may be a reflective electrode, a semi-transmissive electrode, or a transmissive electrode. When the first electrode 11 is a transmissive electrode, a material for forming a first electrode may be selected from indium tin oxide (ITO), indium zinc oxide (IZO), tin oxide ($SnO_2$), zinc oxide (ZnO), and any combination thereof, but embodiments of the present disclosure are not limited thereto. In one or more embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combination thereof, but embodiments of the present disclosure are not limited thereto.

The first electrode 11 may have a single-layered structure or a multi-layered structure including two or more layers.

Energy Level of Material in Emission Layer 15

The emission layer 15 includes a first host and a dopant. The dopant may be an organometallic compound including platinum (Pt).

The organic light-emitting device 10 satisfies HOMO(D)−HOMO(Host 1)≥0.2 electron volts (eV). For example, the emission layer 15 may satisfy HOMO(D)−HOMO(Host 1)≥0.2 eV.

Here, HOMO(D) is a highest occupied molecular orbital (HOMO) energy level (eV) of a dopant in the emission layer 15, and HOMO(Host 1) is a HOMO energy level (eV) of a first host in the emission layer 15.

HOMO(D) and HOMO(Host 1) may be measured using an photoelectron spectrometer, for example a photoelectron spectrometer AC-3 (manufactured by RIKEN KEIKI Co., Ltd.), in an ambient atmosphere, wherein the energy levels (eV) have negative values.

The organic light-emitting device 10 satisfies HOMO (Host 1)≤−5.65 eV. In detail, HOMO(Host 1) may be about −5.65 eV to about −5.8 eV, for example, about −5.65 eV to about −5.75 eV, but embodiments of the present disclosure are not limited thereto.

Since the organic light-emitting device 10 satisfies HOMO(Host 1)≤−5.65 eV, a hole injection voltage to the emission layer may decrease, and hole carrier accumulation may occur at an interface of the emission layer on the first electrode side. Furthermore, since the organic light-emitting device 10 satisfies HOMO(D)−HOMO(Host1)≥0.2 eV, as a trap depth increases, a dopant included in the emission layer 15 may act as a trap site with respect to a hole injected to the emission layer 15. Since a hole trap easily may occur in the emission layer 15, hole mobility in the emission layer 15 may be decreased.

Without being limited to or bound by any specific theory, when mobility of holes and electrons in an emission layer is high, in the same current driving mode, the change in charge injection may be significant such that charge balance may not be efficiently achieved, resulting in a significant reduction in luminance when driving the organic light-emitting device. In contrast, the organic light-emitting device according to an embodiment may decrease hole mobility, thereby efficiently achieving charge balance in the emission layer, resulting in improvement of lifespan.

In an embodiment, the organic light-emitting device 10 may satisfy HOMO(D)−HOMO(Host 1)≥0.22 eV.

In an embodiment, the emission layer 15 may further include a second host, wherein the first host is a hole transport host, and the second host is an electron transport host including an electron transport moiety.

Here, the organic light-emitting device 10 may satisfy HOMO(Host 1)−HOMO(Host 2)≥0.

Here, HOMO(Host 2) is a HOMO energy level (eV) of the second host, and HOMO(Host 2) is measured using a photoelectron spectrometer, e.g. a photoelectron spectrometer AC-3 (manufactured by RIKEN KEIKI Co., Ltd.), in an ambient atmosphere.

In an embodiment, the first electrode 11 is an anode, a second electrode 19 is a cathode, the organic layer 10A may further include a hole transport region 13 disposed between the first electrode 11 and the emission layer 15, and an electron transport region 17 may be disposed between the emission layer 15 and the second electrode 19, the hole transport region 13 may include a hole injection layer, a hole transport layer, an emission auxiliary layer, an electron blocking layer, or any combination thereof, and the electron transport region 17 may include a hole blocking layer, an electron transport layer, an electron injection layer, or any combination thereof.

In one embodiment, the hole transport region 13 of the organic light-emitting device 10 may include a first hole transport material, and the organic light-emitting device 10 may satisfy T1(HT1)≥T1(D).

Here, T1(HT1) is a triplet energy level (eV) of the first hole transport material, and T1(D) is a triplet energy level (eV) of the dopant. T1(HT1) and T1(D) may be each measured using a density functional theory (DFT) method of a Gaussian program structurally optimized at a B3LYP level and a 6-31G(d,p) level.

In one or more embodiments, the hole transport region 13 of the organic light-emitting device 10 may include a hole transport layer or an interlayer, the hole transport layer or the interlayer may include a first hole transport material, and the organic light-emitting device 10 may satisfy T1(HT1)≥T1 (D). In one or more embodiments, the hole transport layer or the interlayer may be in contact, for example in direct contact, with the emission layer 15.

Without being bound by theory, since the organic light-emitting device 10 according to an embodiment satisfies T1(HT1)≥T1(D), excitons may be efficiently confined in the emission layer 15 (exciton confinement). Accordingly, there may be substantially no exciton quenching problem that may occur when recombination is maldistributed at near interface between the hole transport region 13 and the emission layer 15 due to a hole trap.

Dopant in Emission Layer 15

A dopant in the emission layer 15 may be a phosphorescent compound. The dopant may be an organometallic compound including platinum (Pt).

In an embodiment, the dopant may be an organometallic compound including platinum and an organic ligand, and the platinum and the organic ligand may form one cyclometalated ring, two cyclometalated rings, or three cyclometalated rings.

In one or more embodiments, the dopant may be an organometallic compound including platinum and an organic ligand, and the organic ligand may be a tetradentate ligand coordinated to the platinum, wherein the platinum and the organic ligand form three or four cyclometalated rings.

In one or more embodiments, the organic ligand may be a tetradentate ligand coordinated to the platinum, wherein the platinum and the organic ligand form three or four cyclometalated rings, and the tetradentate organic ligand may include at least one of benzimidazole, benzoxazole, or benzothiazole.

In one or more embodiments, the dopant may include platinum and at least one ligand from among ligands represented by Formulae 1-1 to 1-4:

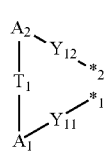

1-1

-continued

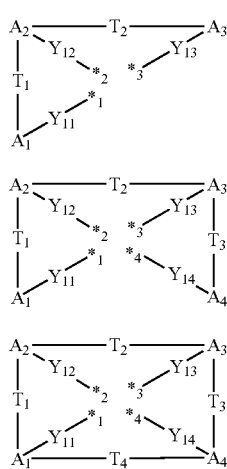

In Formulae 1-1 to 1-4, $A_1$ to $A_4$ may each independently be a substituted or unsubstituted $C_5$-$C_{30}$ carbocyclic group, a substituted or unsubstituted $C_1$-$C_{30}$ heterocyclic group, or a non-cyclic group, $Y_{11}$ to $Y_{14}$ may each independently be a chemical bond, O, S, $N(R_{91})$, $B(R_1)$, $P(R_{91})$, or $C(R_1)(R_{92})$, $T_1$ to $T_4$ may each independently be a single bond, a double bond, *—$N(R_{93})$—*, *—$B(R_{93})$—*', *—P $(R_{93})$—*', *—$C(R_{93})(R_{94})$—*', *—$Si(R_{93})$ $(R_{94})$—*', *—$Ge(R_{93})(R_{94})$—*', *—S—*', *—Se—*', * —O—*', *—C(=O)—*', *—S(=O)—*', *—S $(=O)_2$—*', *—$C(R_{93})$=*', *=$C(R_{93})$—*', *—$C(R_{93})$=C $(R_{94})$—*', *—C(=S)—*', or *—C≡C—*', a substituent of the substituted $C_5$-$C_{30}$ carbocyclic group, a substituent of the substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, $Q_1$ to $Q_9$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one of deuterium, a $C_1$-$C_{60}$ alkyl group, and a $C_1$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a substituted or unsubstituted $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a monovalent non-aromatic condensed polycyclic group, or a monovalent non-aromatic condensed heteropolycyclic group, and

*¹, *², *³, and *⁴ each indicate a binding site to the platinum.

For example, the dopant may include the ligand represented by Formula 1-3, any one of $A_1$ to $A_4$ in Formula 1-3 may be a substituted or unsubstituted benzimidazole group, a substituted or unsubstituted benzoxazole group, or a substituted or unsubstituted benzothiazole group, and any one of others of $A_1$ to $A_4$ in Formula 1-3 may be a substituted or unsubstituted pyridine group, but embodiments of the present disclosure are not limited thereto.

For example, the dopant may include the ligand represented by Formula 1-3, any two of $A_1$ to $A_4$ in Formula 1-3 may each be independently a substituted or unsubstituted a benzimidazole group and a substituted or unsubstituted pyridine group, but embodiments of the present disclosure are not limited thereto.

In one or more embodiments, the dopant may be an organometallic compound represented by Formula 1A:

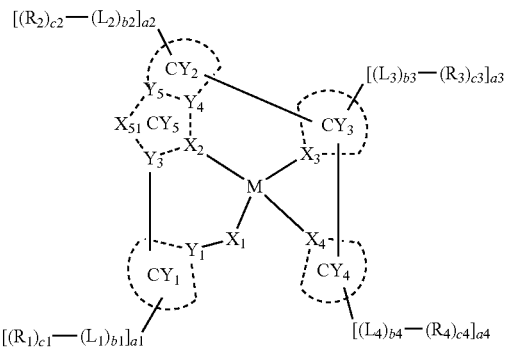

Formula 1A

In Formula 1A,
M may be platinum (Pt),
$X_1$ may be O or S,
a bond between $X_1$ and M may be a covalent bond,
$X_2$ and $X_3$ may each independently be C or N,
$X_4$ may be N,
one of a bond between $X_2$ and M, a bond between $X_3$ and M, and a bond between $X_4$ and M may be a covalent bond, the other two bonds may be coordination bonds,
$Y_1$ to $Y_5$ may each independently be C or N,
a bond between $Y_1$ and $Y_2$, a bond between $X_2$ and $Y_3$, a bond between $X_2$ and $Y_4$, a bond between $Y_4$ and $Y_5$, a bond between $Y_5$ and $X_{51}$, and a bond between $X_51$ and $Y_3$ may be chemical bonds, $CY_1$ to $CY_5$ may each independently be a $C_5$-$C_{30}$ carbocyclic group or a $C_1$-$C_{30}$ heterocyclic group, wherein $CY_4$ may not be benzimidazole, a cyclometalated ring formed by $CY_5$, $CY_2$, $CY_3$, and M may be a 6-membered ring, $X_{51}$ may be O, S, N-[$(L_7)_{b7}$-$(R_7)_{c7}$], $C(R_7)(R_8)$, $Si(R_7)(R_8)$, $Ge(R_7)(R_8)$, $C(=O)$, N, $C(R_7)$, $Si(R_7)$, or $Ge(R_7)$, $R_7$ and $R_8$ may optionally be linked together via a first linking group to form a substituted or unsubstituted $C_5$-$C_{30}$ carbocyclic group or a substituted or unsubstituted $C_1$-$C_{30}$ heterocyclic group, $L_1$ to $L_4$ and $L_7$ may each independently be a substituted or unsubstituted $C_5$-$C_{30}$ carbocyclic group or a substituted or unsubstituted $C_1$-$C_{30}$ heterocyclic group, b1 to b4 and b7 may each independently be an integer from 0 to 5, $R_1$ to $R_4$, $R_7$, and $R_8$ may each independently be hydrogen, deuterium, —F, —Cl, —Br, —I, —SF$_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), c1 to c4 may each independently be an integer from 1 to 5, a1 to a4 may each independently be 0, 1, 2, 3, 4, or 5, two of a plurality of neighboring $R_1$(s) may optionally be linked together to form a substituted or unsubstituted $C_5$-$C_{30}$ carbocyclic group or a substituted or unsubstituted $C_1$-$C_{30}$ heterocyclic group, two of a plurality of neighboring $R_2$(s) may optionally be linked together to form a substituted or unsubstituted $C_5$-$C_{30}$ carbocyclic group or a substituted or unsubstituted $C_1$-$C_{30}$ heterocyclic group, two of a plurality of neighboring $R_3$(s) may optionally be linked together to form a substituted or unsubstituted $C_5$-$C_{30}$ carbocyclic group or a substituted or unsubstituted $C_1$-$C_{30}$ heterocyclic group, two of a plurality of neighboring $R_4$(s) may optionally be linked together to form a substituted or unsubstituted $C_5$-$C_{30}$ carbocyclic group or a substituted or unsubstituted $C_1$-$C_{30}$ heterocyclic group, neighboring two or more of $R_1$ to $R_4$ may optionally be linked together to form a substituted or unsubstituted $C_5$-$C_{30}$ carbocyclic group or a substituted or unsubstituted $C_1$-$C_{30}$ heterocyclic group, at least one of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), or —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), or —P(=O)($Q_{28}$)($Q_{29}$); or —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ are the same as described in connection with $Q_1$ in the present disclosure.

In Formulae 1-1 to 1-4 and 1A, an unsubstituted $C_5$-$C_{30}$ carbocyclic group, an unsubstituted $C_1$-$C_{30}$ heterocyclic group, and $CY_1$ to $CY_4$ may each independently be from a) a 6-membered ring, b) a condensed ring in which two or more 6-membered rings are condensed with each other, or c) a condensed ring in which one or more 6-membered rings and one 5-membered ring are condensed with each other, the 6-membered ring may be a cyclohexane group, a cyclohexene group, an adamantane group, a norbornane group, a norbornene group, a benzene group, a pyridine group, a pyrimidine group, a pyrazine group, a pyridazine group, or a triazine group, and the 5-membered ring may be a cyclopentane group, a cyclopentene group, a cyclopentadiene group, a furan group, a thiophene group, a silole group, a pyrrole group, a pyrazole group, an imidazole group, a triazole group, an oxazole group, an isoxazole group, a thiazole group, an isothiazole group, an oxadiazole group, or a thiadiazole group.

In Formulae 1-1 to 1-4, a non-cyclic group may be *—C(=O)—*', *—O—C(=O)—*', *—S—C(=O)—*', *—O—C(=S)—*', *—S—C(=S)—*', or the like, but embodiments of the present disclosure are not limited thereto.

In Formulae 1-1 to 1-4 and 1A, a substituent of a substituted $C_5$-$C_{30}$ carbocyclic group, a substituent of a substituted $C_1$-$C_{30}$ heterocyclic group, $R_{91}$ to $R_{94}$, $R_1$ to $R_4$, $R_7$, and $R_8$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with at least one of deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, or —S($Q_{33}$)($Q_{34}$)($Q_{35}$); or —N($Q_1$)($Q_2$), —Si($Q_3$)($Q_4$)($Q_5$), —B($Q_6$)($Q_7$), and —P(=O)($Q_8$)($Q_9$), wherein $Q_1$ to $Q_9$ and $Q_{33}$ to $Q_{35}$ are the same as described in connection with $Q_{31}$ in the present disclosure.

In one or more embodiments, the dopant may be represented by Formula 1A-1:

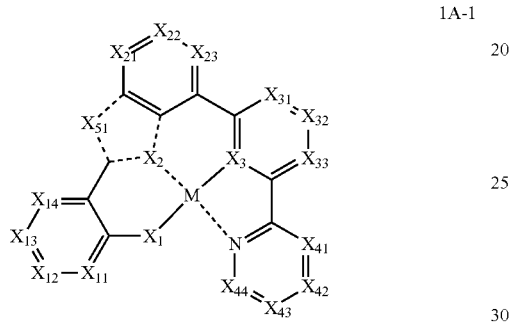

1A-1

In Formula 1A-1,

M, $X_1$ to $X_3$, and $X_1$ are each independently the same as described above, $X_{11}$ may be N or C-[($L_{11}$)$_{b11}$-($R_{11}$)$_{c11}$], $X_{12}$ may be N or C-[($L_{12}$)$_{b12}$-($R_{12}$)$_{c12}$], $X_{13}$ may be N or C-[($L_{13}$)$_{b13}$-($R_{13}$)$_{c13}$], $X_{14}$ may be N or C-[($L_{14}$)$_{b14}$-($R_{14}$)$_{c14}$], $L_{11}$ to $L_{14}$, b1 to b14, $R_{11}$ to $R_{14}$, and c1 to c14 are each independently the same as described in connection with $L_1$, b1, $R_1$, and c1 in the present disclosure, $X_{21}$ may be N or C-[($L_{21}$)$_{b21}$-($R_{21}$)$_{c21}$], $X_{22}$ may be N or C-[($L_{22}$)$_{b22}$-($R_{22}$)$_{c22}$], $X_{23}$ may be N or C-[($L_{23}$)$_{b23}$-($R_{23}$)$_{c23}$], $L_{21}$ to $L_{23}$, b21 to b23, $R_{21}$ to $R_{23}$, and c21 to c23 are each independently the same as described in connection with $L_2$, b2, $R_2$, and c2 in the present disclosure, $X_{31}$ may be N or C-[($L_{31}$)$_{b31}$-($R_{31}$)$_{c31}$], $X_{32}$ may be N or C-[($L_{32}$)$_{b32}$-($R_{32}$)$_{c32}$], $X_{33}$ may be N or C-[($L_{33}$)$_{b33}$-($R_{33}$)$_{c33}$], $L_{31}$ to $L_{33}$, b31 to b33, $R_{31}$ to $R_{33}$, and c31 to c33 are each independently the same as described in connection with $L_3$, b3, $R_3$, and c3 in the present disclosure, $X_{41}$ may be N or C-[($L_{41}$)$_{b41}$-($R_{41}$)$_{c41}$], $X_{42}$ may be N or C-[($L_{42}$)$_{b42}$-($R_{42}$)$_{c42}$], $X_{43}$ may be N or C-[($L_{43}$)$_{b43}$-($R_{43}$)$_{c43}$], $X_{44}$ may be N or C-[($L_{44}$)$_{b44}$-($R_{44}$)$_{c44}$], $L_{41}$ to $L_{44}$, b41 to b44, $R_{41}$ to $R_{44}$, and c41 to c44 are each independently the same as described in connection with $L_4$, b4, $R_4$, and c4 in the present specification, two of $R_{11}$ to $R_{14}$ may optionally be linked together to form a substituted or unsubstituted $C_5$-$C_{30}$ carbocyclic group or a substituted or unsubstituted $C_1$-$C_{30}$ heterocyclic group, two of $R_{21}$ to $R_{23}$ may optionally be linked together to form a substituted or unsubstituted $C_5$-$C_{30}$ carbocyclic group or a substituted or unsubstituted $C_1$-$C_{30}$ heterocyclic group, two of $R_{31}$ to $R_{33}$ may optionally be linked together to form a substituted or unsubstituted $C_5$-$C_{30}$ carbocyclic group or a substituted or unsubstituted $C_1$-$C_{30}$ heterocyclic group, and two of $R_{41}$ to $R_{44}$ may optionally be linked together to form a substituted or unsubstituted $C_5$-$C_{30}$ carbocyclic group or a substituted or unsubstituted $C_1$-$C_{30}$ heterocyclic group.

For example, the dopant may be one of Compounds 1-1 to 1-88, 2-1 to 2-47, and 3-1 to 3-583, but embodiments of the present disclosure are not limited thereto:

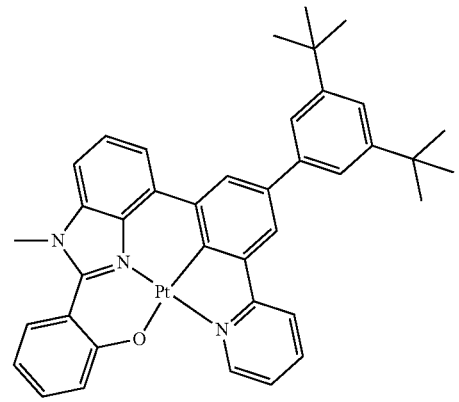

1-1

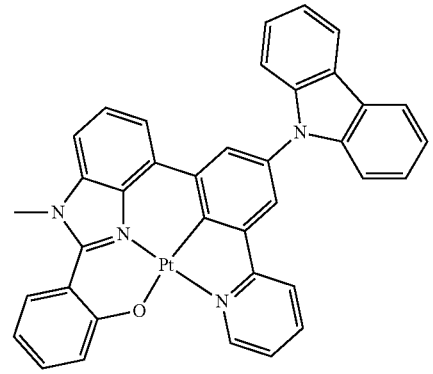

1-2

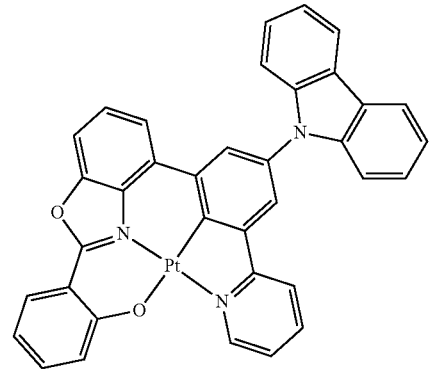

1-3

-continued
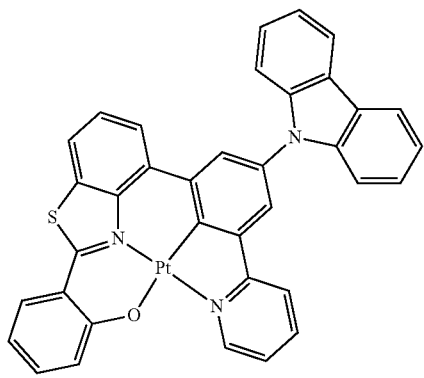
1-4
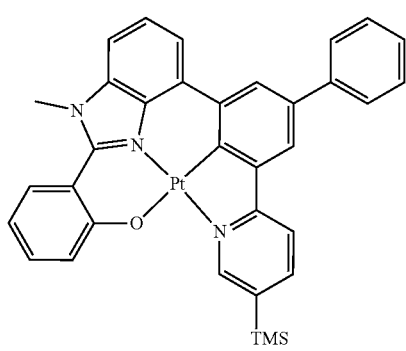
1-5
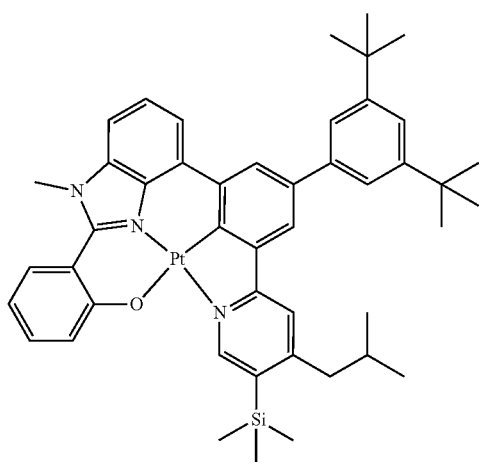
1-6
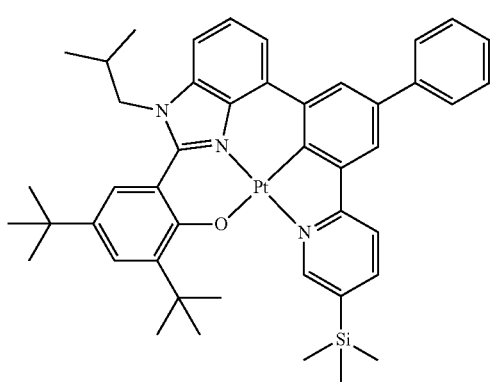
1-7
-continued
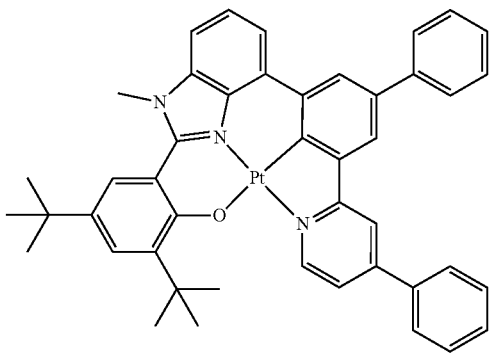
1-8
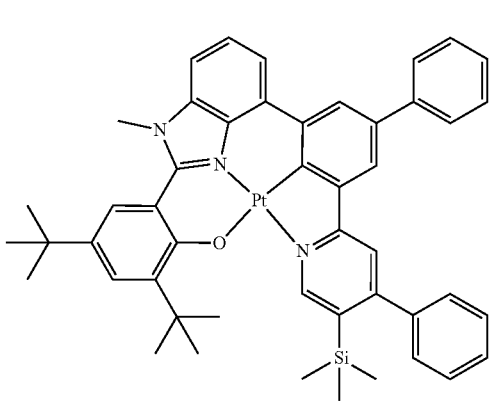
1-9
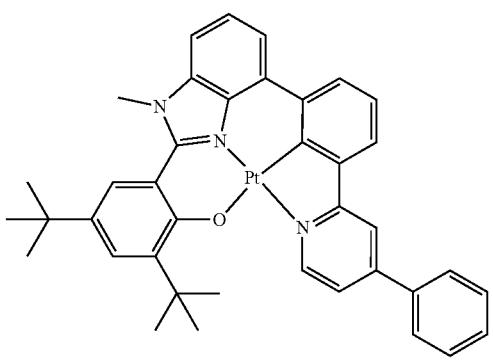
1-10
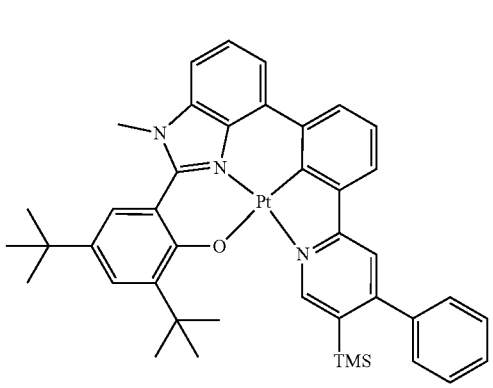
1-11

-continued
1-12
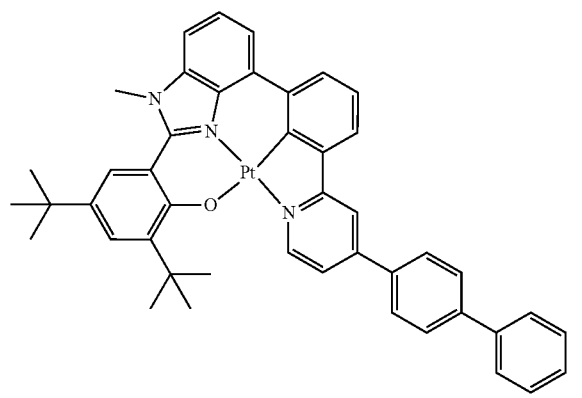
1-13
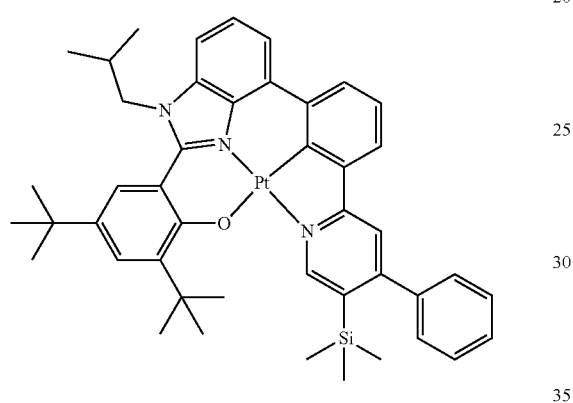
1-14
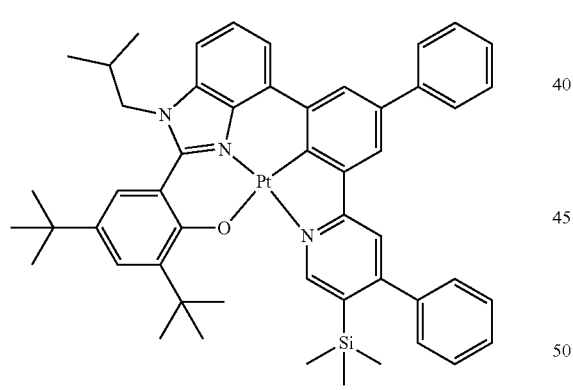
1-15
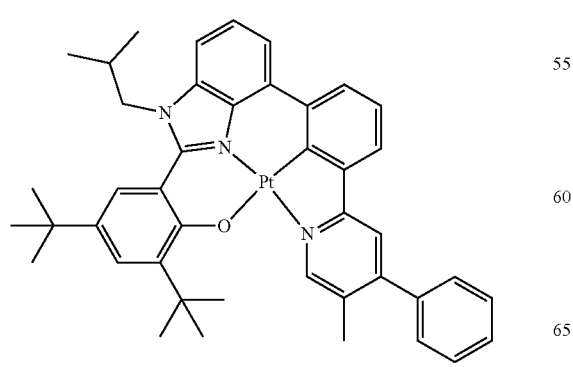
-continued
1-16
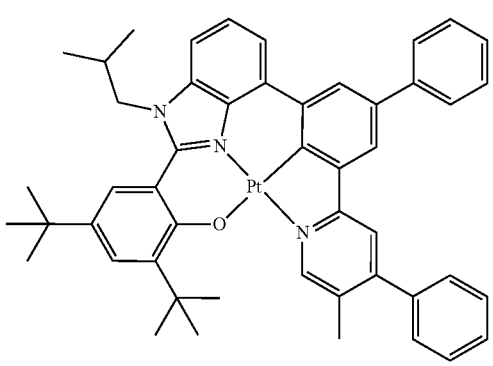
1-17
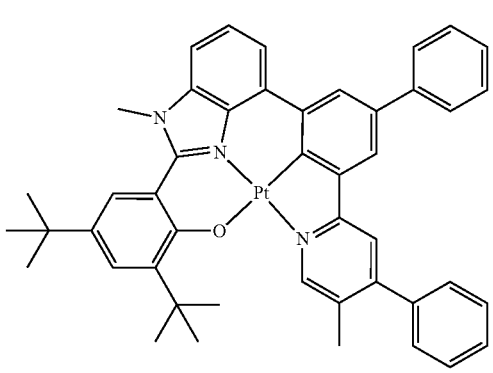
1-18
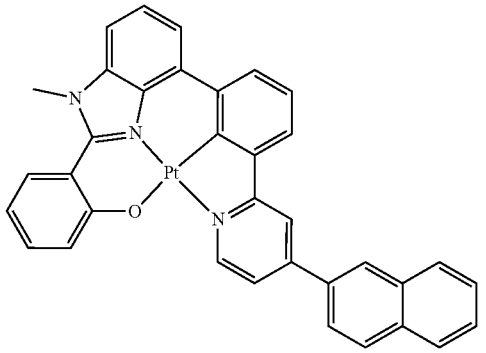
1-19
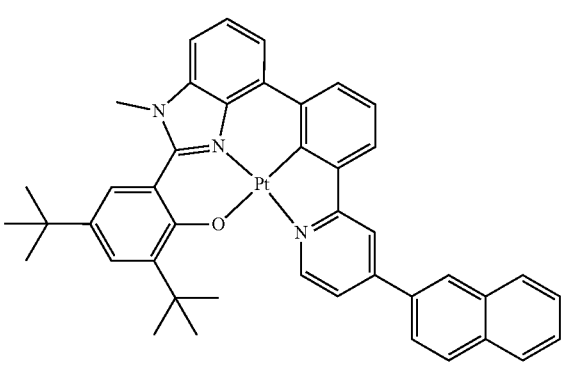

-continued
1-20
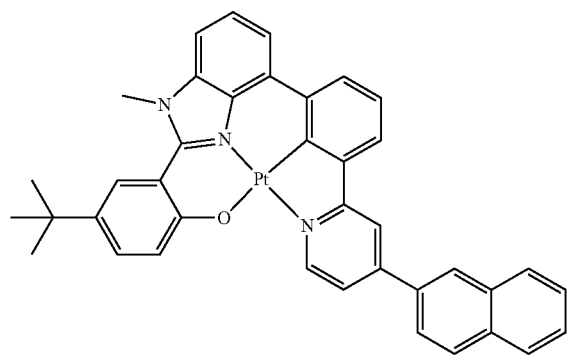
1-21
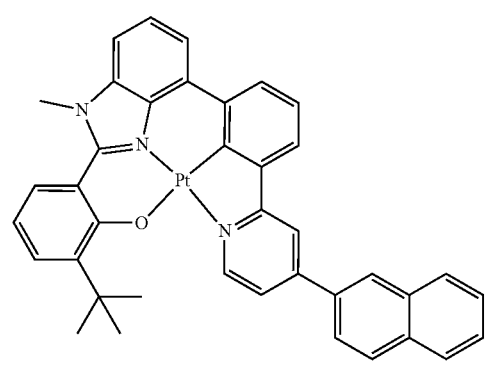
1-22
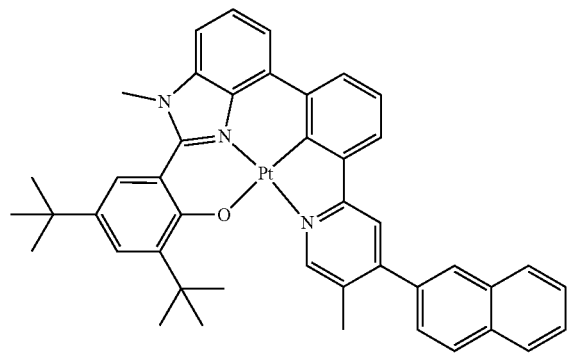
1-23
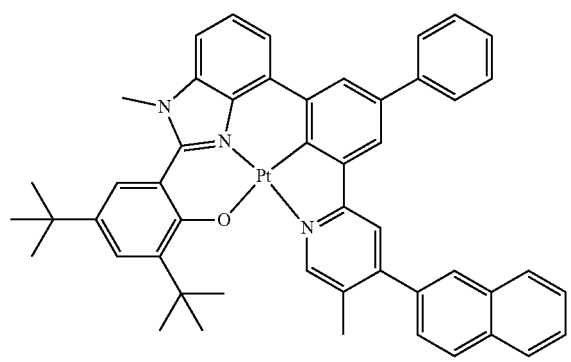
-continued
1-24
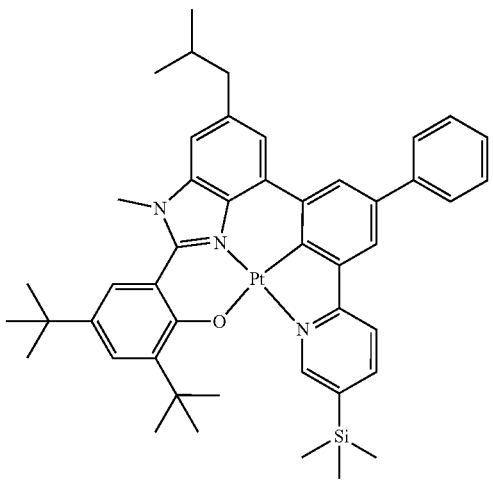
1-25
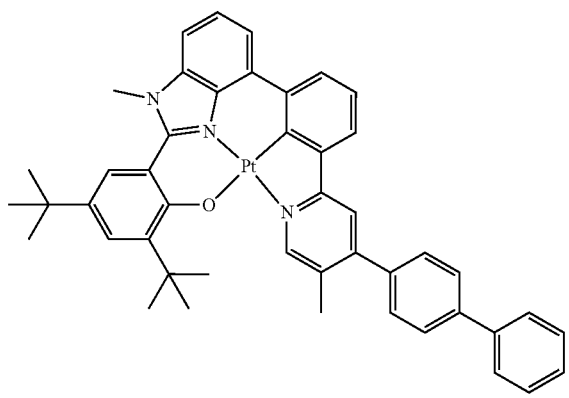
1-26
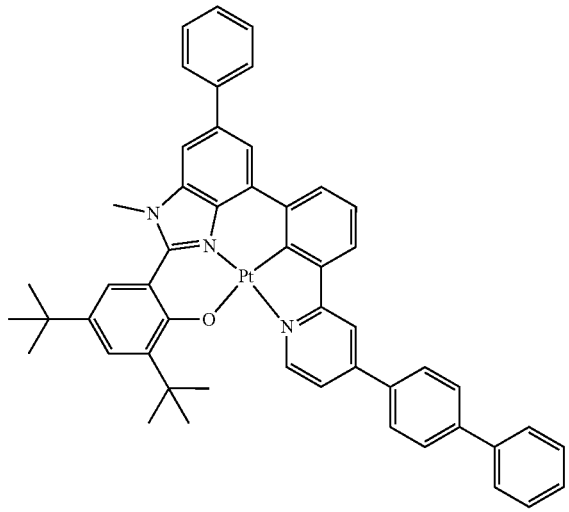

1-27
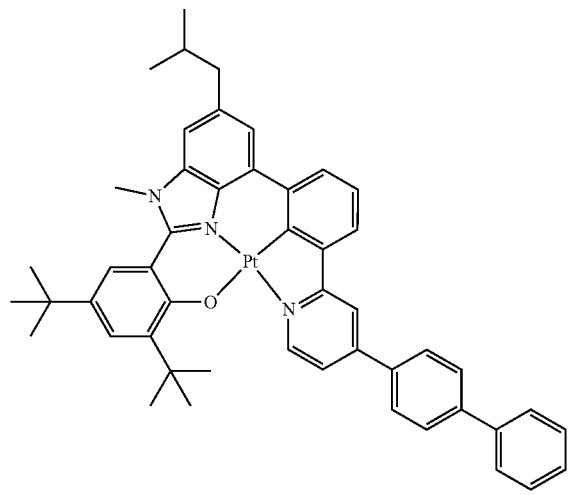
1-28
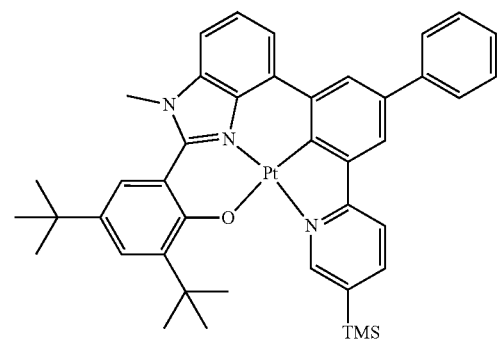
1-29
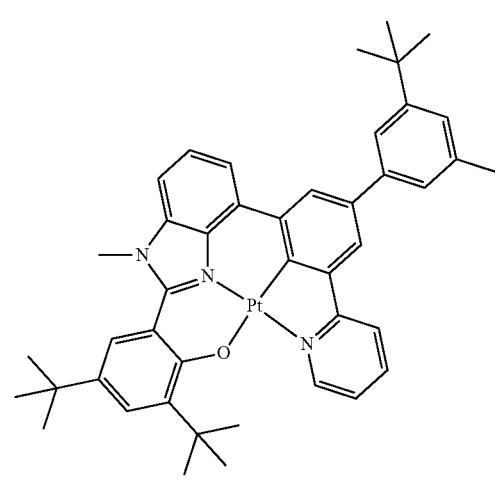
1-30
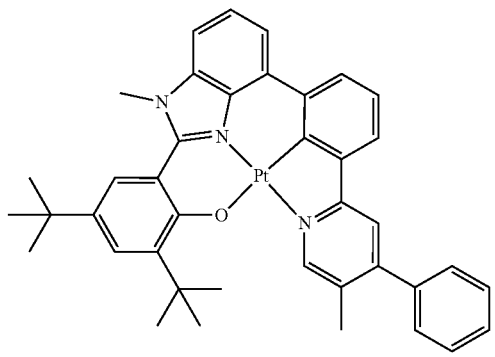
1-31
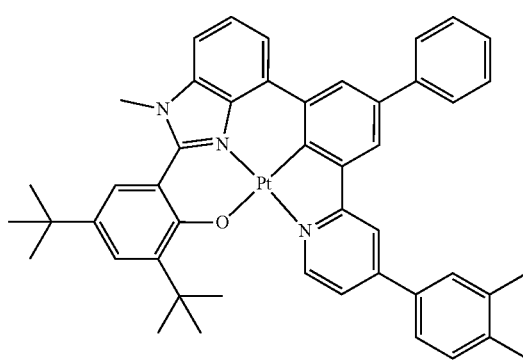
1-32
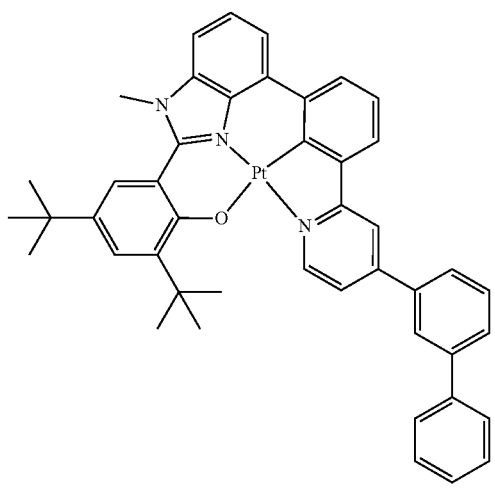
1-33
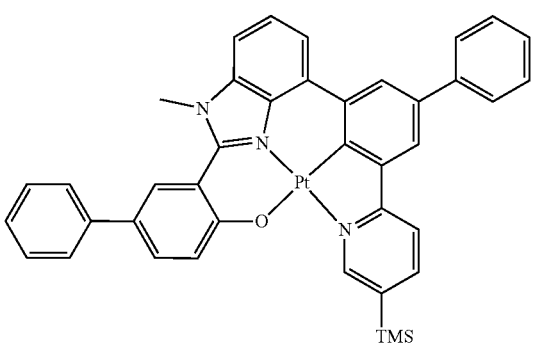

1-34
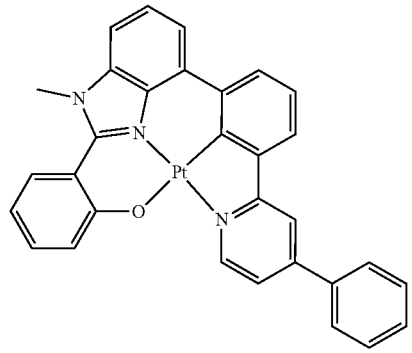
1-38
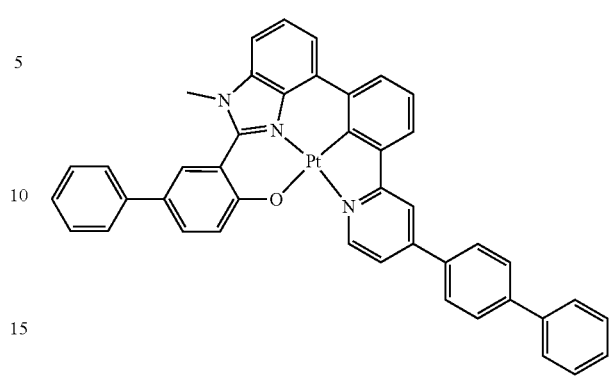
1-35
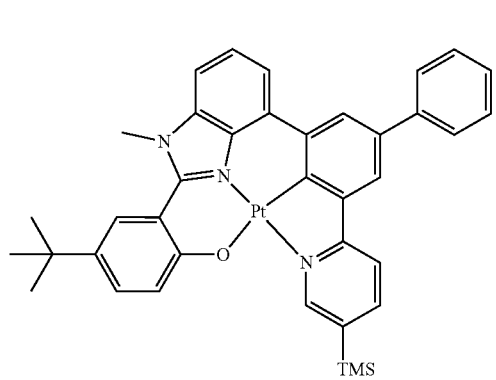
1-39
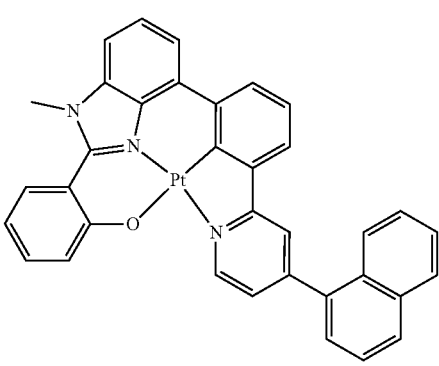
1-36
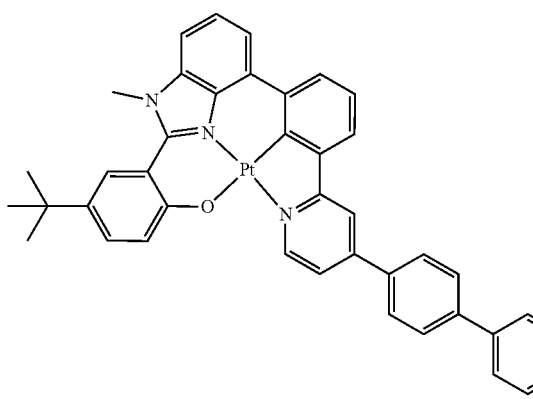
1-40
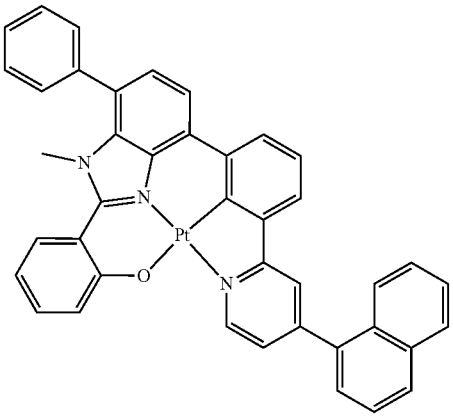
1-37
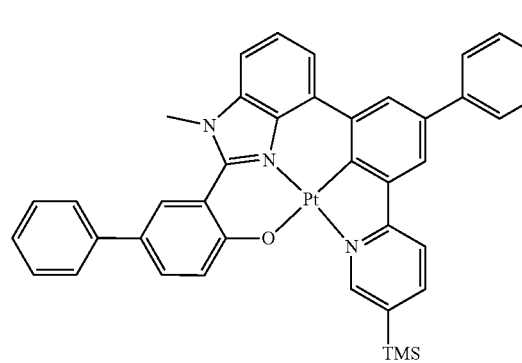
1-41
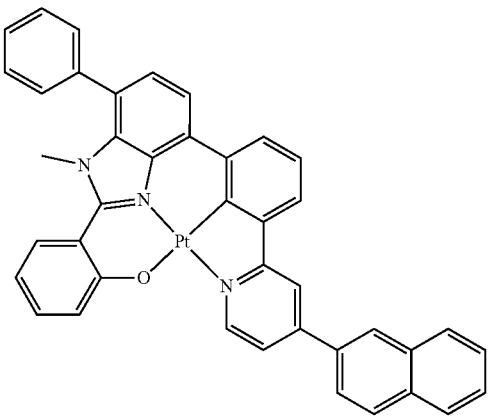

-continued
1-42
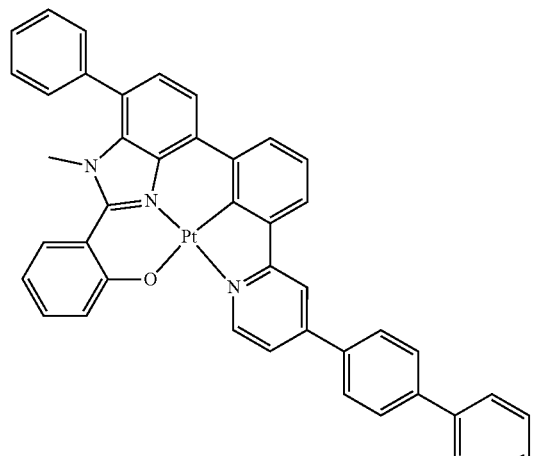
1-43
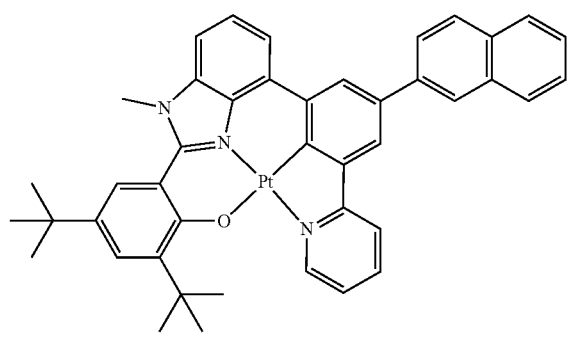
1-44
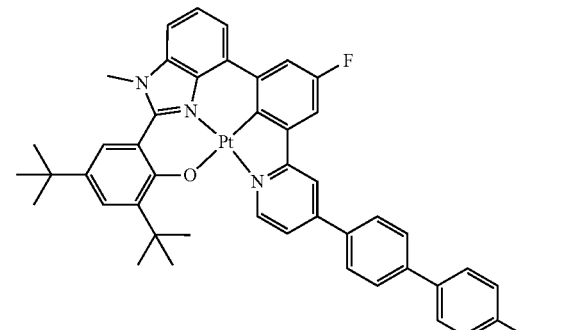
1-45
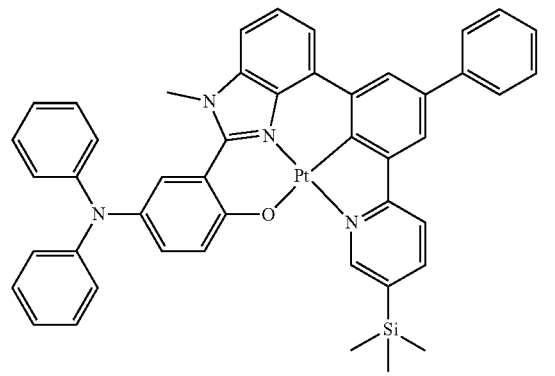
-continued
1-46
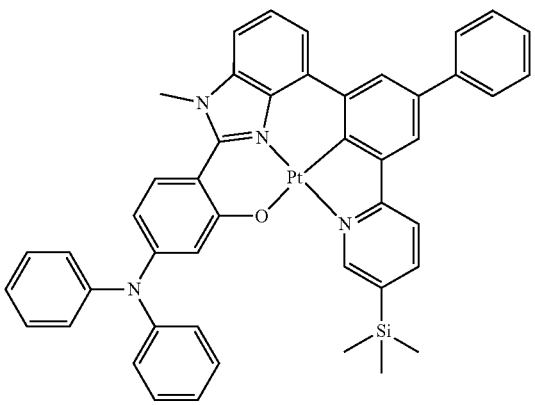
1-47
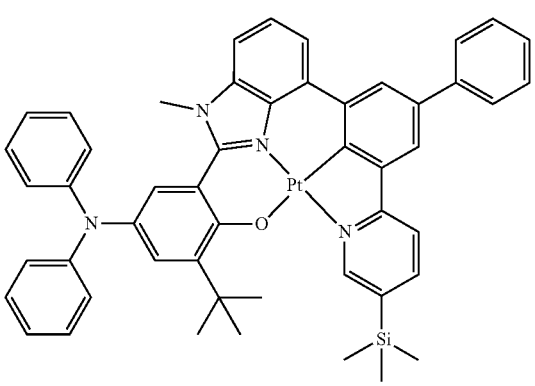
1-48
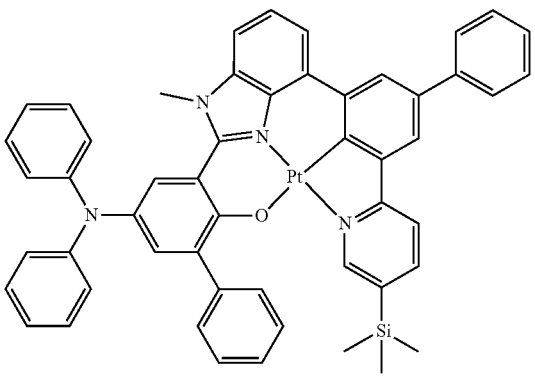
1-49
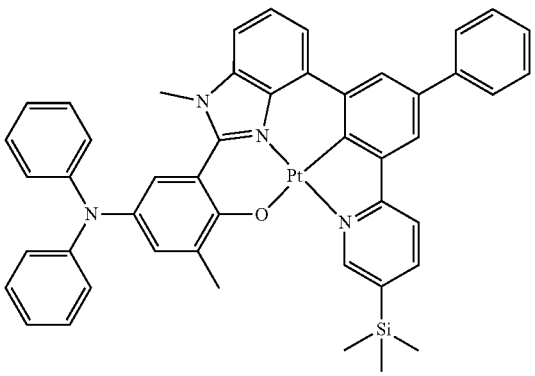

1-50
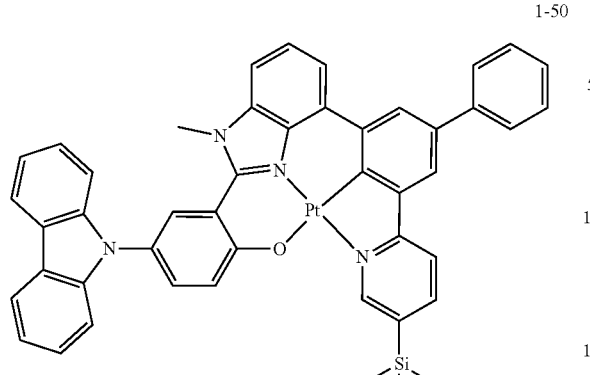
1-51
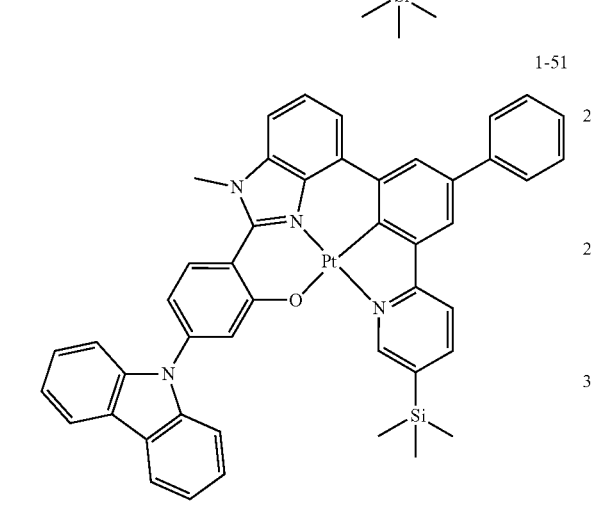
1-52
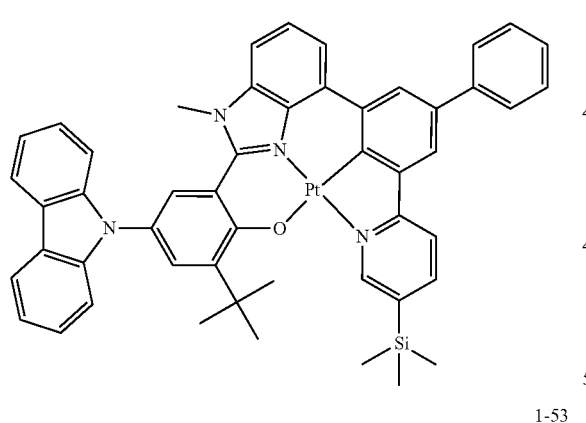
1-53
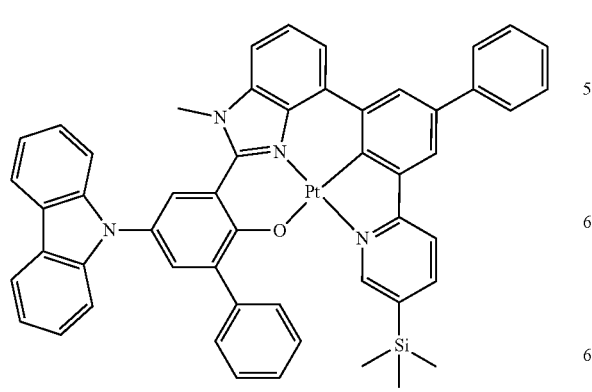
1-54
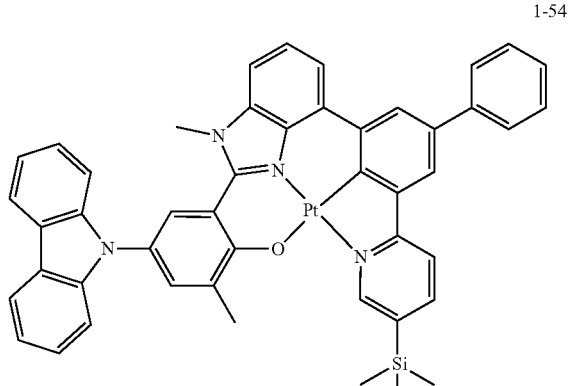
1-55
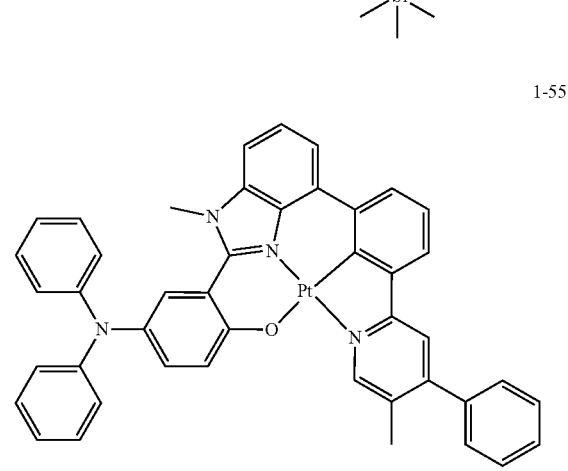
1-56
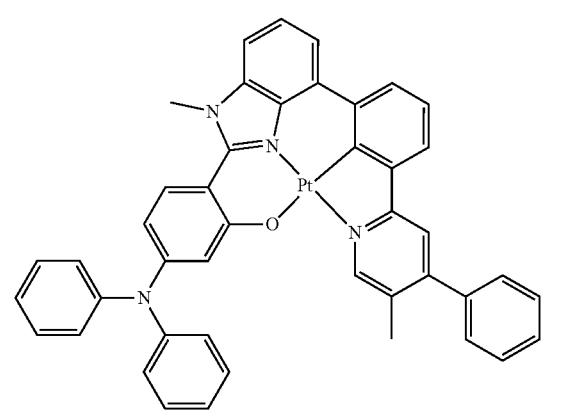
1-57
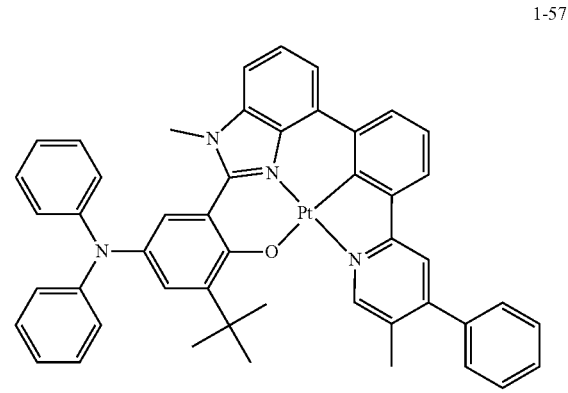

-continued
1-58
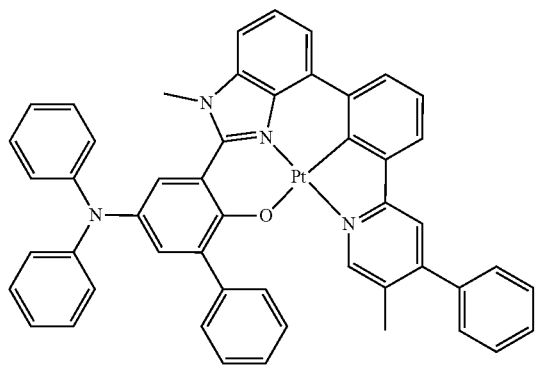
1-59
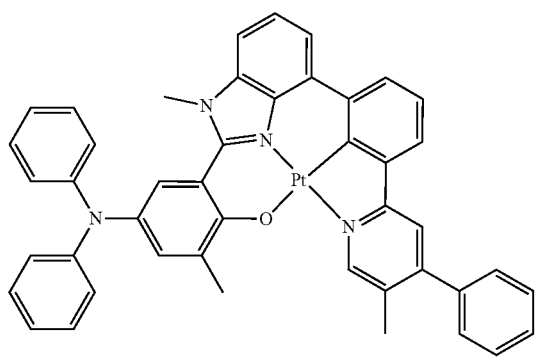
1-60
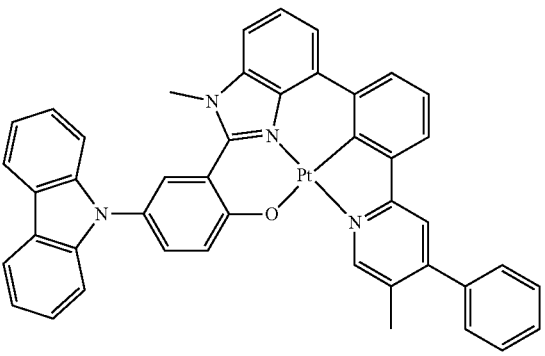
1-61
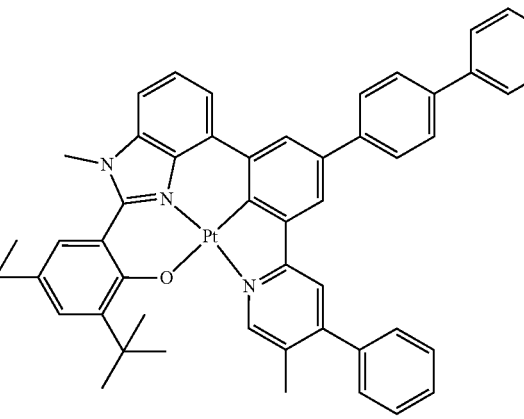
-continued
1-62
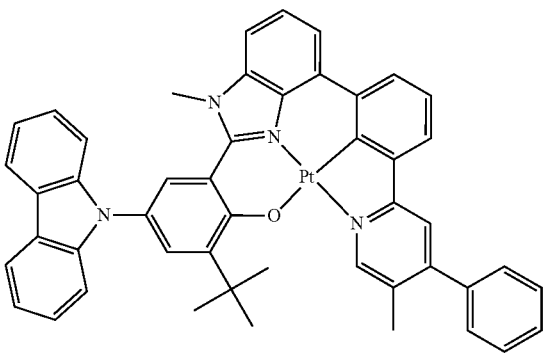
1-63
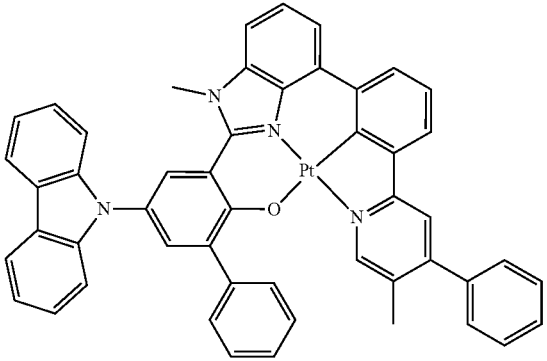
1-64
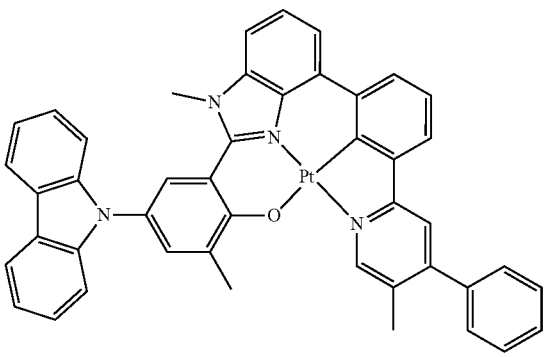
1-65

1-66
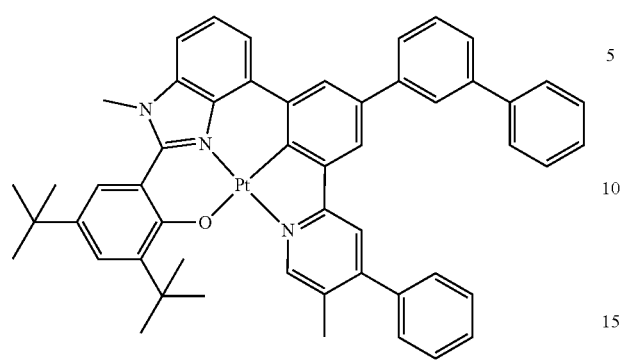
1-69
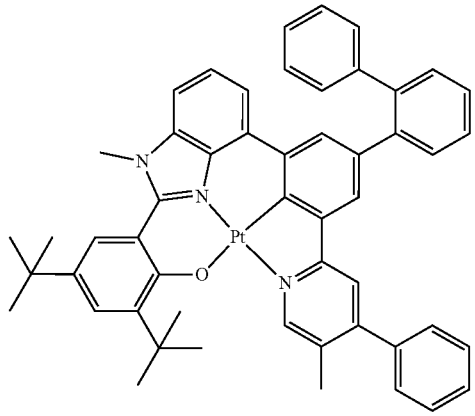
1-67
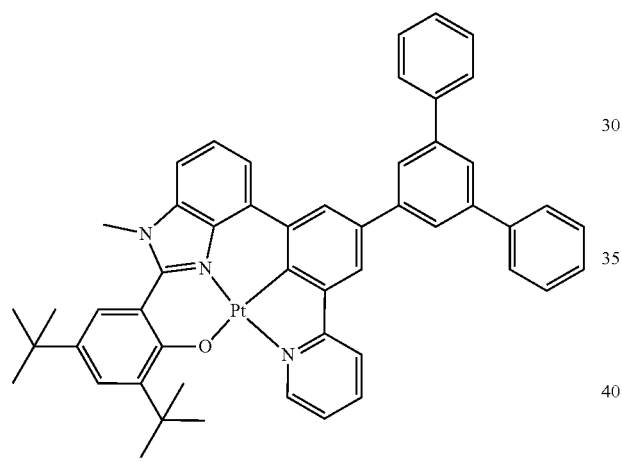
1-70
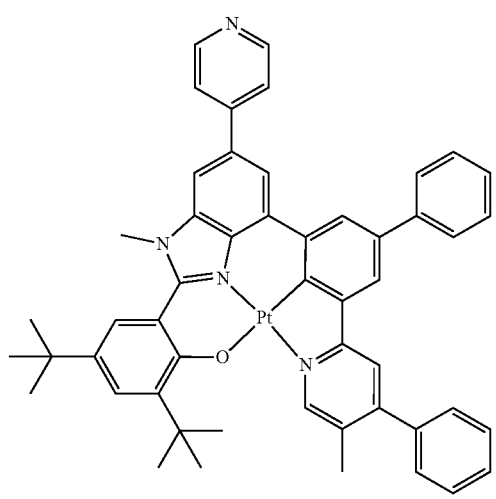
1-68
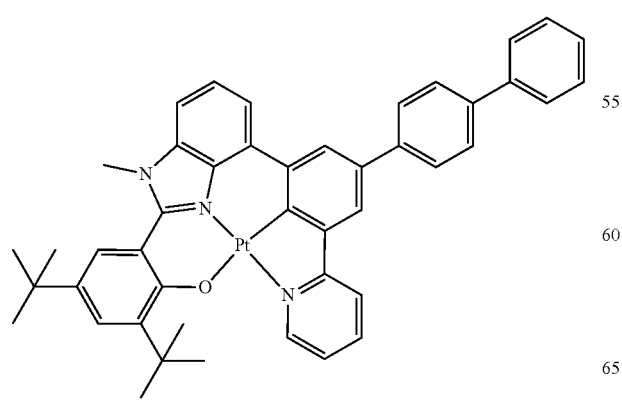
1-71
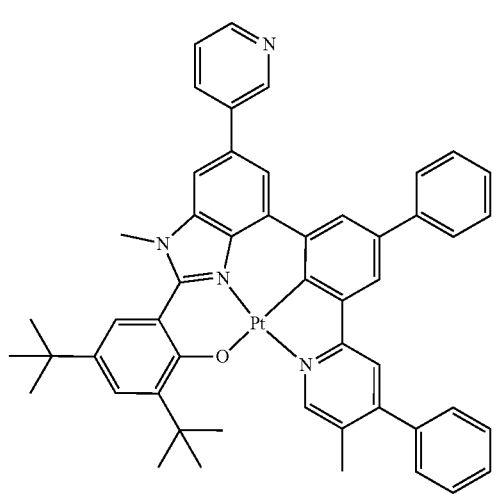

1-72
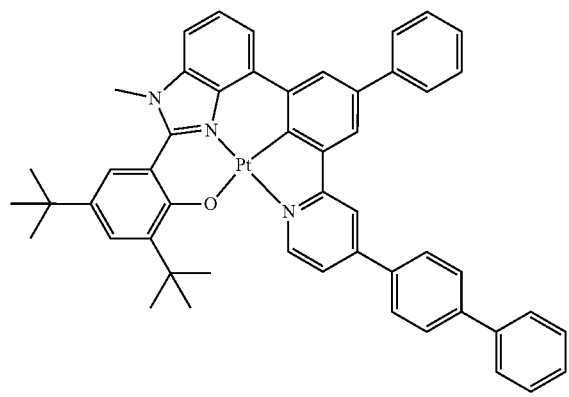
1-73
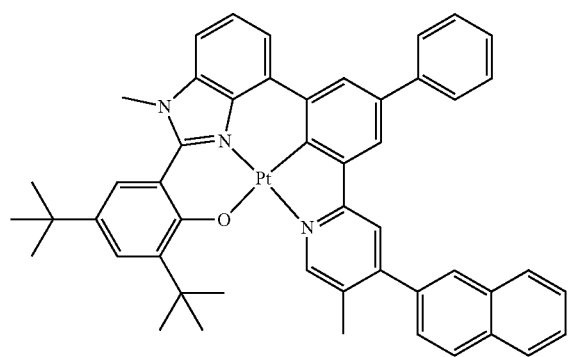
1-74
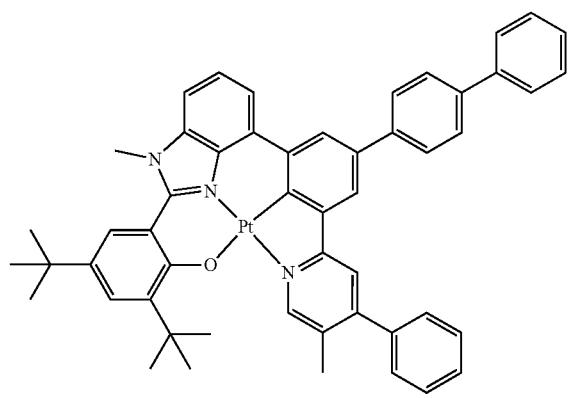
1-75
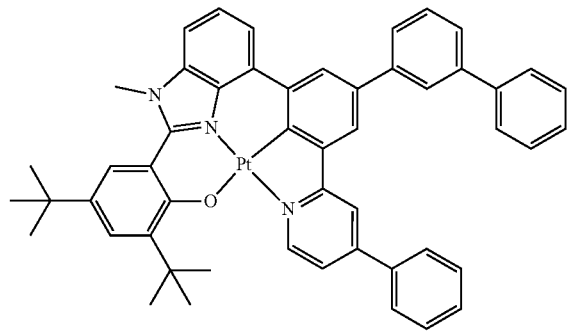
1-76
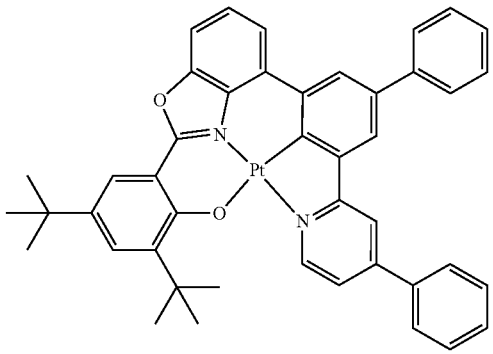
1-77
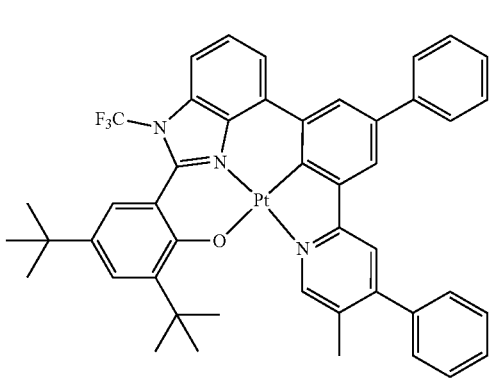
1-78
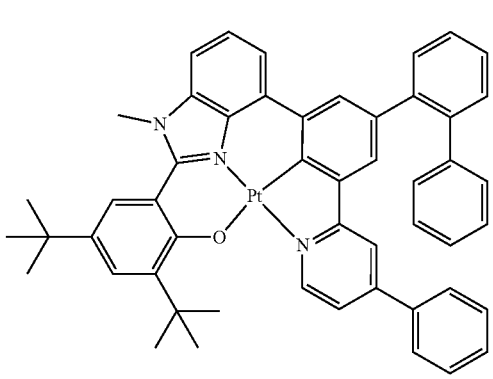
1-79
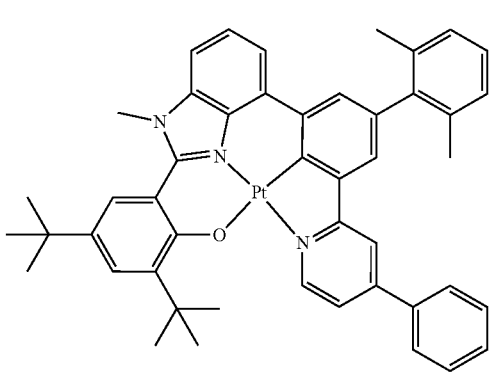

1-80
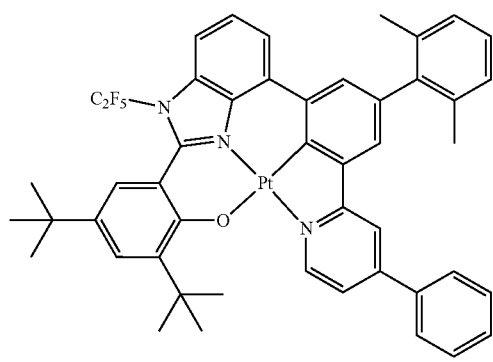
1-84
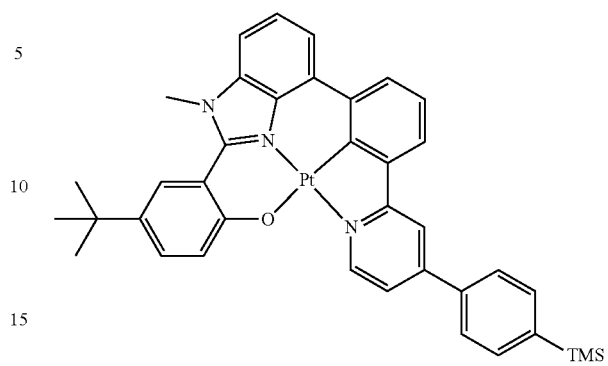
1-81
1-85
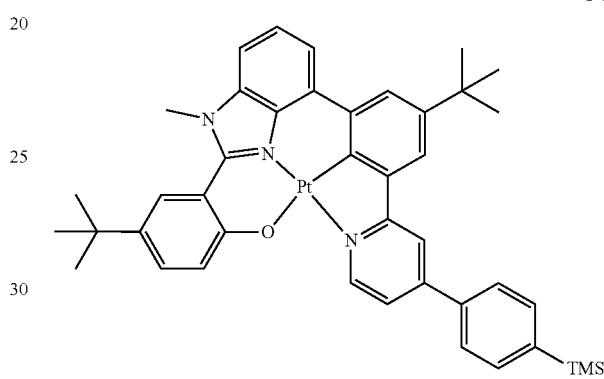
1-82
1-86
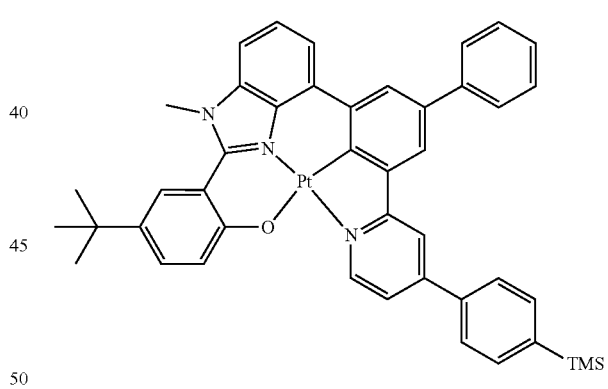
1-83
1-87
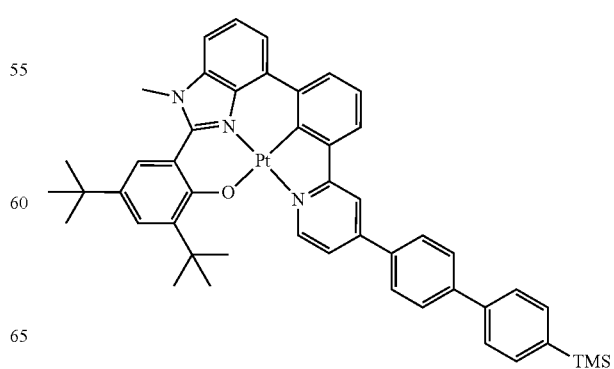

-continued
1-88
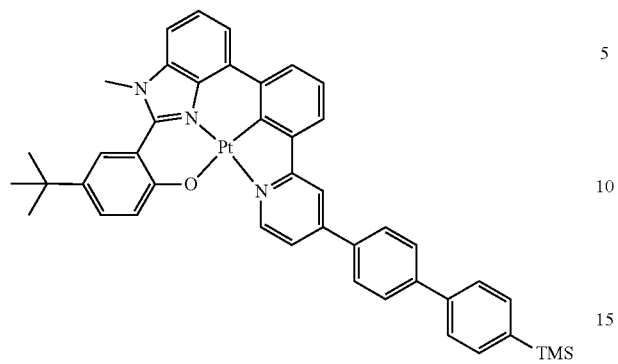
2-1
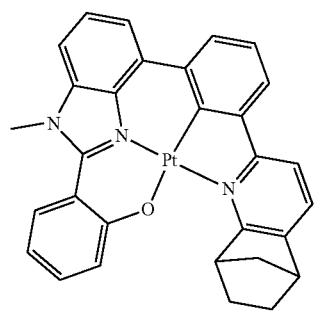
2-2
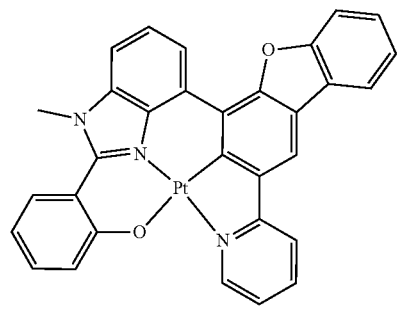
2-3
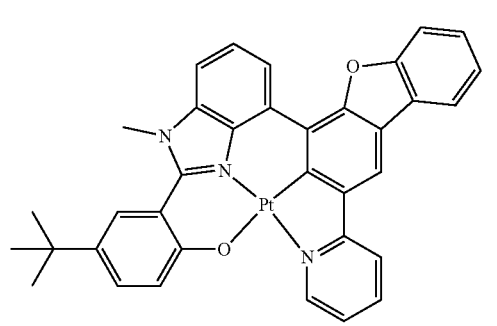
-continued
2-4
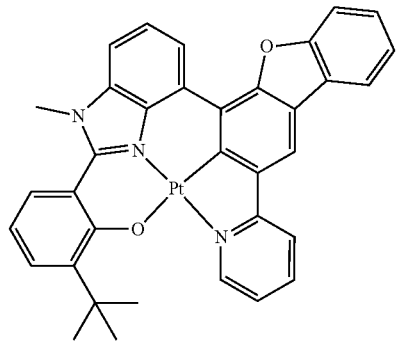
2-5
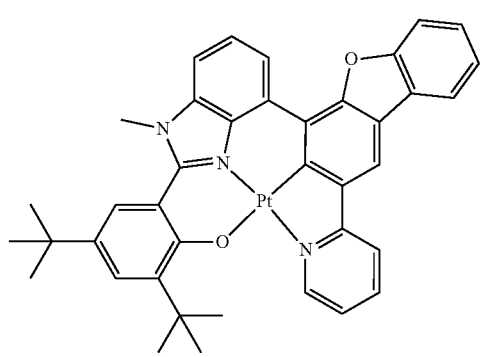
2-6
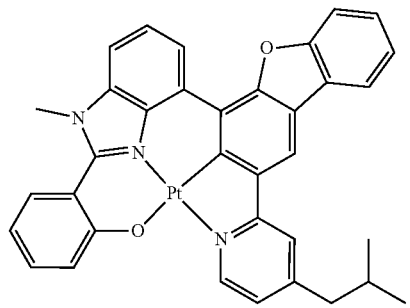
2-7
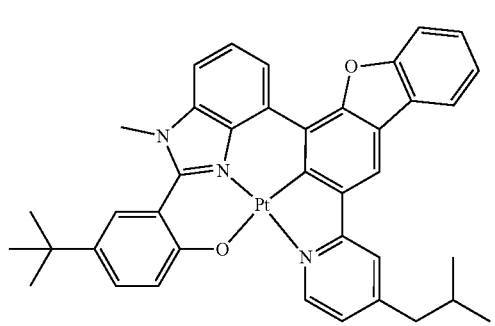

2-8
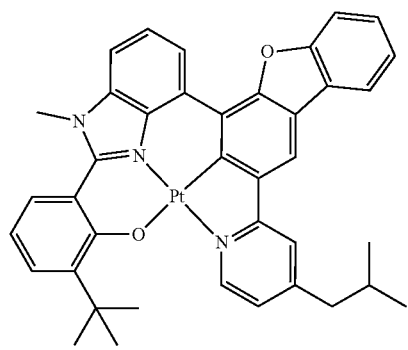
2-9
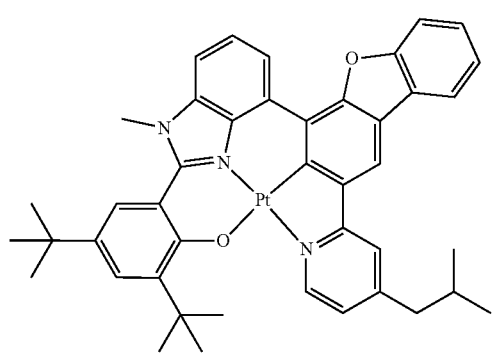
2-10
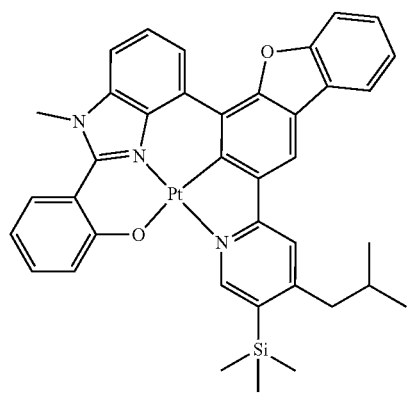
2-11
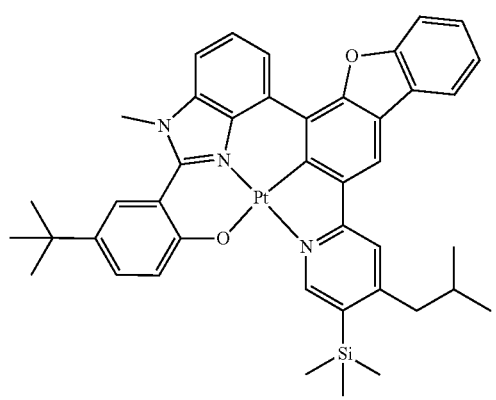
2-12
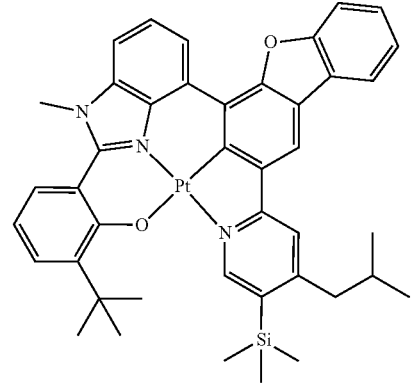
2-13
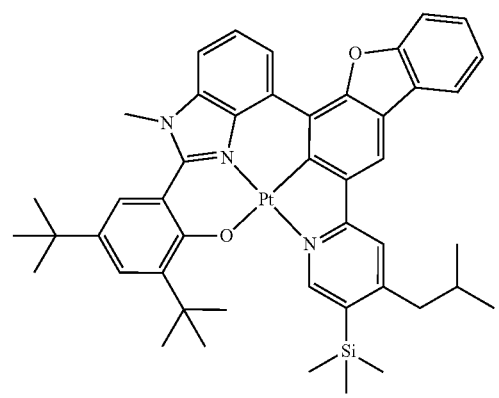
2-14
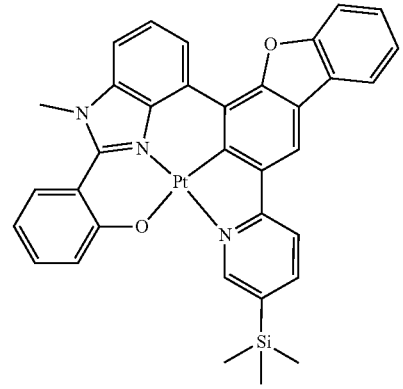
2-15
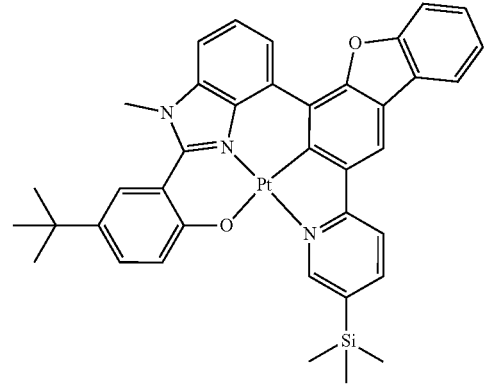

-continued
2-16
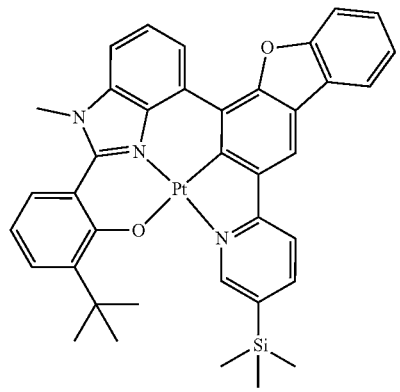
2-17
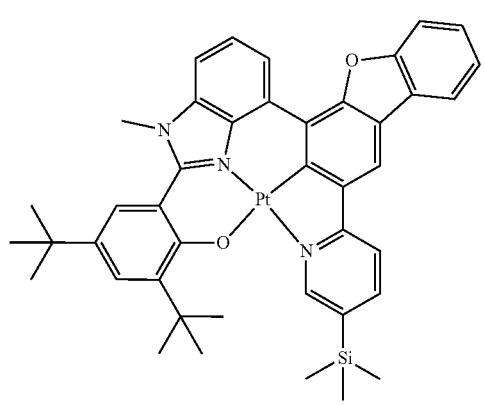
2-18
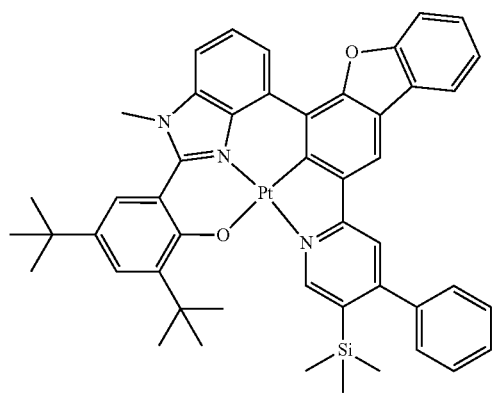
2-19
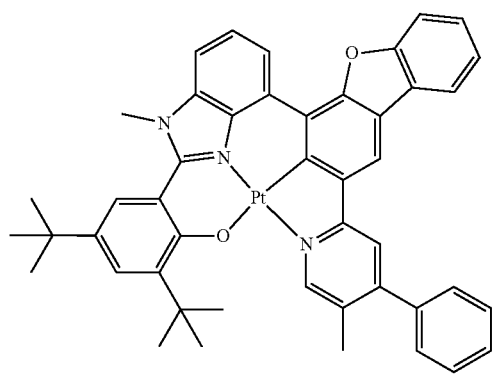
-continued
2-20
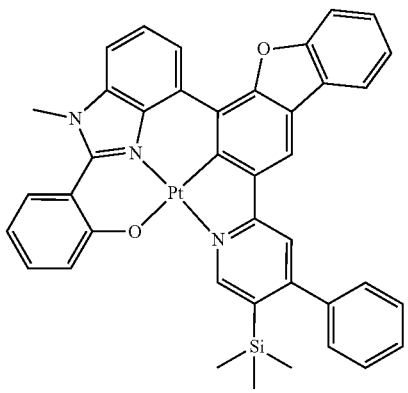
2-21
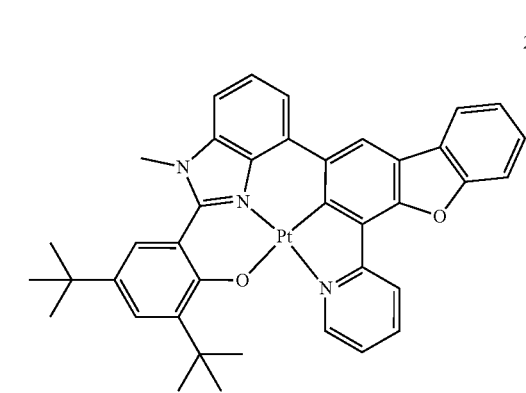
2-22
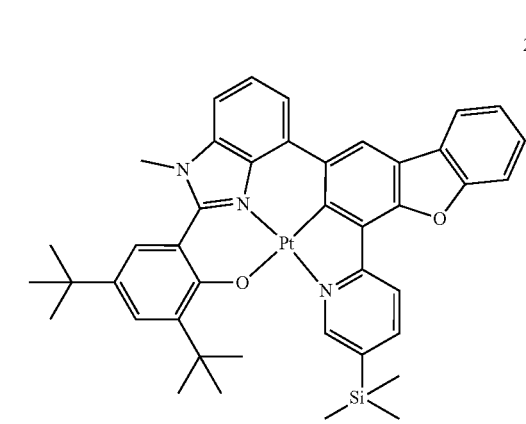
2-23
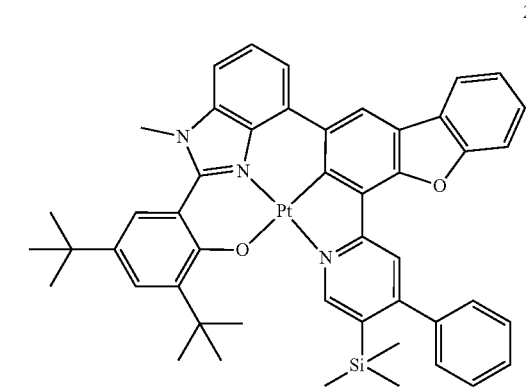

2-24
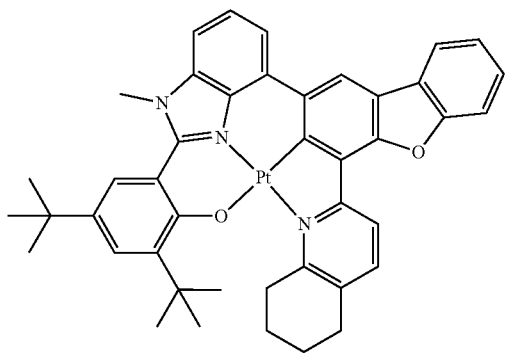
2-25
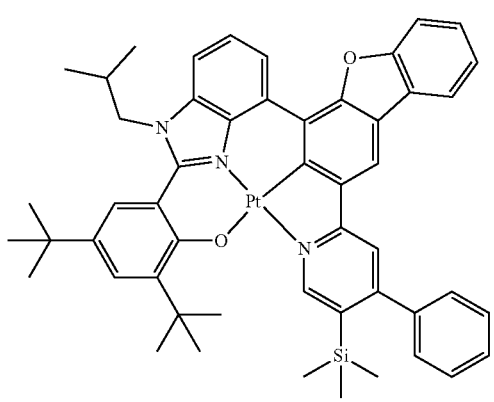
2-26
2-27
2-28
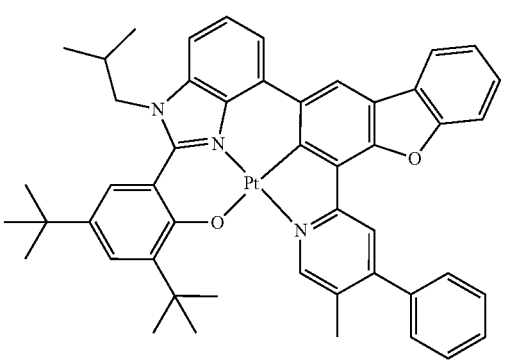
2-29
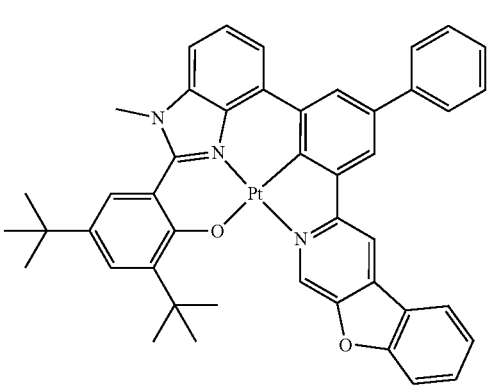
2-30
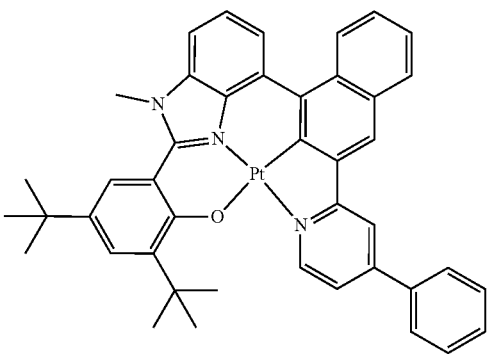
2-31
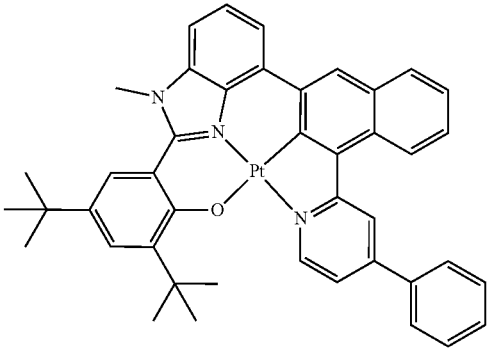

-continued
2-32
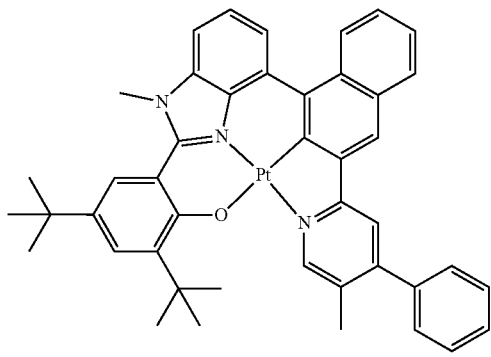
2-33
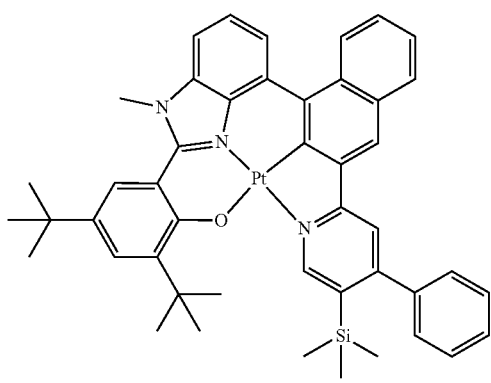
2-34
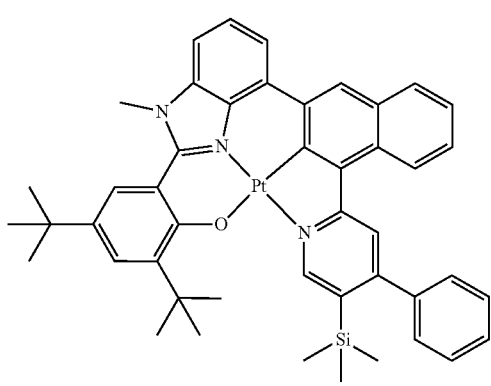
2-35
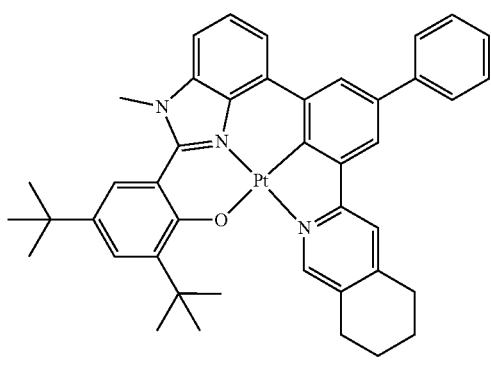
-continued
2-36
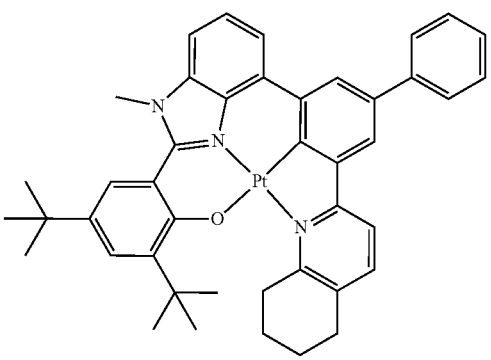
2-37
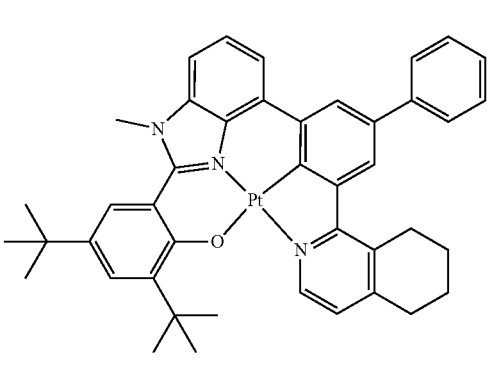
2-38
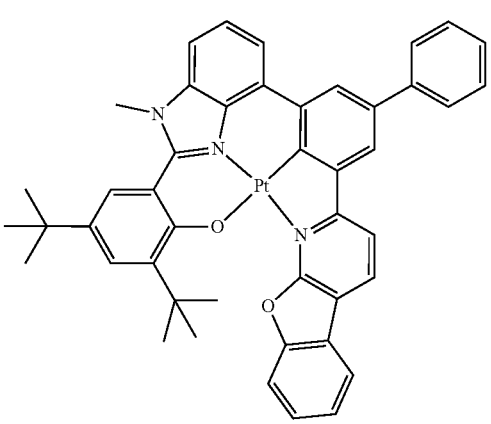
2-39
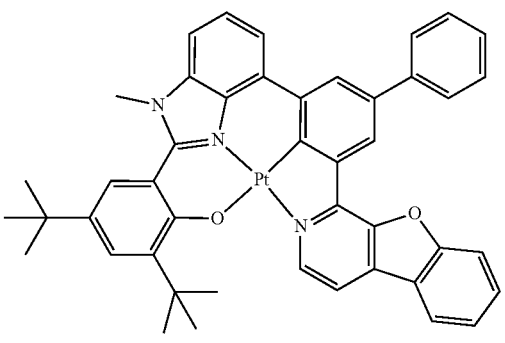

2-40
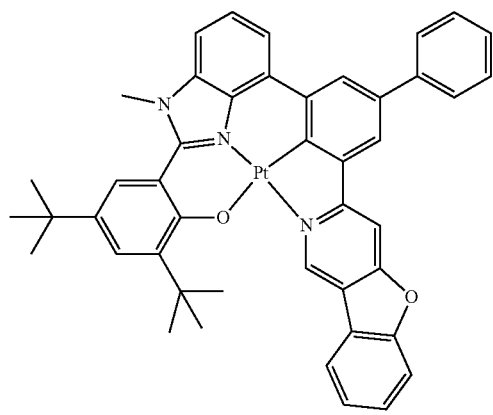
2-41
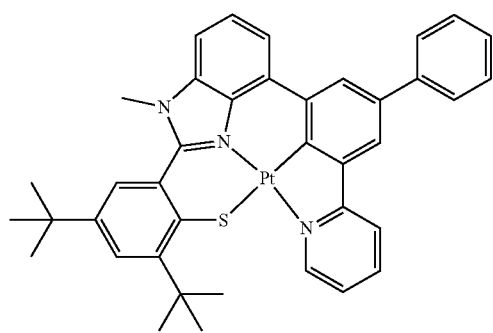
2-42
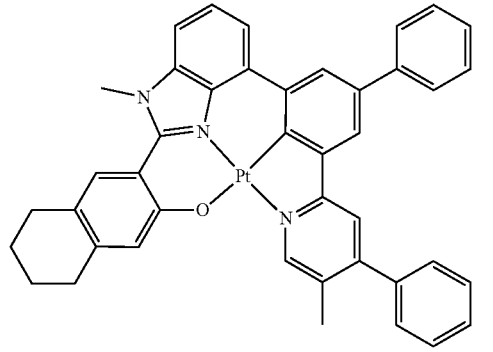
2-43
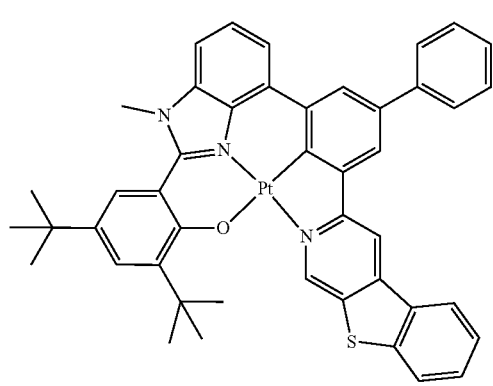
2-44
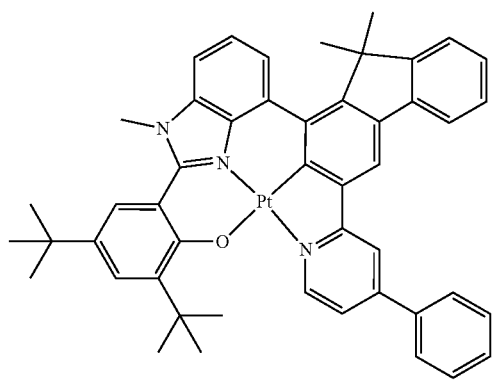
2-45
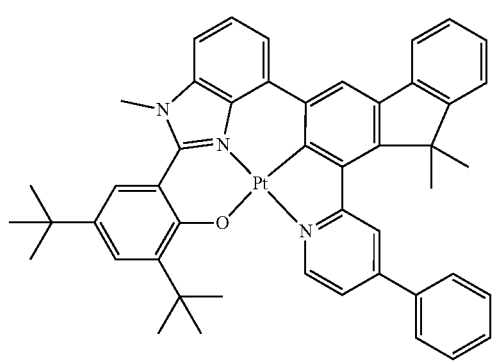
2-46
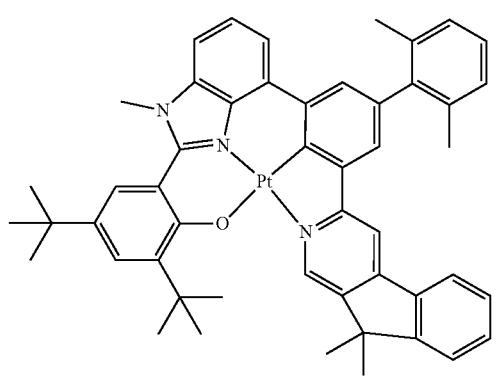
2-47
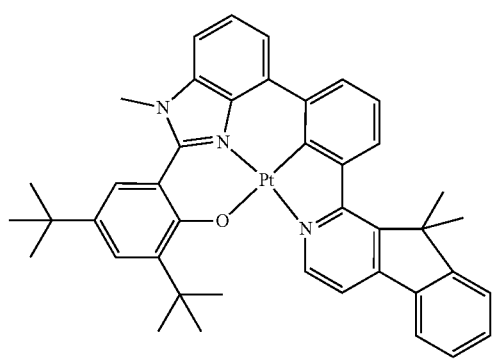

3-1
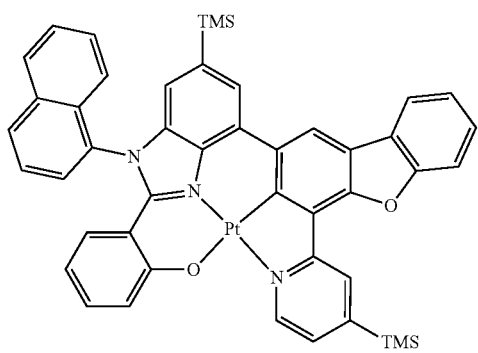
3-2
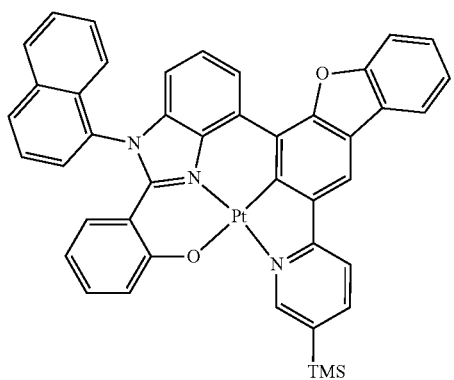
3-3
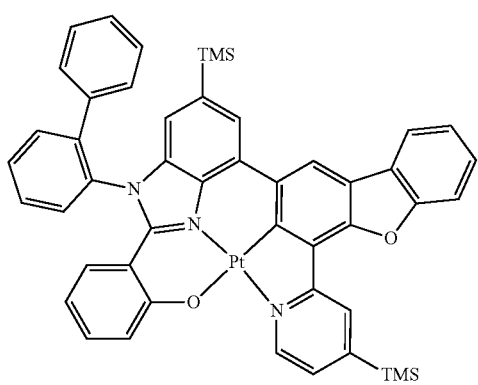
3-4
3-5
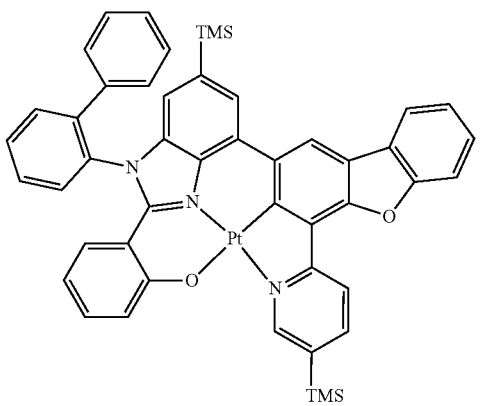
3-6
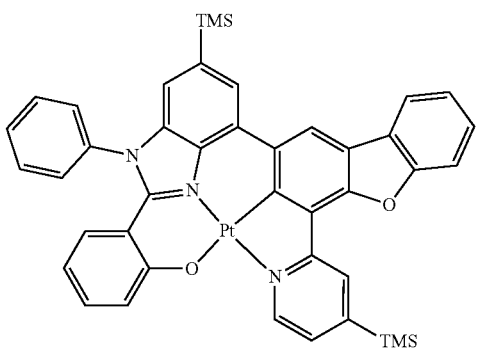
3-7
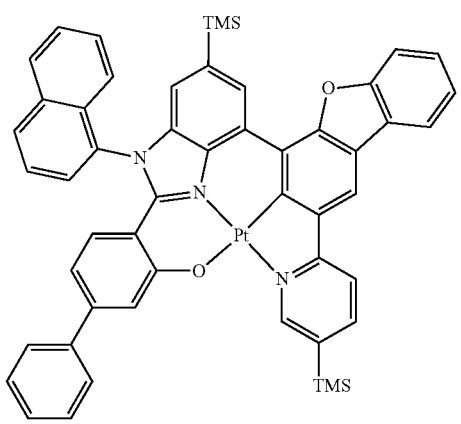
3-8
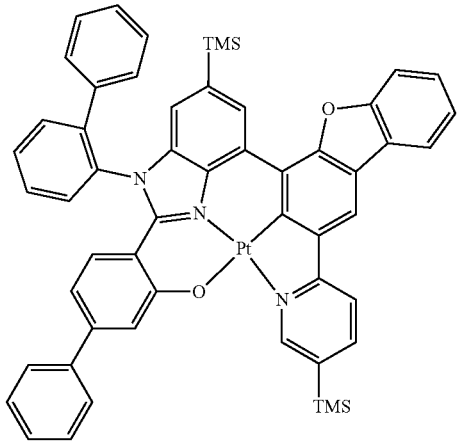

3-9
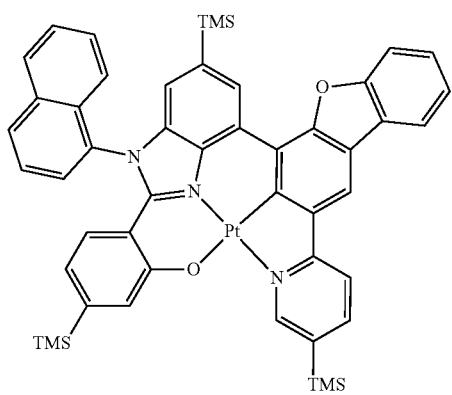
3-12
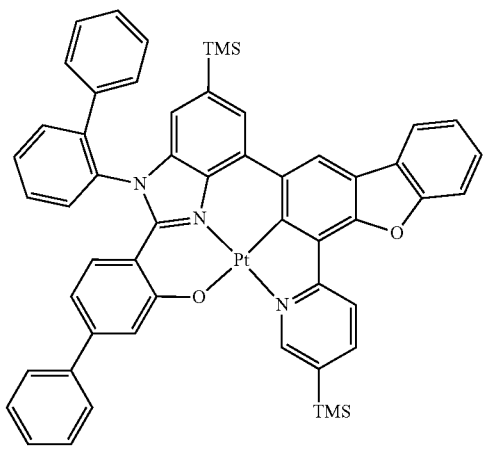
3-10
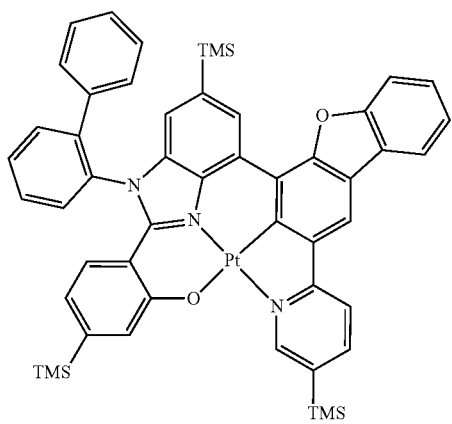
3-13
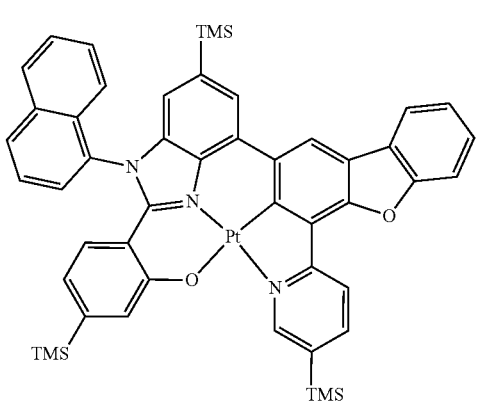
3-11
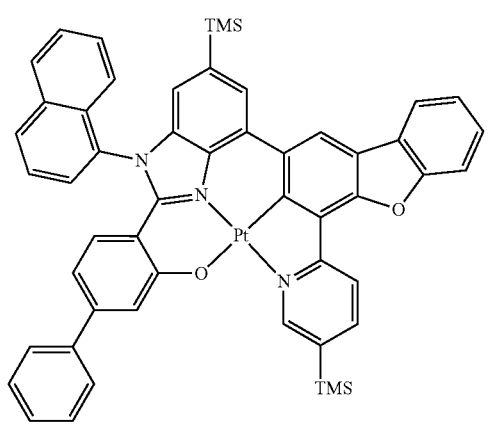
3-14
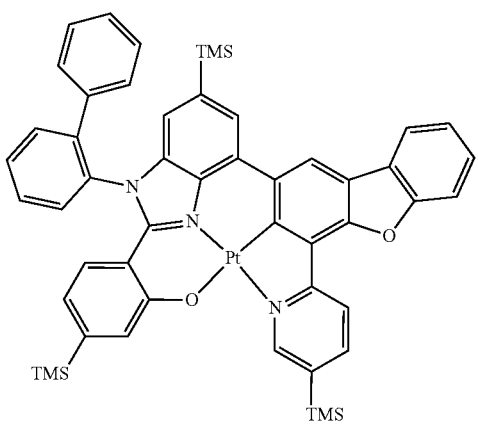

3-15
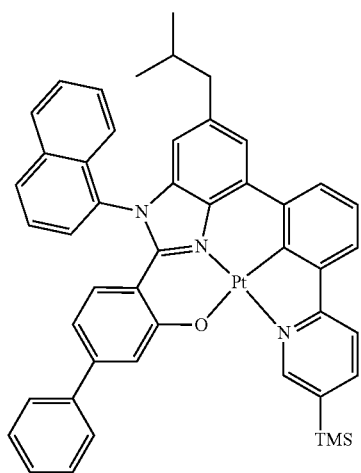
3-16
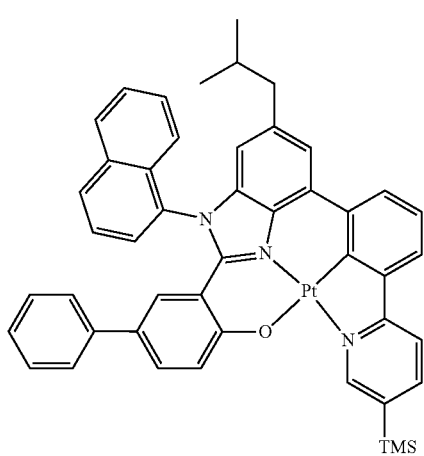
3-17
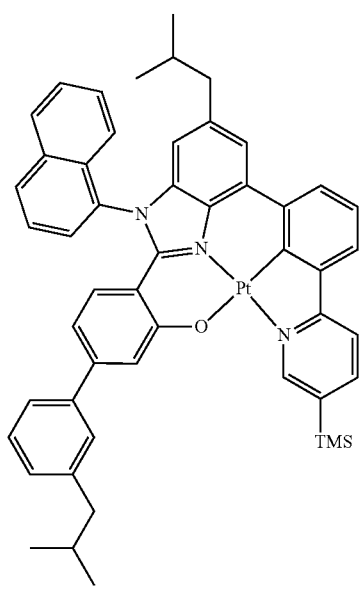
3-18
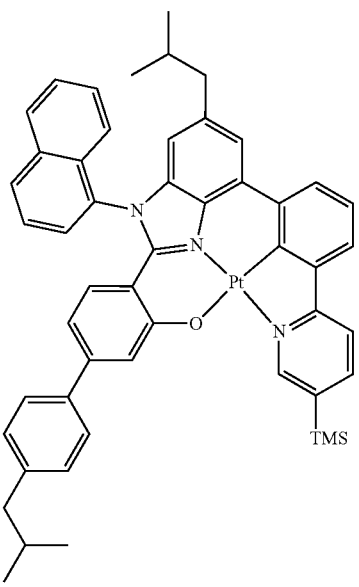
3-19
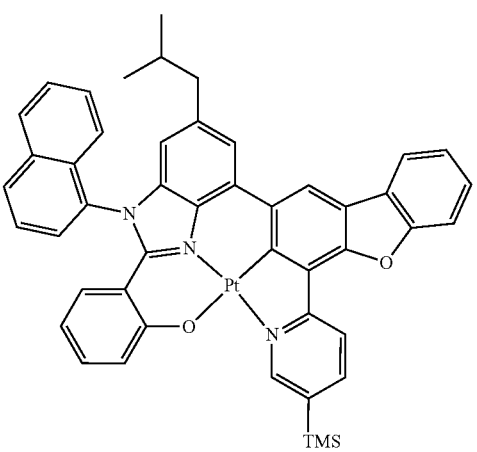
3-20
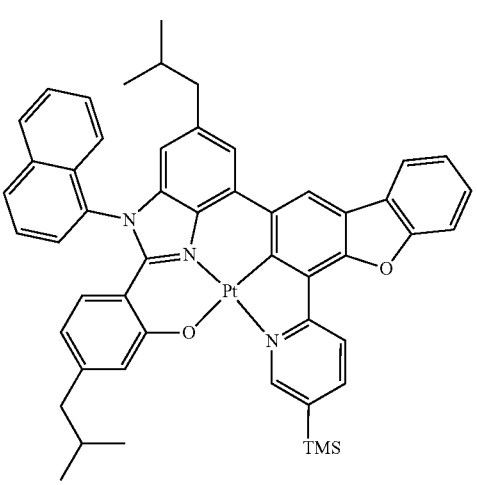

3-21
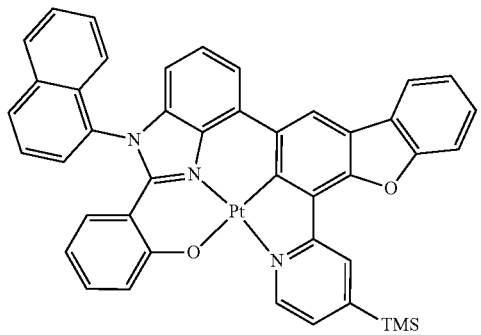
3-24
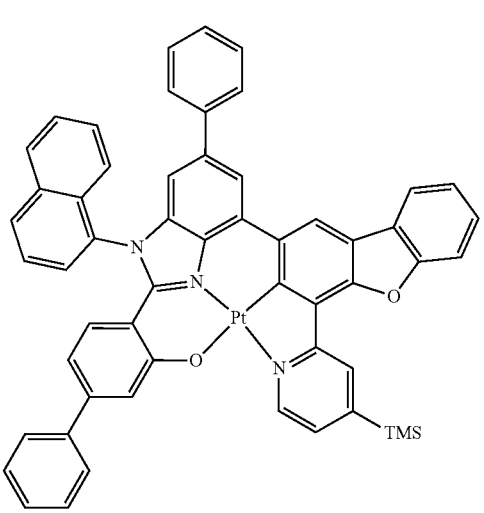
3-22
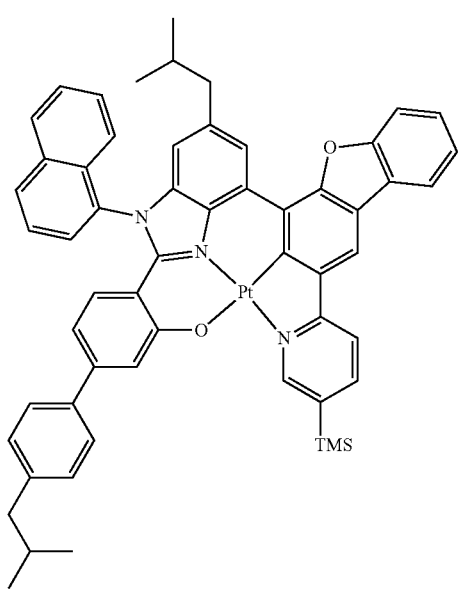
3-25
3-23
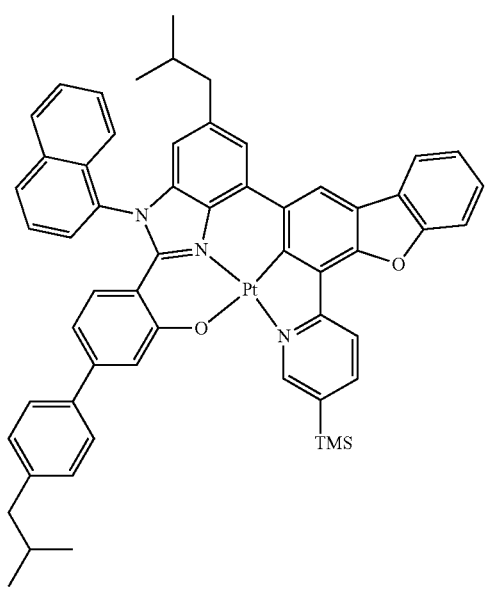
3-26
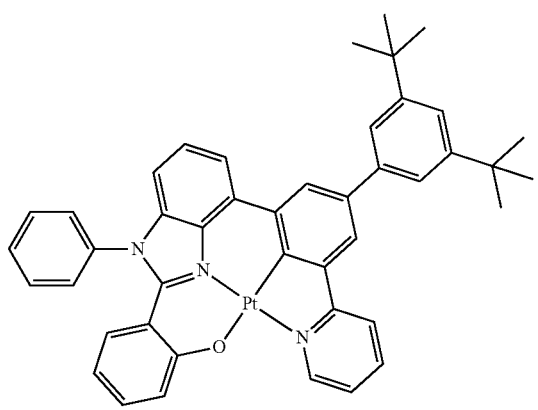

3-27
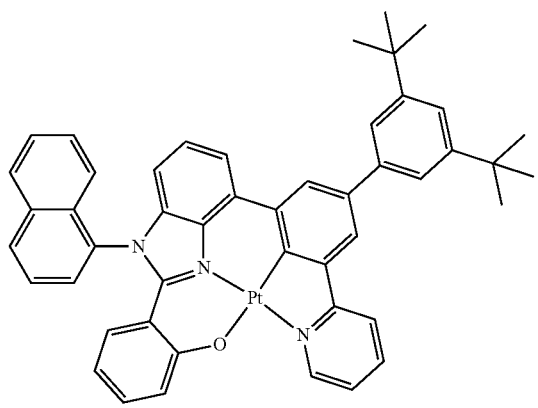
3-28
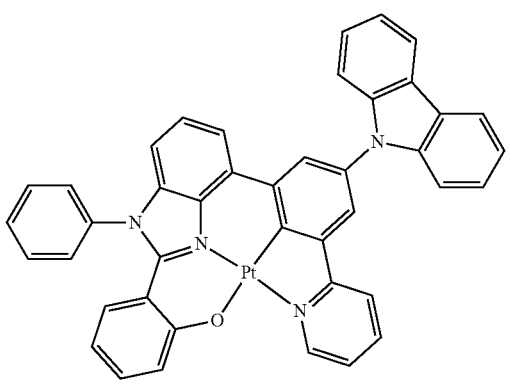
3-29
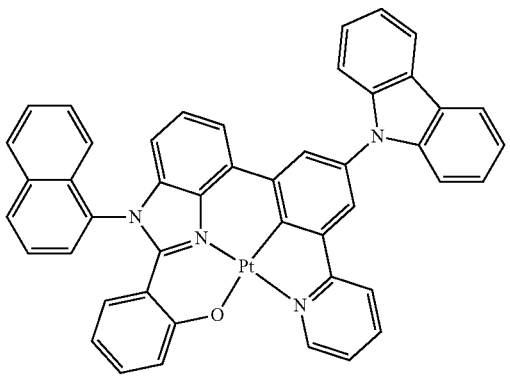
3-30
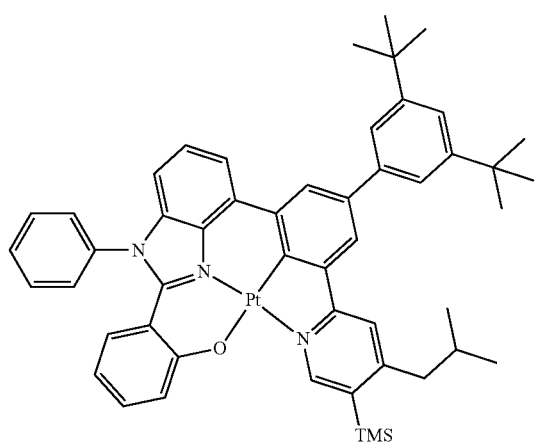
3-31
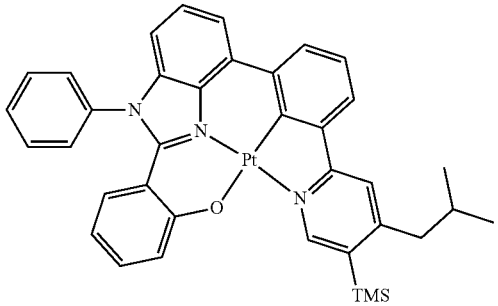
3-32
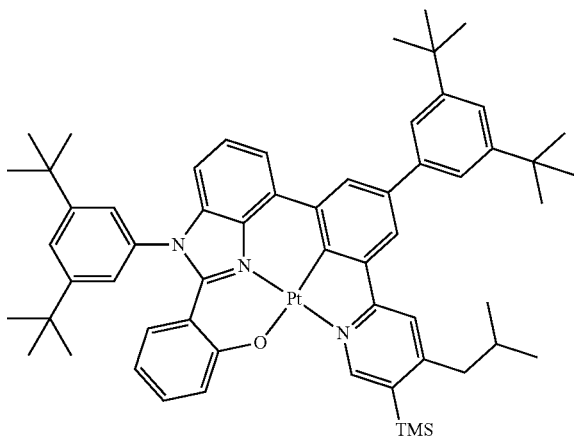
3-33
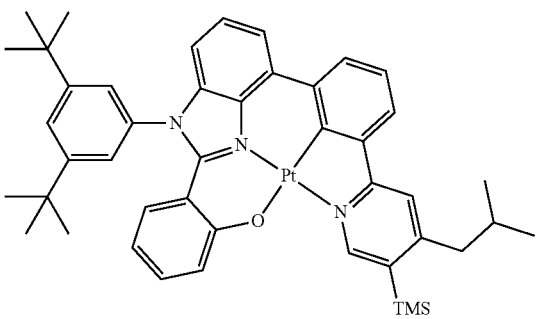
3-34
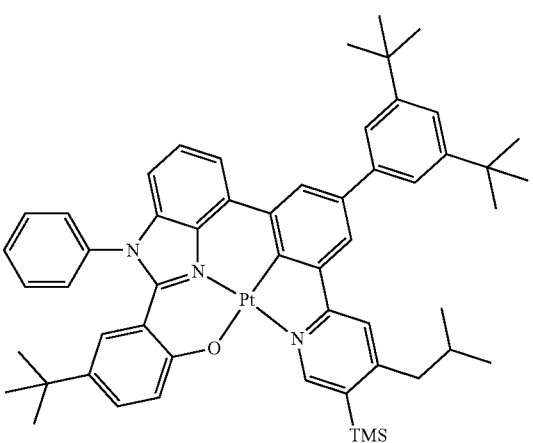

3-35
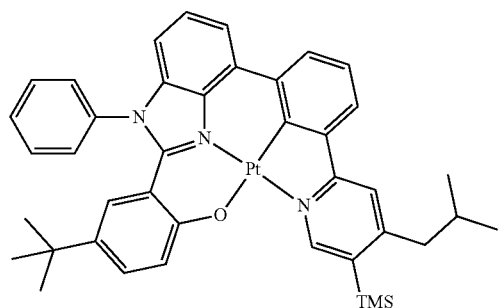
3-36
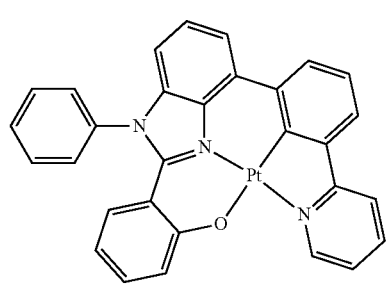
3-37
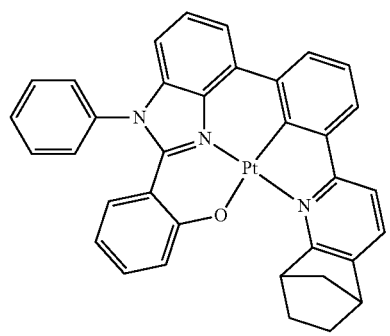
3-38
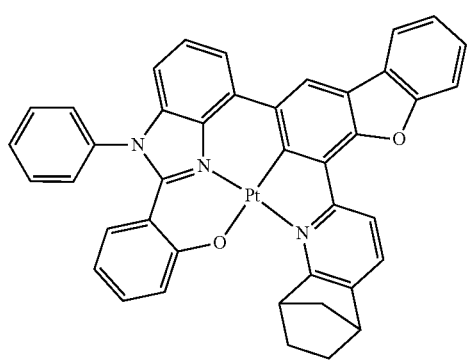
3-39
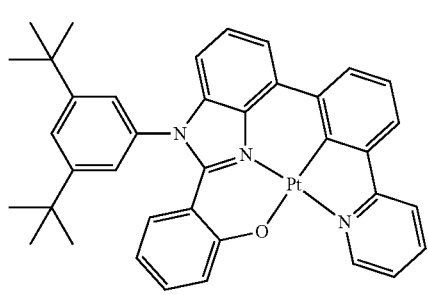
3-40
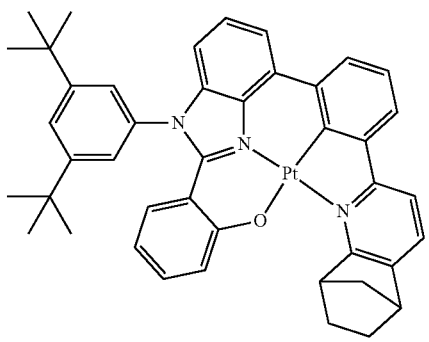
3-41
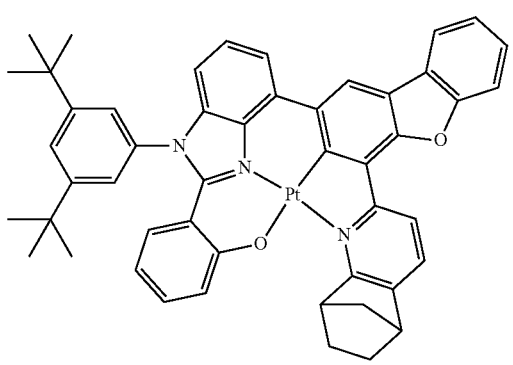
3-42
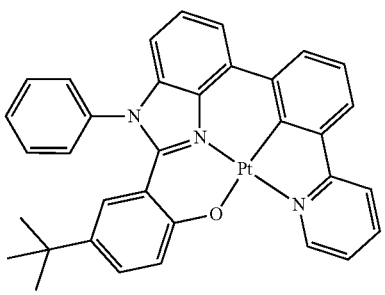
3-43
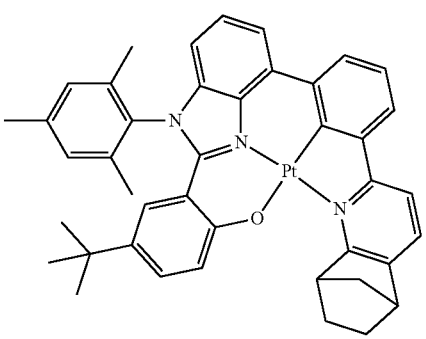

3-44
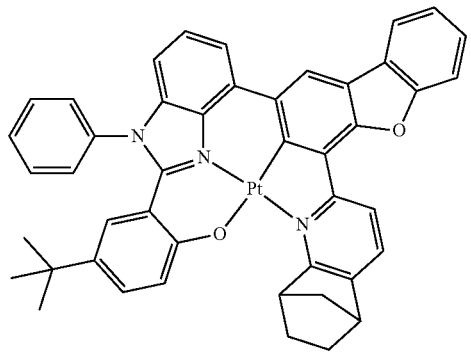
3-45
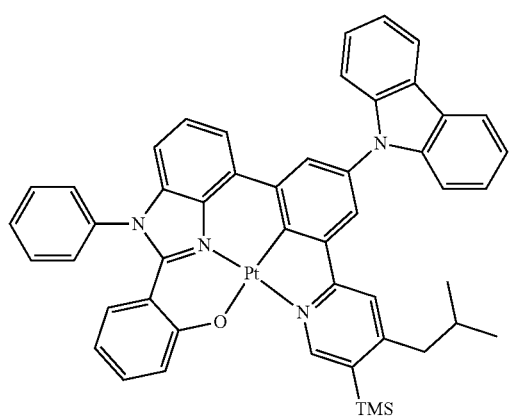
3-46
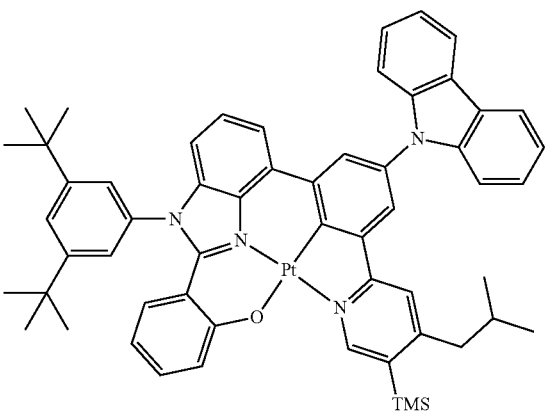
3-47
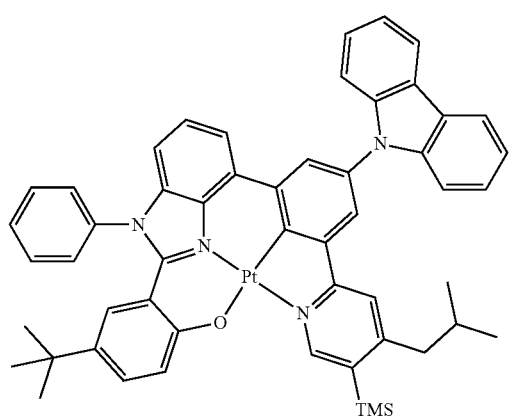
3-48
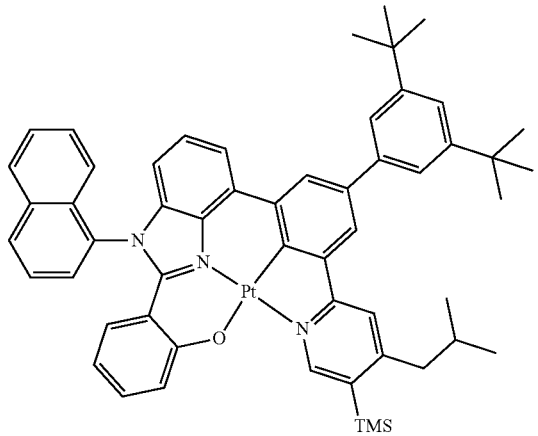
3-49
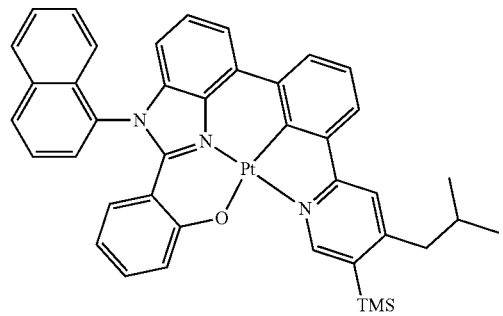
3-50
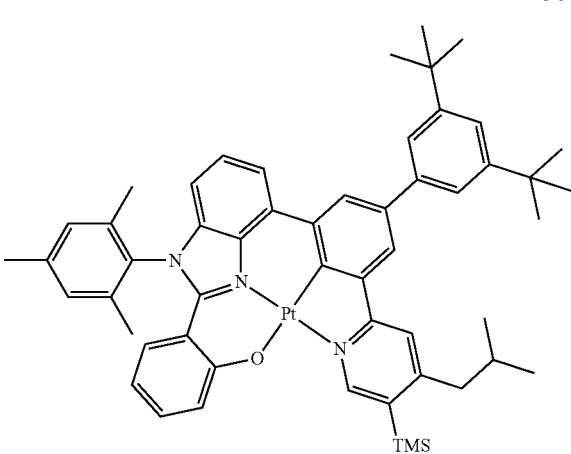
3-51
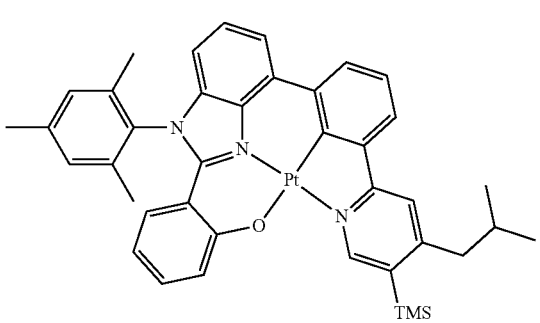

3-52
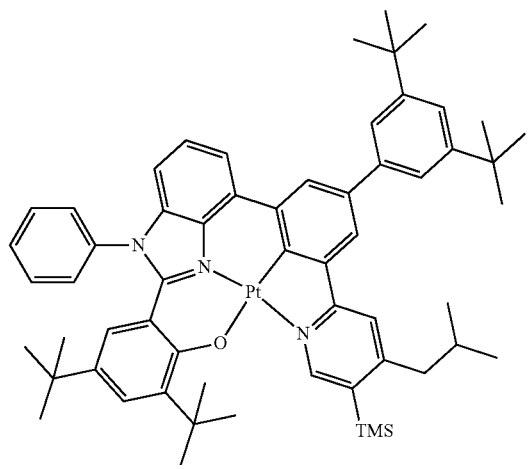
3-56
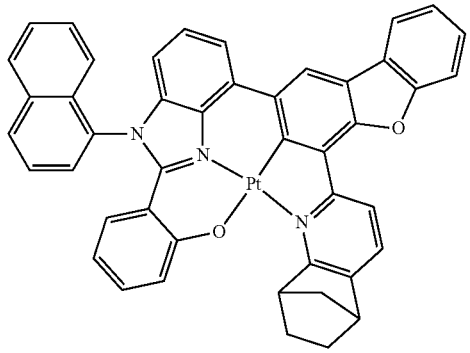
3-53
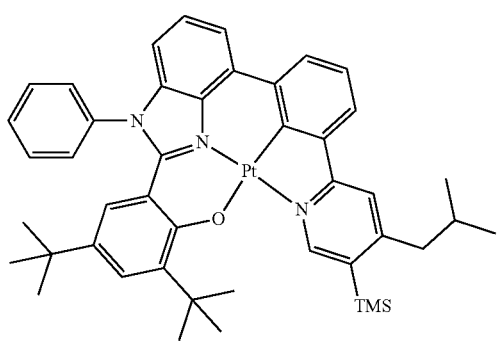
3-57
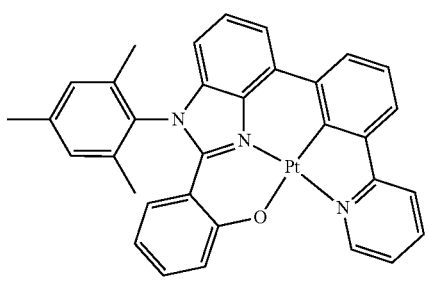
3-54
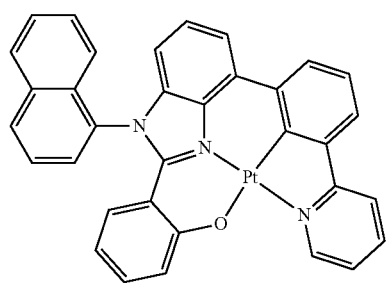
3-58
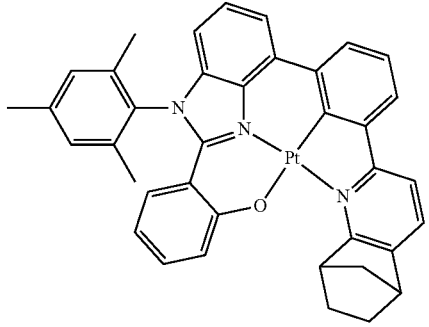
3-55
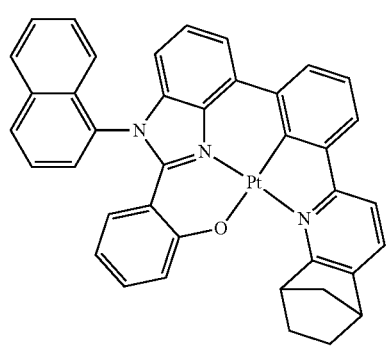
3-59
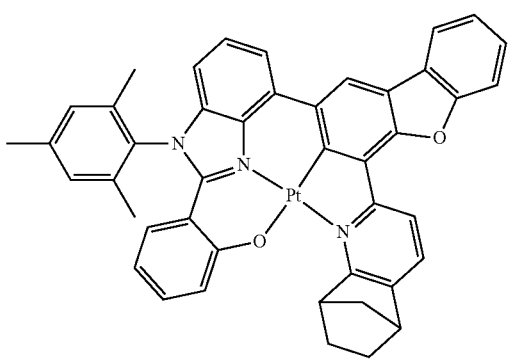

3-60
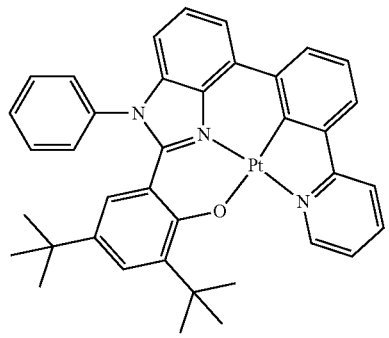
3-61
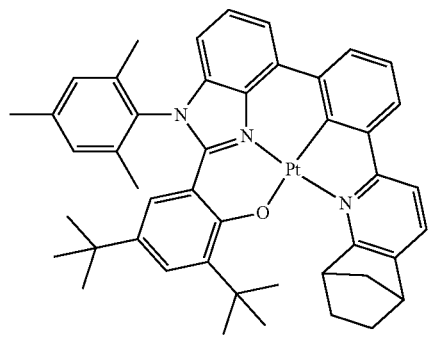
3-62
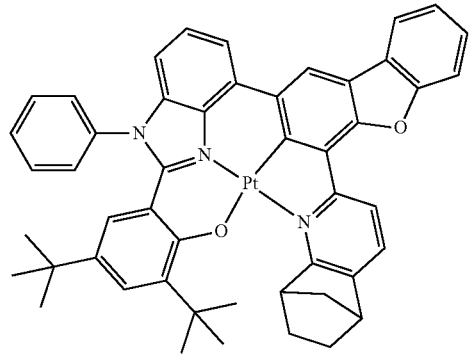
3-63
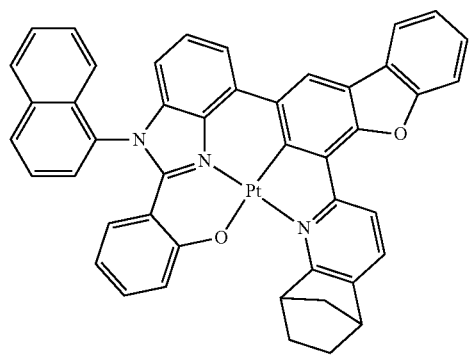
3-64
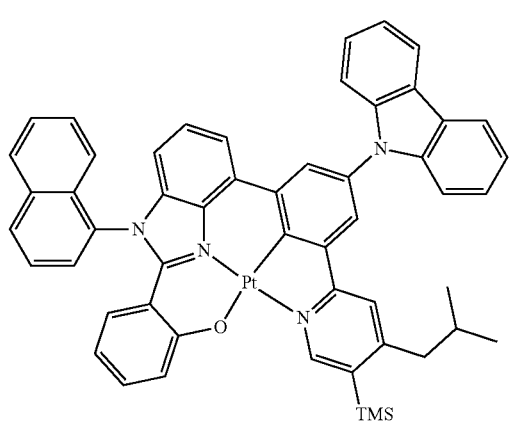
3-65
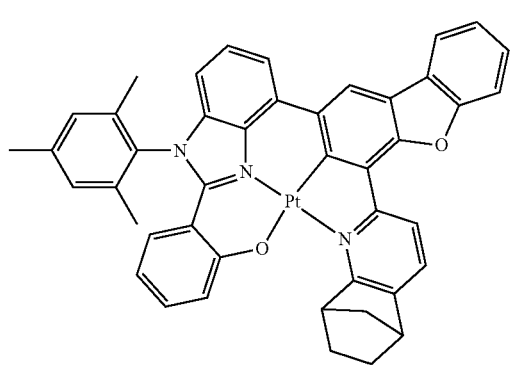
3-66
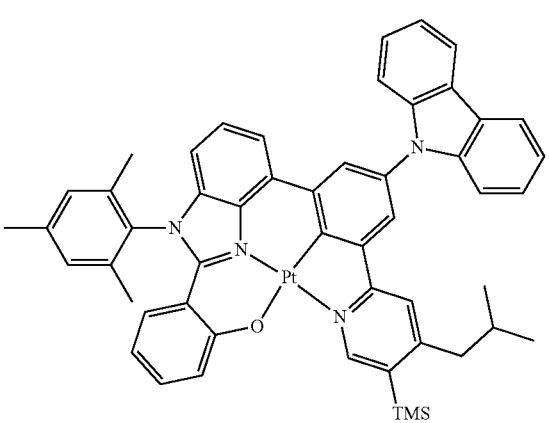
3-67
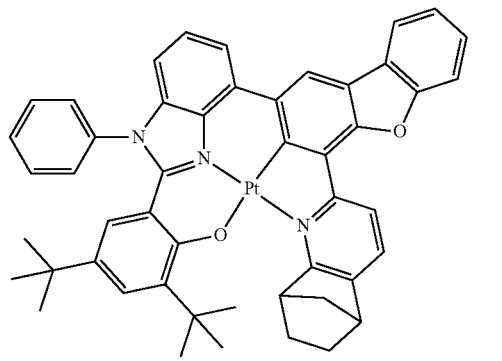

-continued
3-68
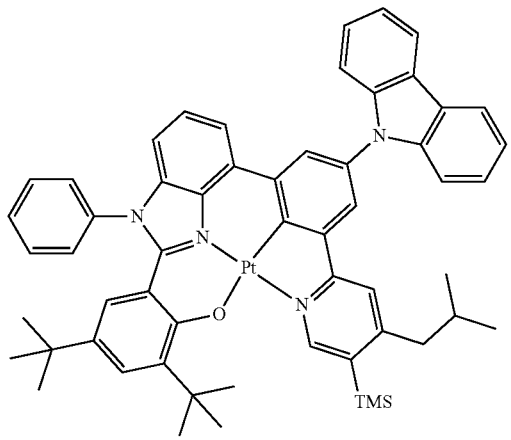
3-69
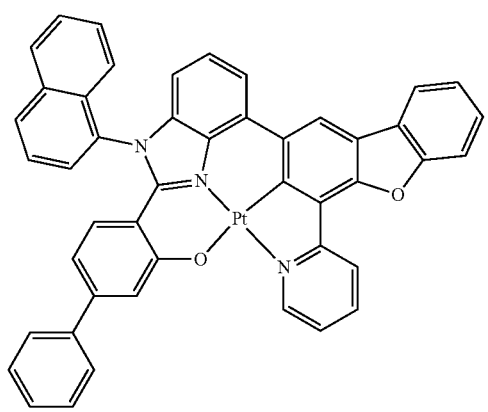
3-70
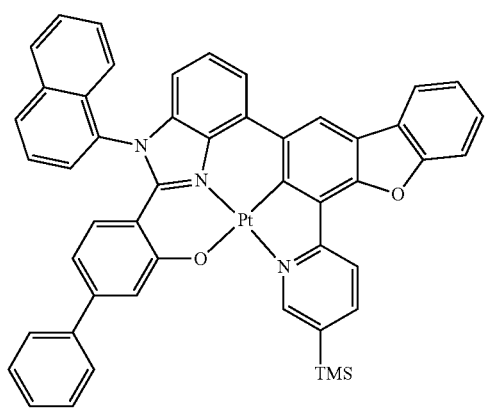
3-71
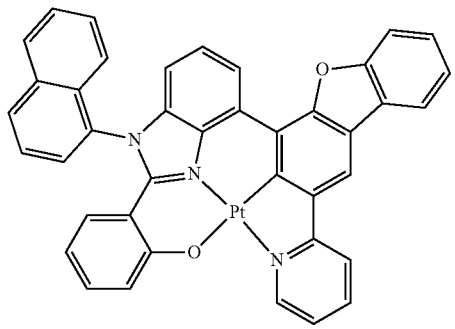
-continued
3-72
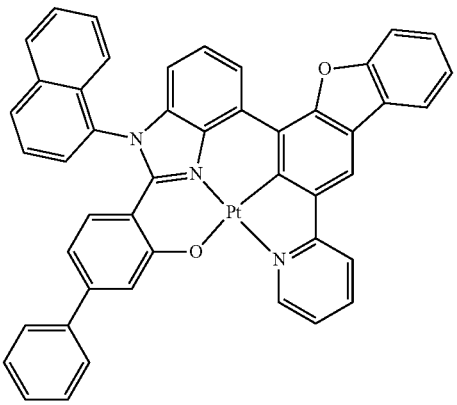
3-73
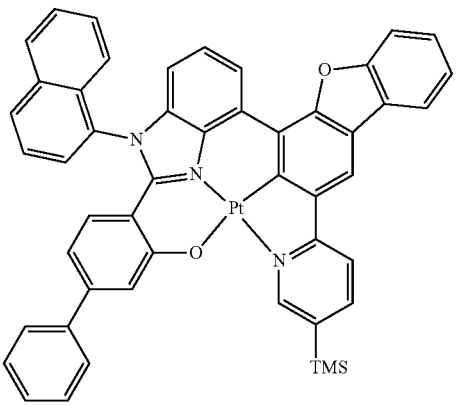
3-74
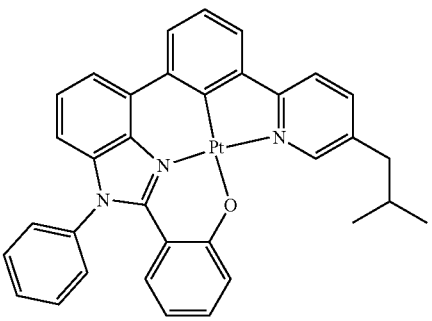
3-75
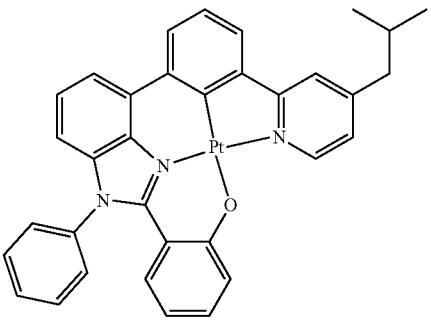

-continued
3-76
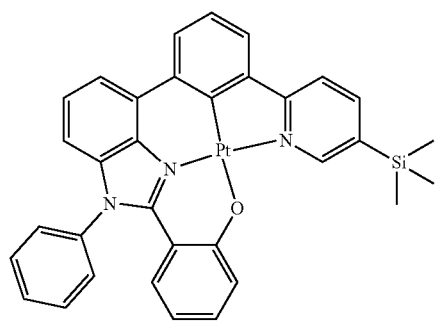
3-77
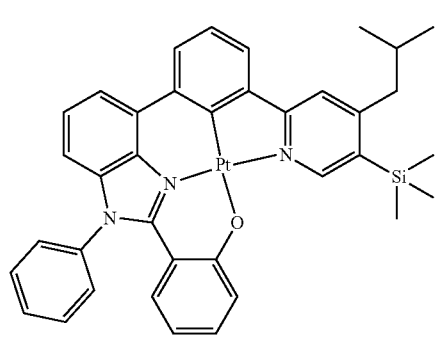
3-78
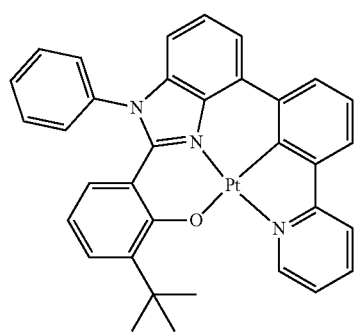
3-79
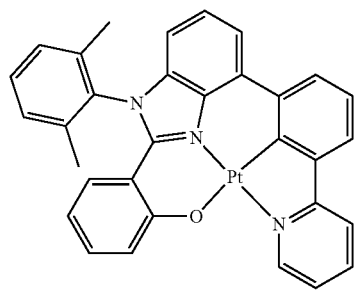
3-80
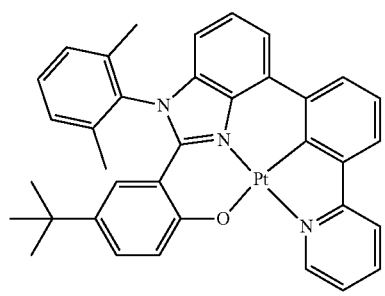
-continued
3-81
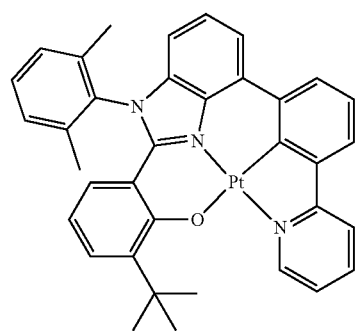
3-82
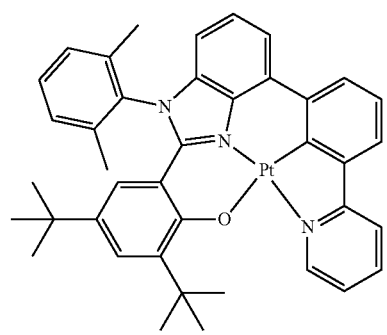
3-83
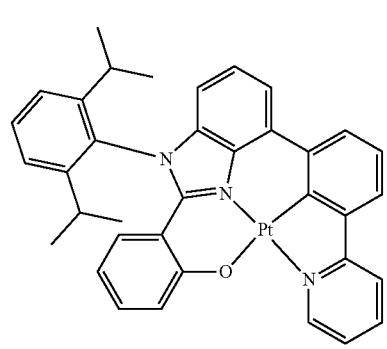
3-84
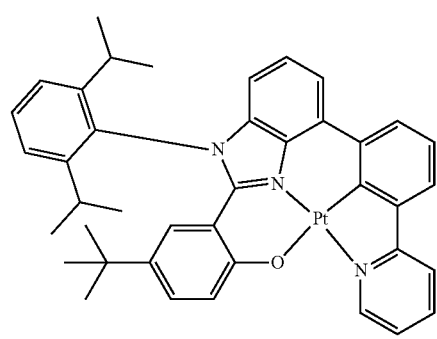

3-85
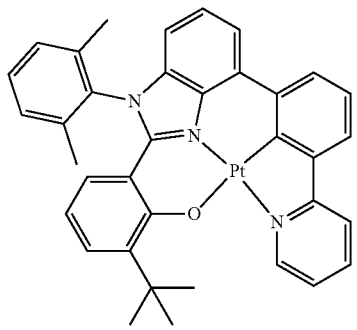
3-86
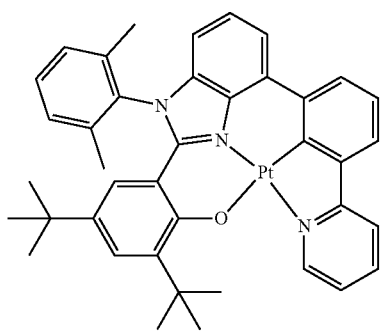
3-87
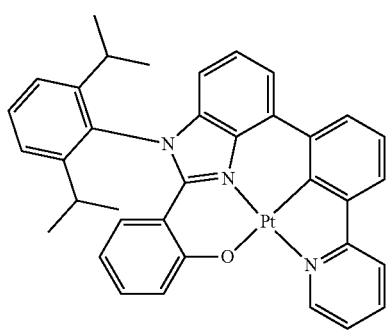
3-88
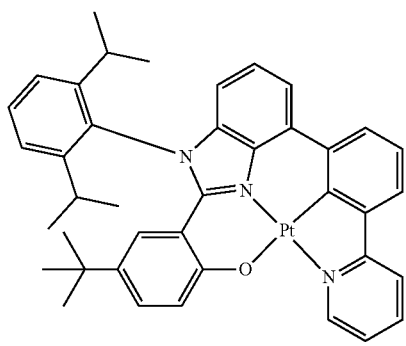
3-89
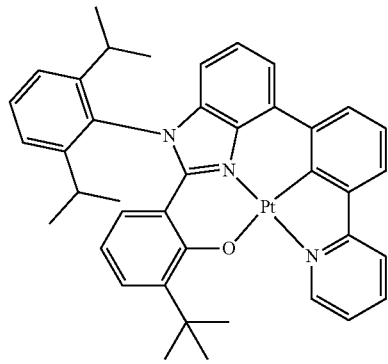
3-90
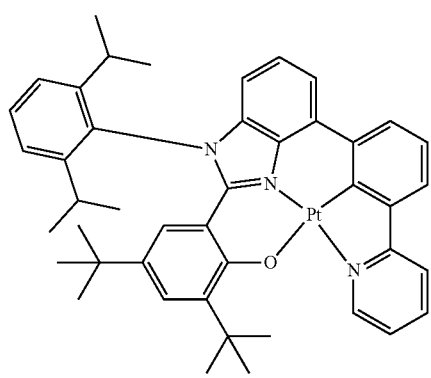
3-91
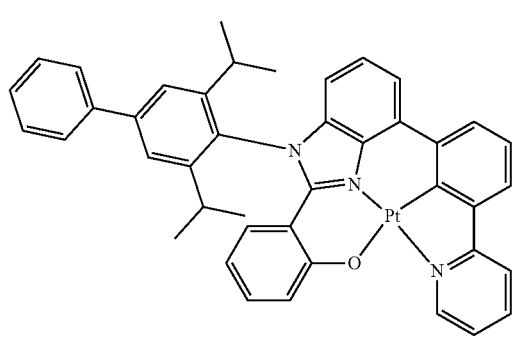
3-92
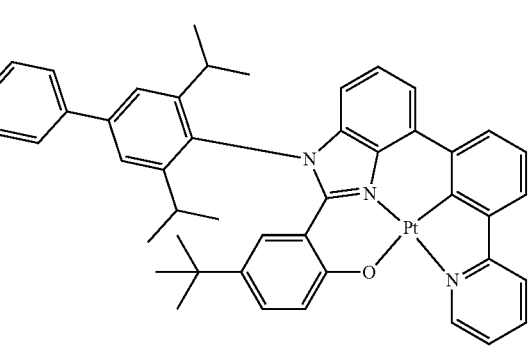

3-93
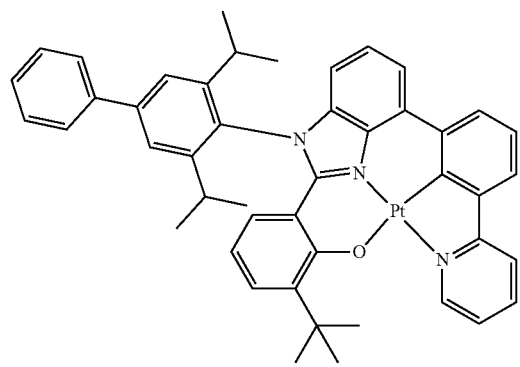
3-94
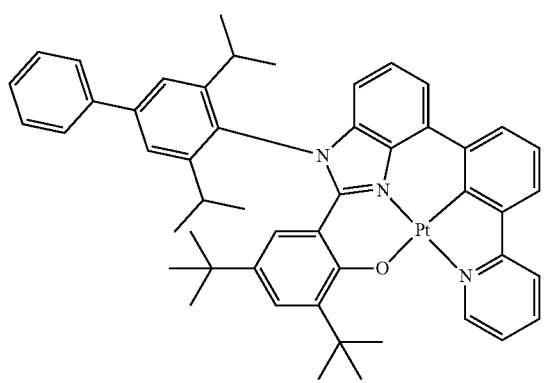
3-95
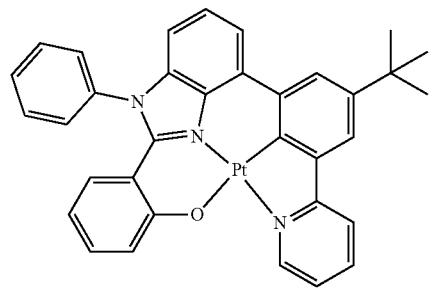
3-96
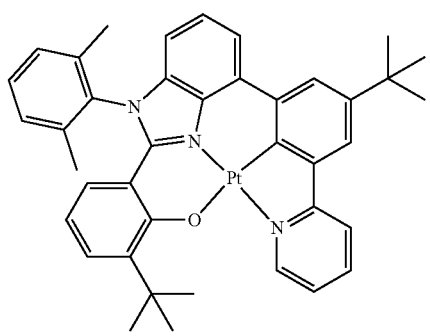
3-97
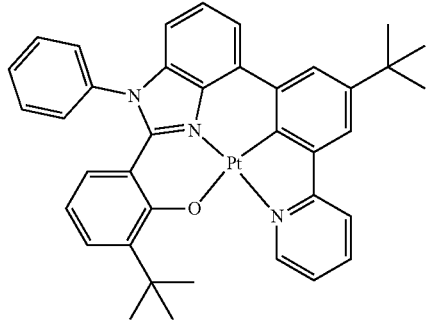
3-98
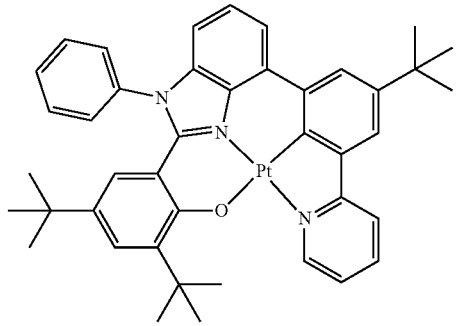
3-99
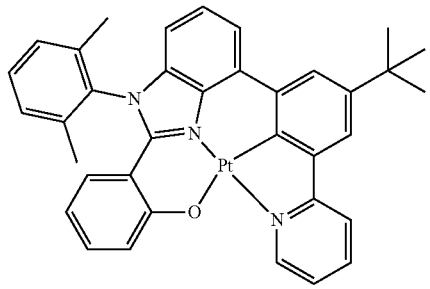
3-100
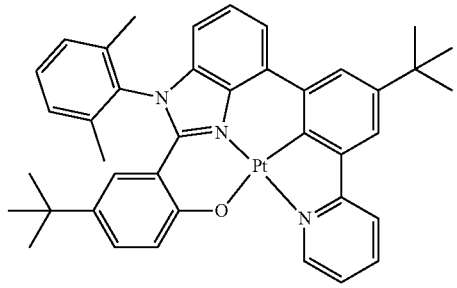
3-101

3-102
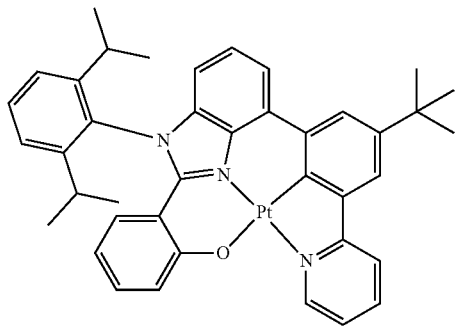
3-106
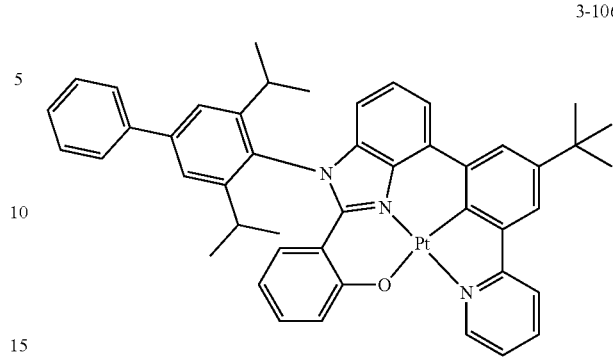
3-103
3-107
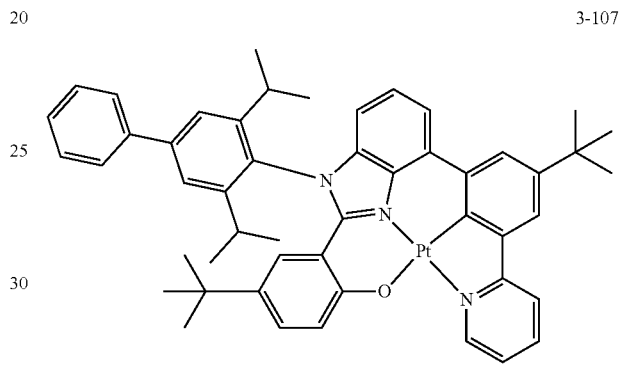
3-104
3-108
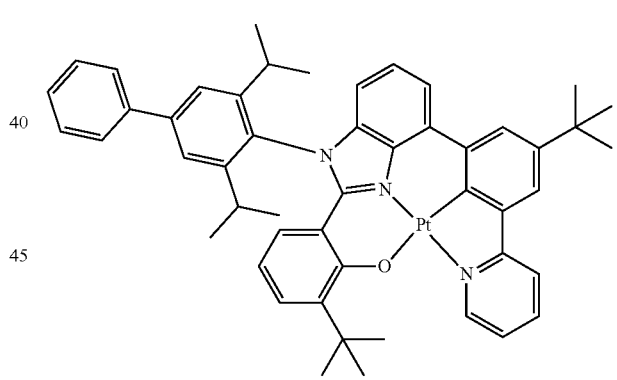
3-105
3-109
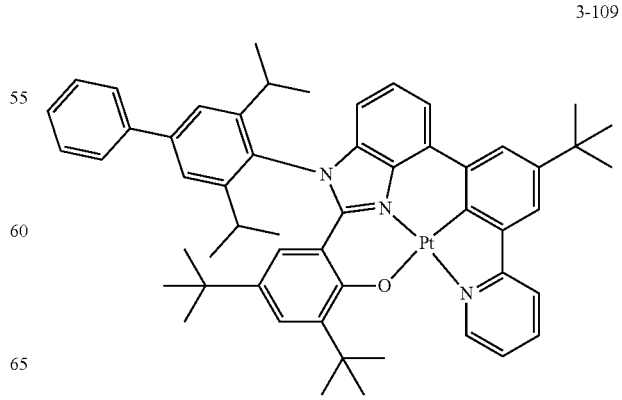

3-110
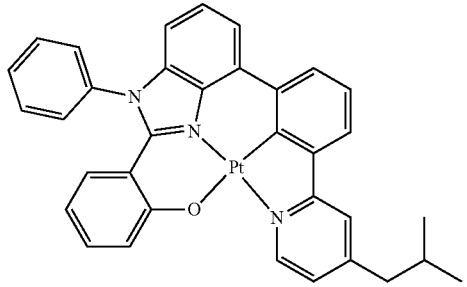
3-111
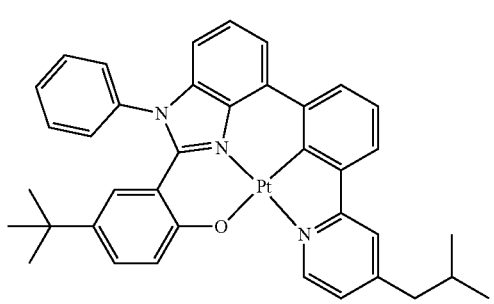
3-112
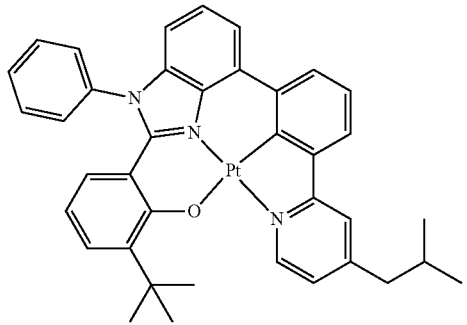
3-113
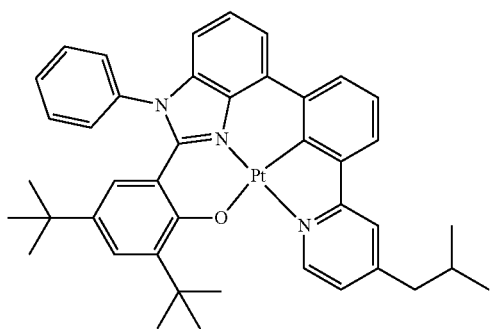
3-114
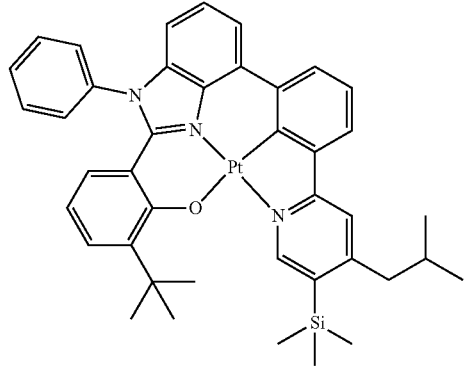
3-115
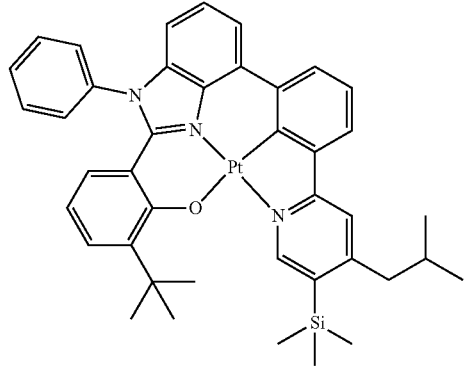
3-116
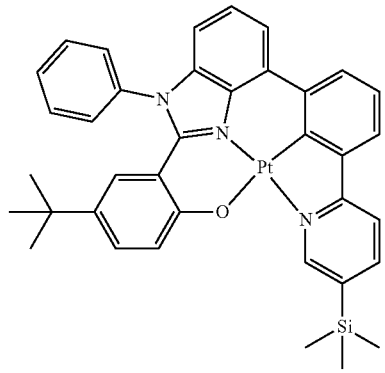
3-117
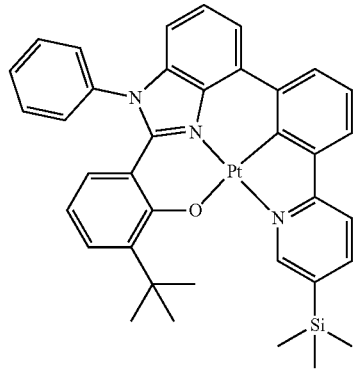

3-118
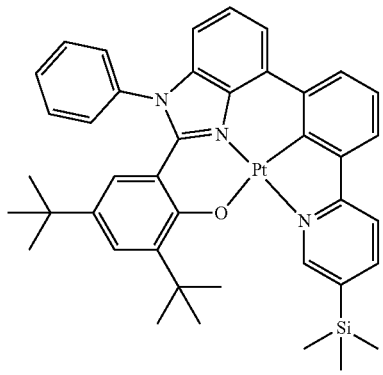
3-119
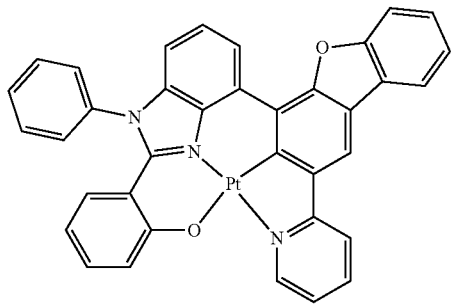
3-120
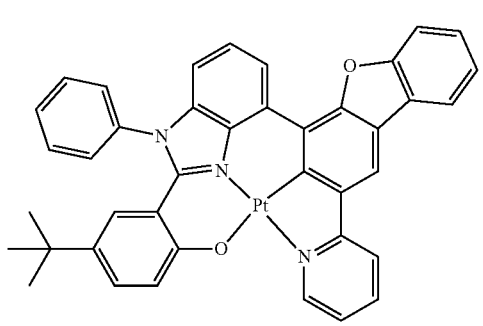
3-121
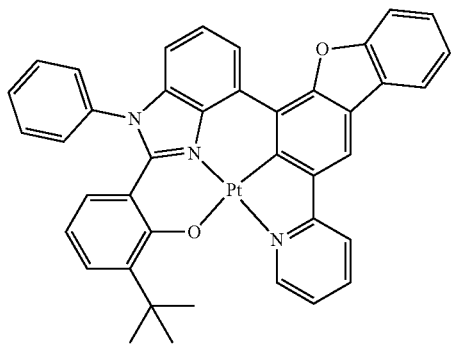
3-122
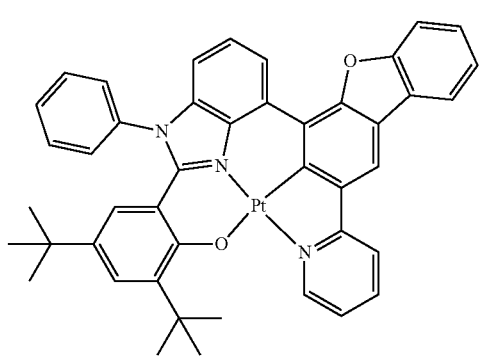
3-123
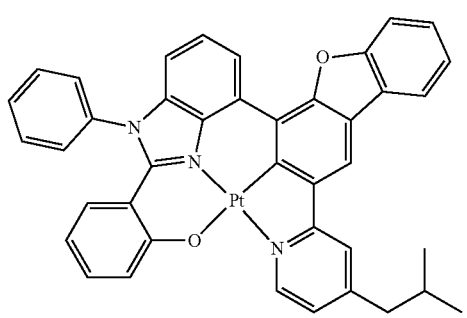
3-124
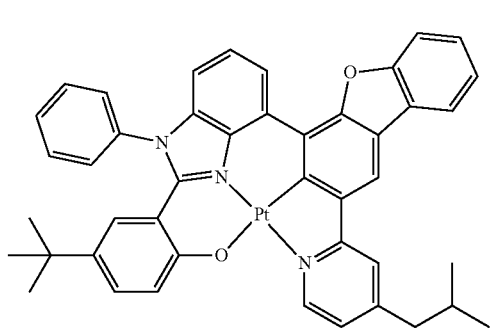
3-125
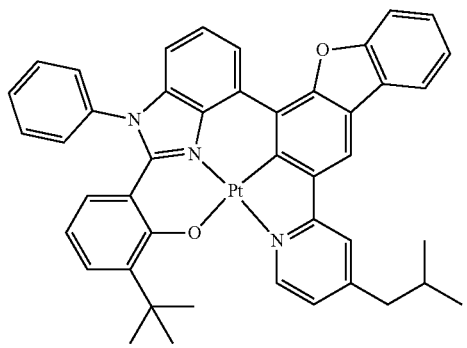

3-126
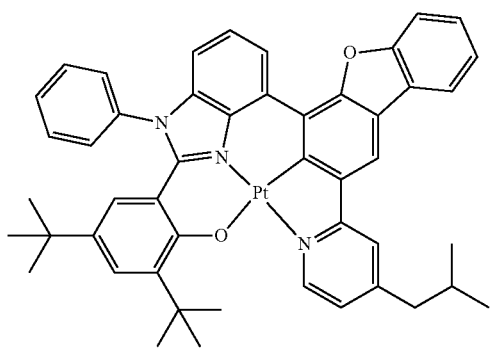
3-127
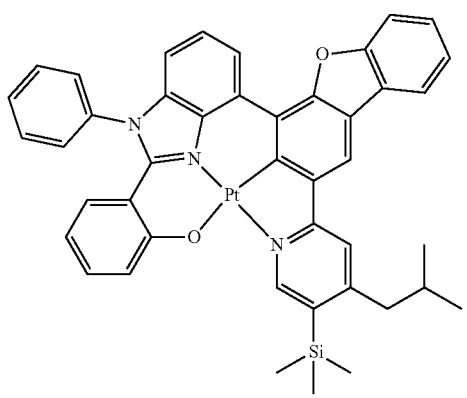
3-128
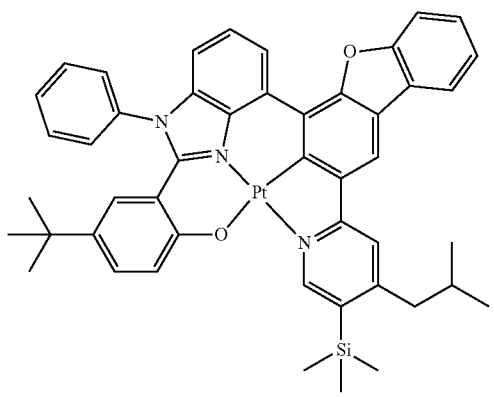
3-129
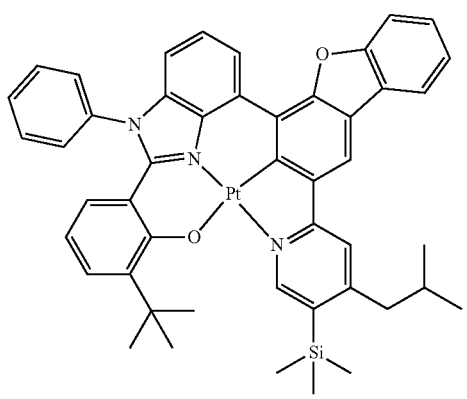
3-130
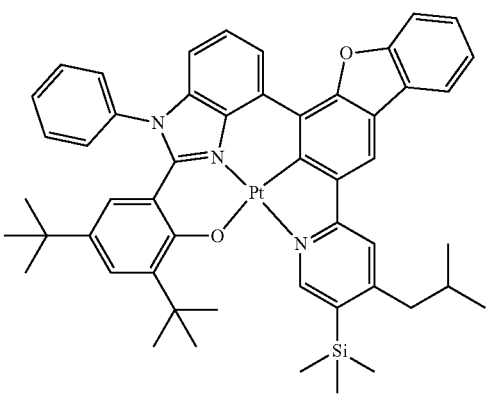
3-131
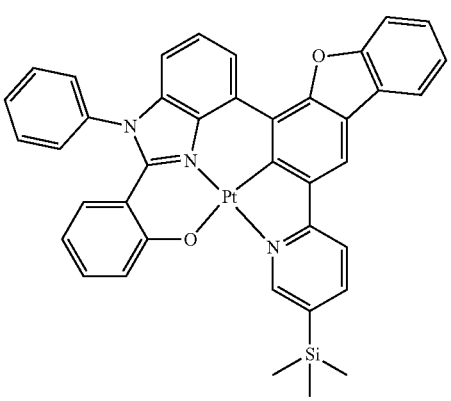
3-132
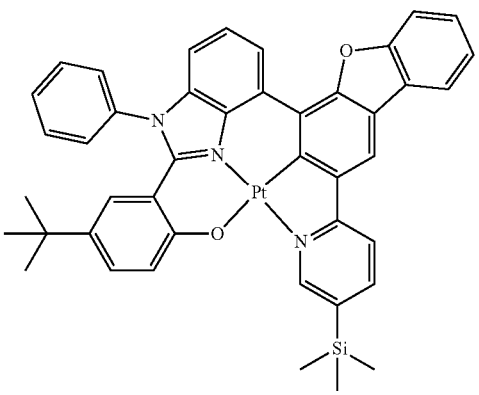
3-133
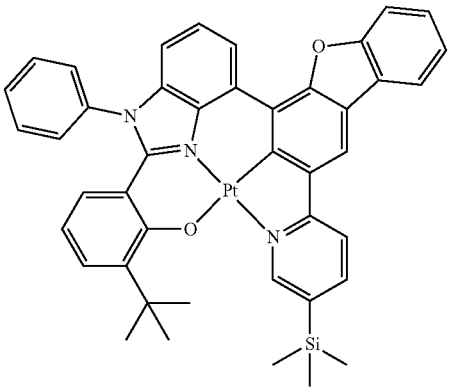

3-134
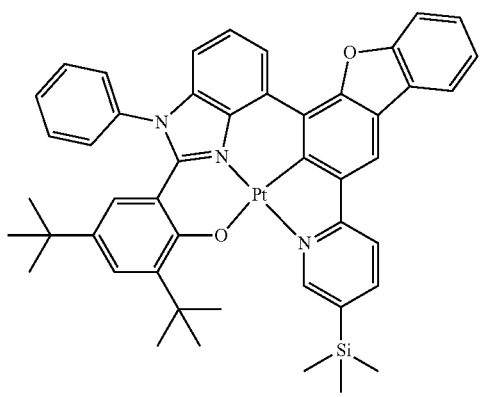
3-135
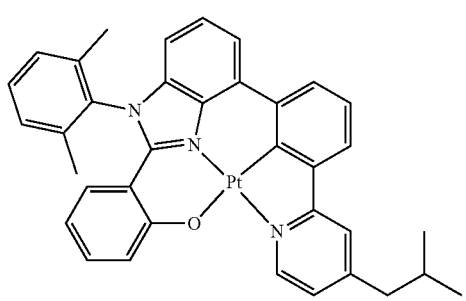
3-136
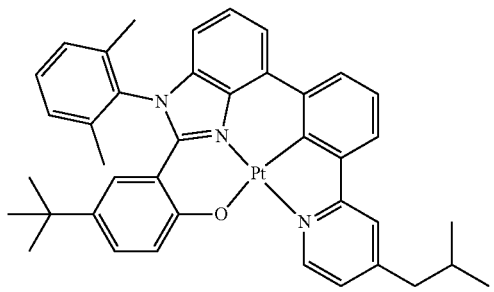
3-137
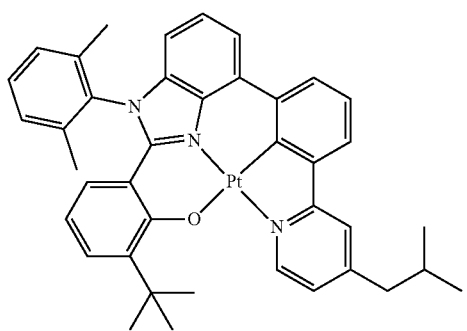
3-138
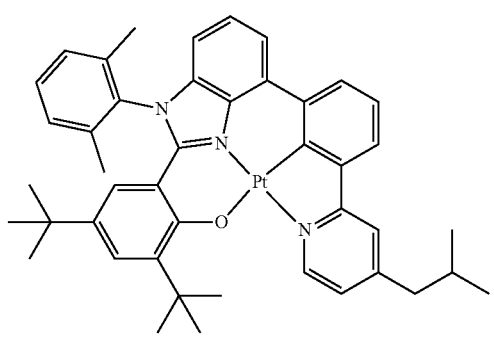
3-139
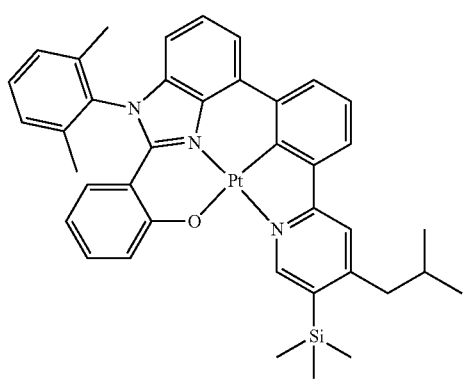
3-140
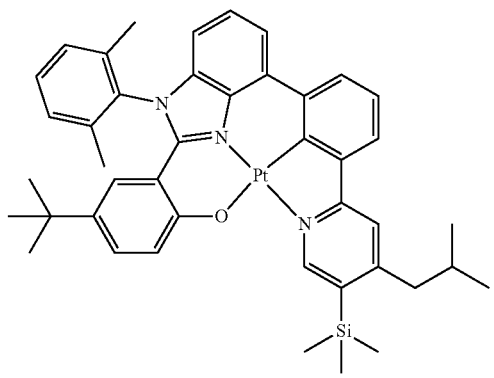
3-141
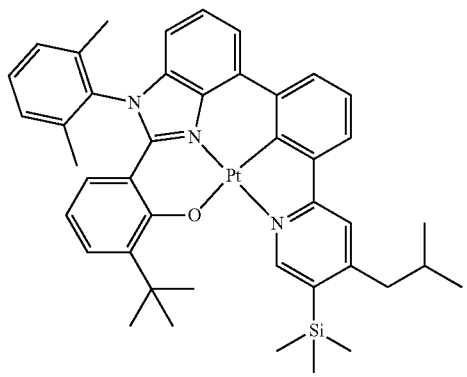

3-142
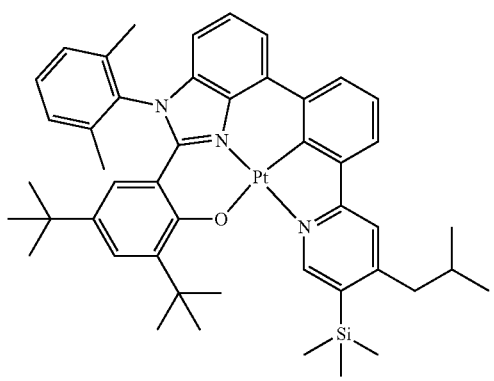
3-143
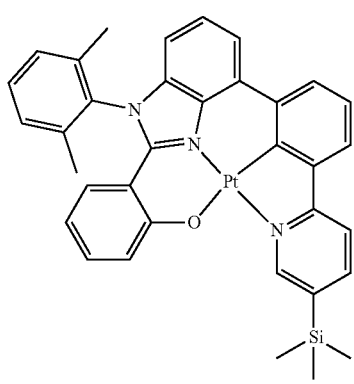
3-144
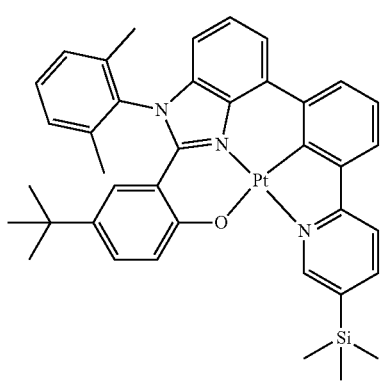
3-145
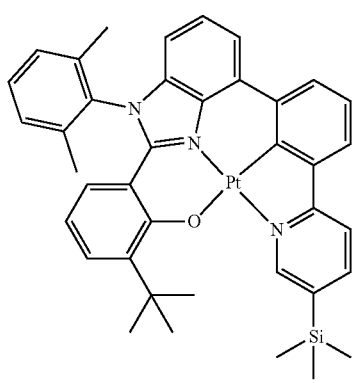
3-146
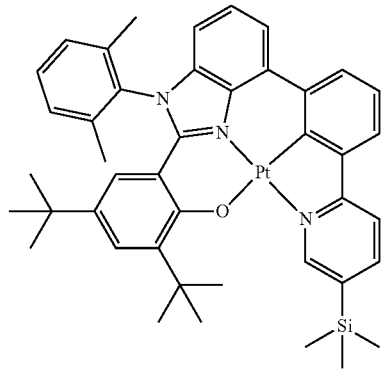
3-147
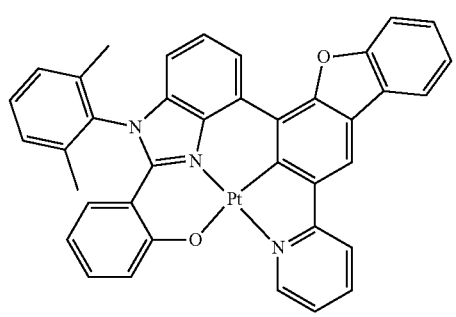
3-148
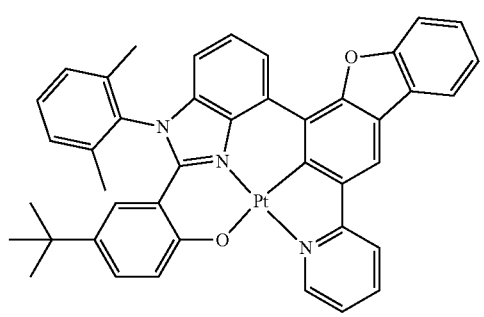
3-149
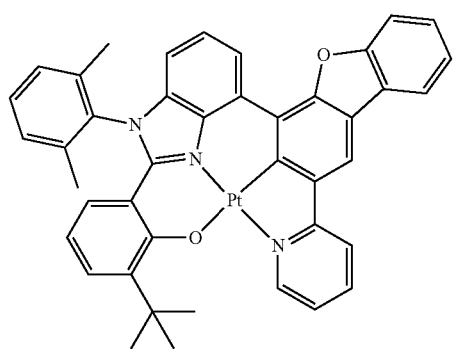

3-150
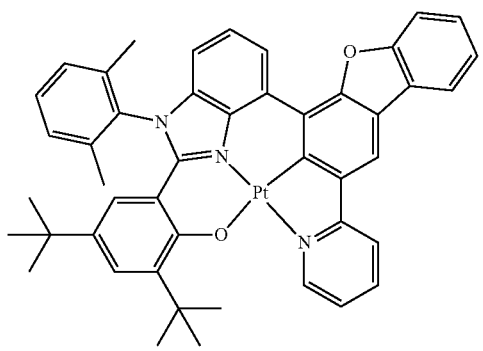
3-151
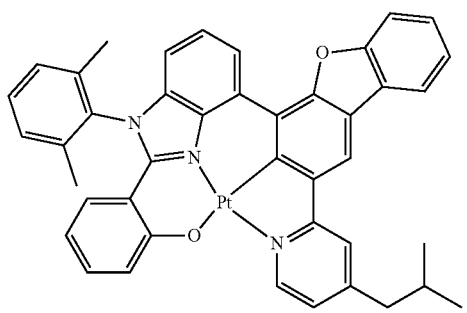
3-152
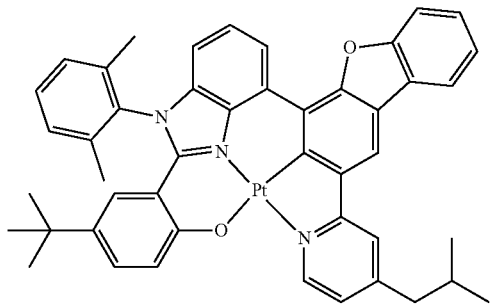
3-153
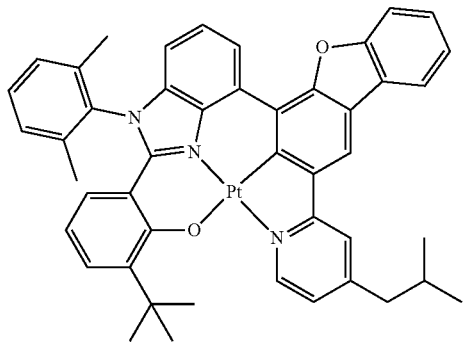
3-154
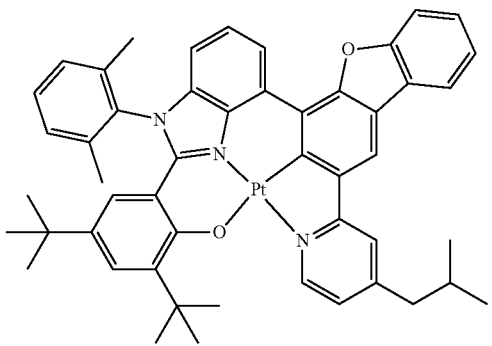
3-155
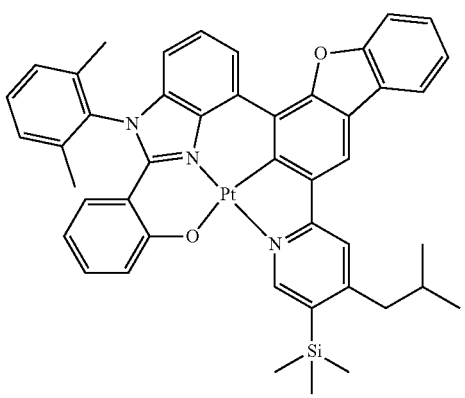
3-156
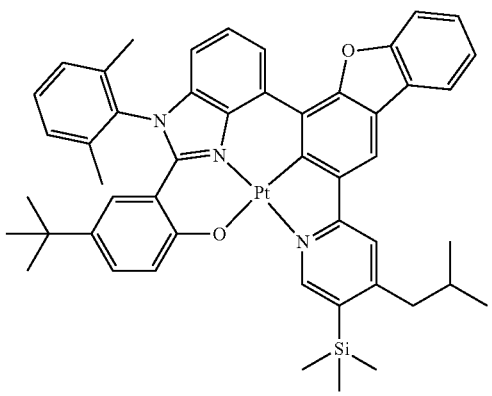
3-157
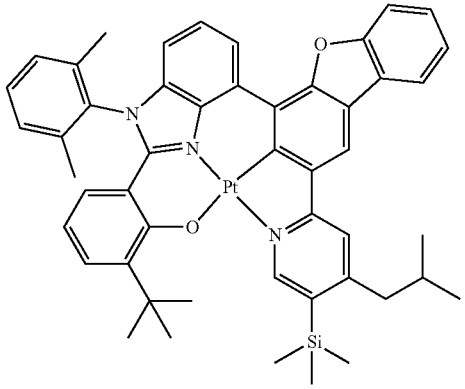

3-158
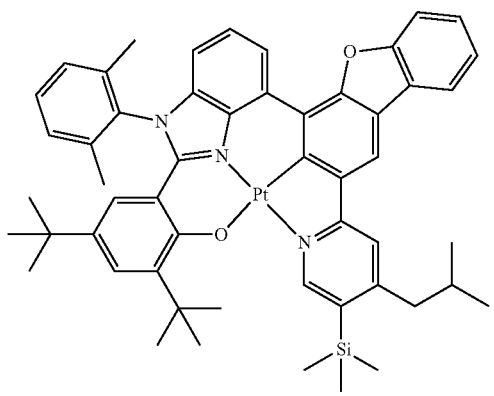
3-159
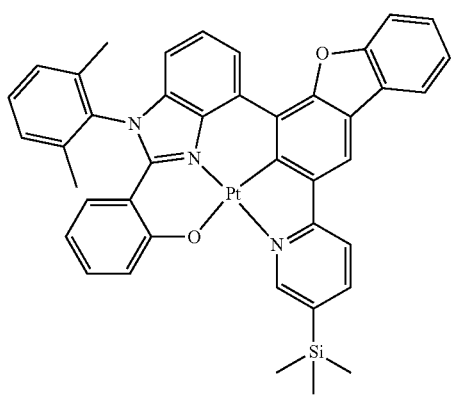
3-160
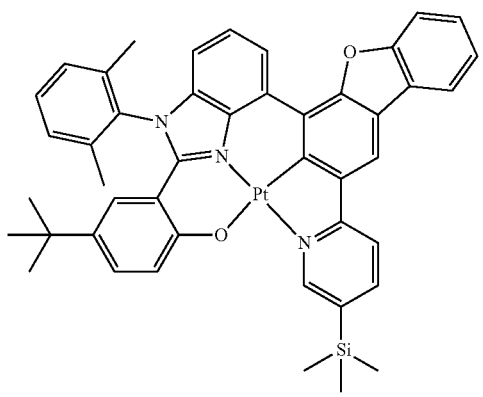
3-161
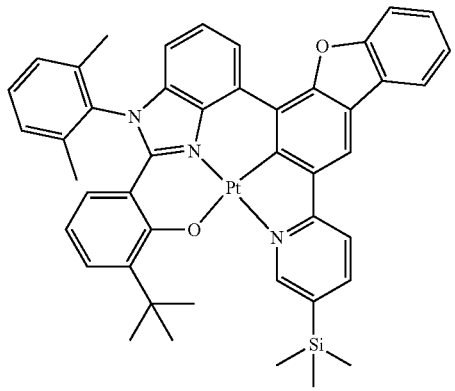
3-162
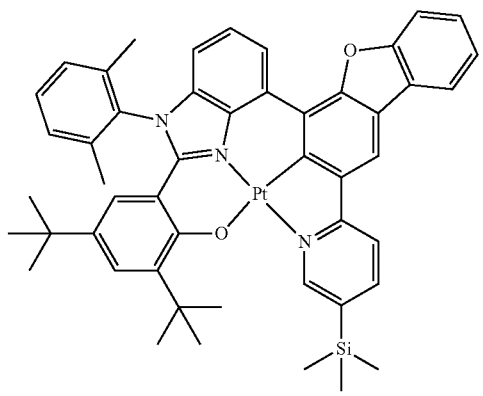
3-163
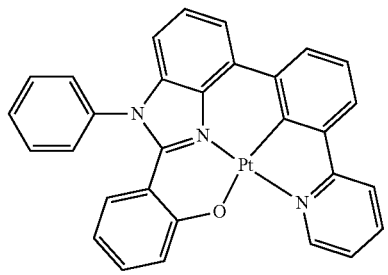
3-164
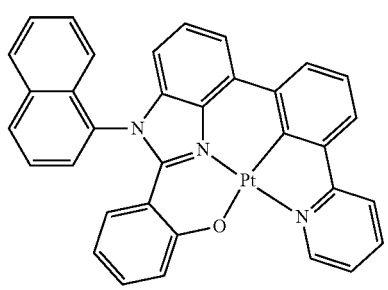
3-165
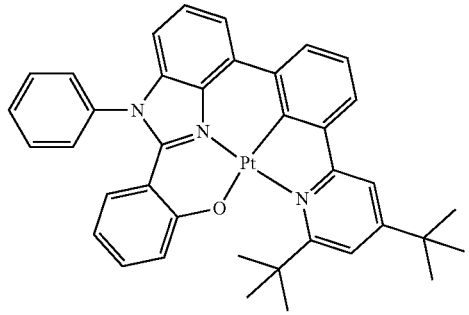

3-166
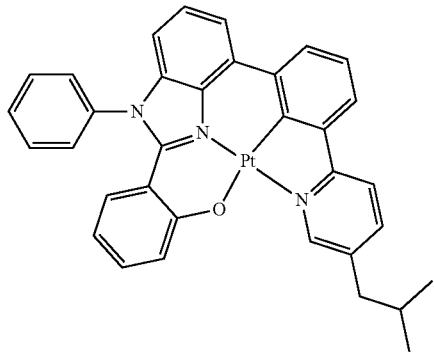
3-167
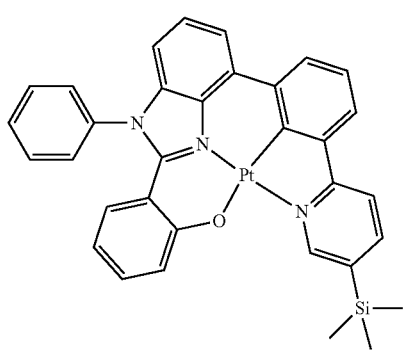
3-168
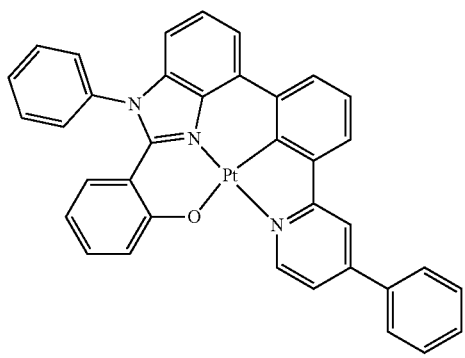
3-169
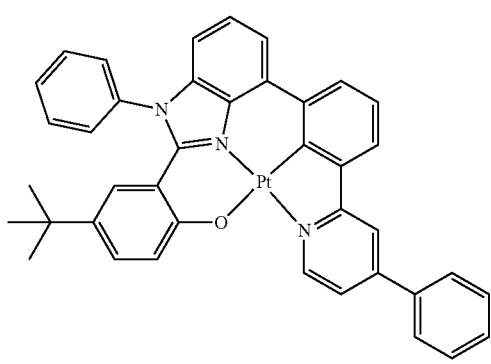
3-170
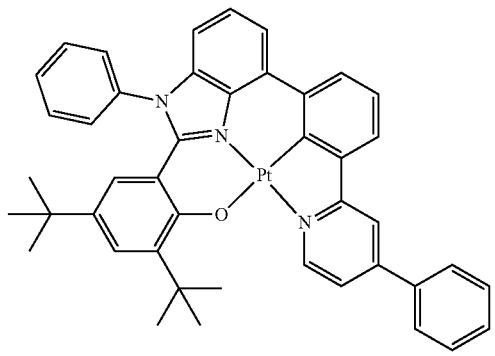
3-171
3-172
3-173
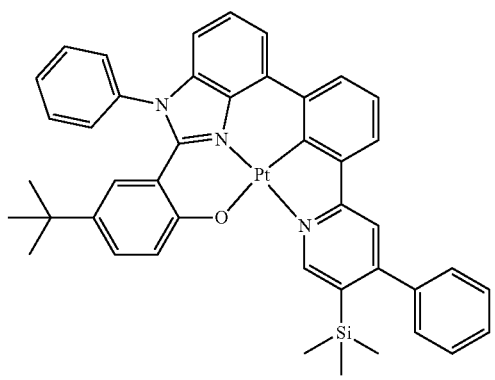

3-174
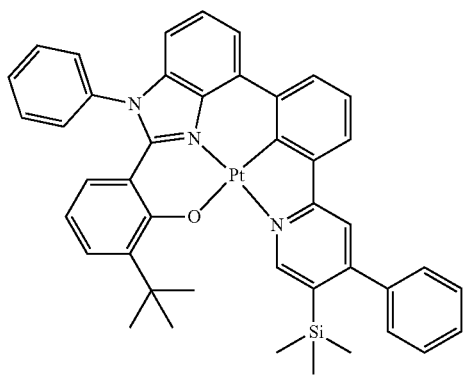
3-175
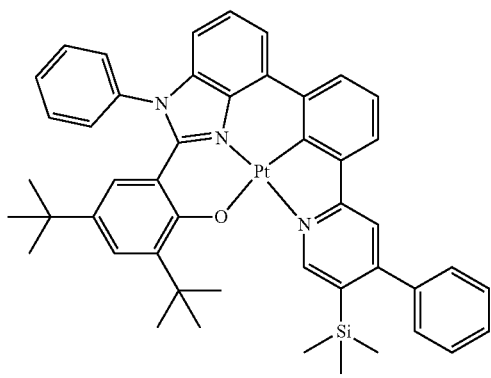
3-176
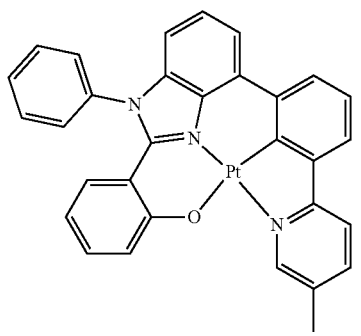
3-177
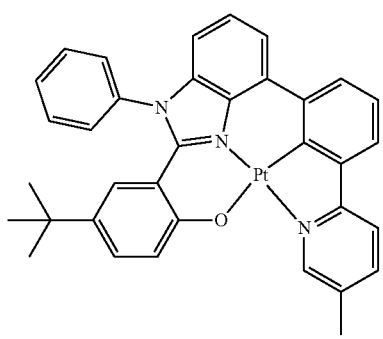
3-178
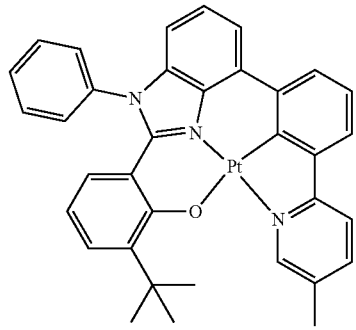
3-179
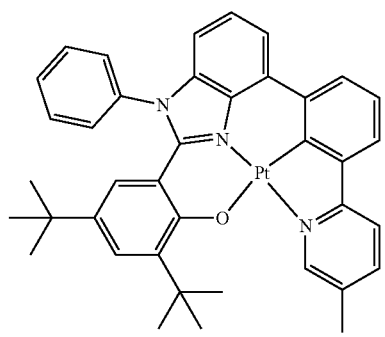
3-180
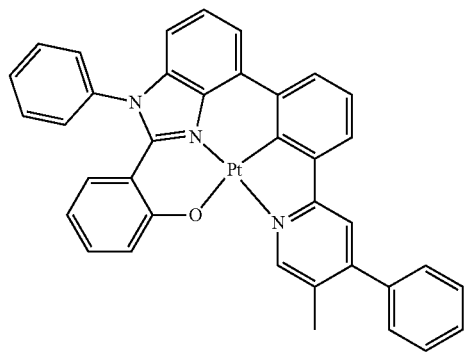
3-181
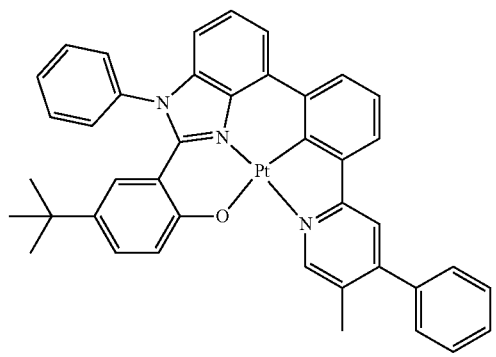

3-182
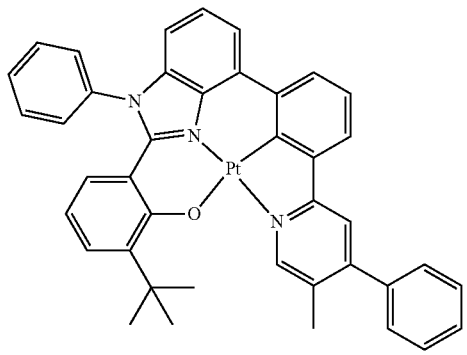
3-183
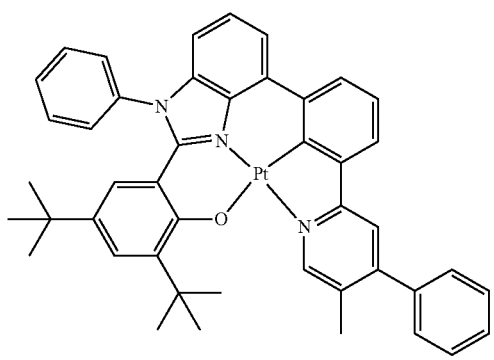
3-184
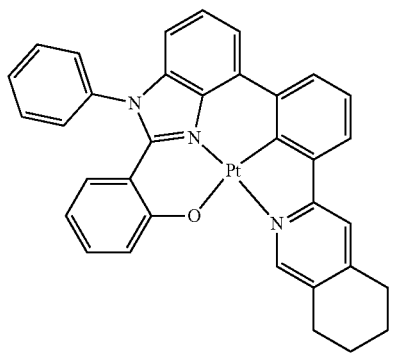
3-185
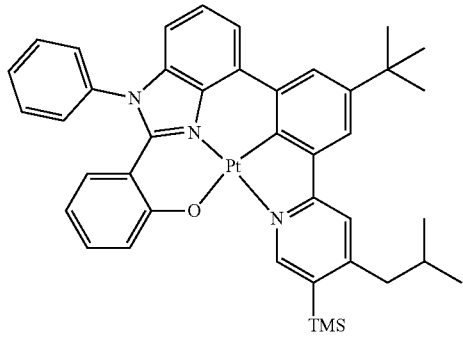
3-186
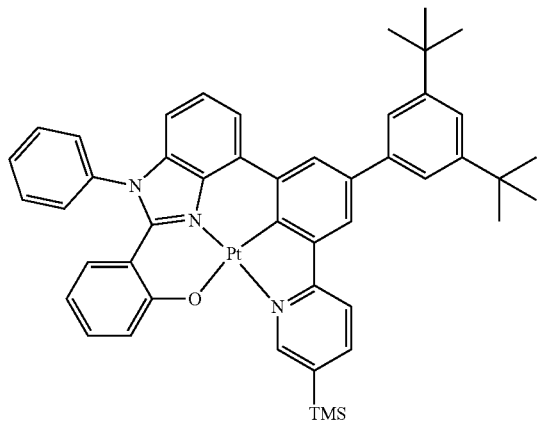
3-187
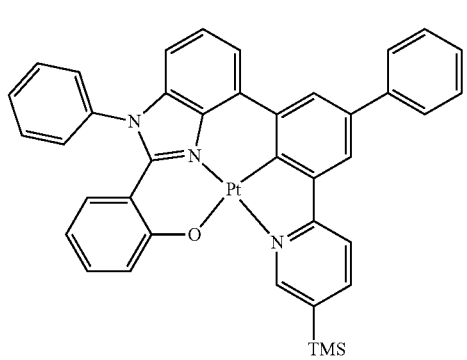
3-188
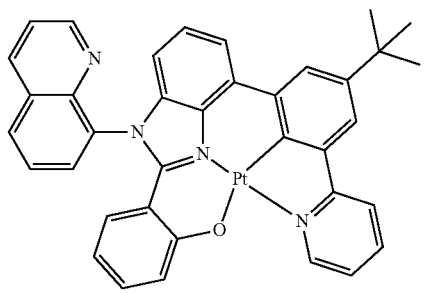
3-189
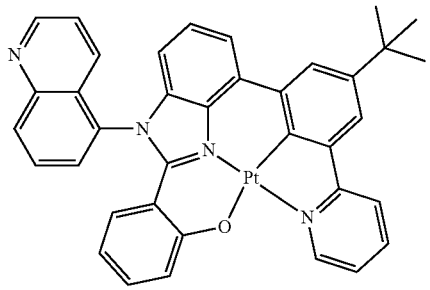

3-190
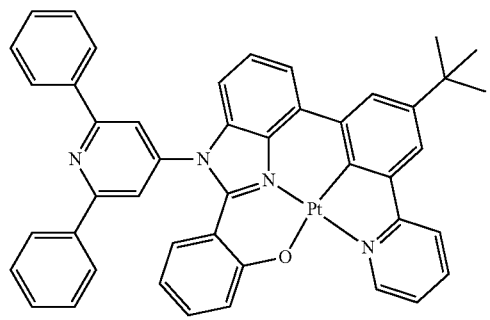
3-191
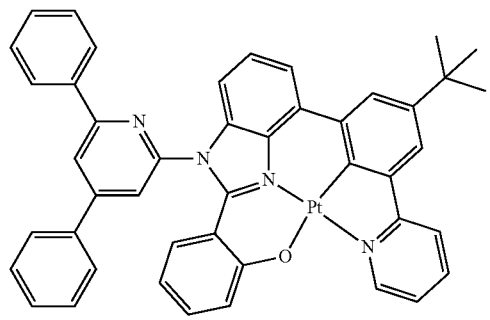
3-192
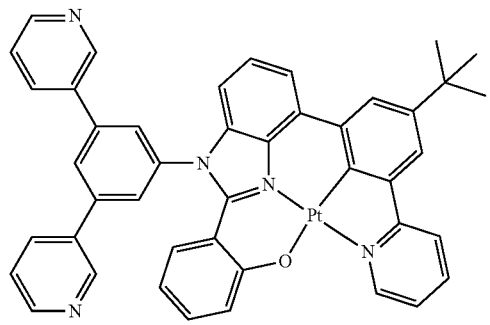
3-193
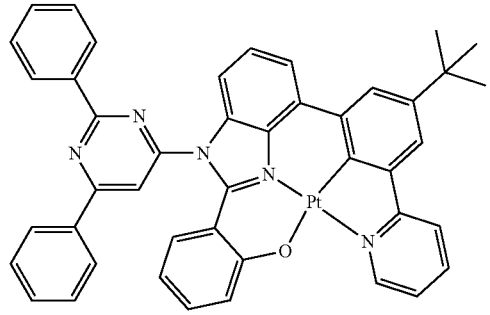
3-194
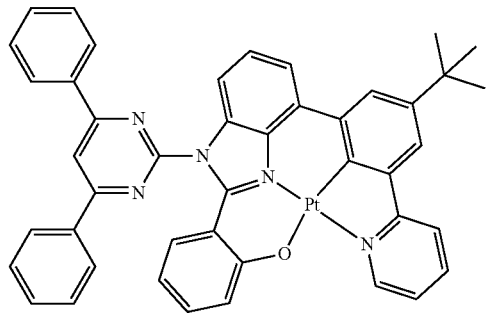
3-195
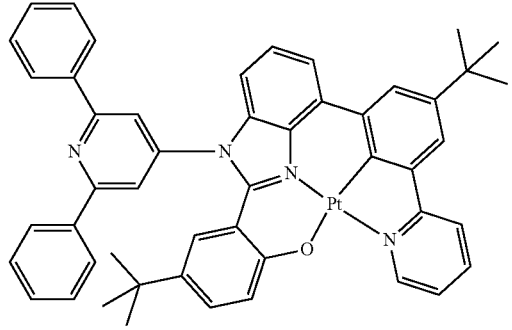
3-196
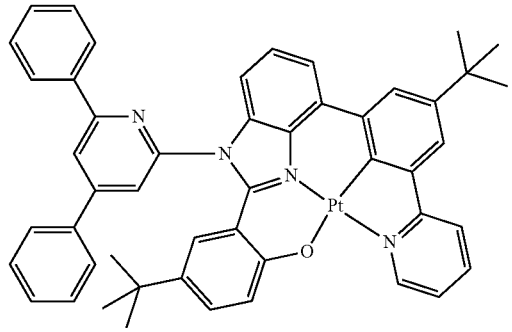
3-197
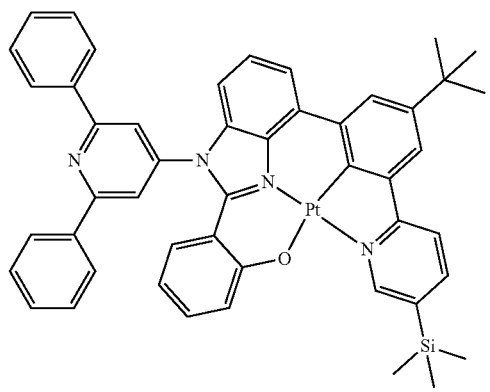

3-198
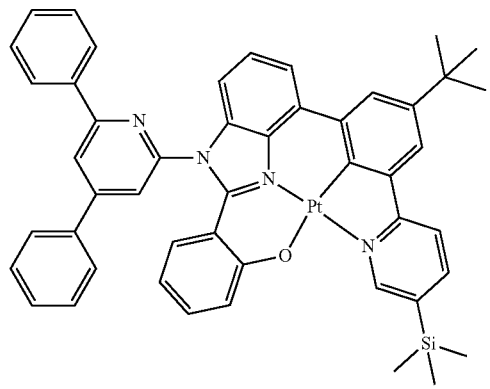
3-199
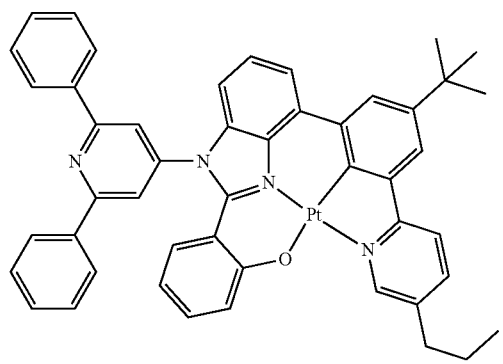
3-200
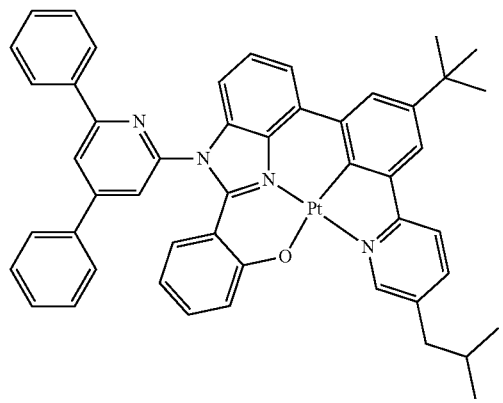
3-201
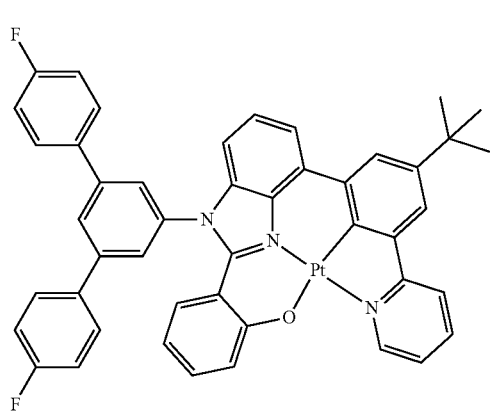
3-202
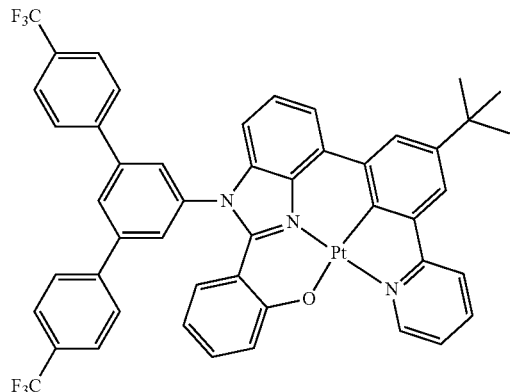
3-203
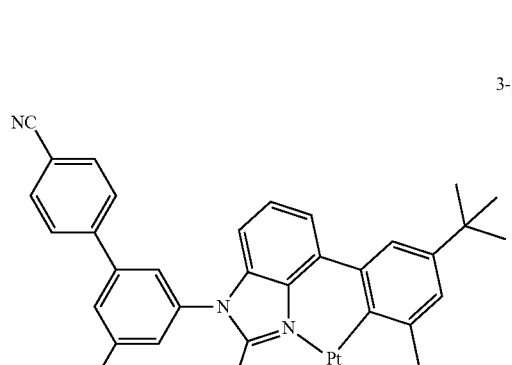
3-204
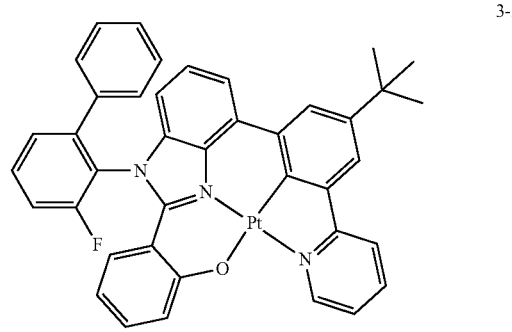
3-205
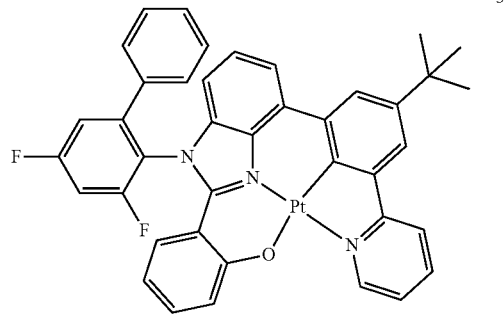

-continued
3-206
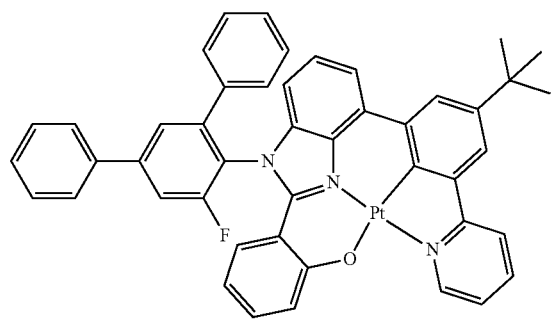
3-207
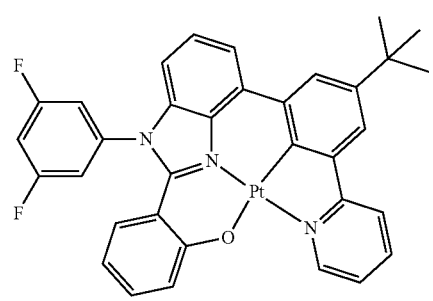
3-208
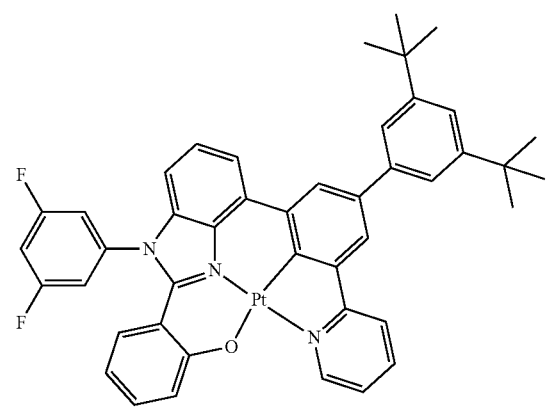
3-209
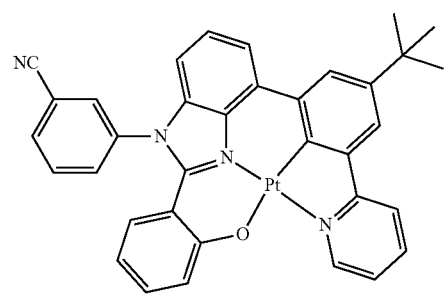
-continued
3-210
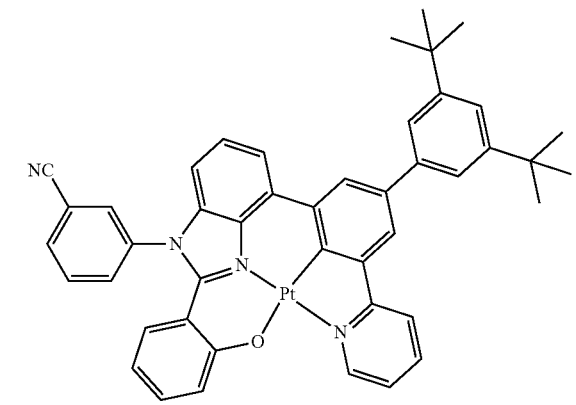
3-211
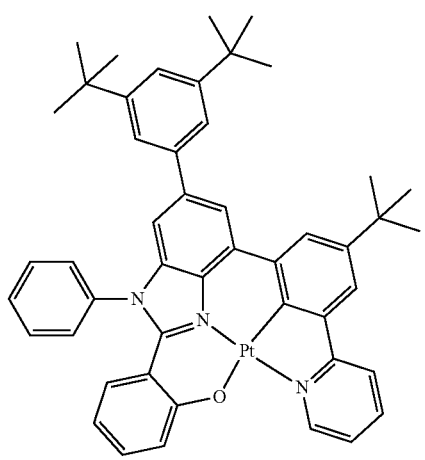
3-212
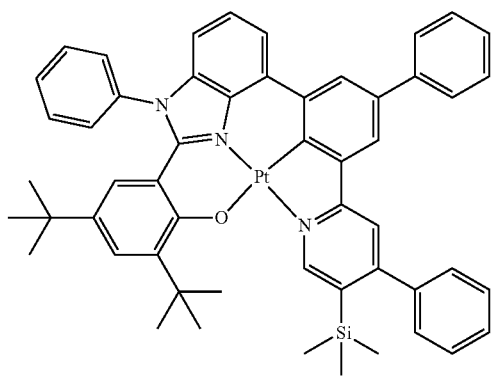
3-213
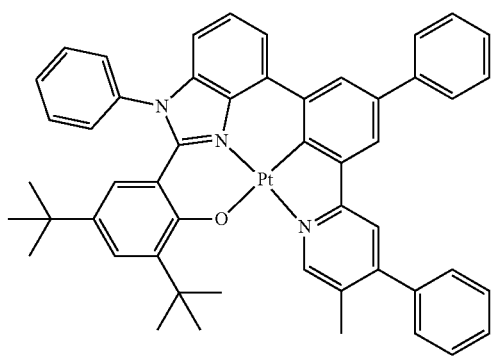

3-214
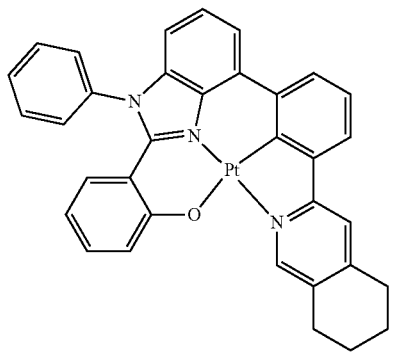
3-215
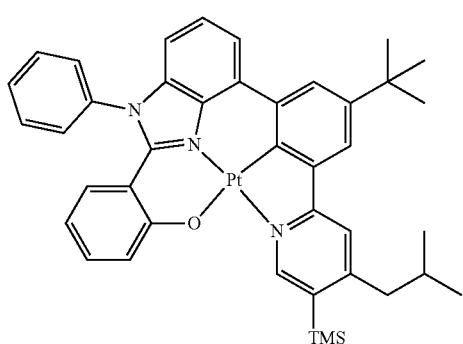
3-216
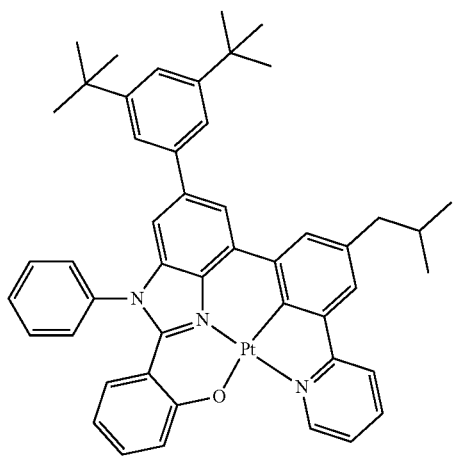
3-217
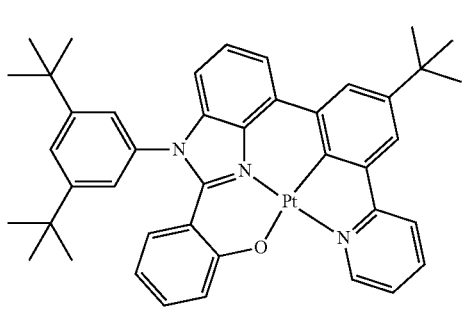
3-218
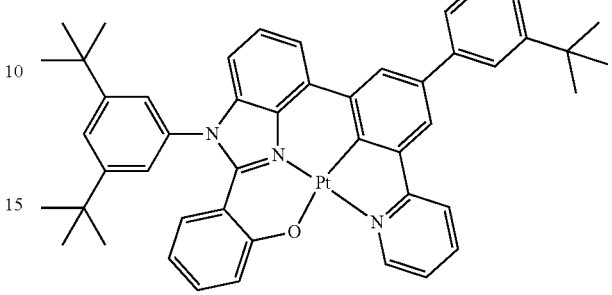
3-219
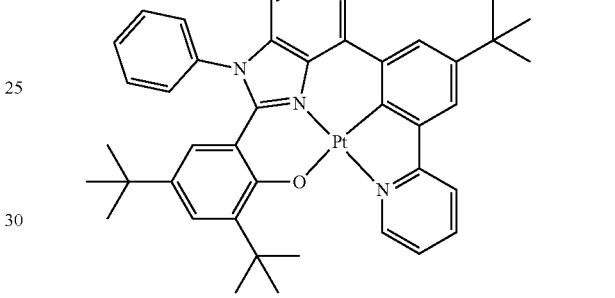
3-220
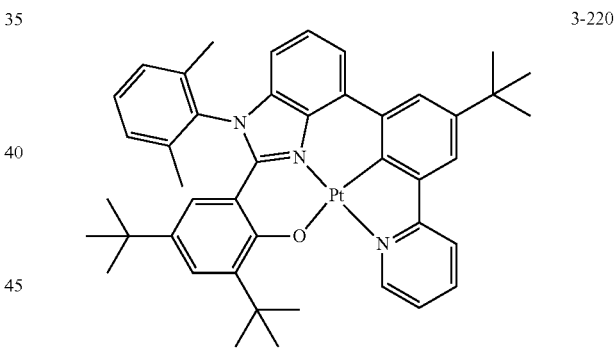
3-221
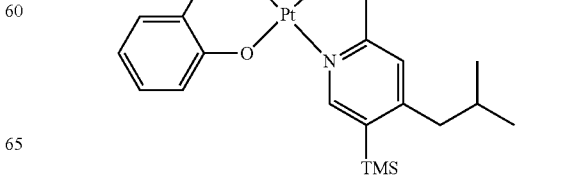

3-222
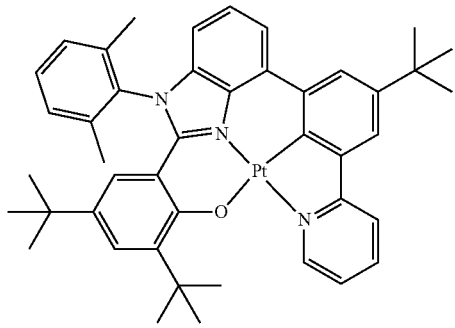
3-223
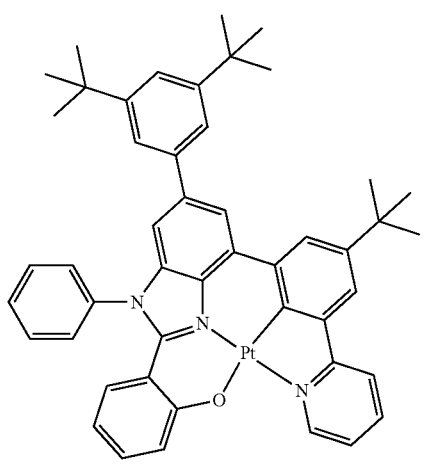
3-224
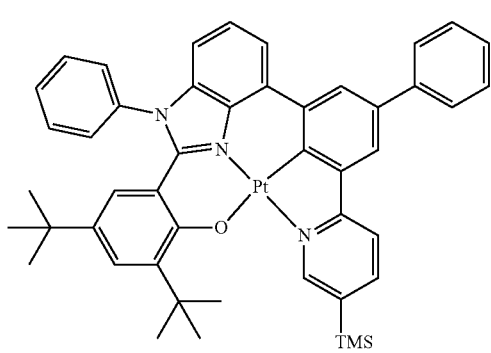
3-225
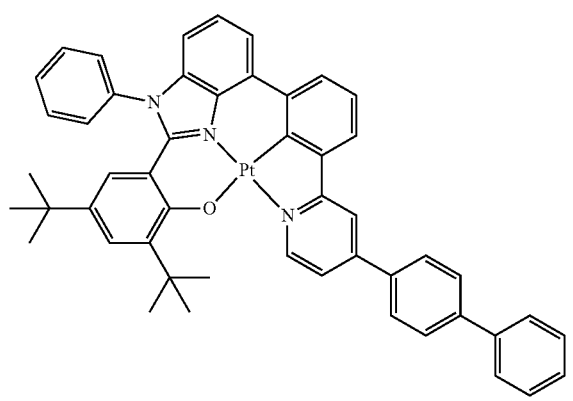
3-226
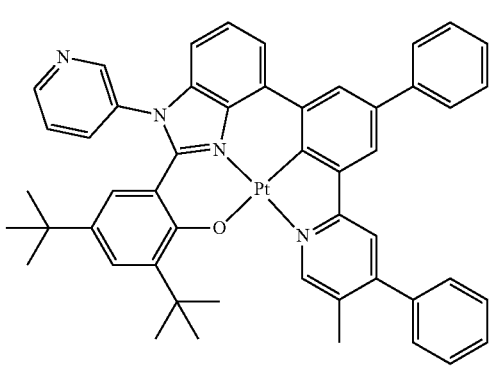
3-227
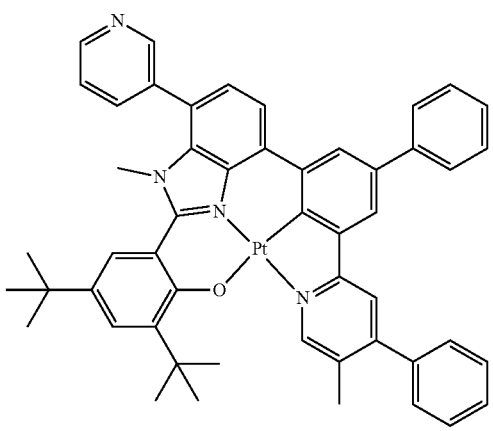
3-228
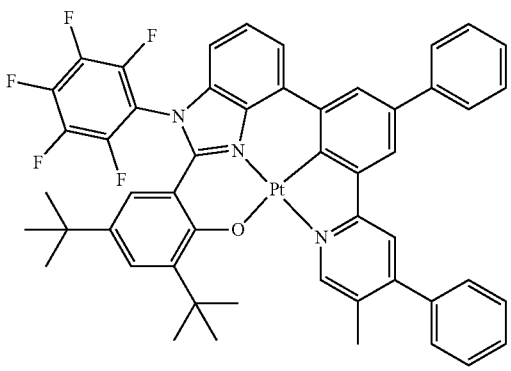
3-229
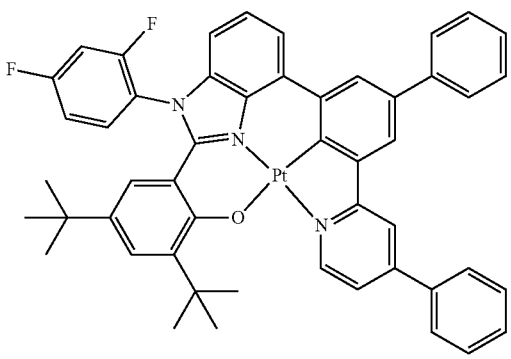

3-230
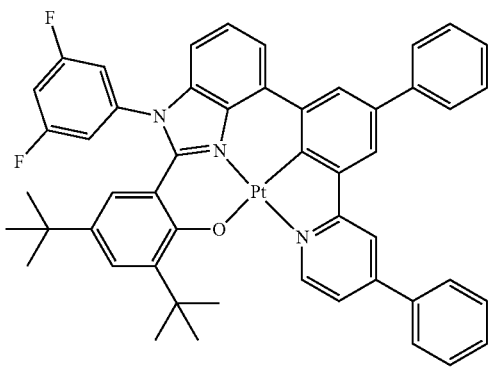
3-231
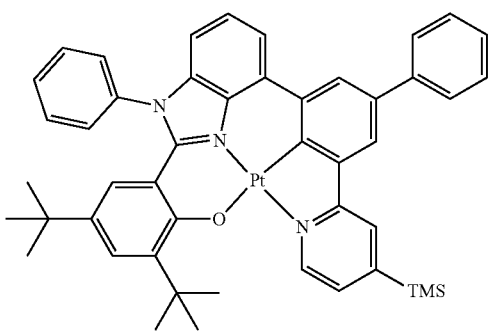
3-232
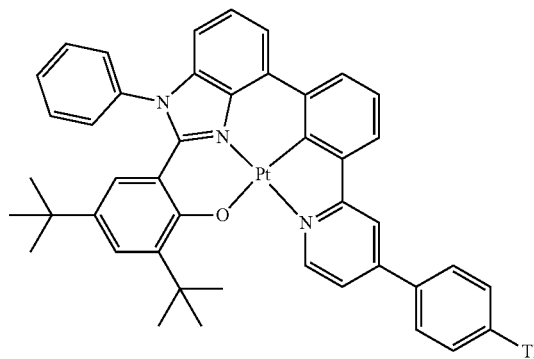
3-233
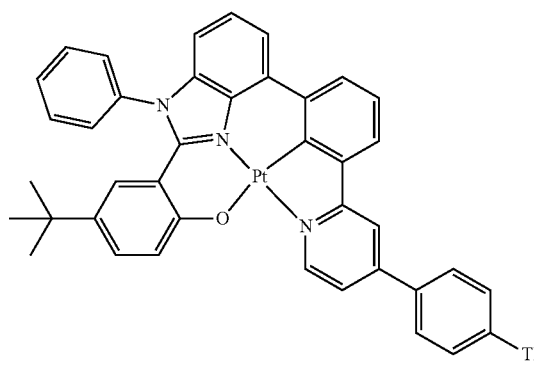
3-234
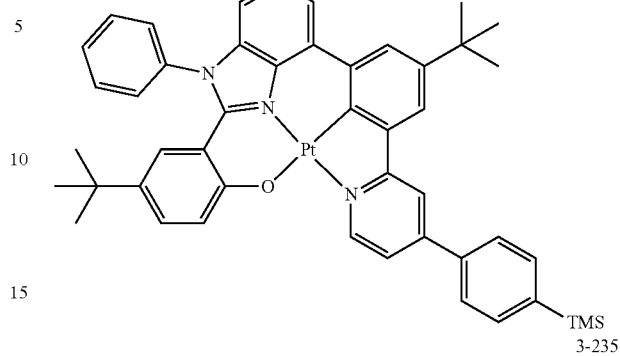
3-235
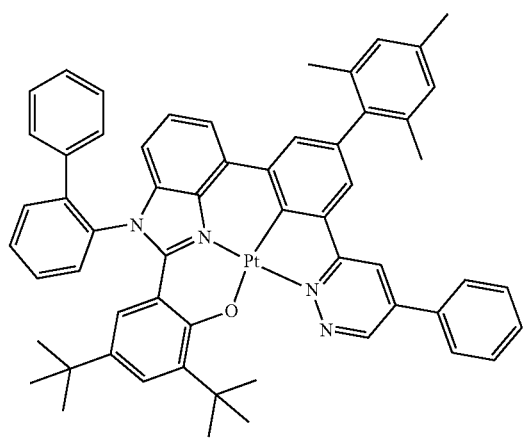
3-236
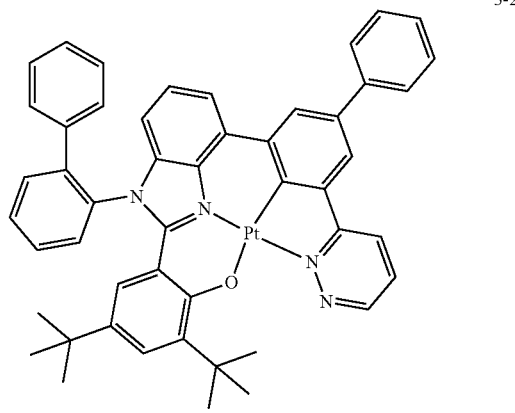
3-237
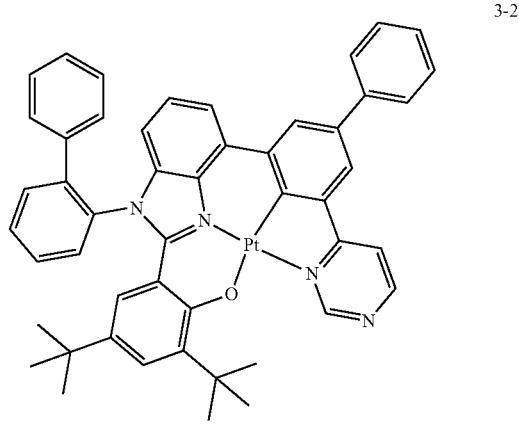

-continued
3-238
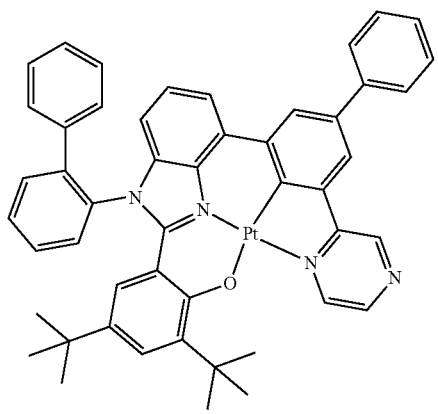
3-239
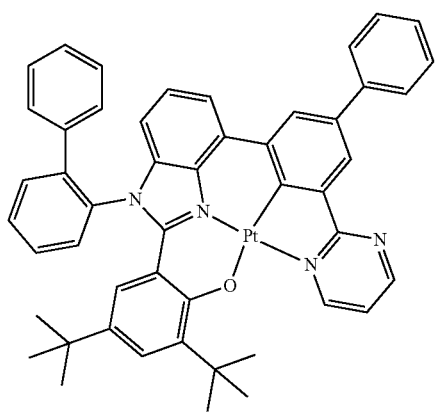
3-240
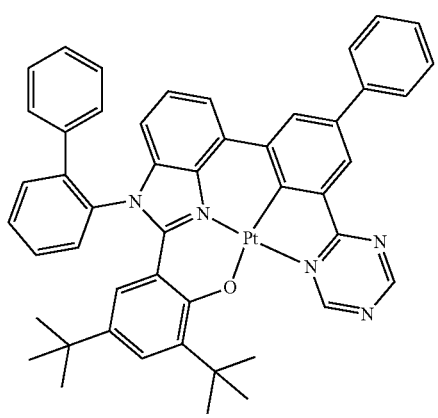
-continued
3-241
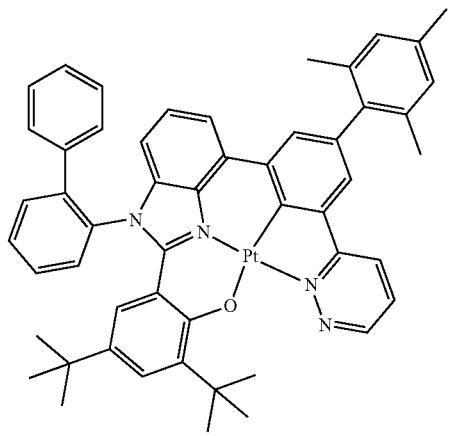
3-242
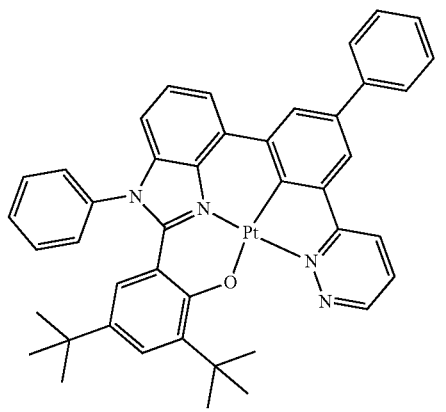
3-243
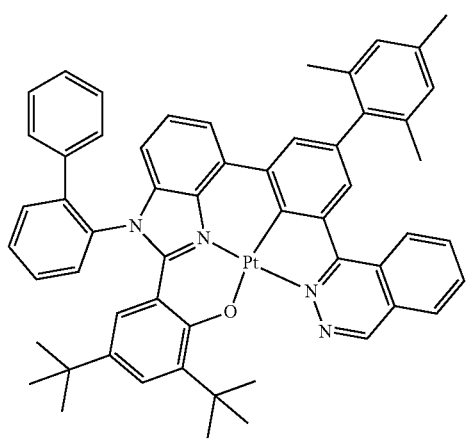

3-244
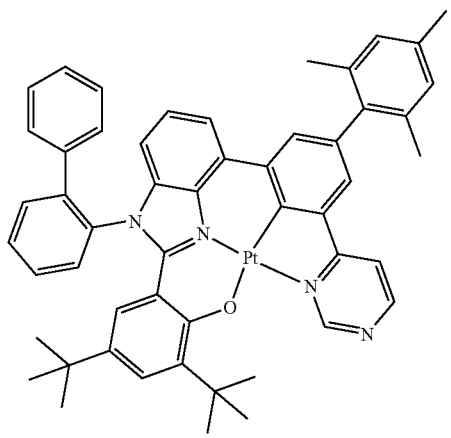
3-245
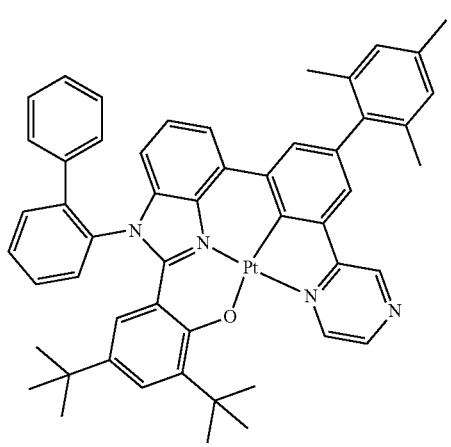
3-246
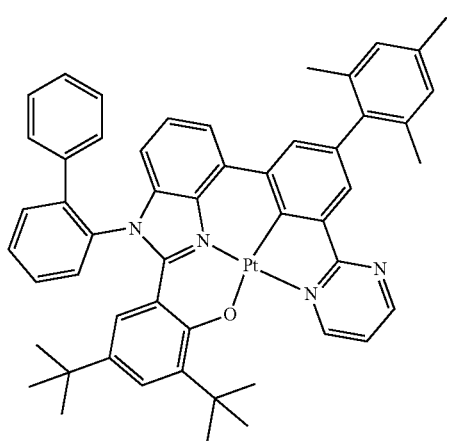
3-247
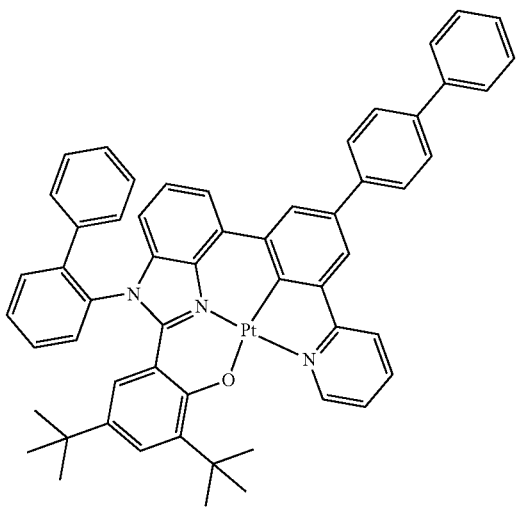
3-248
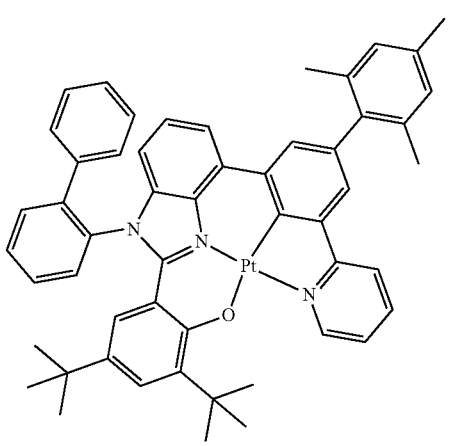
3-249
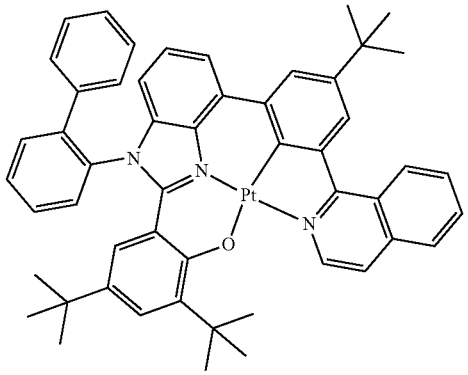

3-250
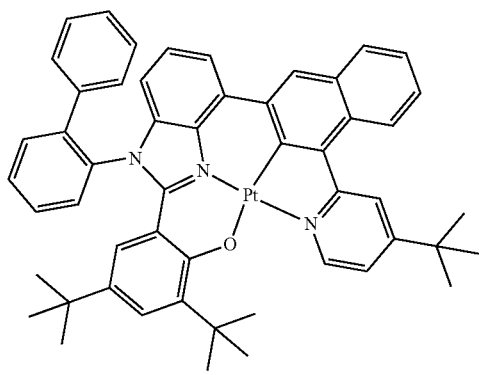
3-251
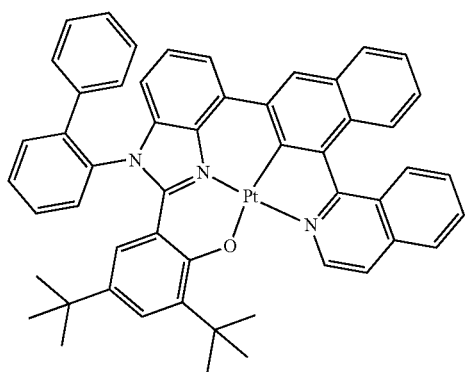
3-252
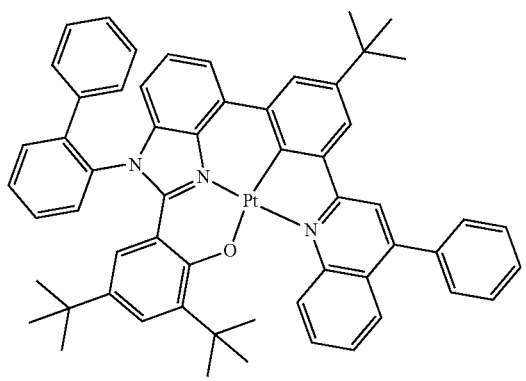
3-253
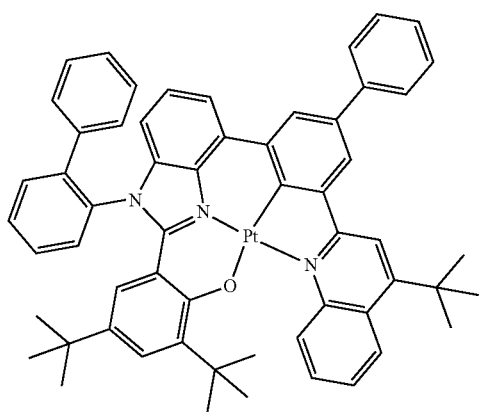
3-254
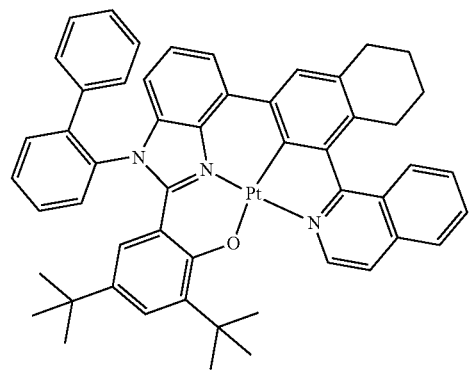
3-255
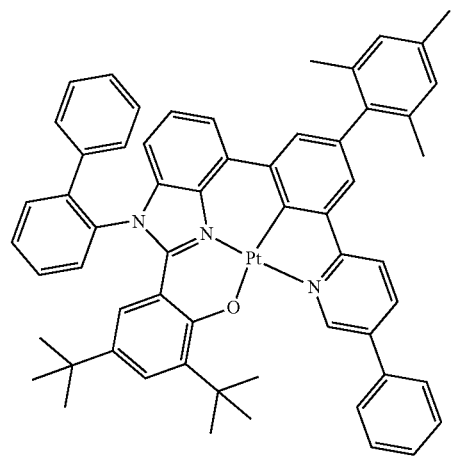
3-256
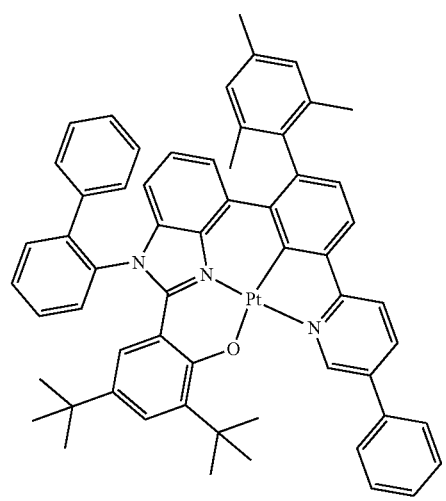

3-257
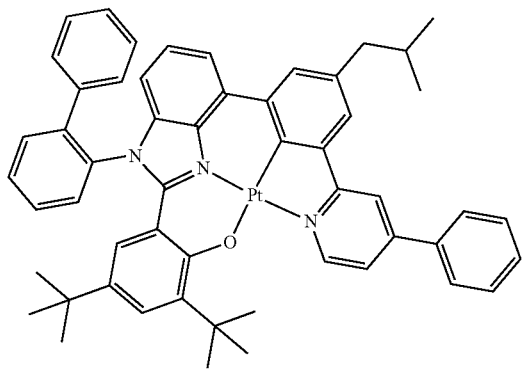
3-258
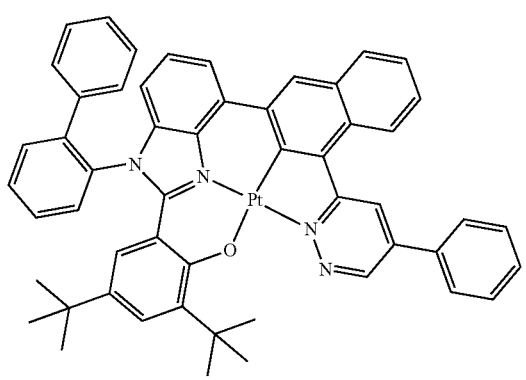
3-259
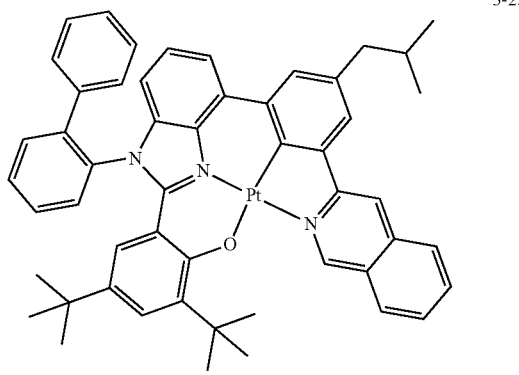
3-260
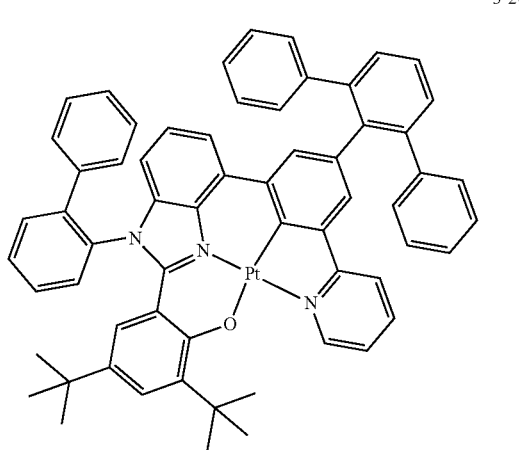
3-261
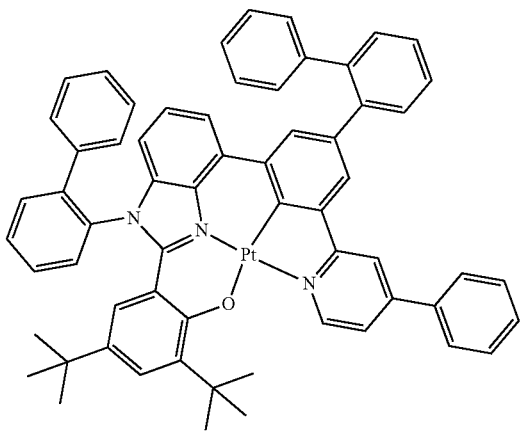
3-262
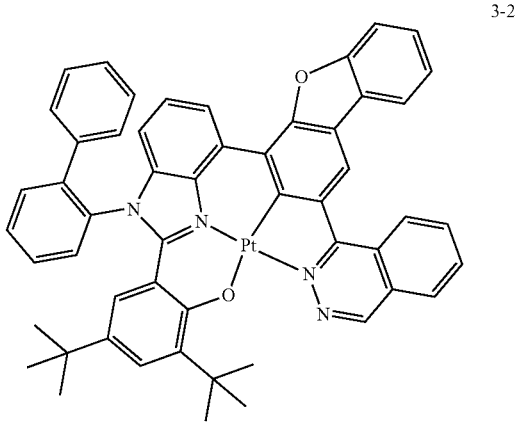
3-263

3-264
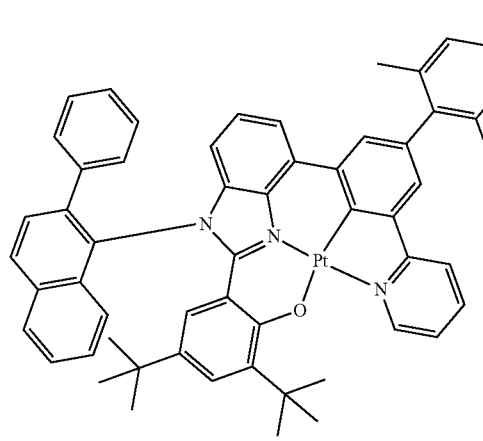
3-265
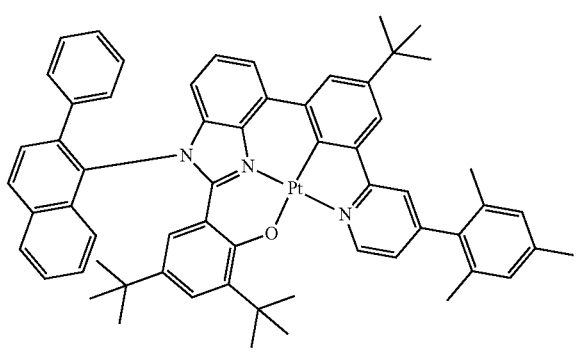
3-266
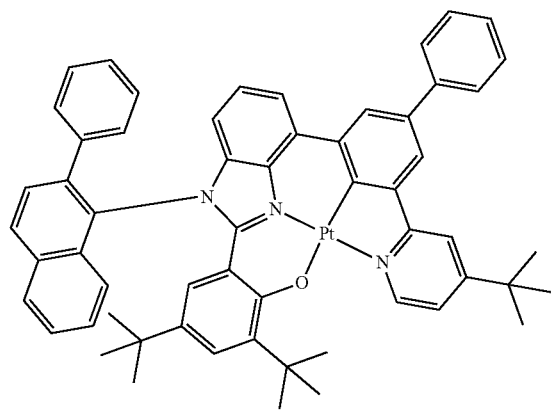
3-267
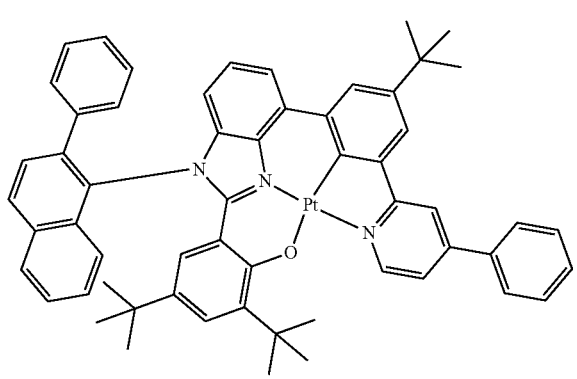
3-268
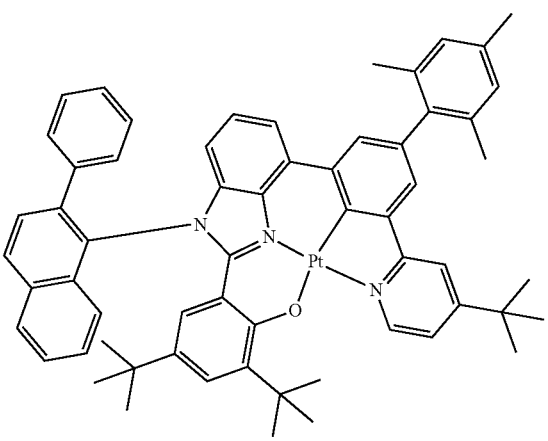
3-269
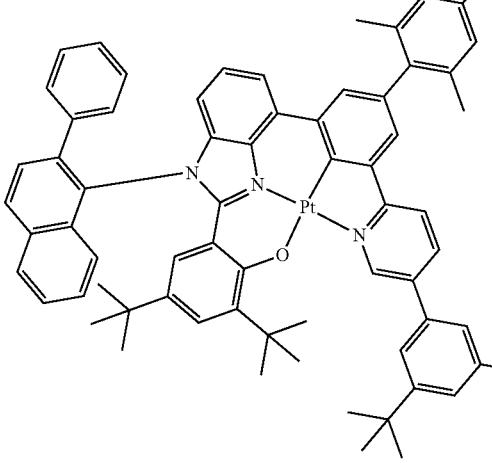
3-270
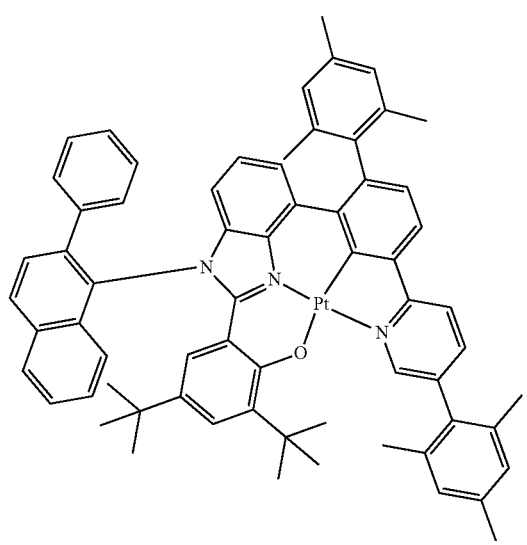

3-271
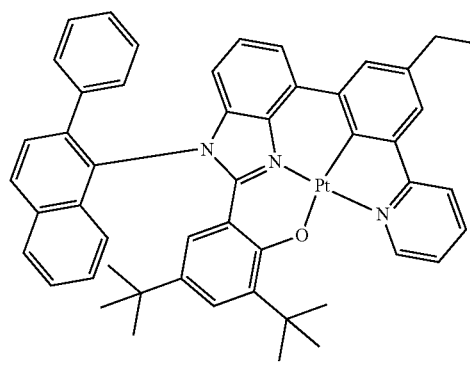
3-275
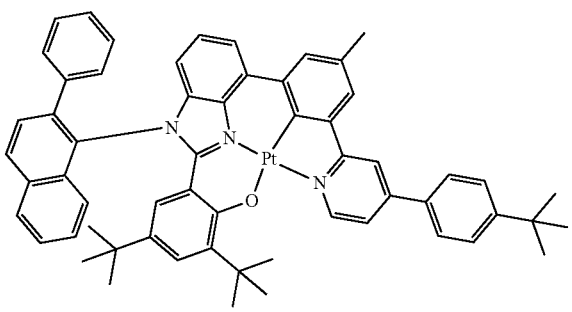
3-272
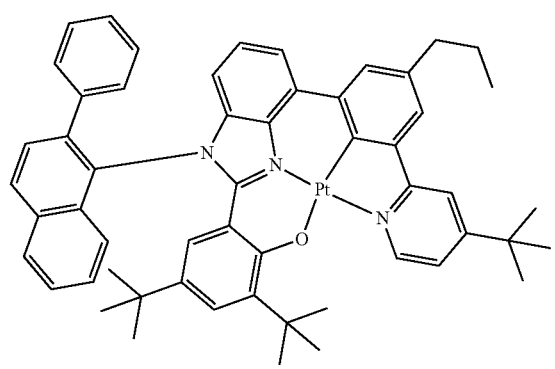
3-276
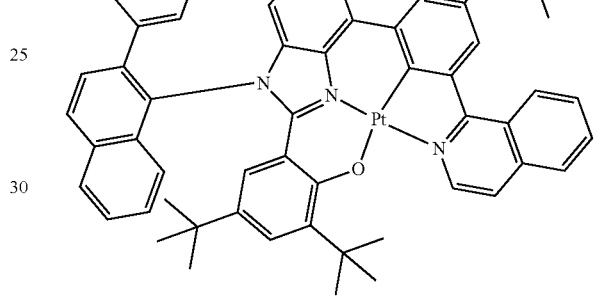
3-273
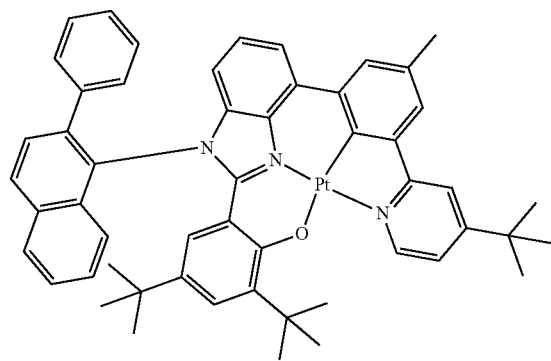
3-277
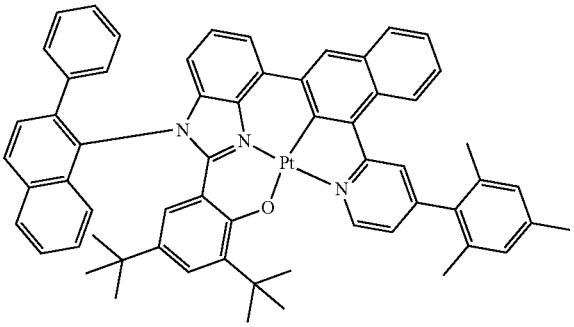
3-274
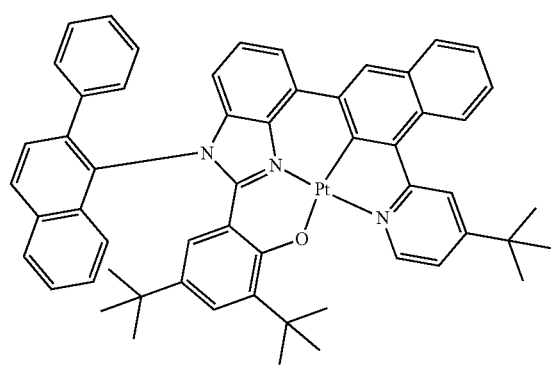
3-278
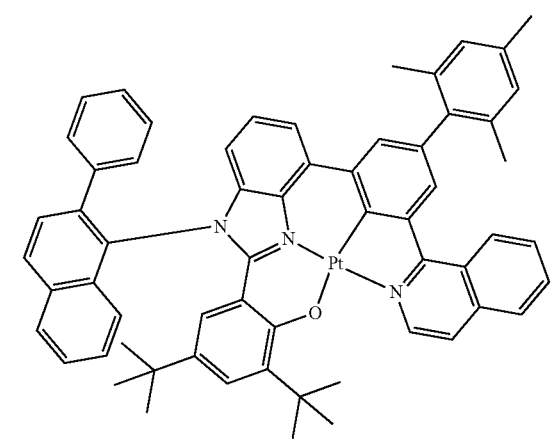

3-279
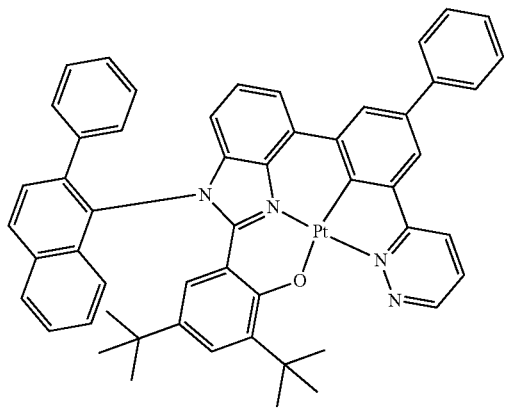
3-280
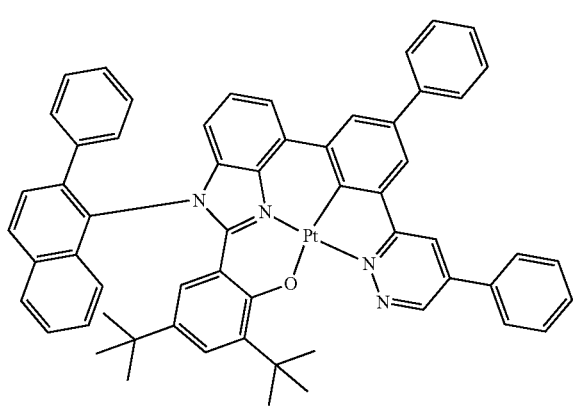
3-281
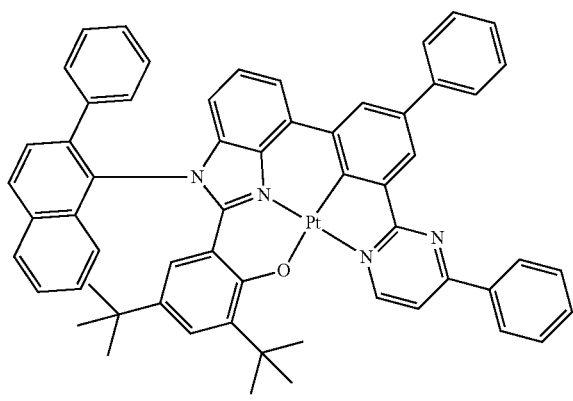
3-282
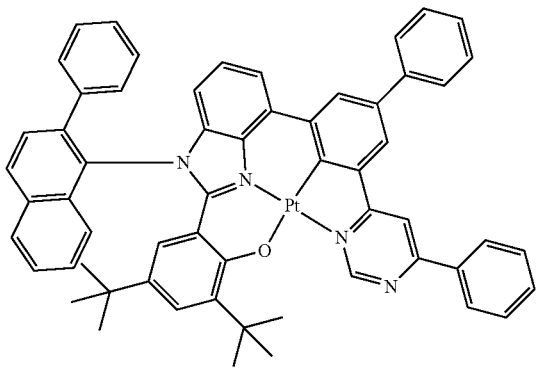
3-283
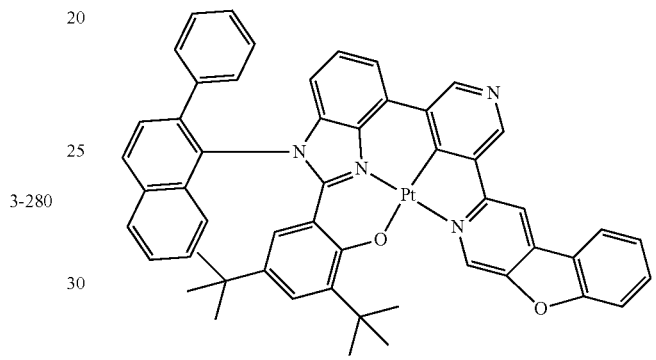
3-284
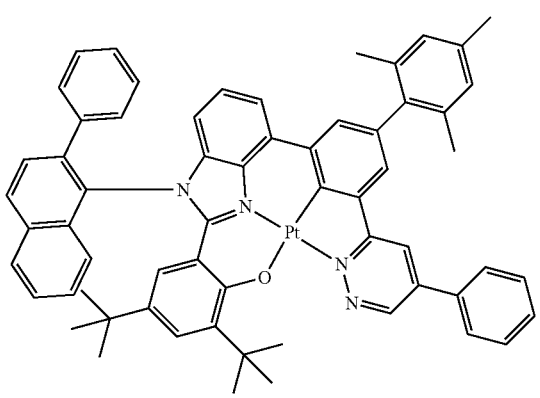
3-285
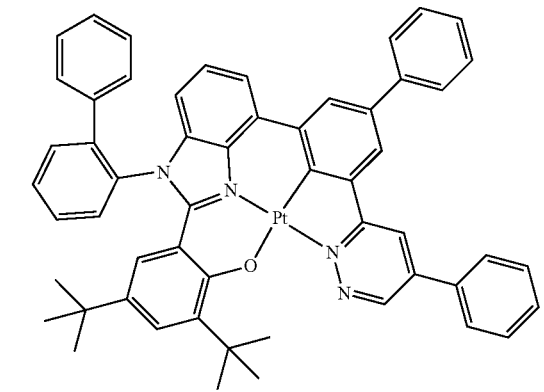

3-286
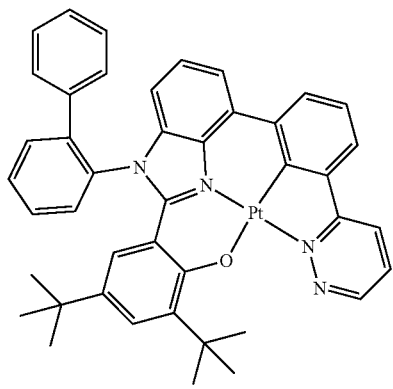
3-287
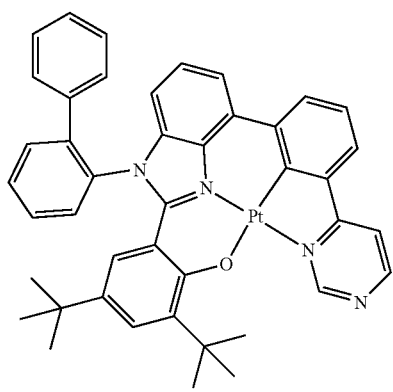
3-288
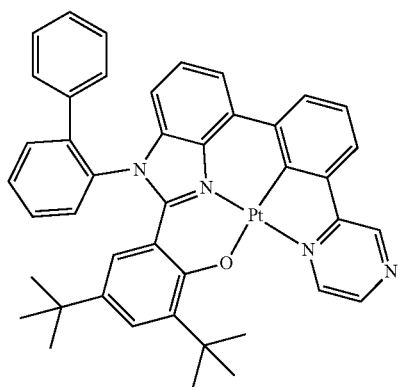
3-289
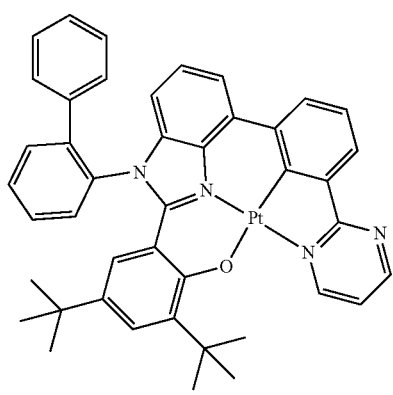
3-290
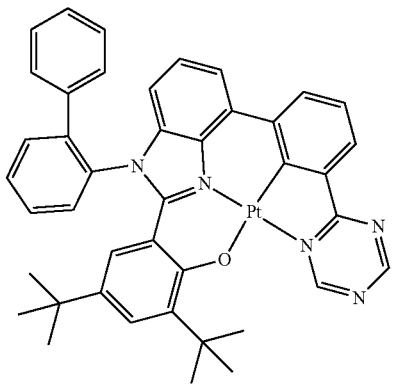
3-291
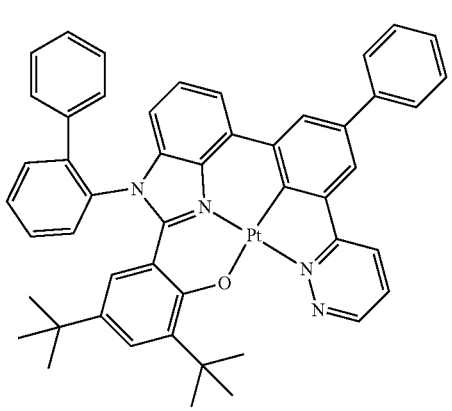
3-292
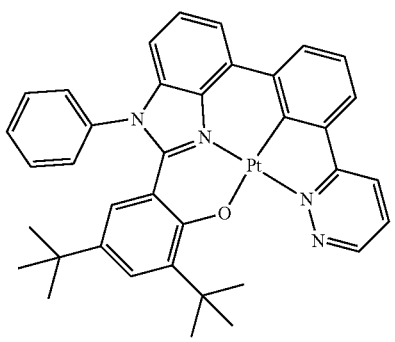
3-293
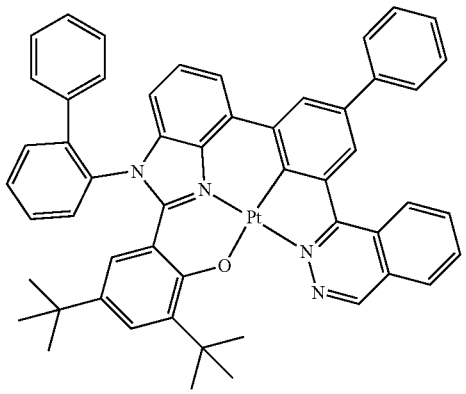

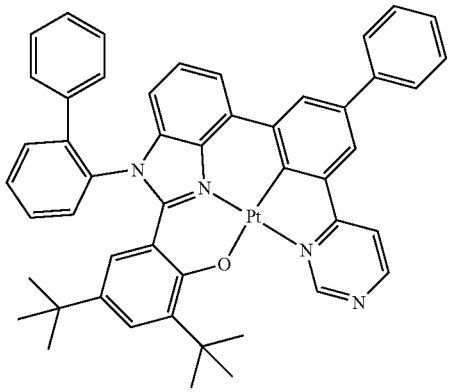
3-294
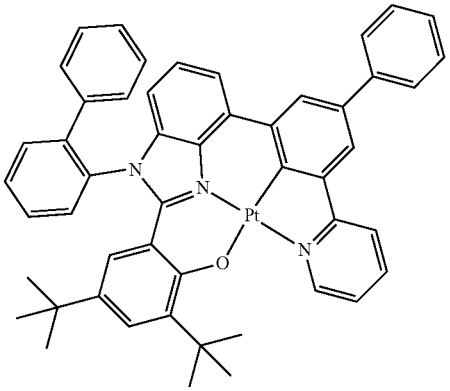
3-298
3-295
3-299
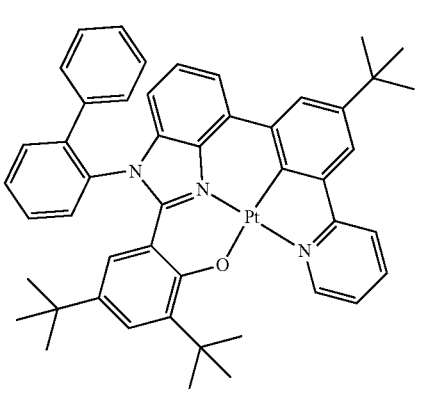
3-296
3-300
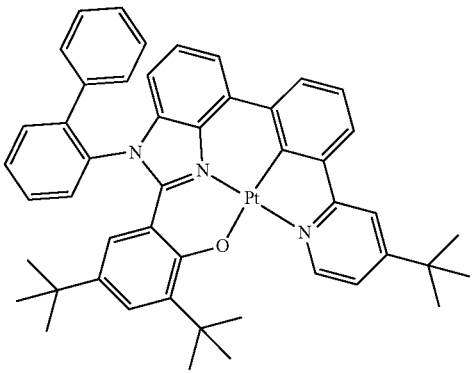
3-297
3-301
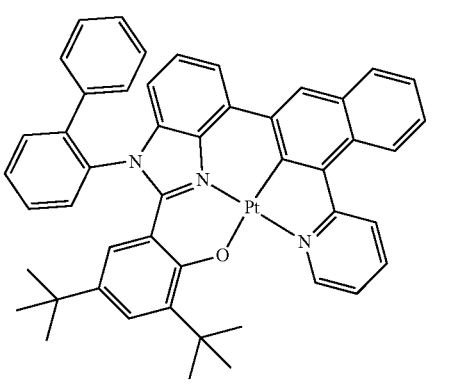

3-302
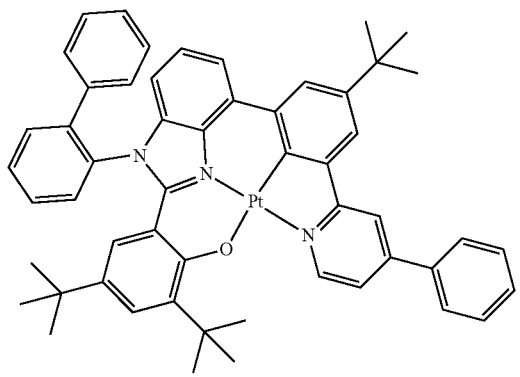
3-303
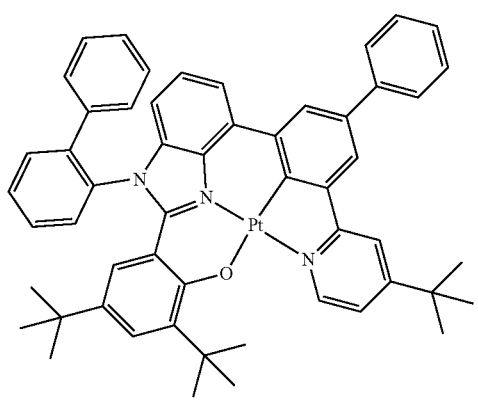
3-304
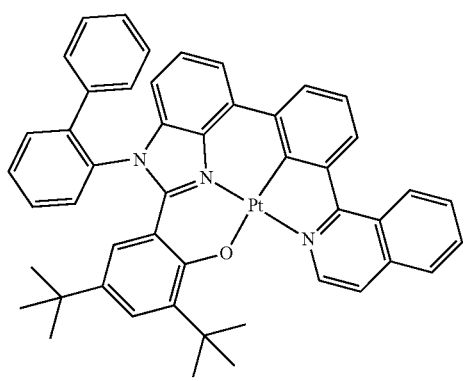
3-305
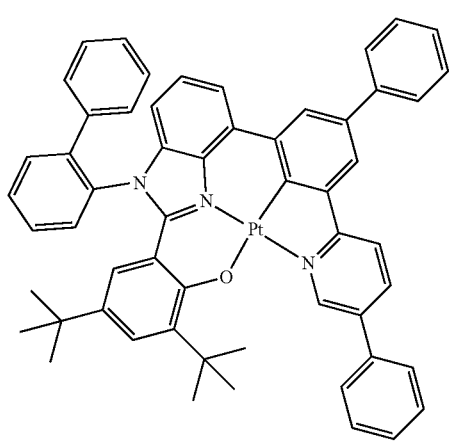
3-306
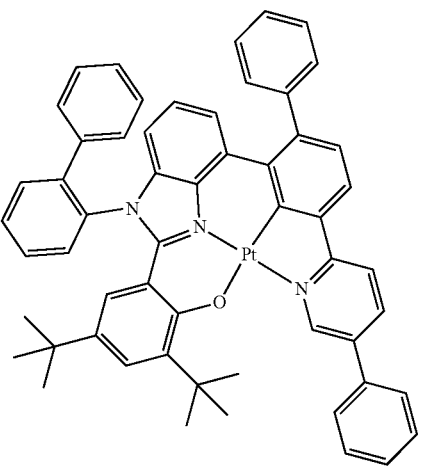
3-307
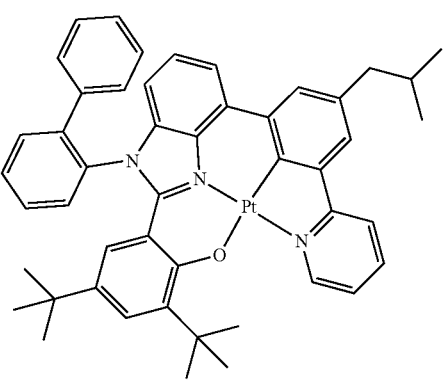
3-308
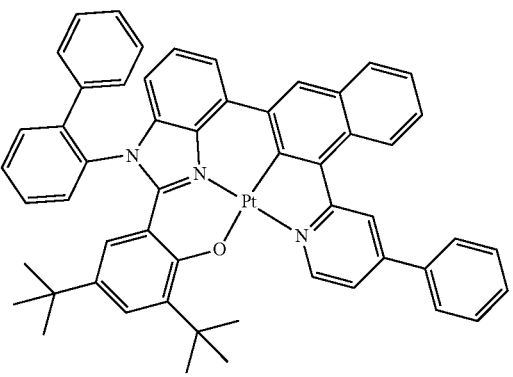
3-309
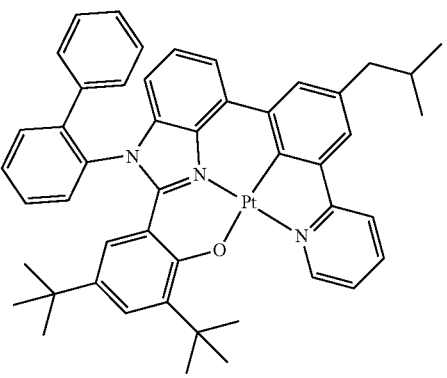

3-310
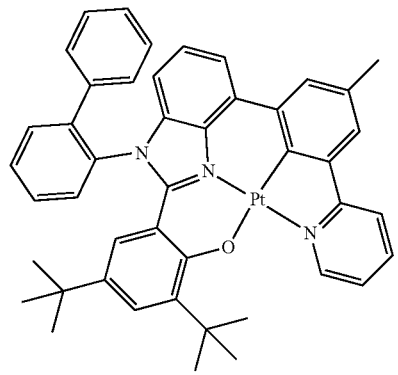
3-314
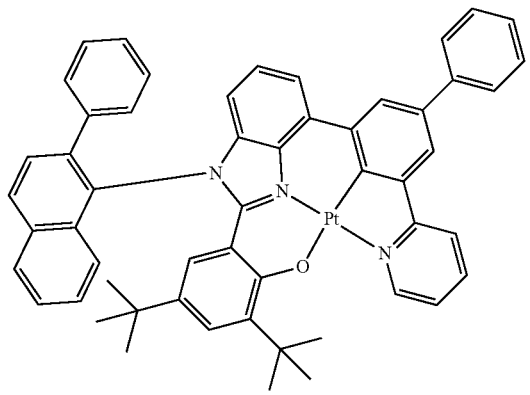
3-311
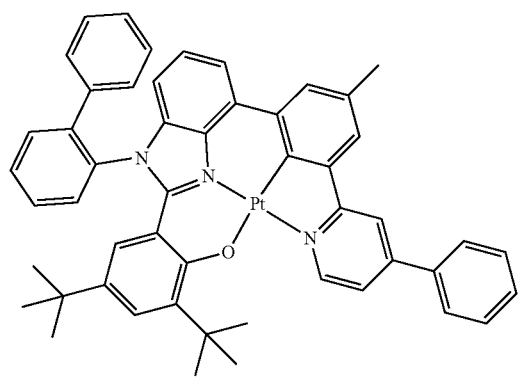
3-315
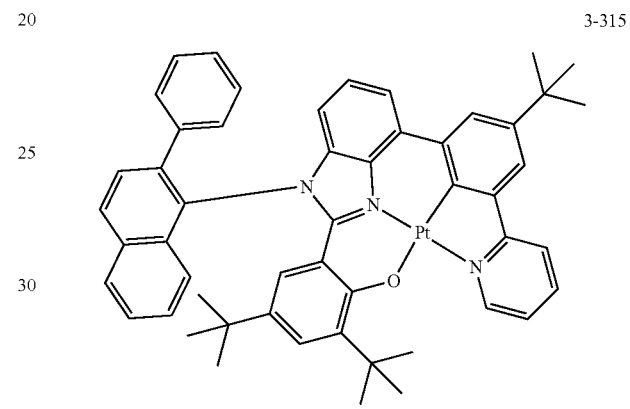
3-312
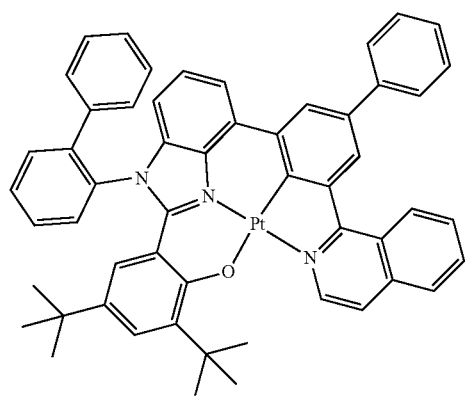
3-316
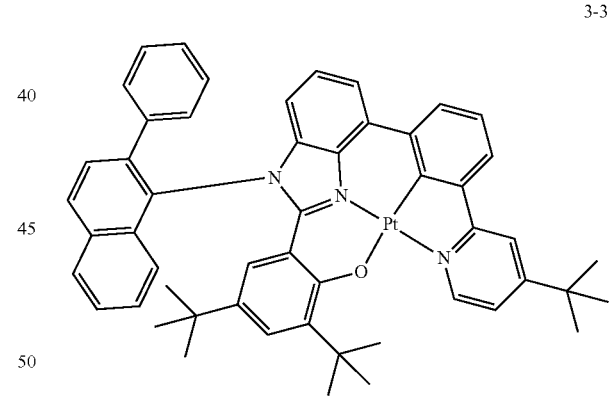
3-313
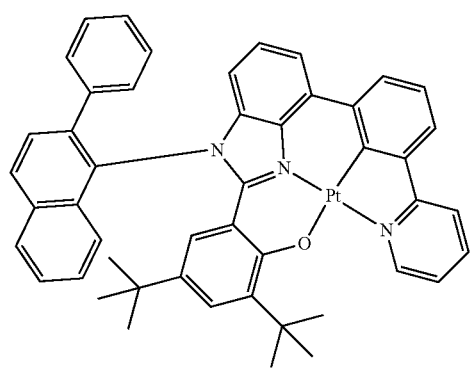
3-317
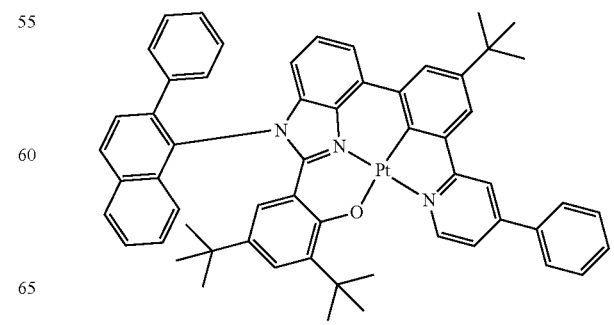

3-318
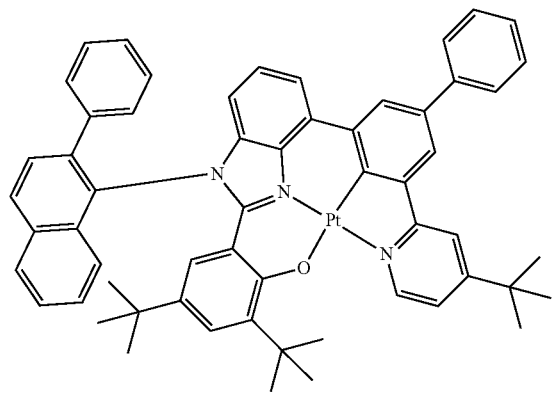
3-319
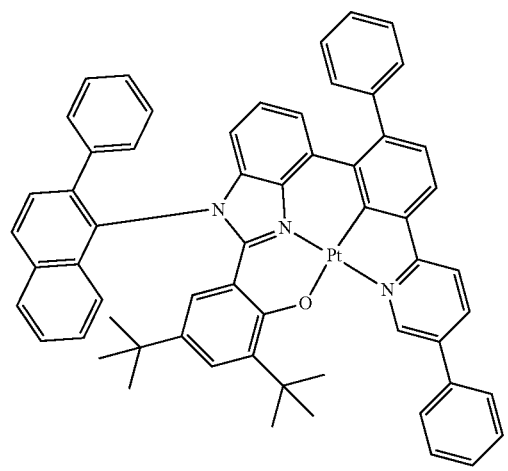
3-320
3-321
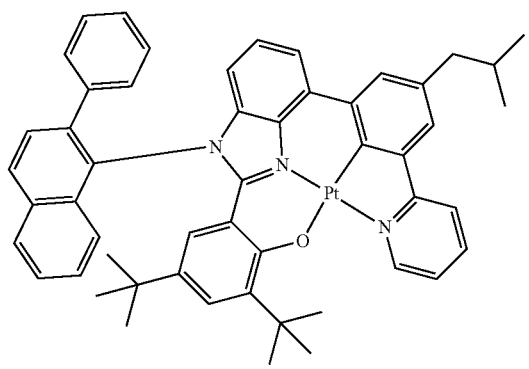
3-322
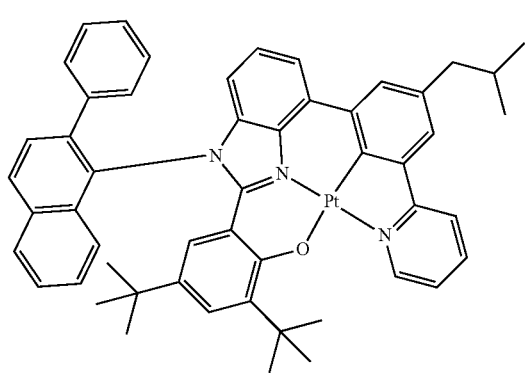
3-323
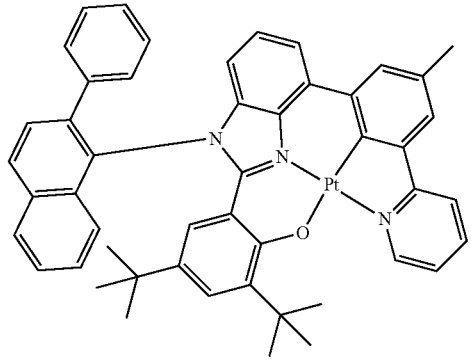
3-324
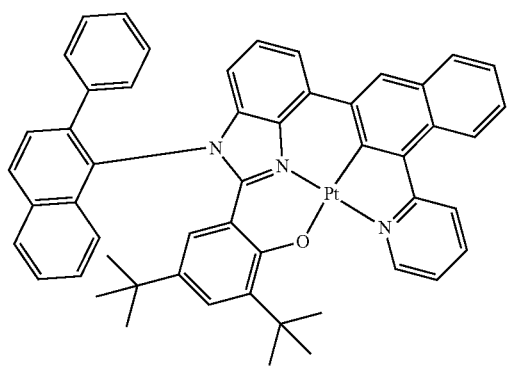

3-325
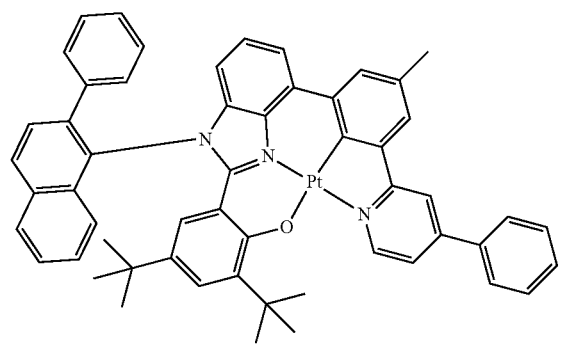
3-326
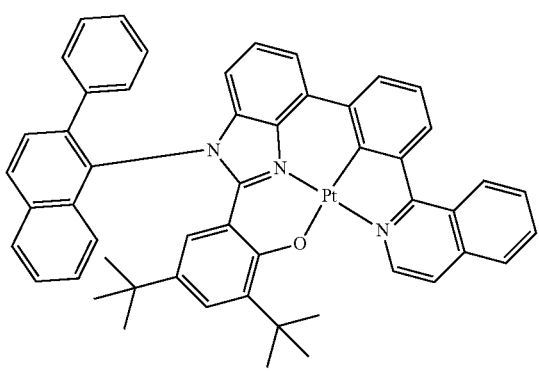
3-327
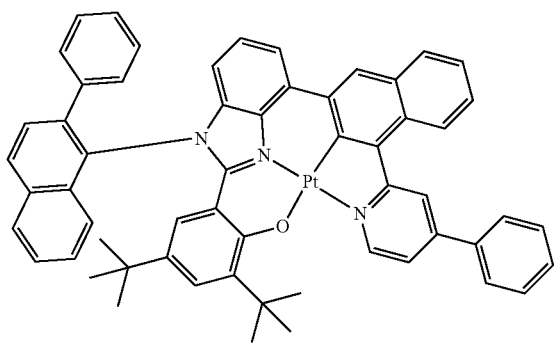
3-328
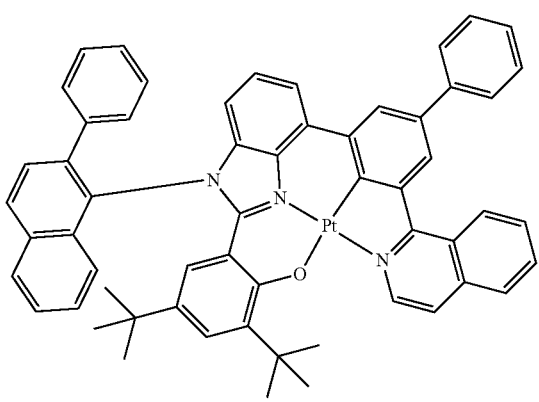
3-329
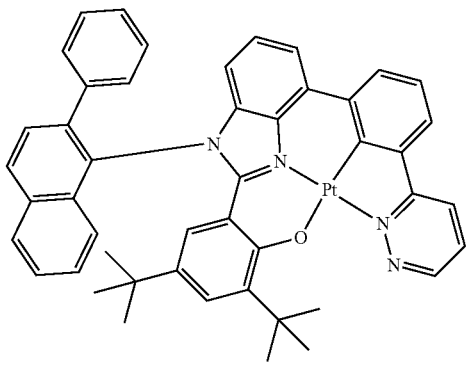
3-330
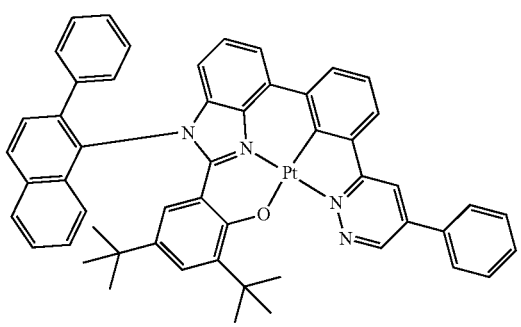
3-331
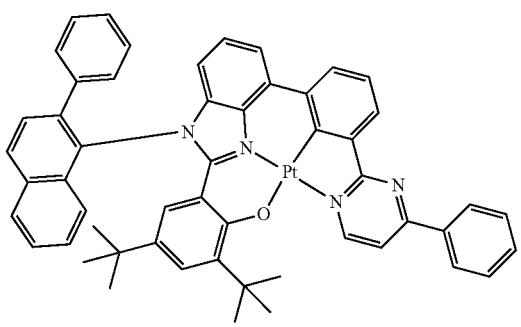
3-332
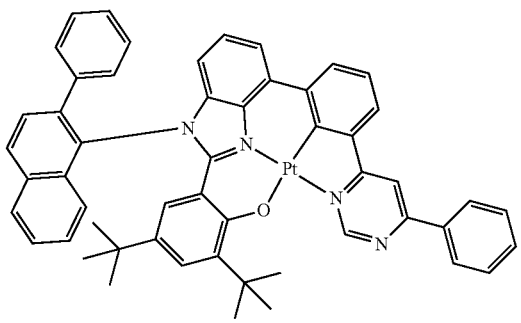

3-333
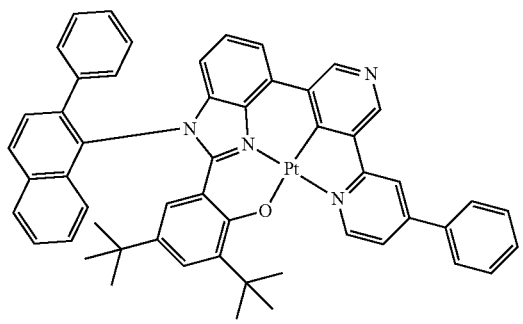
3-334
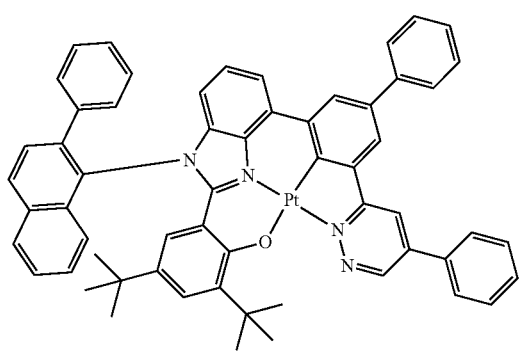
3-335
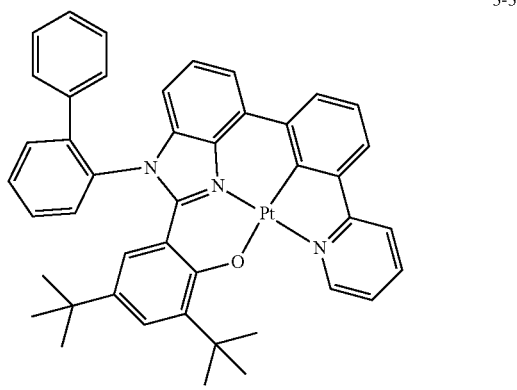
3-336
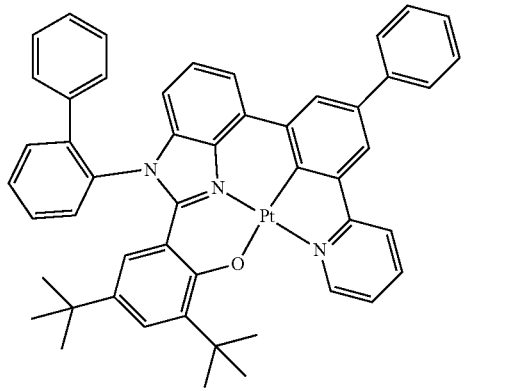
3-337
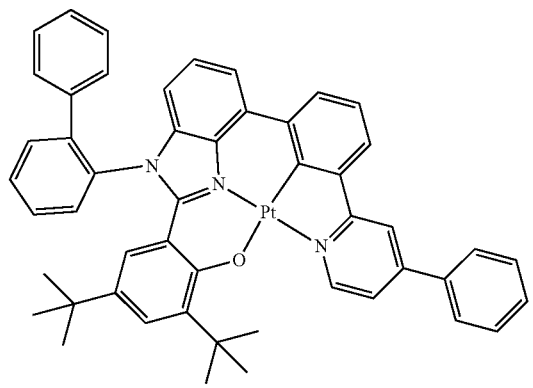
3-338
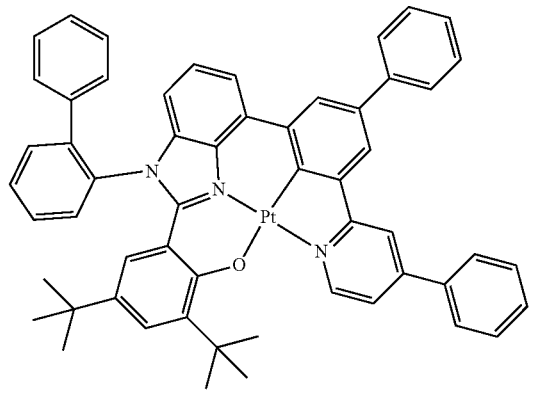
3-339
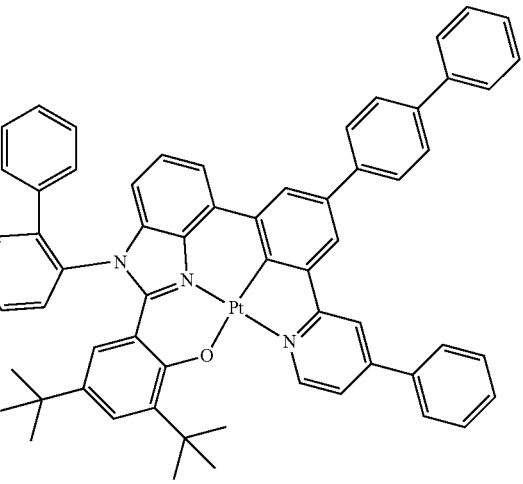

3-340
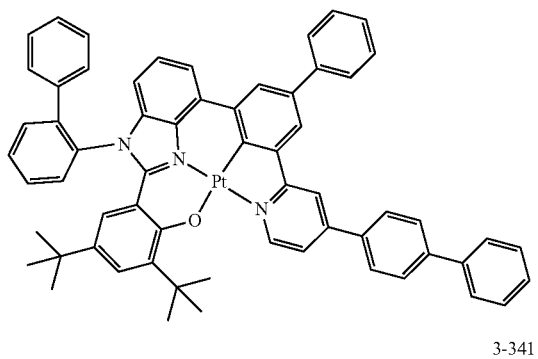
3-341
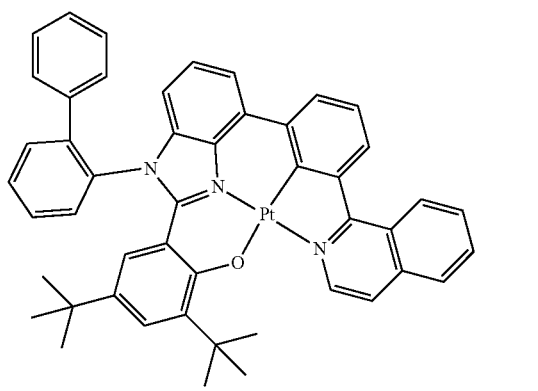
3-342
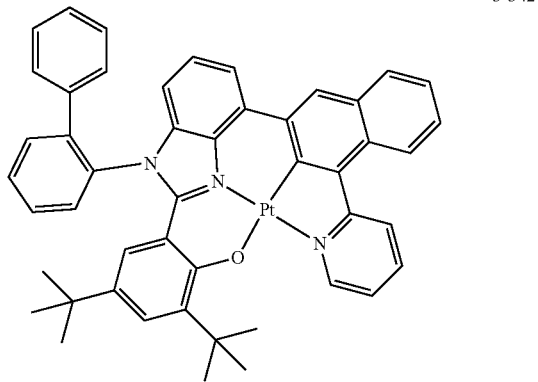
3-343
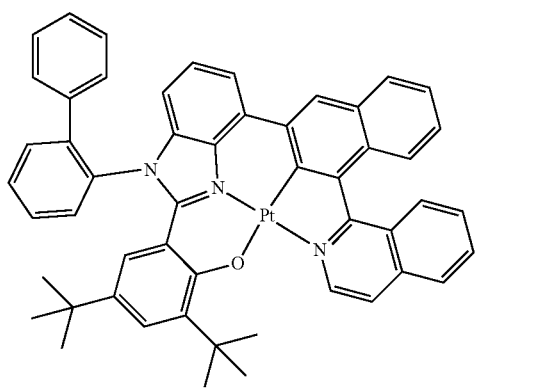
3-344
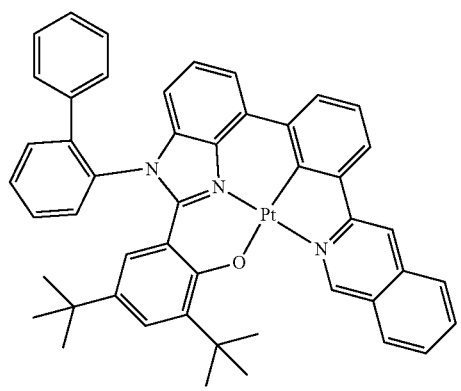
3-345
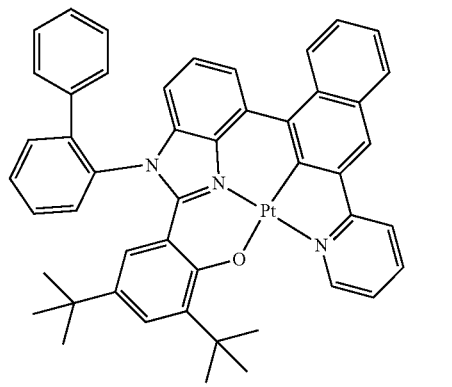
3-346
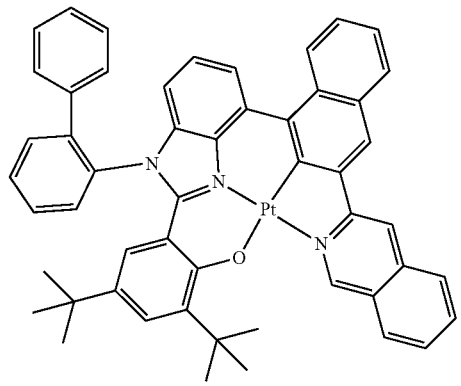
3-347
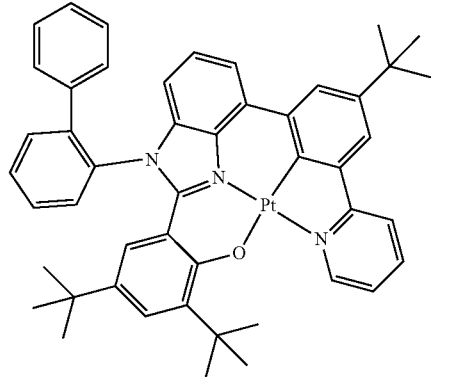

-continued
3-348
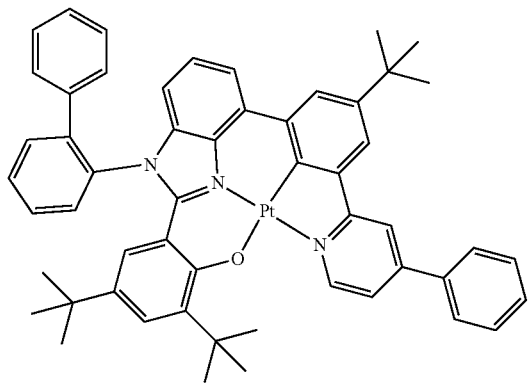
3-349
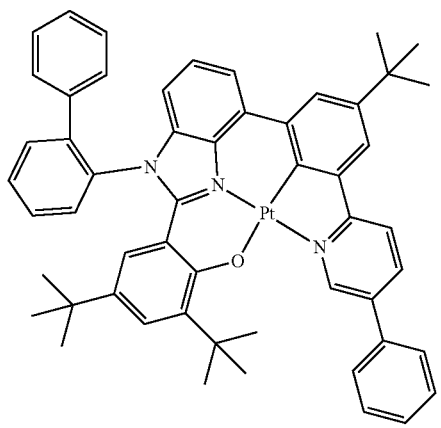
3-350
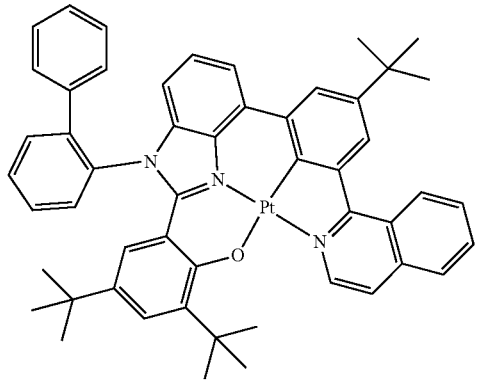
3-351
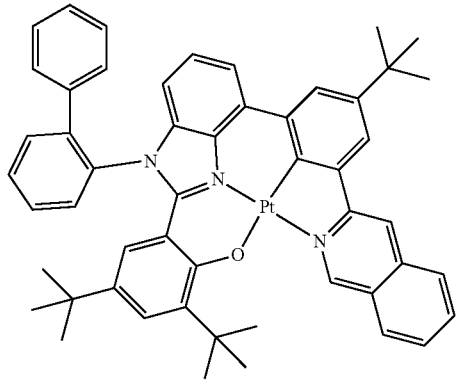
-continued
3-352
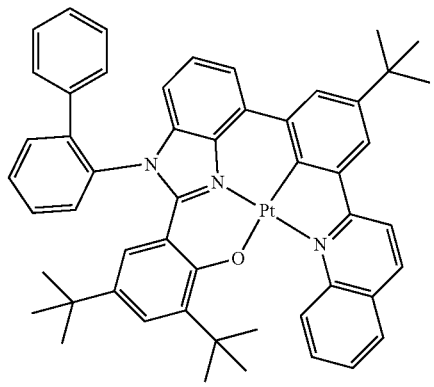
3-353
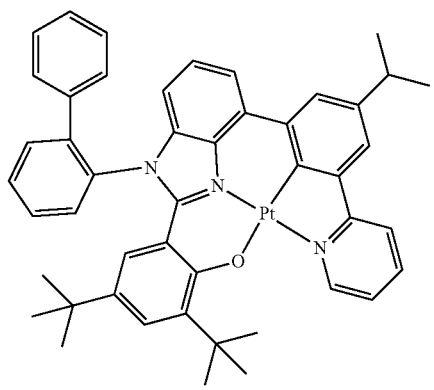
3-354
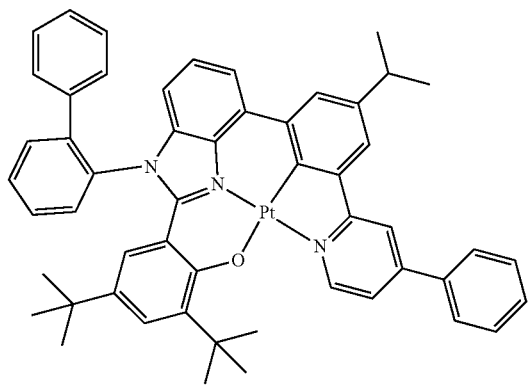
3-355
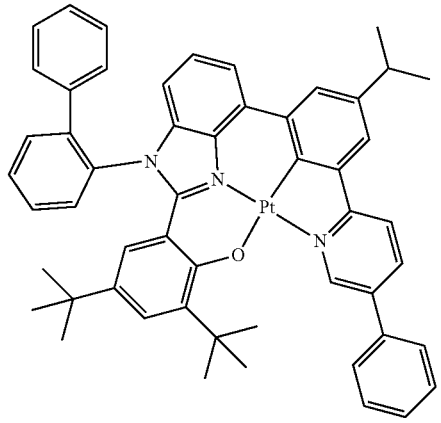

3-356
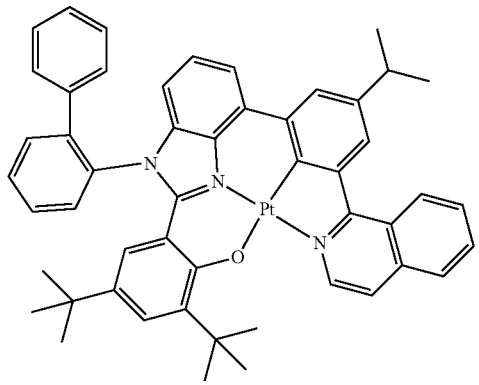
3-360
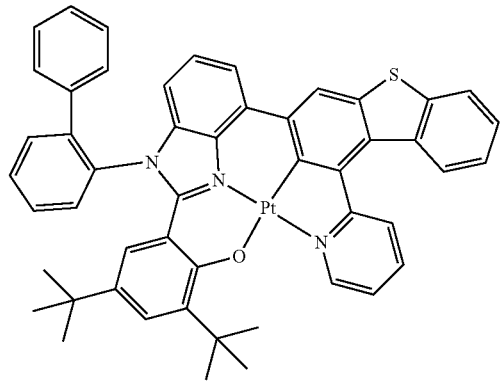
3-357
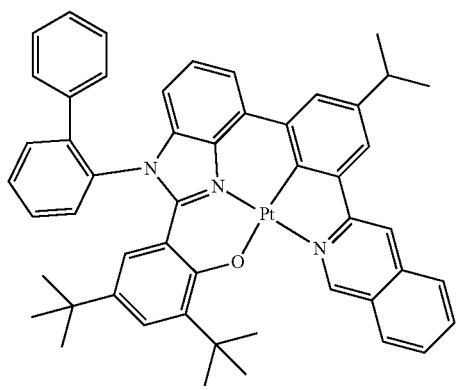
3-361
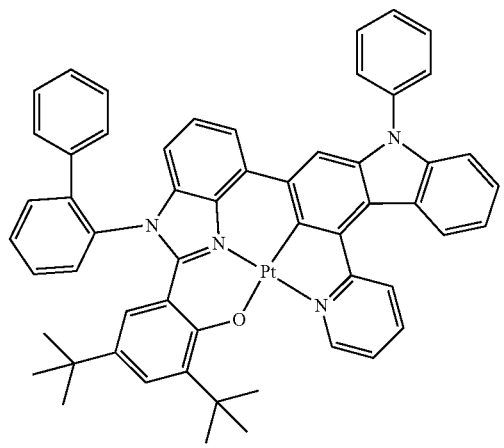
3-358
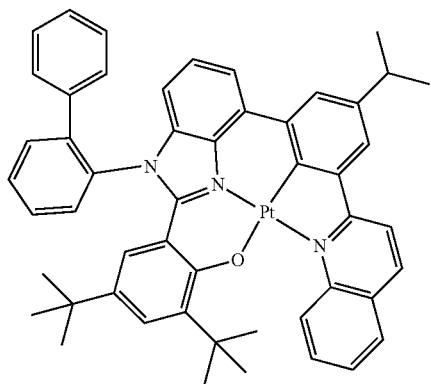
3-359
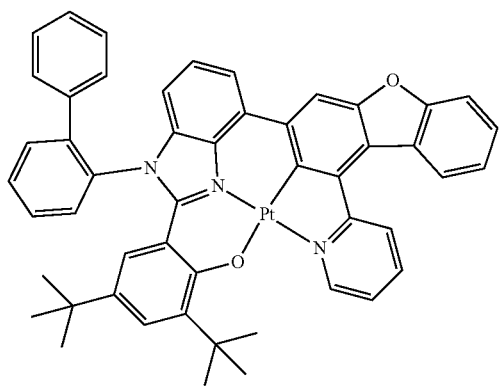
3-362
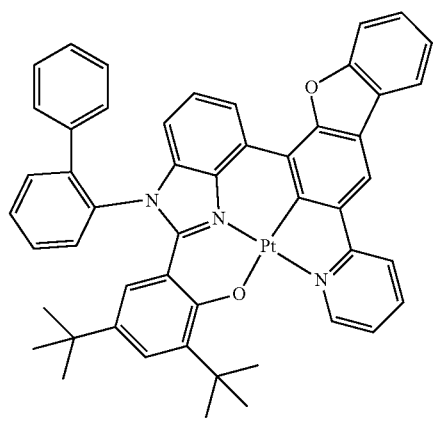

3-363
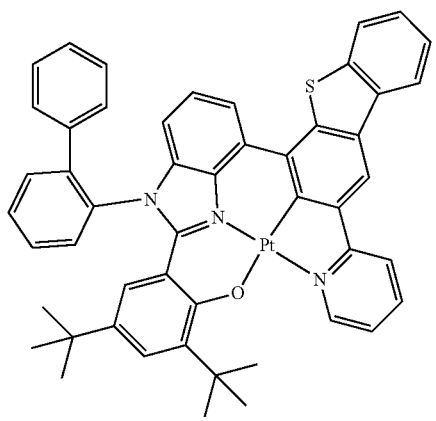
3-364
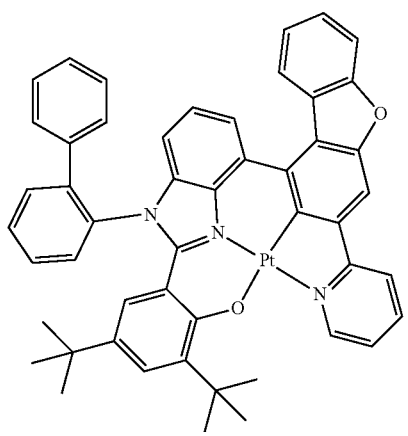
3-365
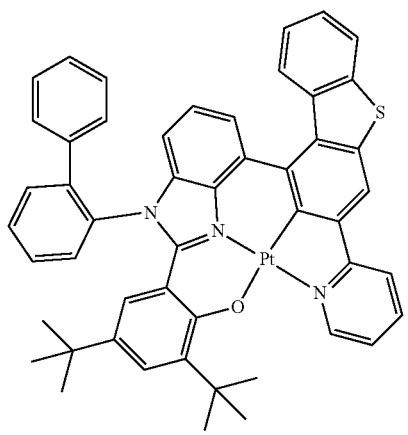
3-366
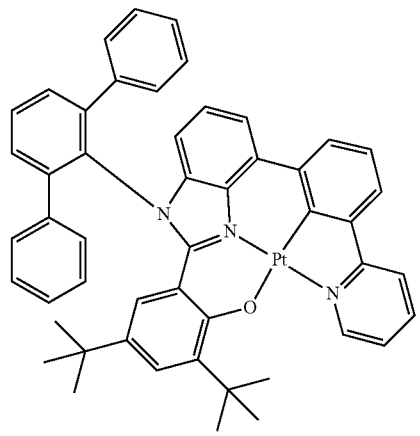
3-367
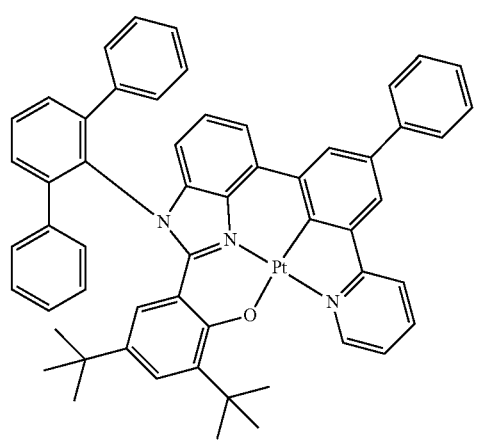
3-368
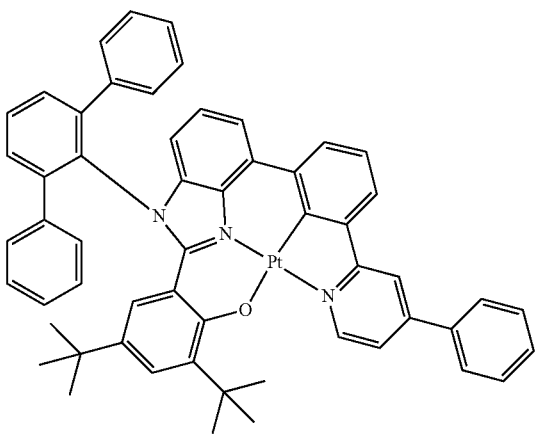

3-369
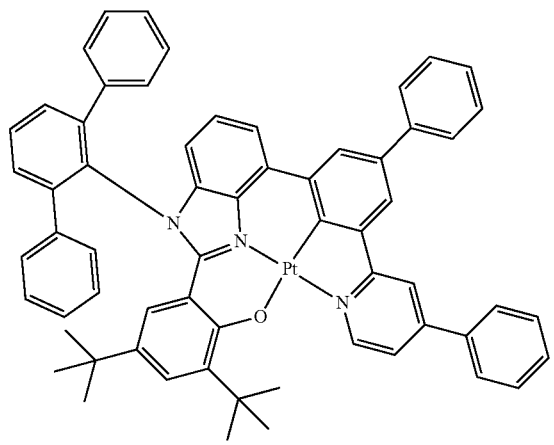
3-370
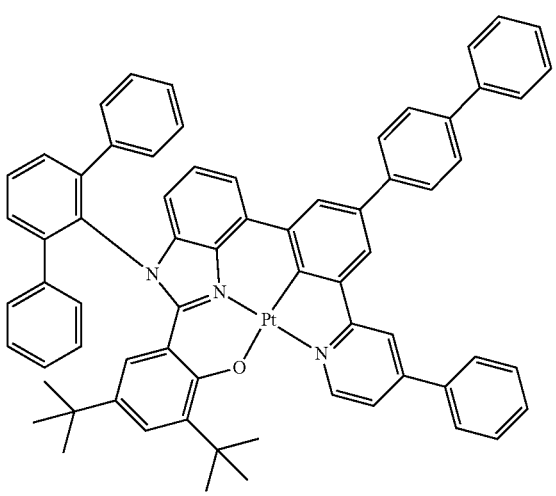
3-371
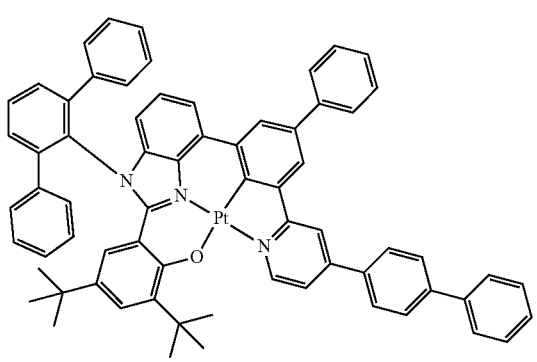
3-372
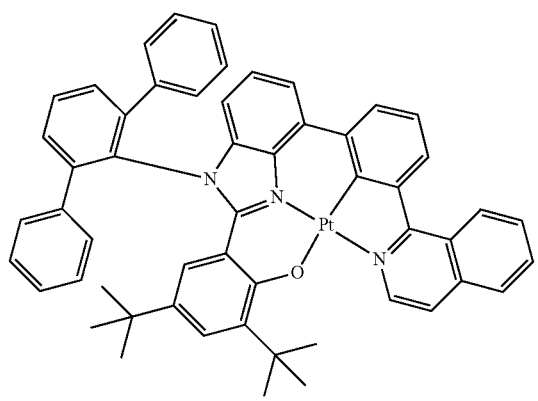
3-373
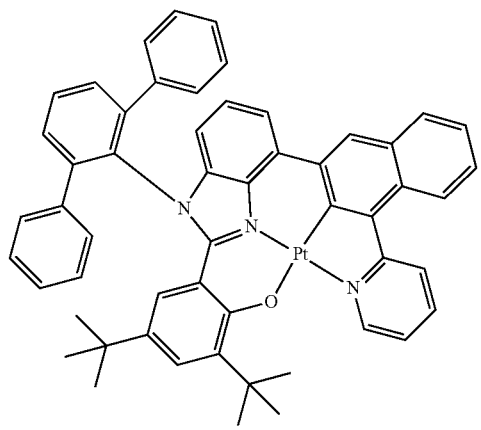
3-374
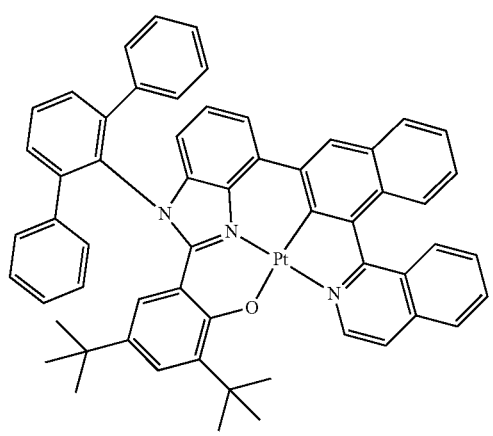

3-375
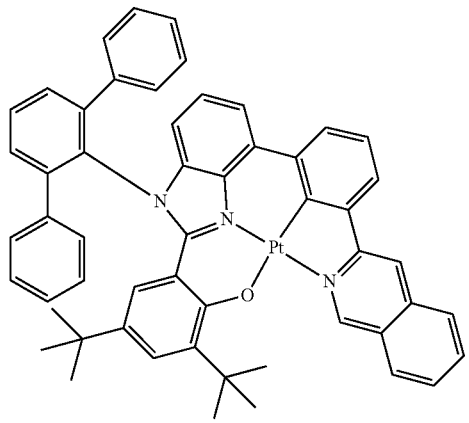
3-378
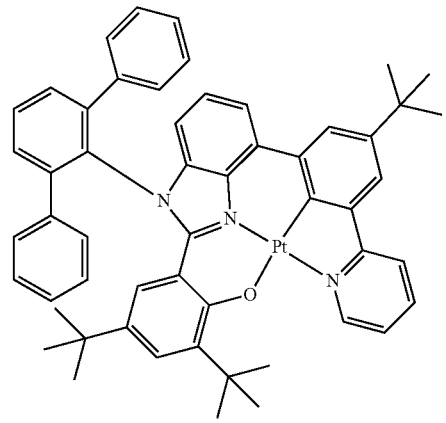
3-376
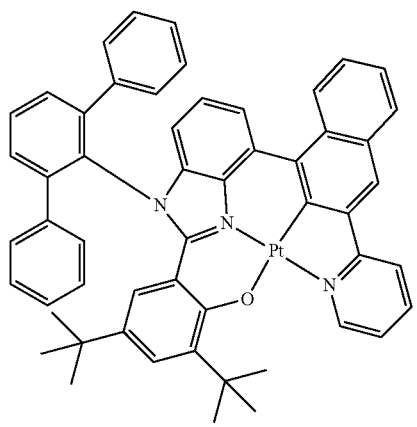
3-379
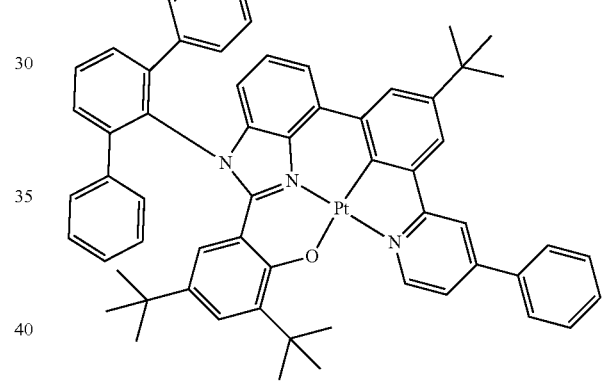
3-377
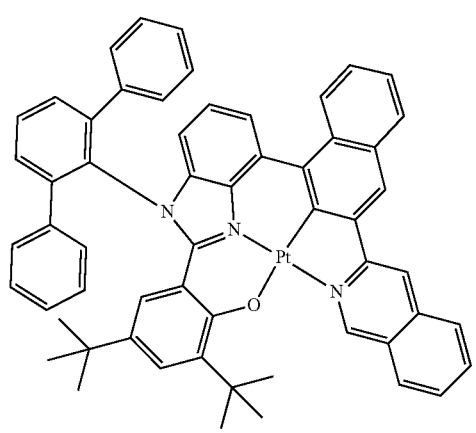
3-380
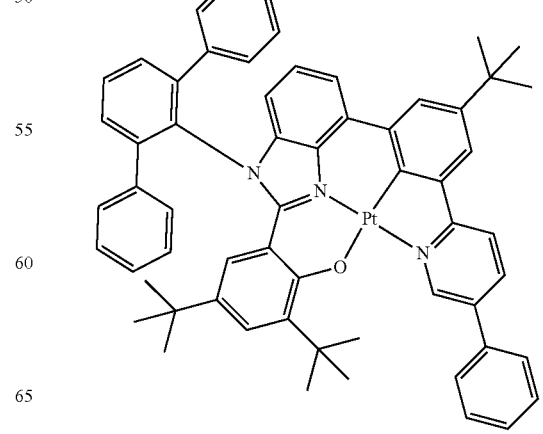

3-381
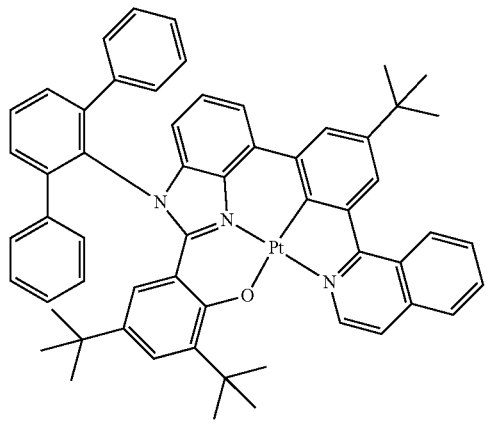
3-384
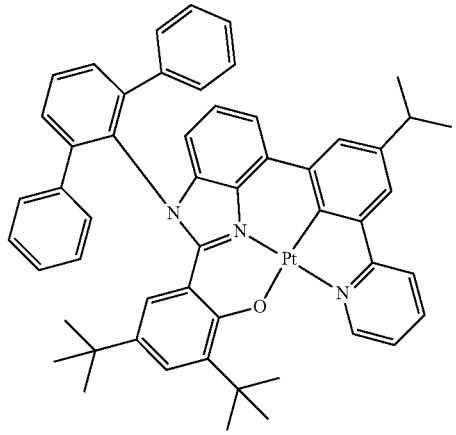
3-382
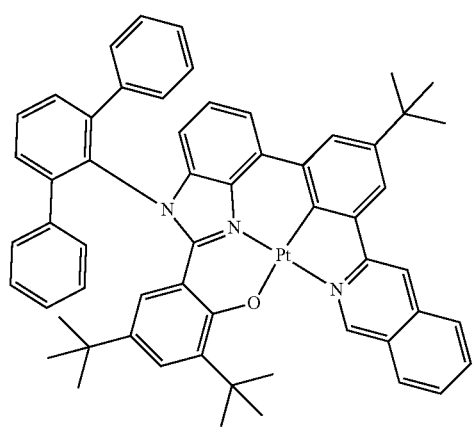
3-385
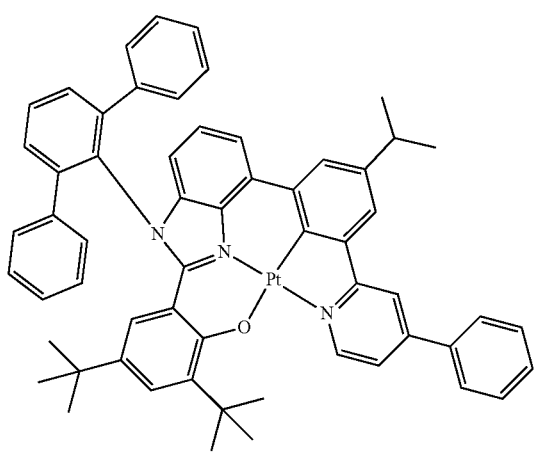
3-383
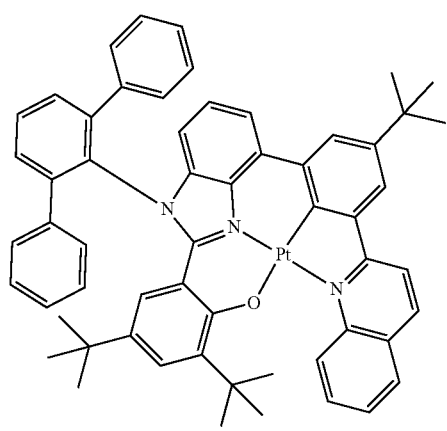
3-386
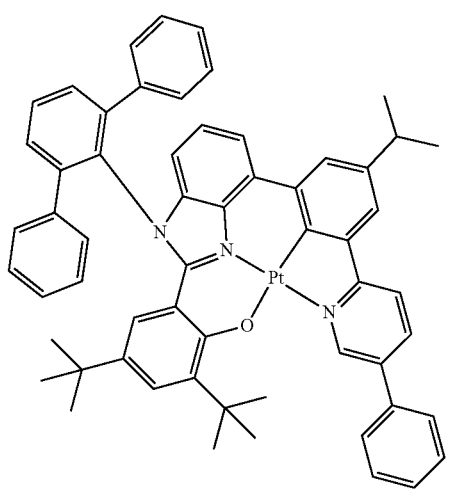

3-387
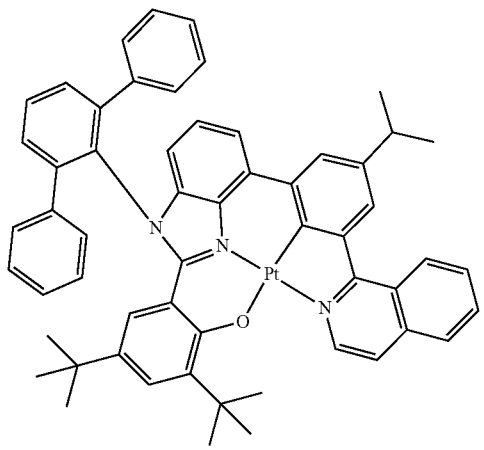
3-388
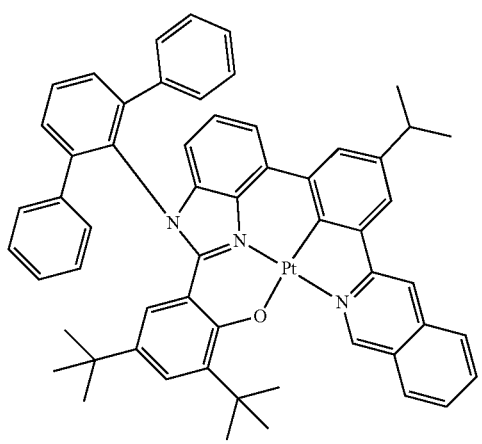
3-389
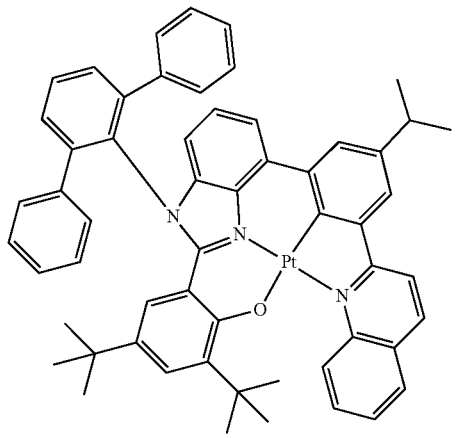
3-390
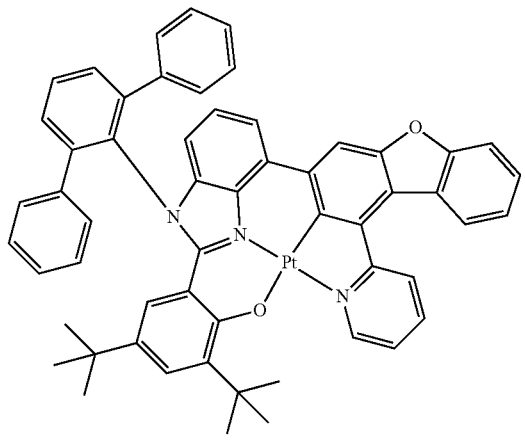
3-391
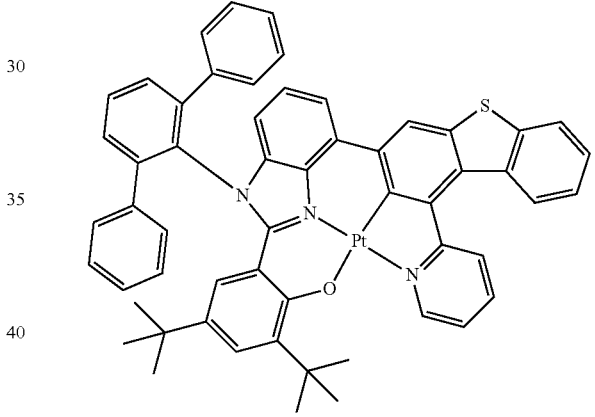
3-392
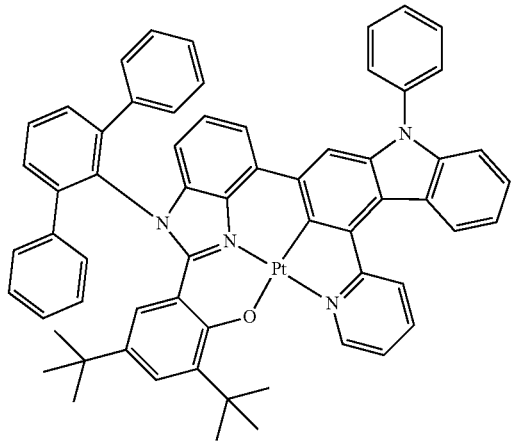

3-393
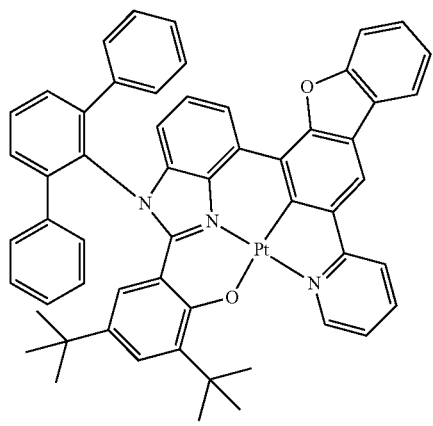
3-394
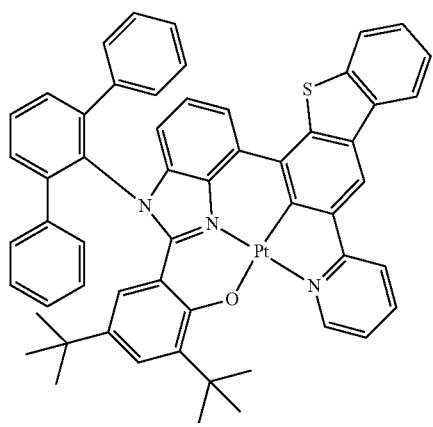
3-395
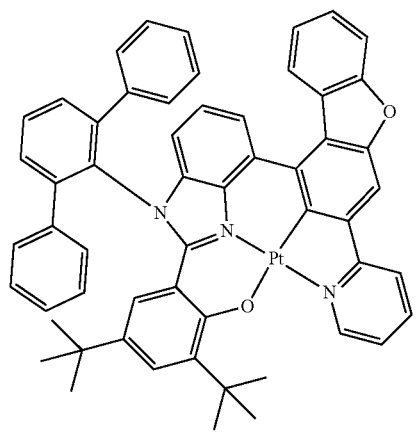
3-396
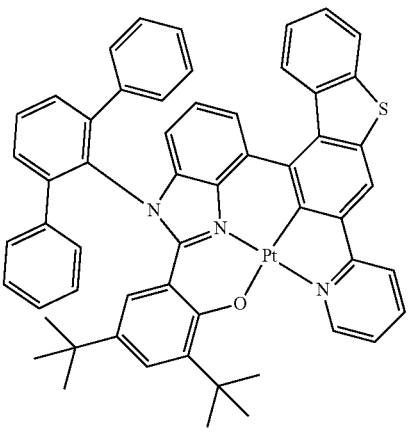
3-397
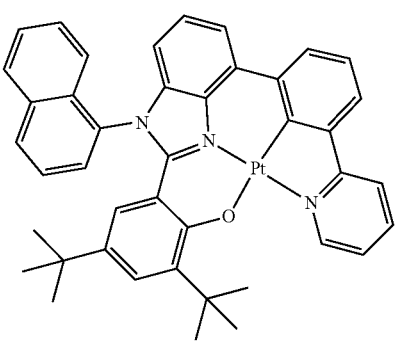
3-398
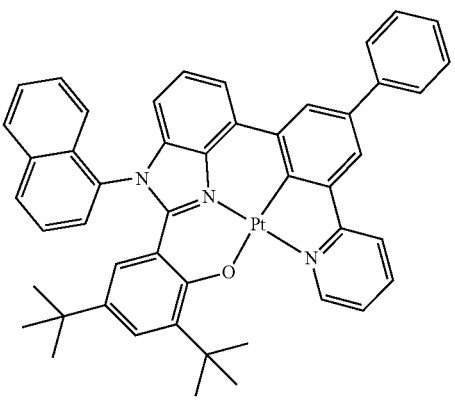
3-399
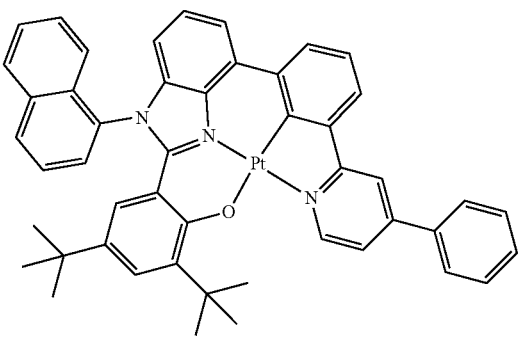

3-400
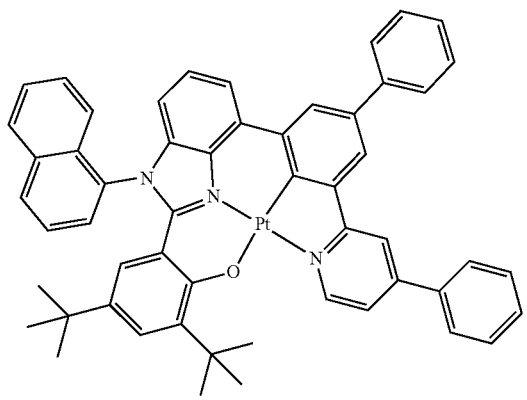
3-401
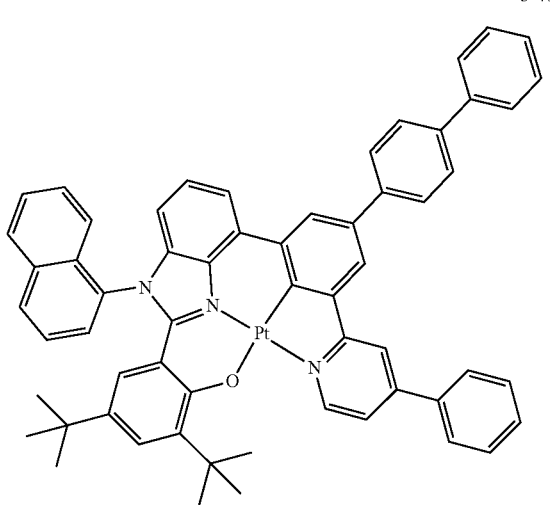
3-402
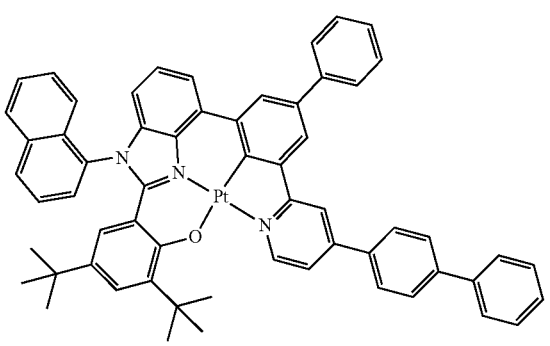
3-403
3-404
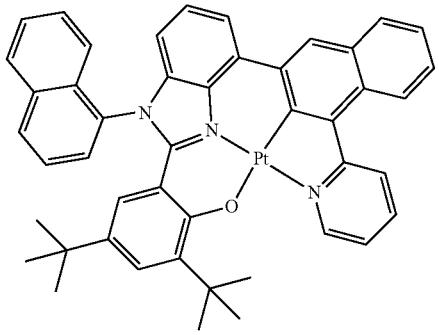
3-405
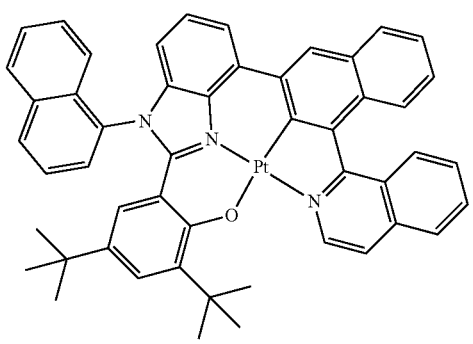
3-406
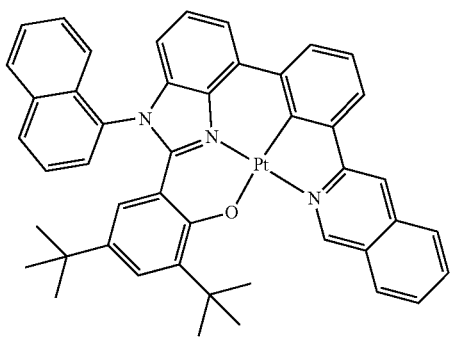
3-407
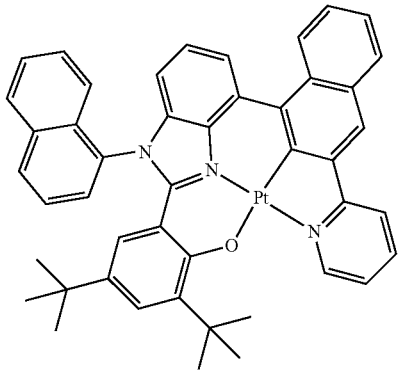

-continued
3-408
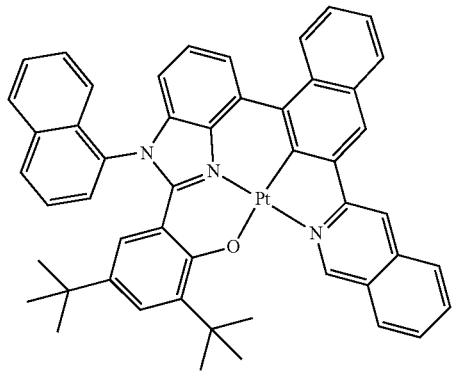
3-409
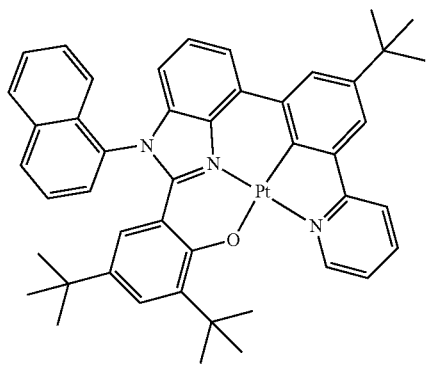
3-410
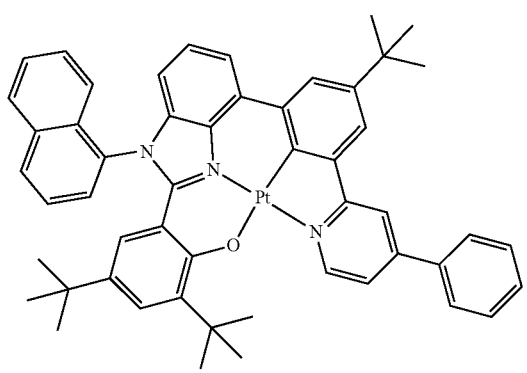
3-411
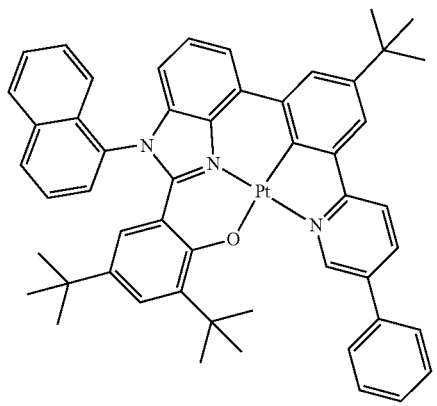
-continued
3-412
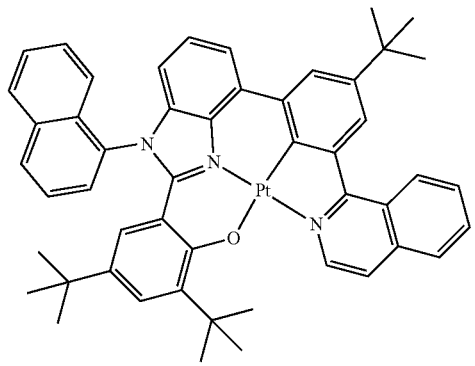
3-413
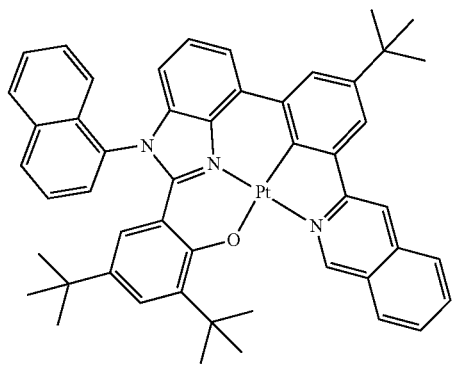
3-414
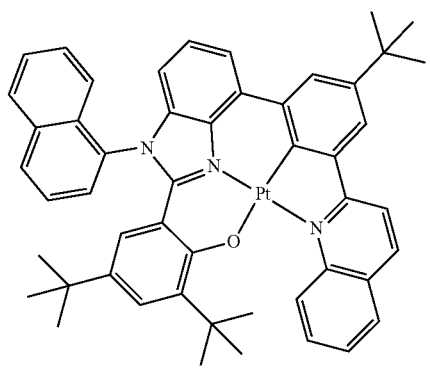
3-415
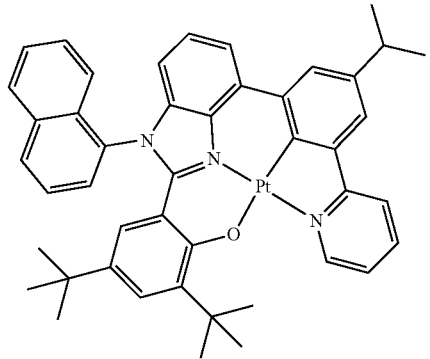

-continued
3-416
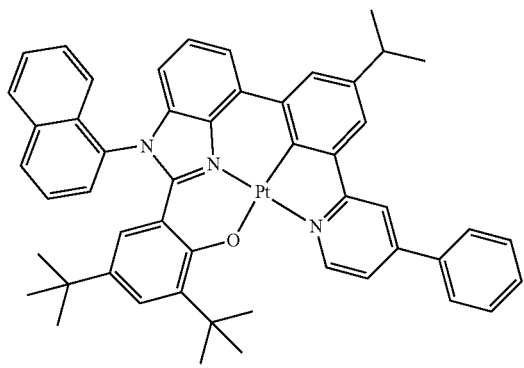
3-417
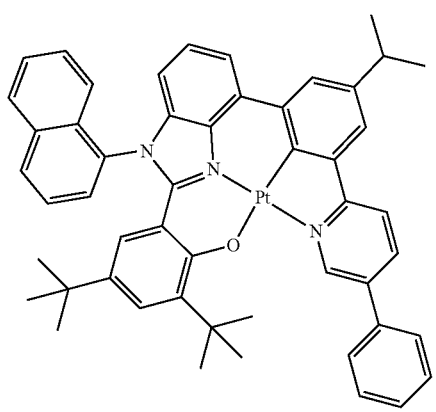
3-418
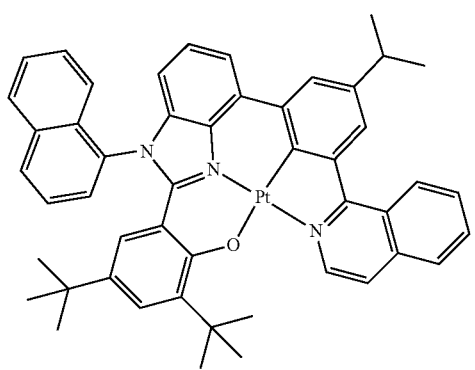
3-419
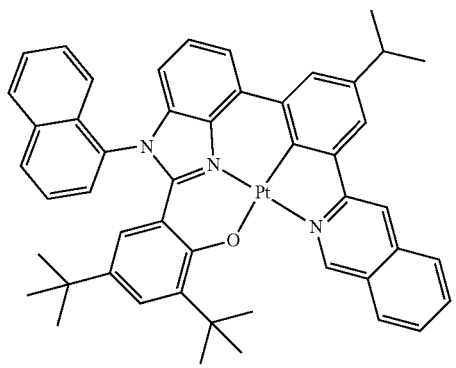
-continued
3-420
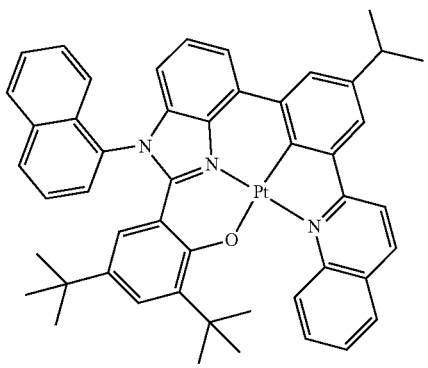
3-421
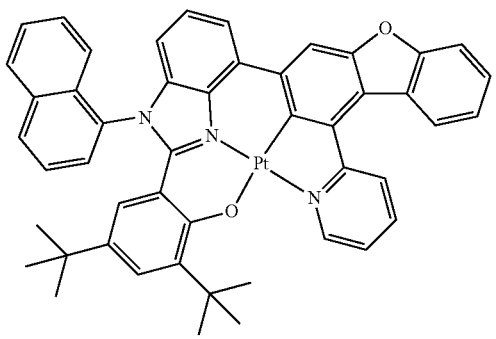
3-422
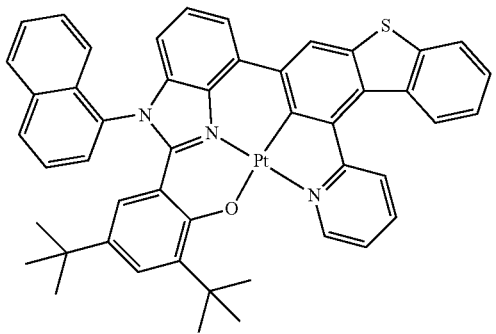
3-423
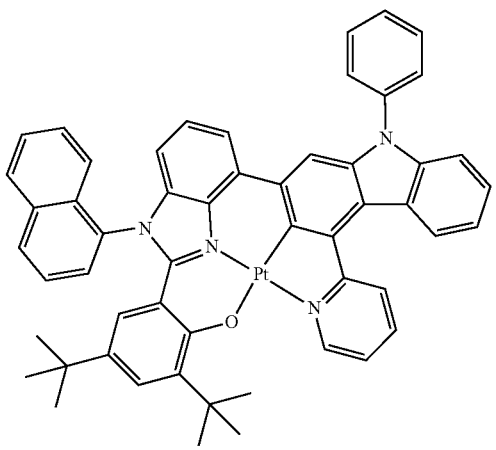

3-424
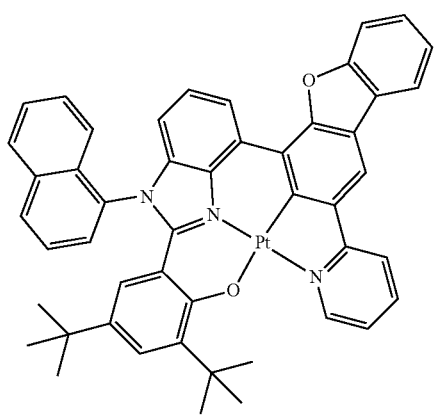
3-425
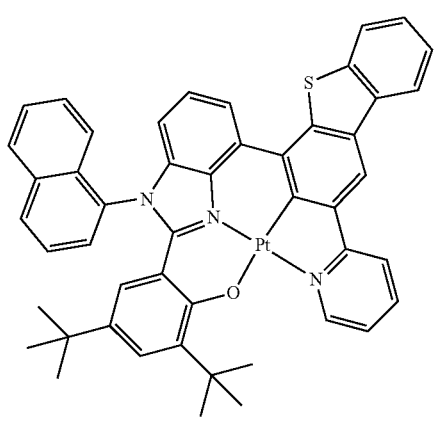
3-426
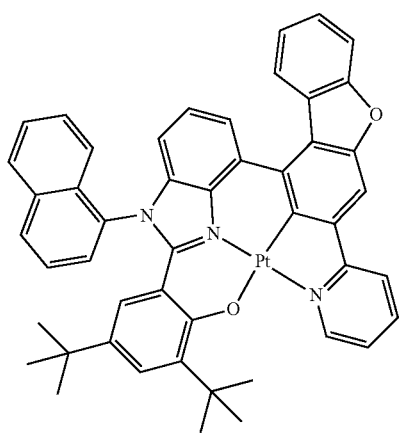
3-427
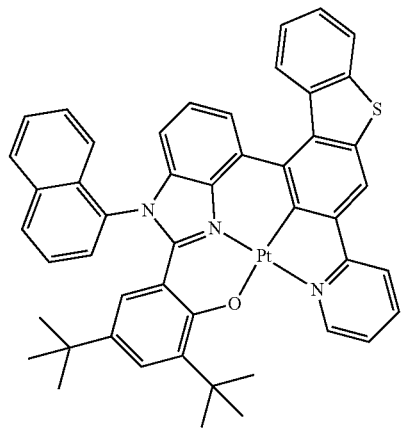
3-428
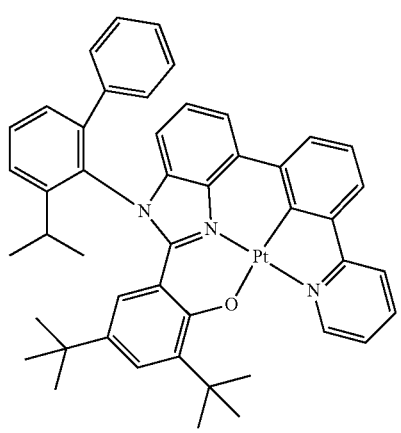
3-429
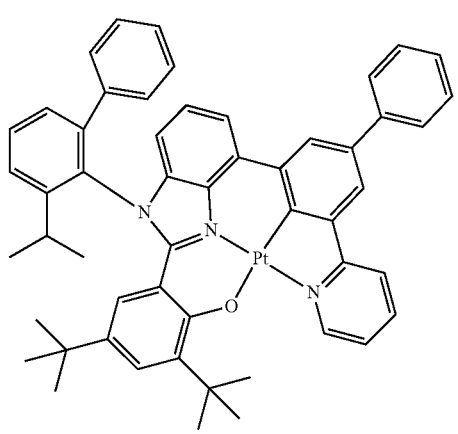

3-430
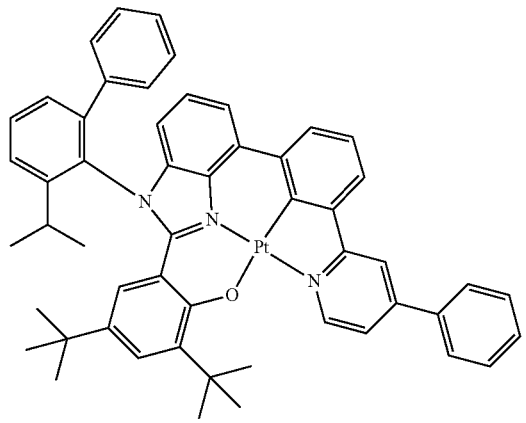
3-433
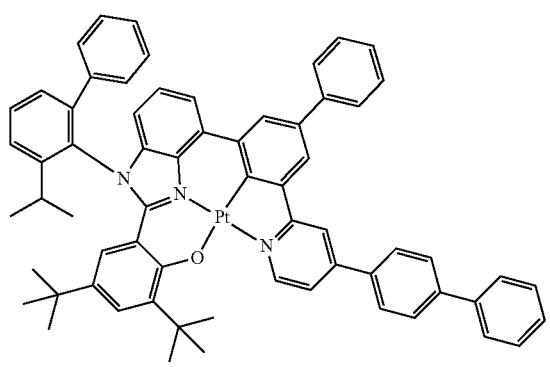
3-431
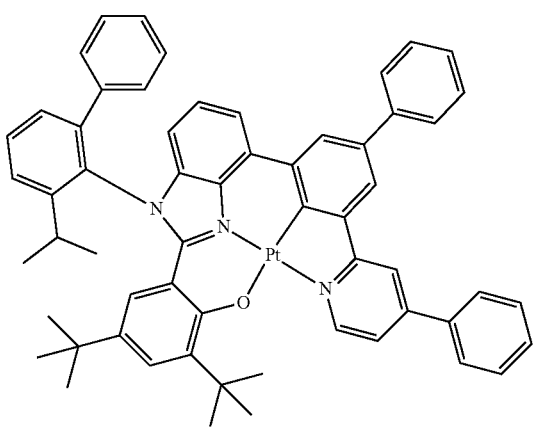
3-434
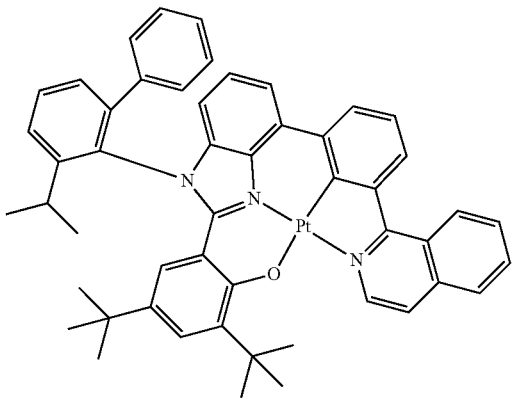
3-432
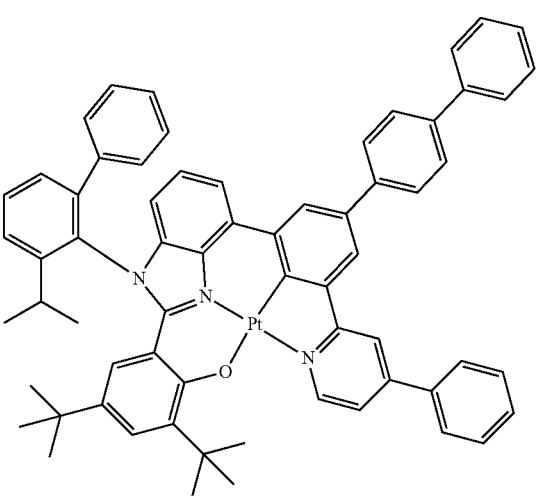
3-435
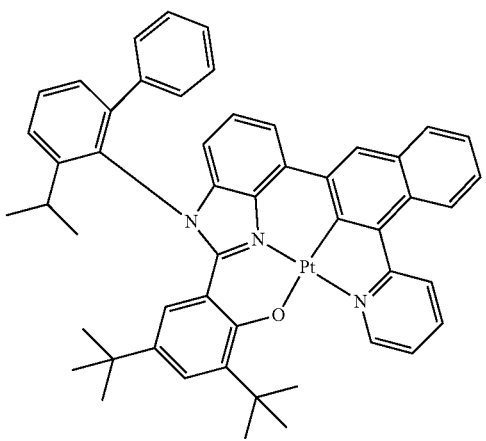

3-436
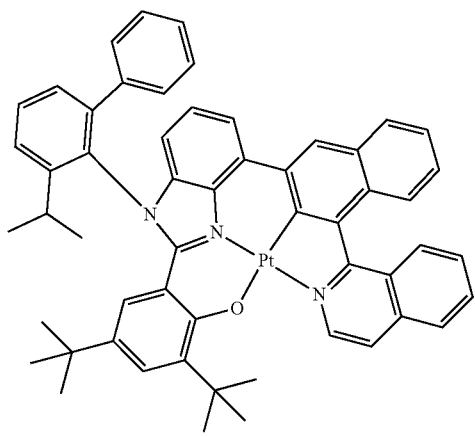
3-437
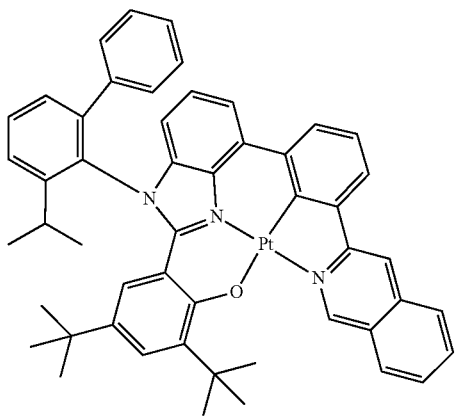
3-438
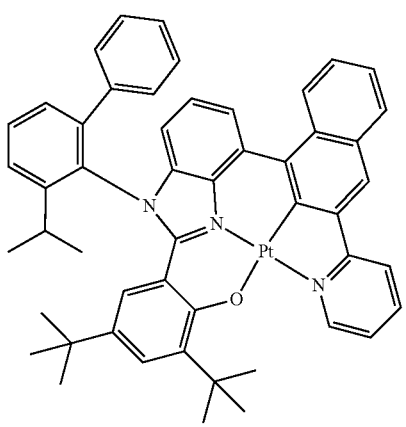
3-439
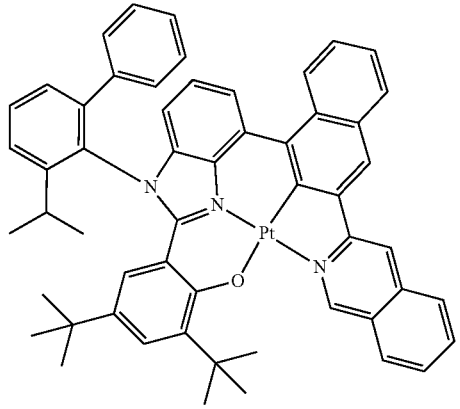
3-440
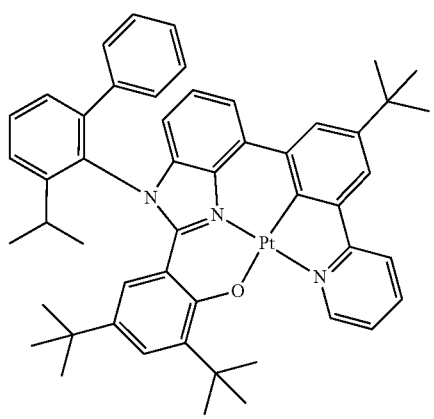
3-441
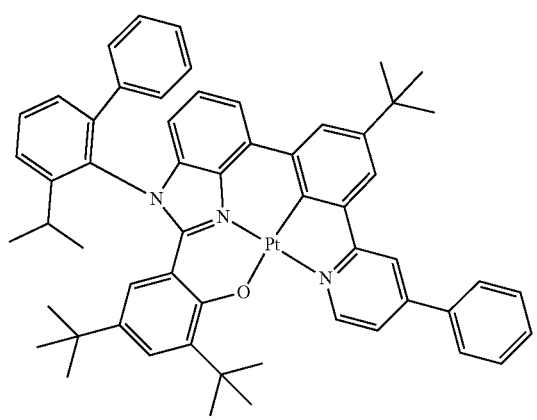

3-442
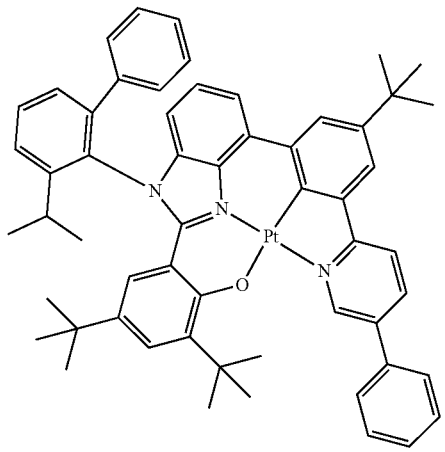
3-443
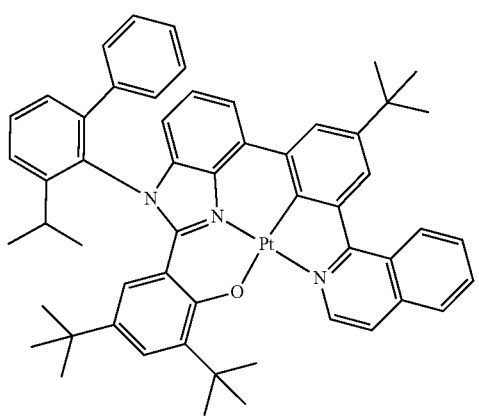
3-444
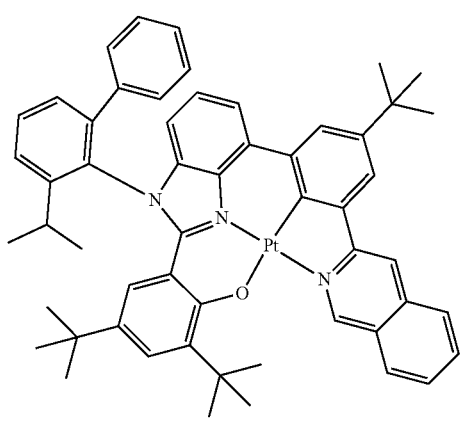
3-445
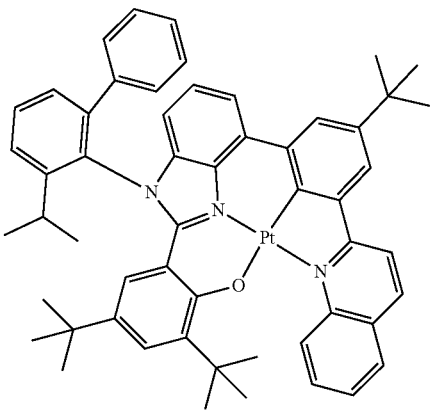
3-446
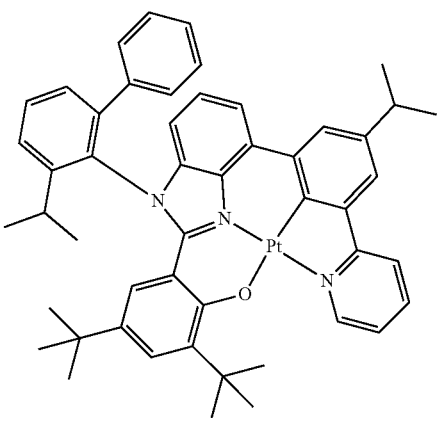
3-447
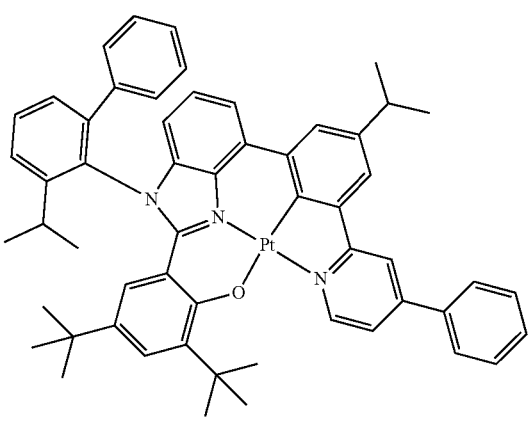

3-448
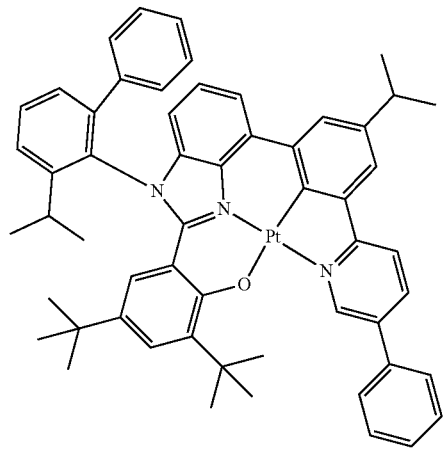
3-451
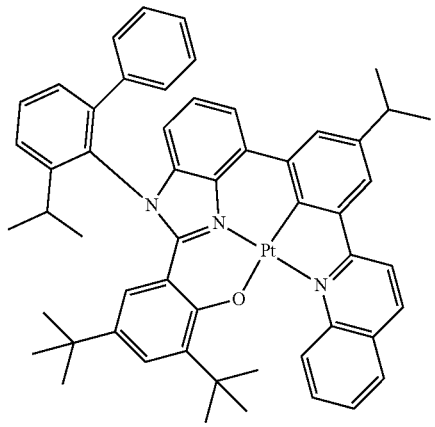
3-449
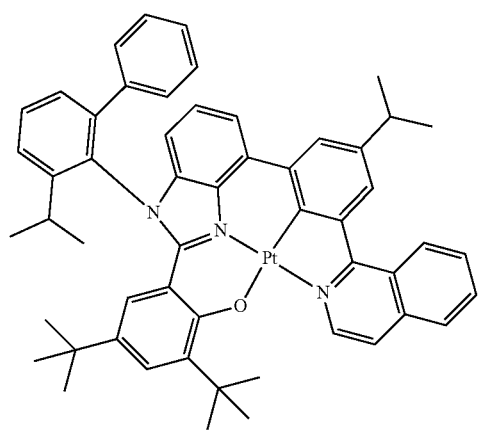
3-452
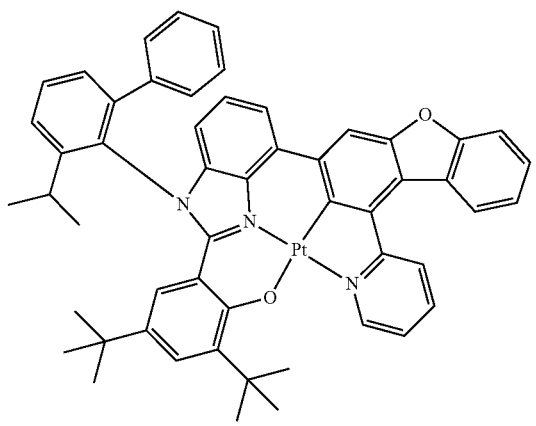
3-450
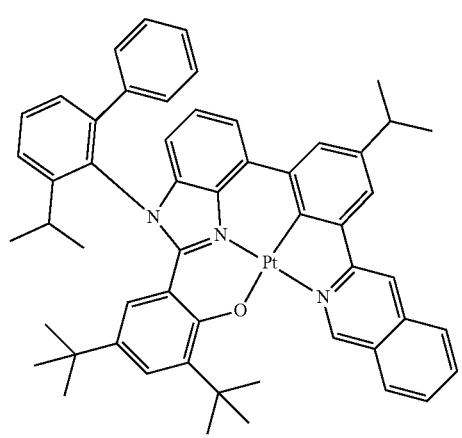
3-453
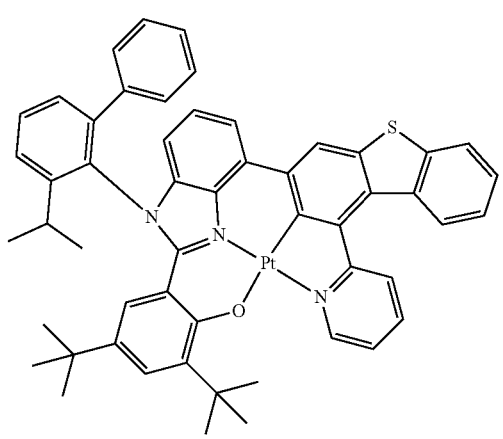

3-454
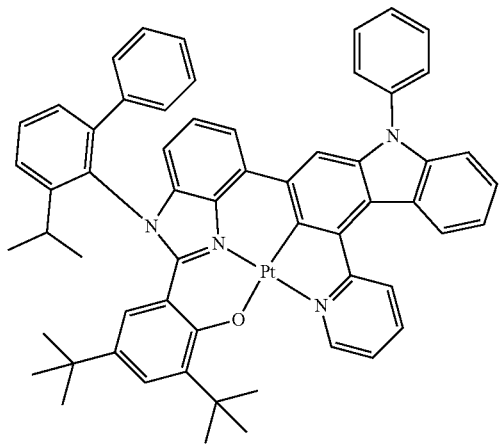
3-455
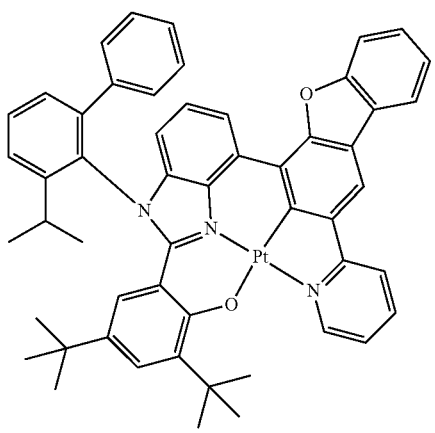
3-456
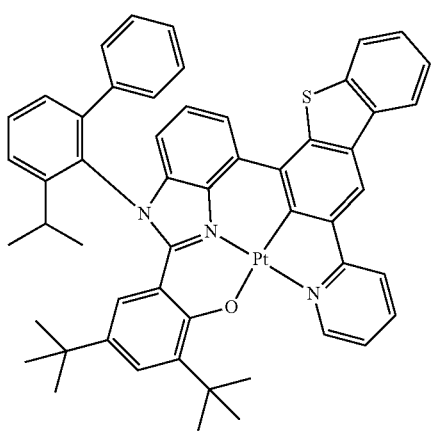
3-457
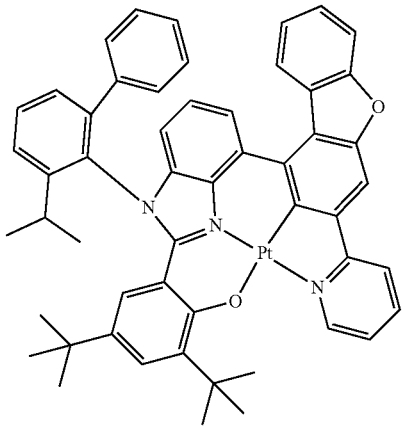
3-458
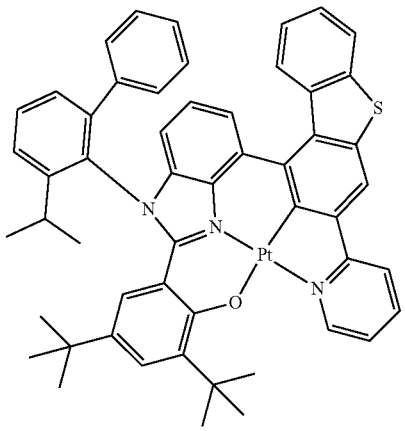
3-459
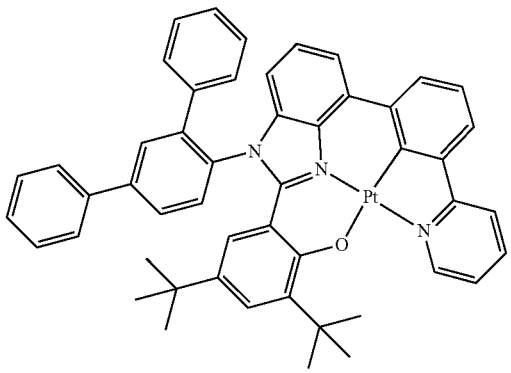

3-460
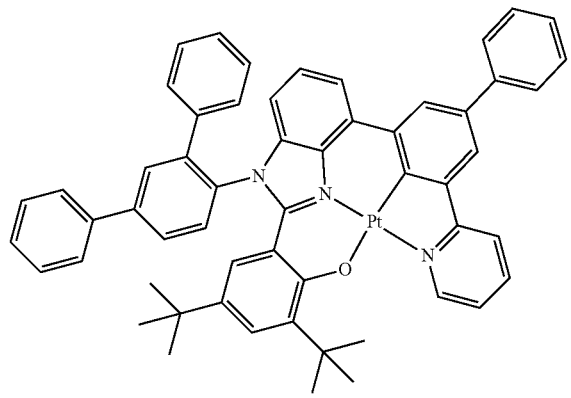
3-461
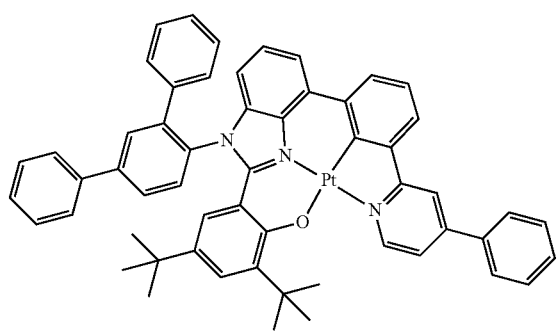
3-462
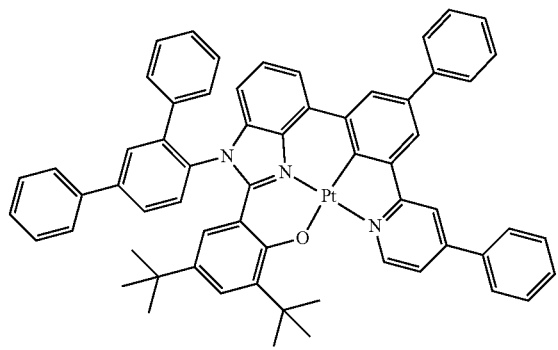
3-463
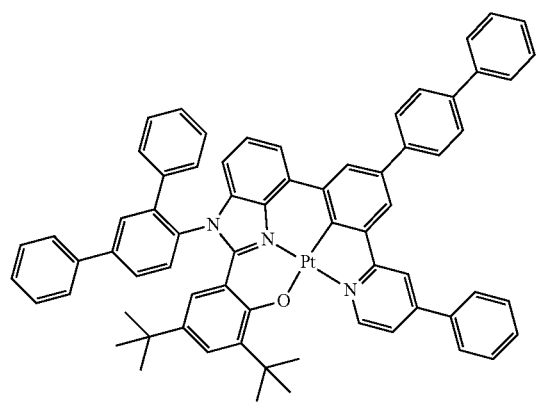
3-464
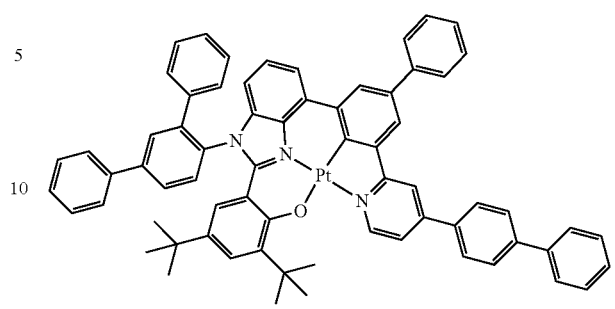
3-465
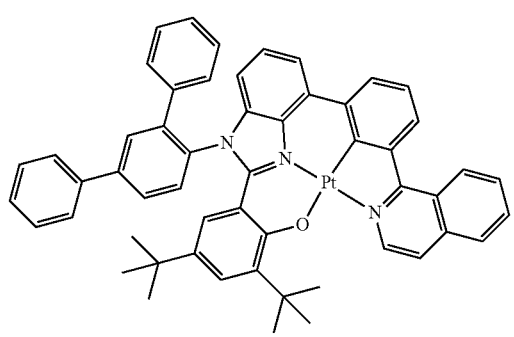
3-466
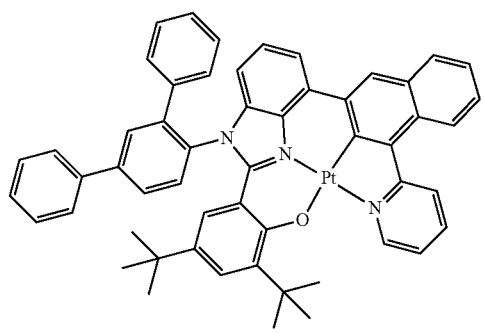
3-467
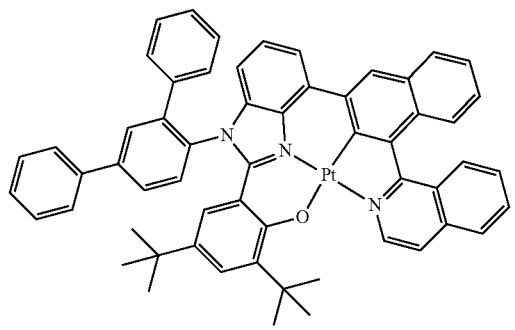

3-468
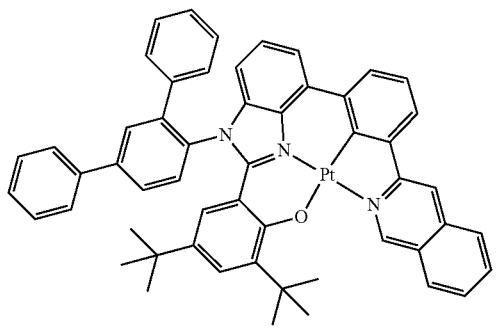
3-469
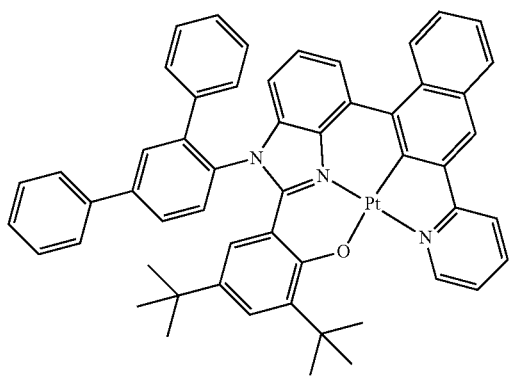
3-470
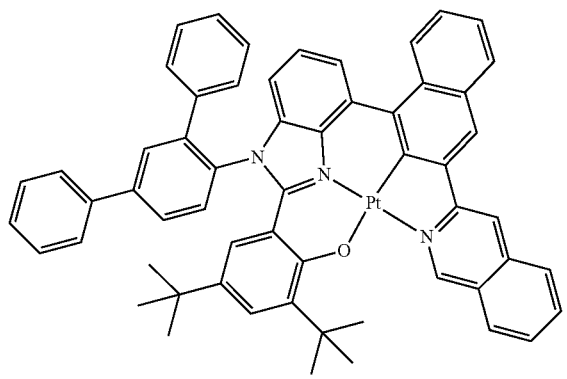
3-471
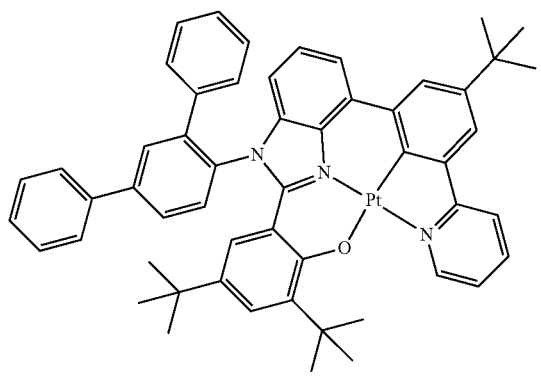
3-472
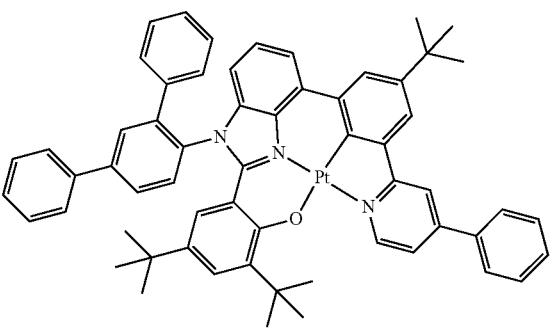
3-473
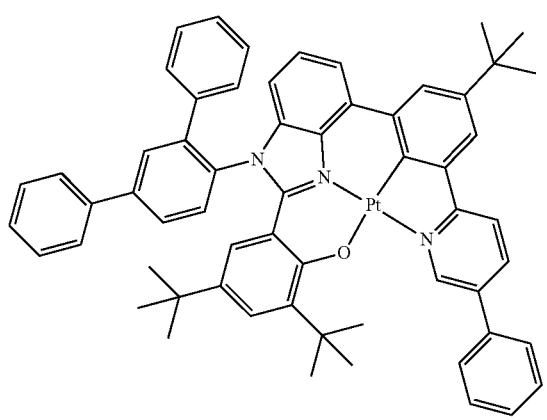
3-474
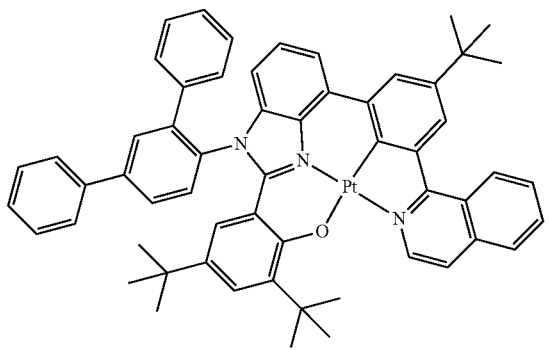
3-475
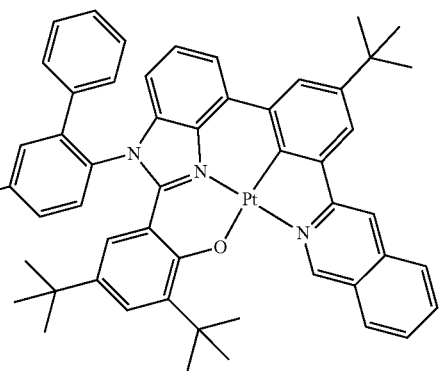

3-476
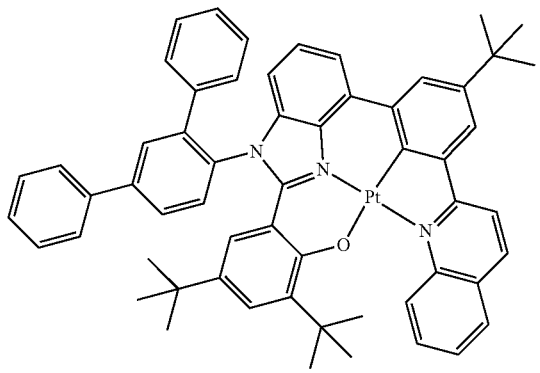
3-477
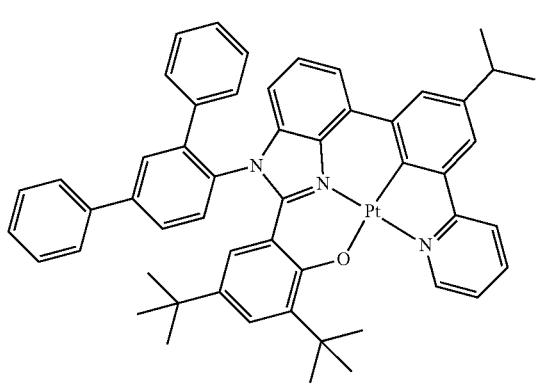
3-478
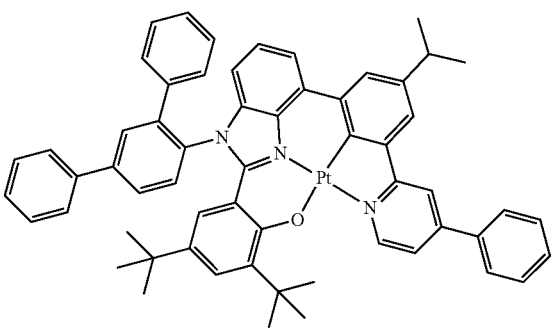
3-479
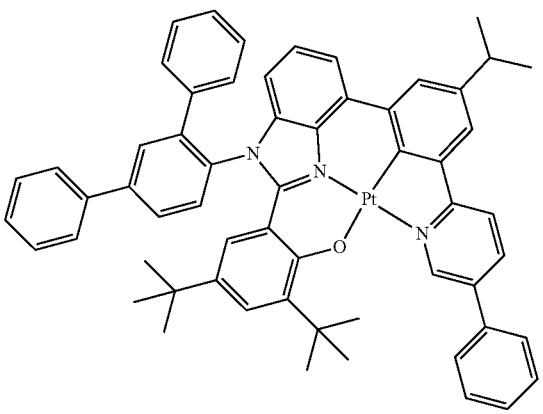
3-480
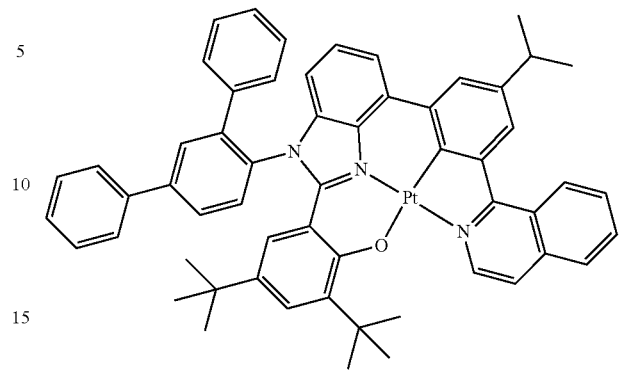
3-481
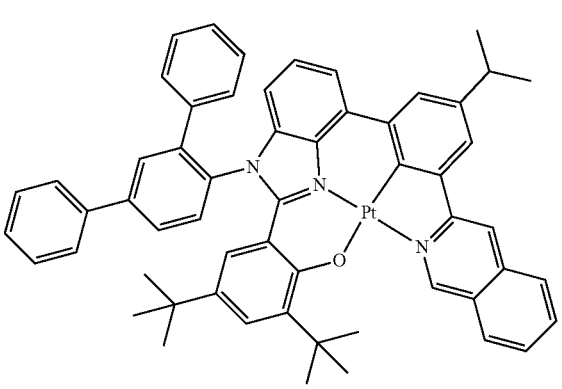
3-482
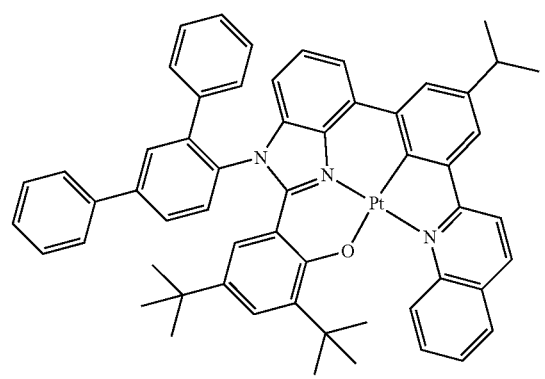
3-483
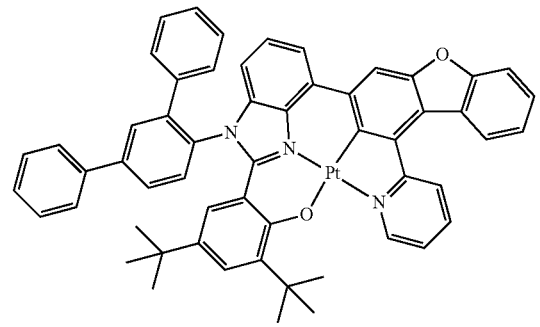

3-484
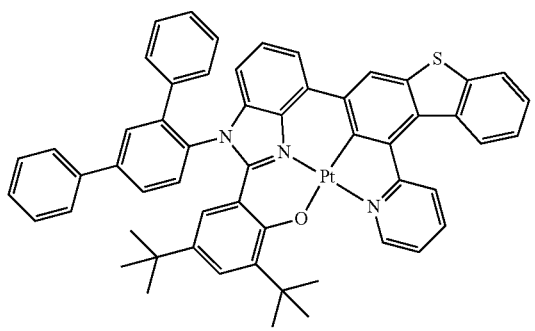
3-487
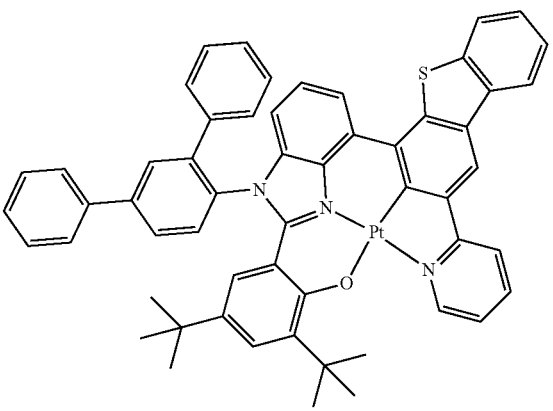
3-485
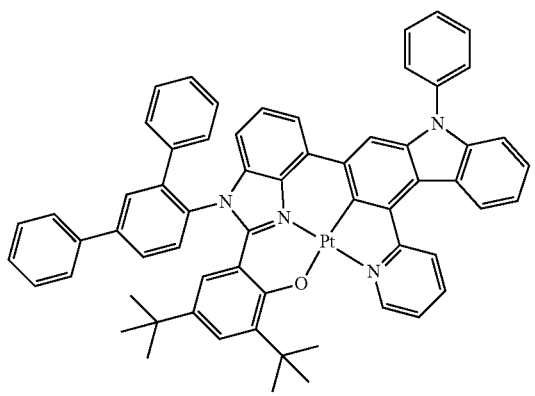
3-488
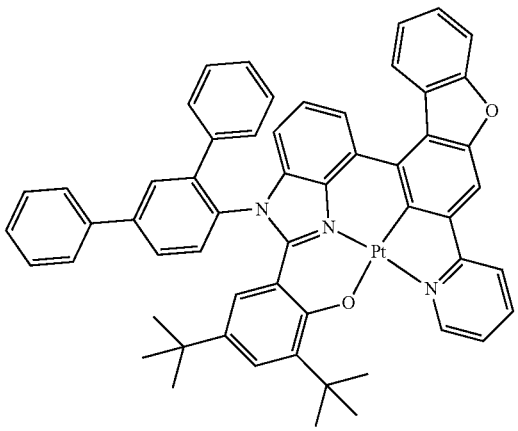
3-486
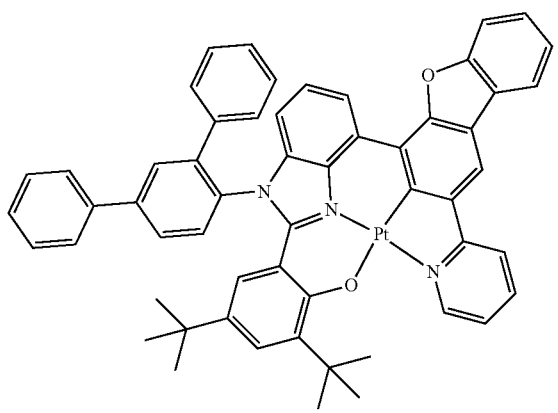
3-489
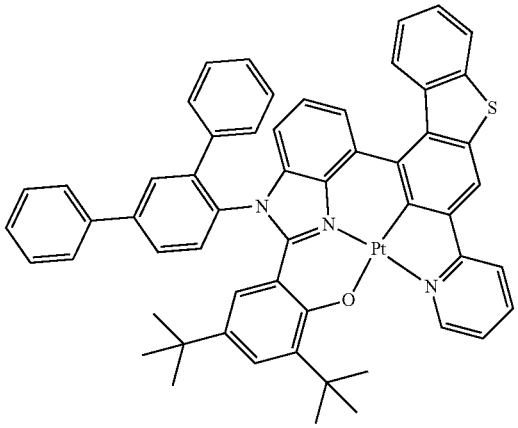

3-490
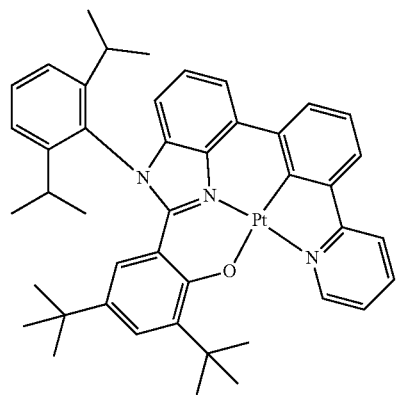
3-491
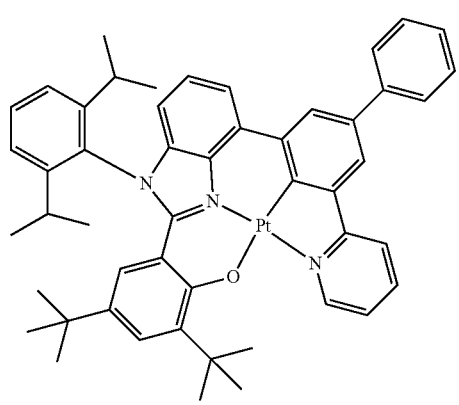
3-492
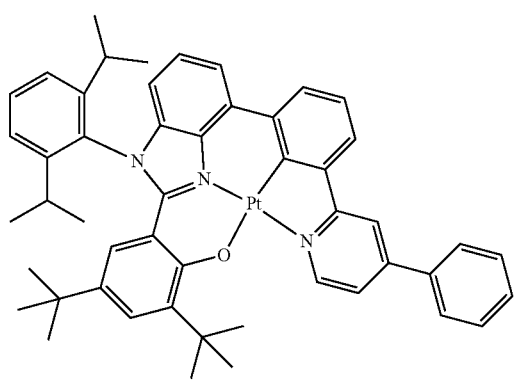
3-493
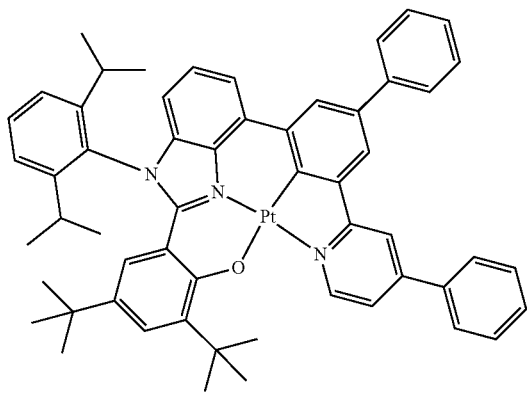
3-494
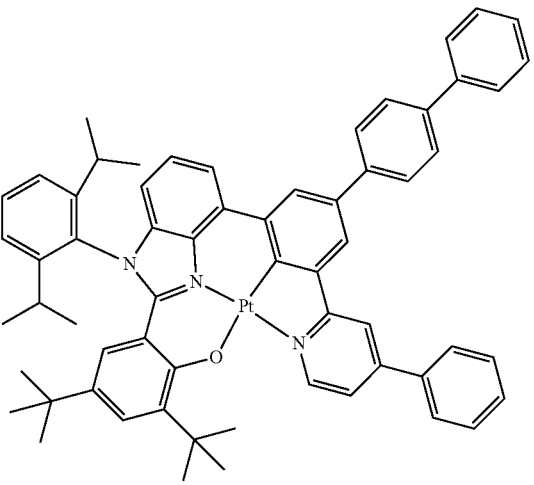
3-495
3-496
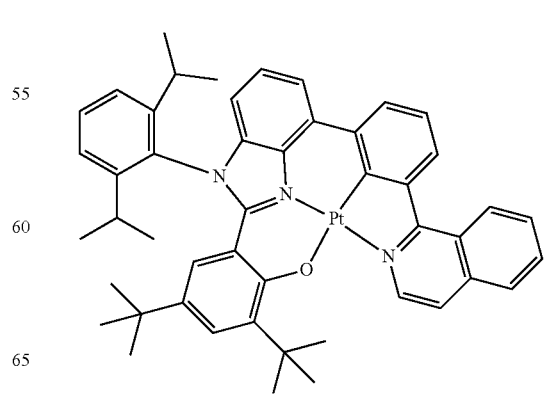

-continued
3-497
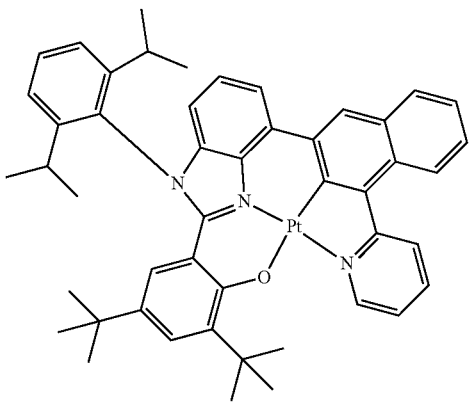
3-498
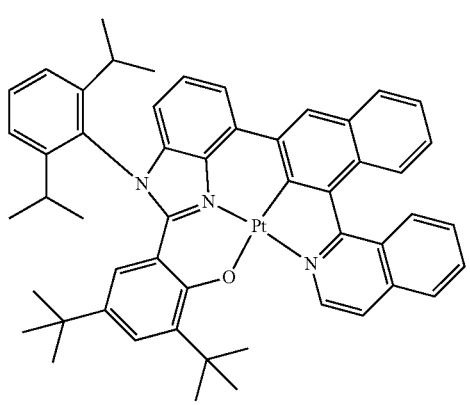
3-499
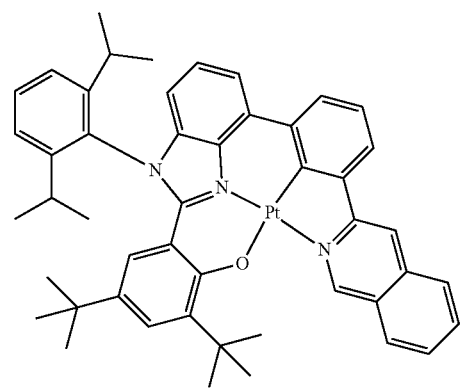
3-500
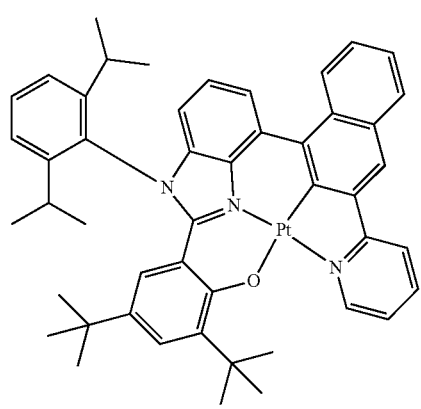
-continued
3-501
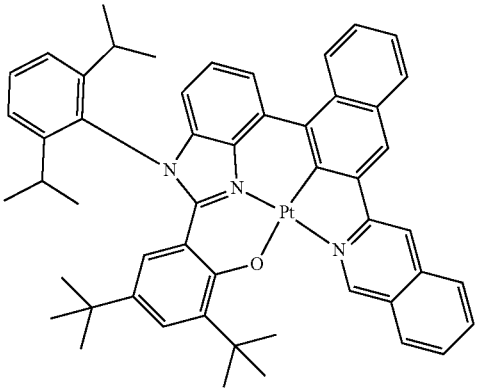
3-502
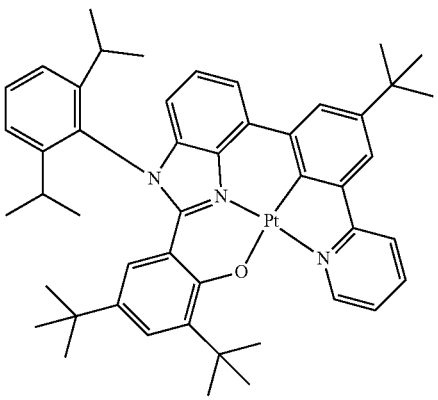
3-503
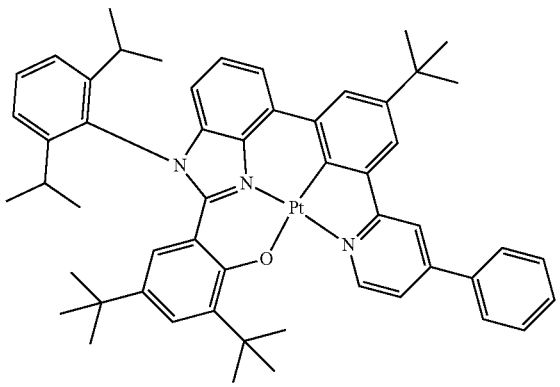
3-504
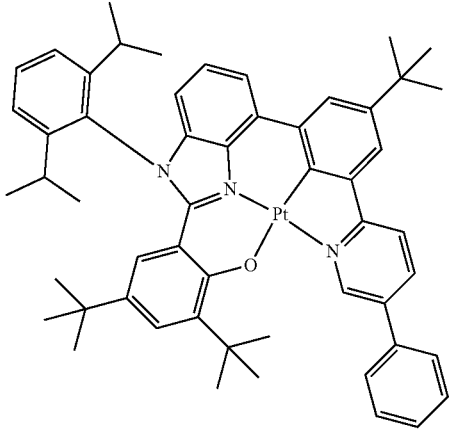

-continued
3-505
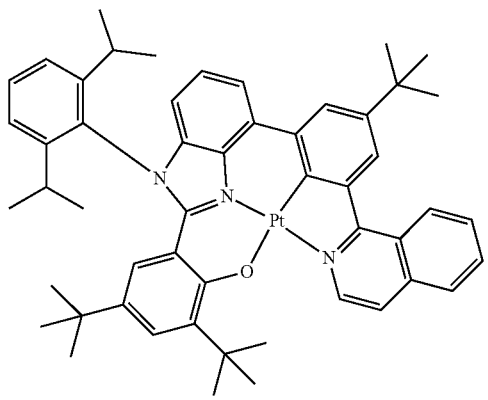
3-506
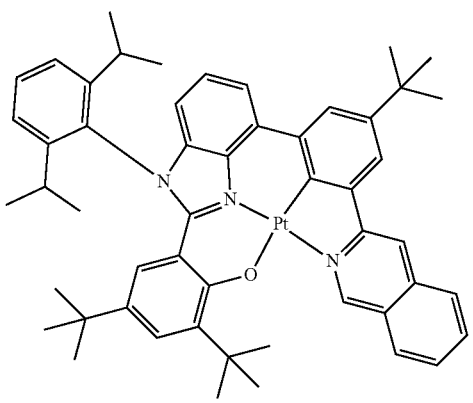
3-507
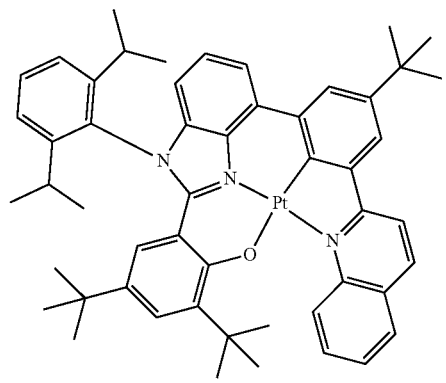
3-508
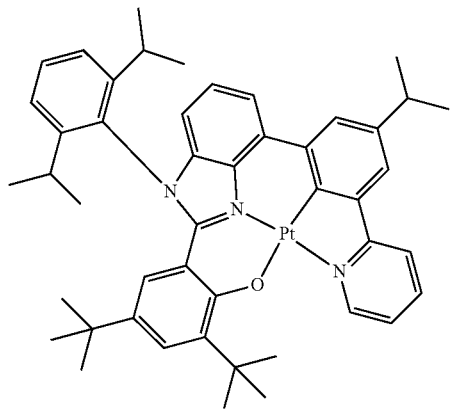
-continued
3-509
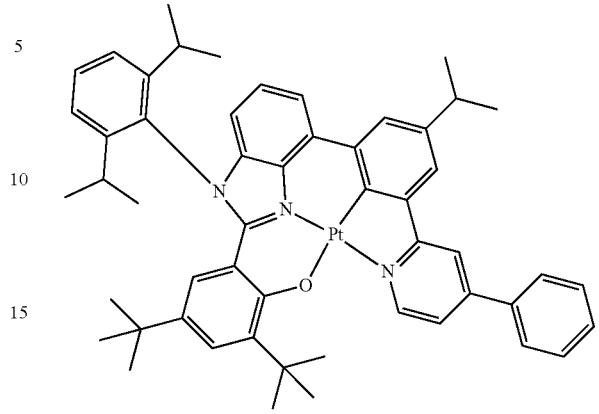
3-510
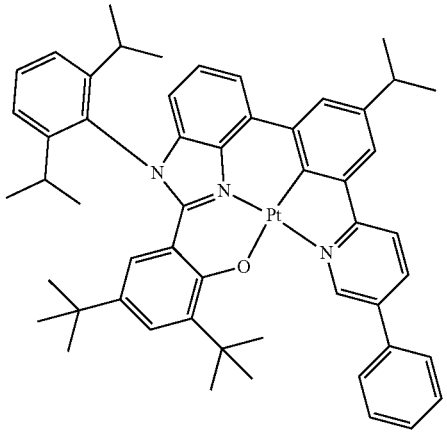
3-511
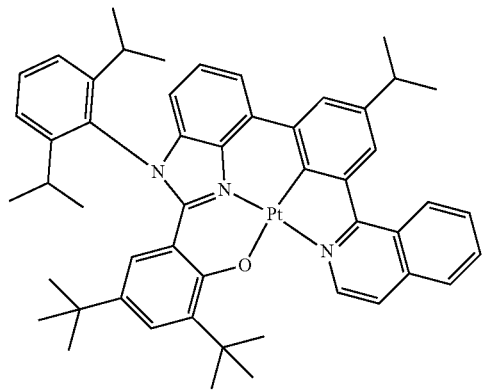

3-512
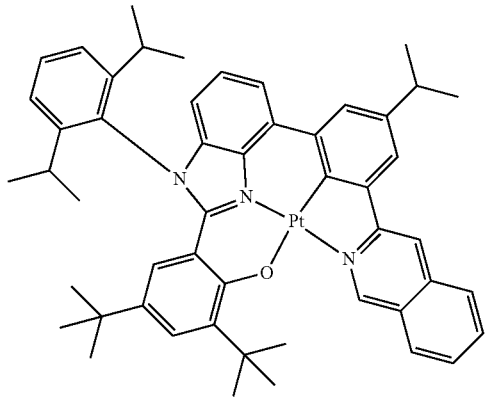
3-513
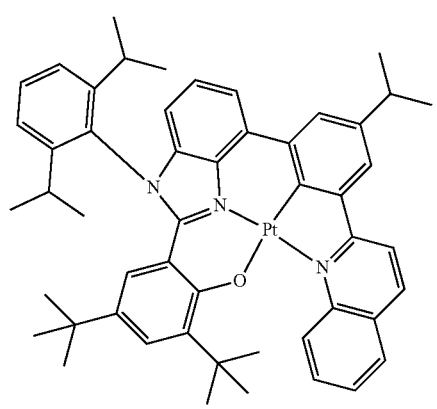
3-514
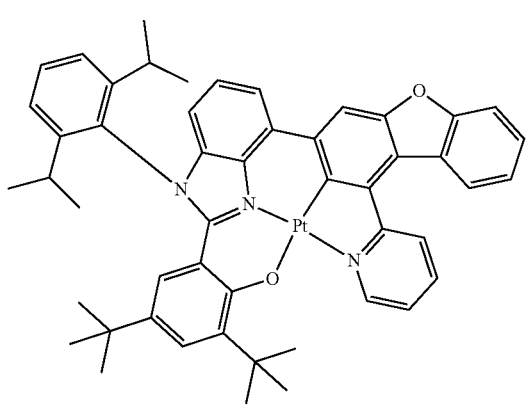
3-515
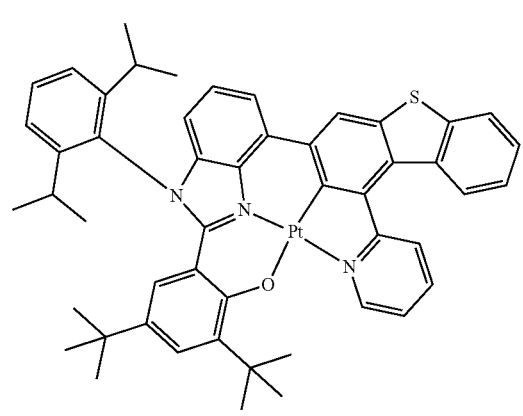
3-516
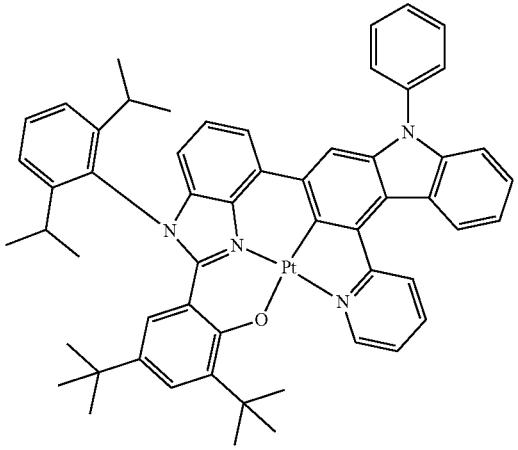
3-517
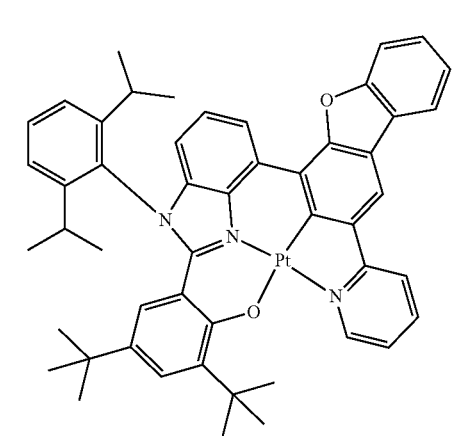
3-518
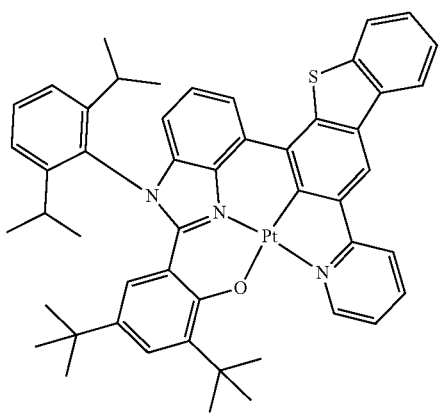

3-519
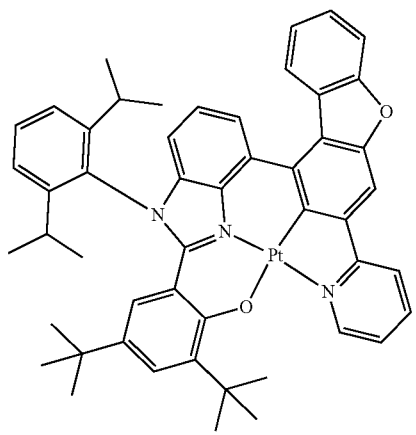
3-520
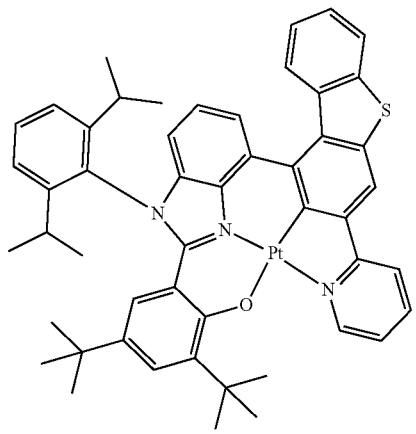
3-521
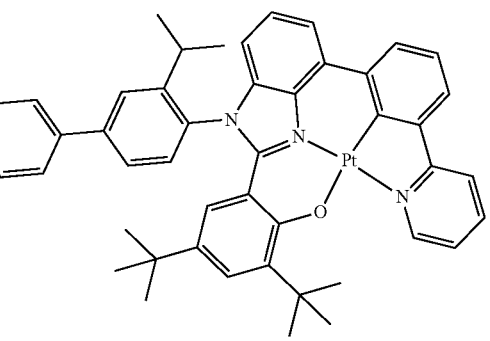
3-522
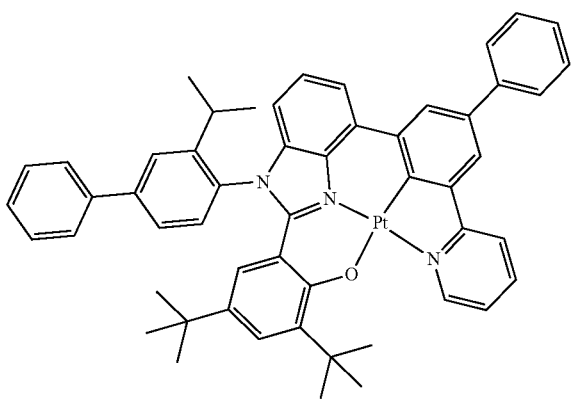
3-523
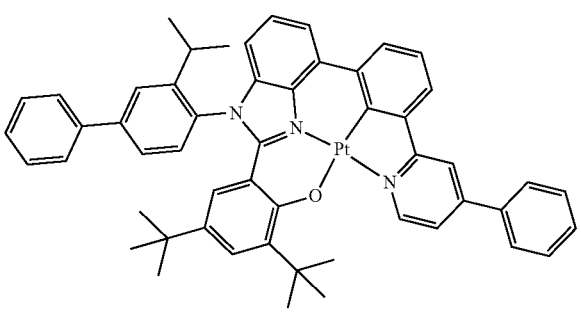
3-524
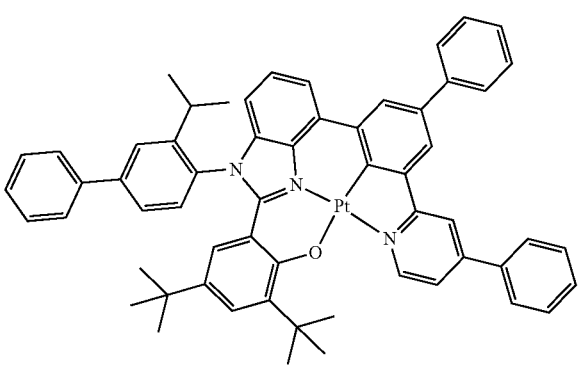
3-525
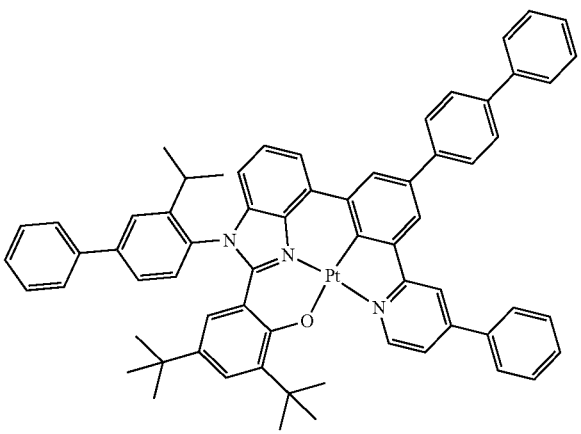
3-526
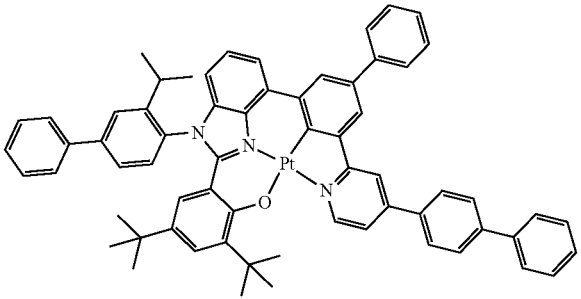

3-527
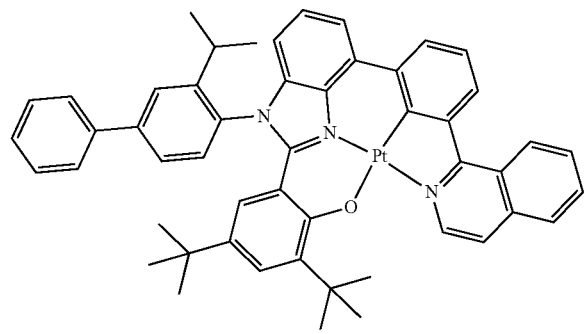
3-528
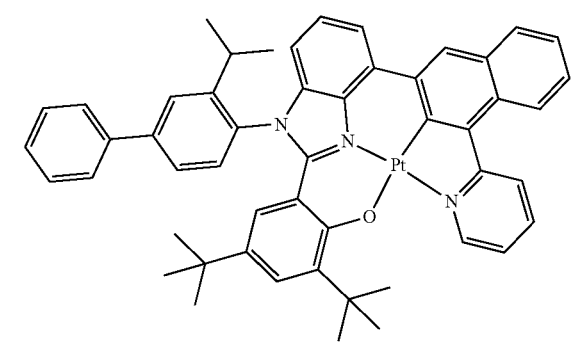
3-529
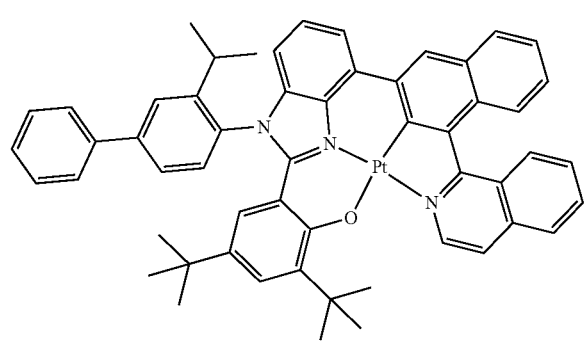
3-530
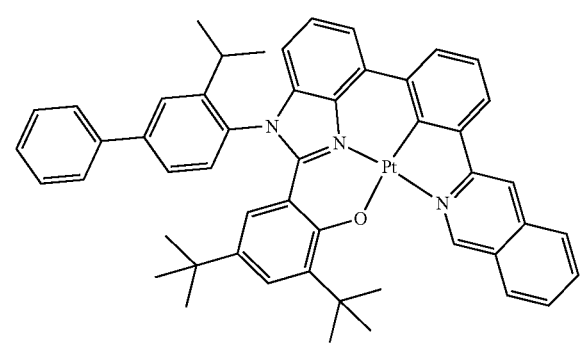
3-531
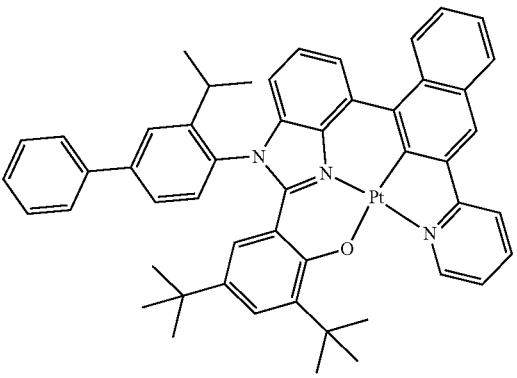
3-532
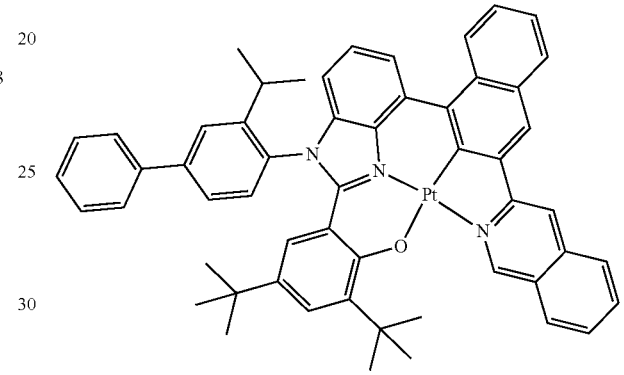
3-533
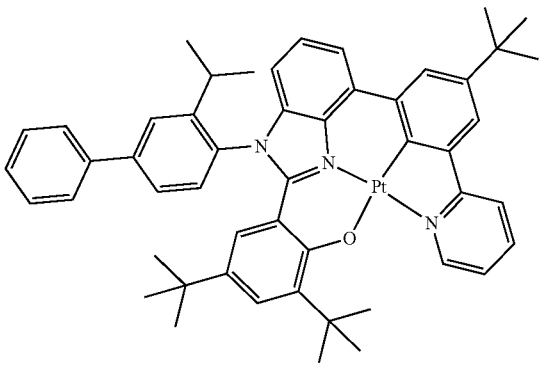
3-534
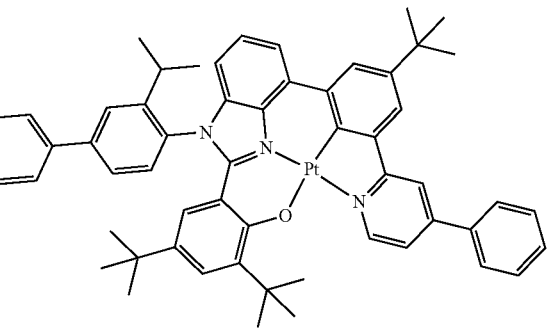

-continued
3-535
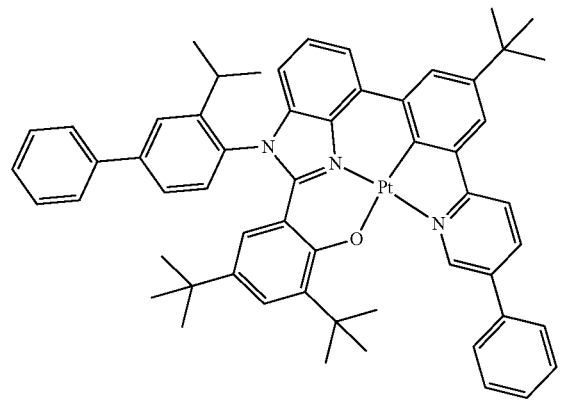
3-536
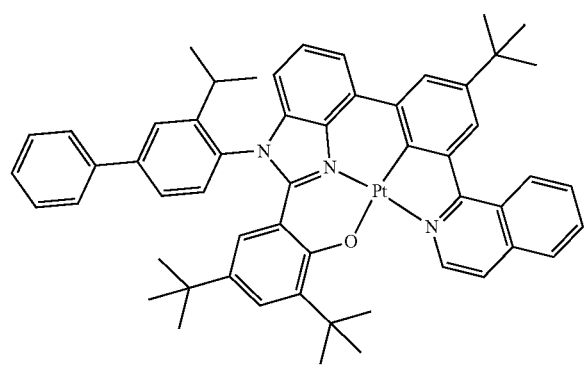
3-537
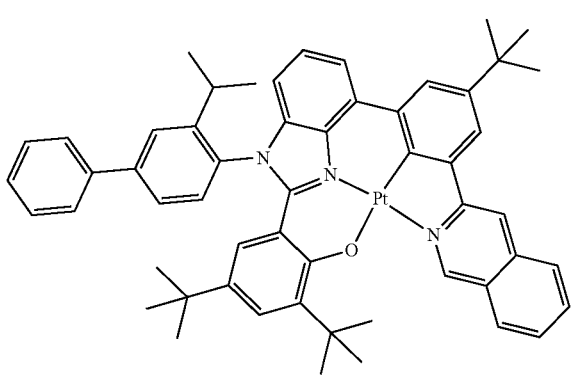
3-538
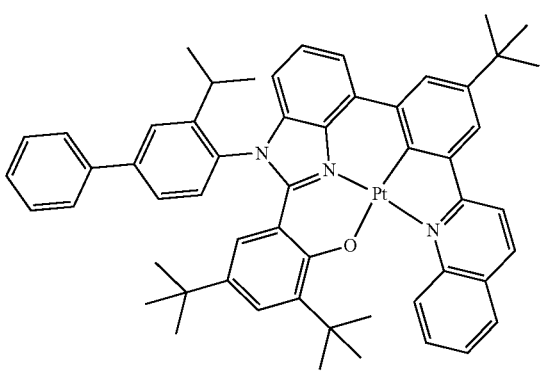
-continued
3-539
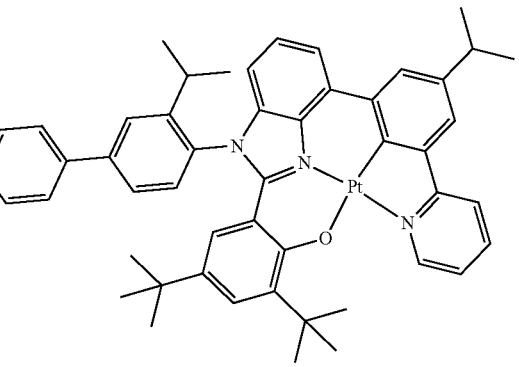
3-540
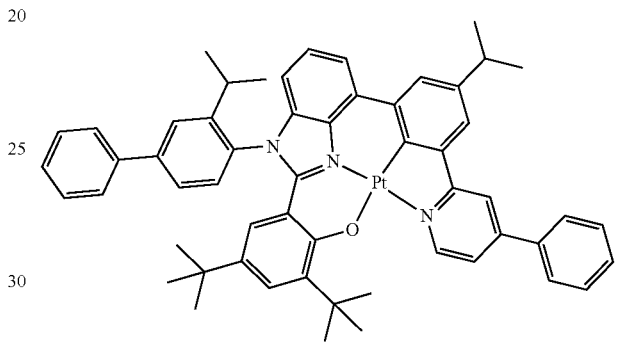
3-541
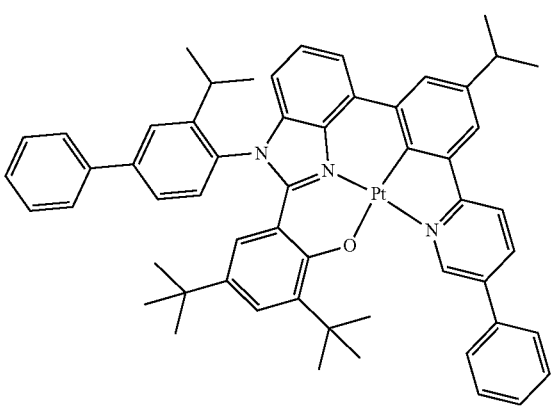
3-542
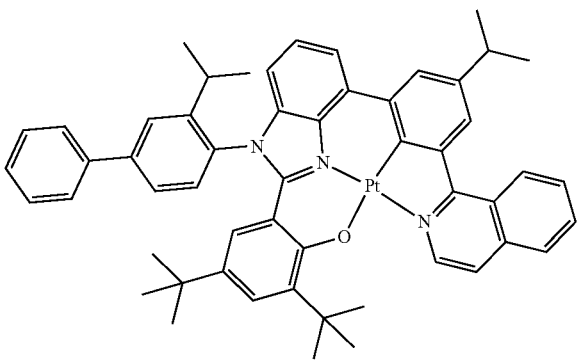

3-543
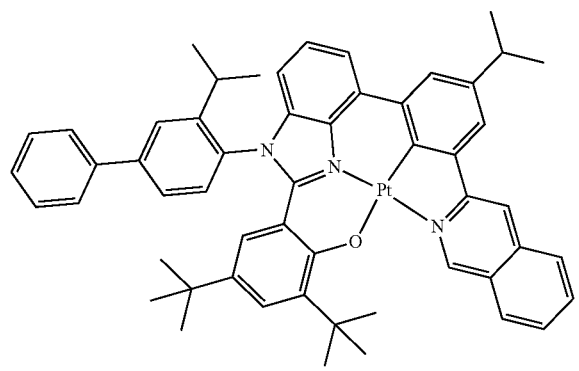
3-544
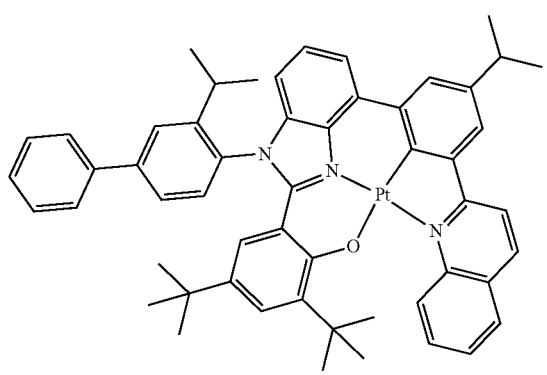
3-545
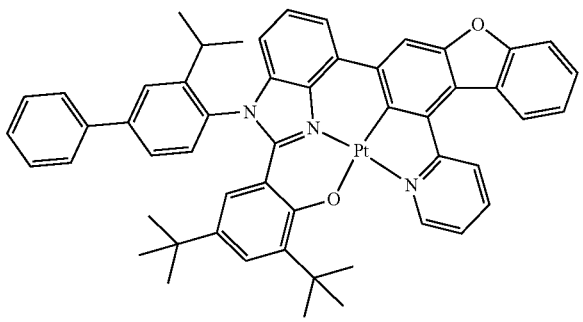
3-546
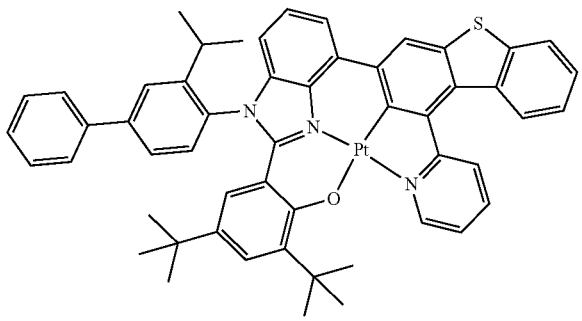
3-547
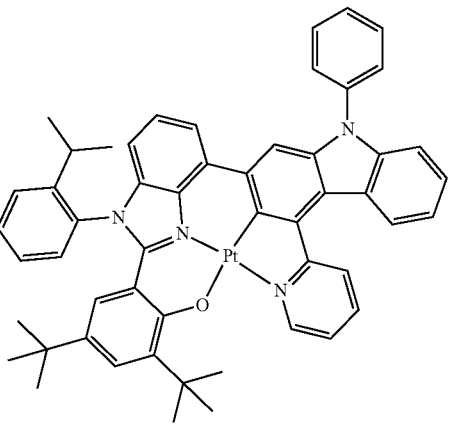
3-548
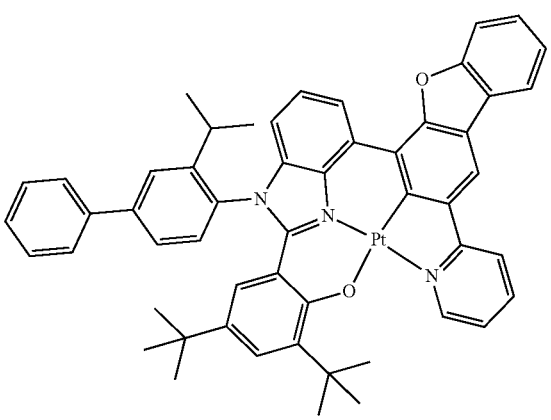
3-549
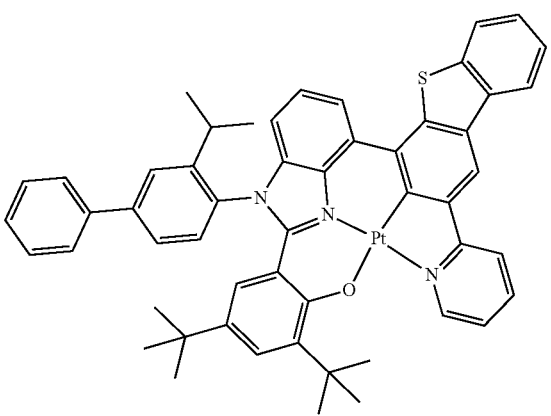

197
-continued
3-550
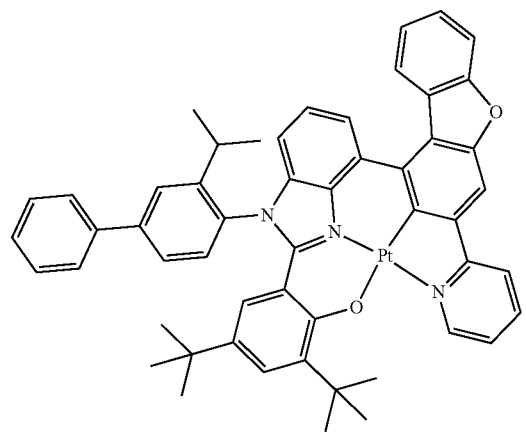
3-551
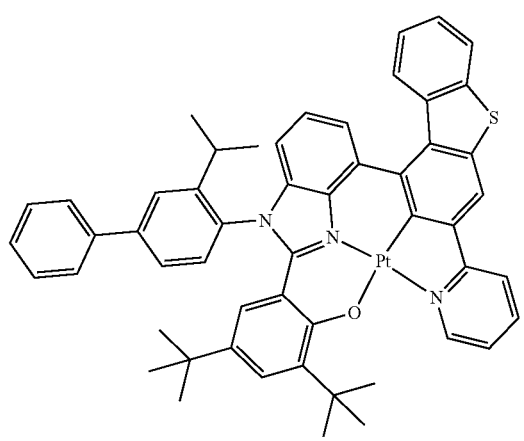
3-552
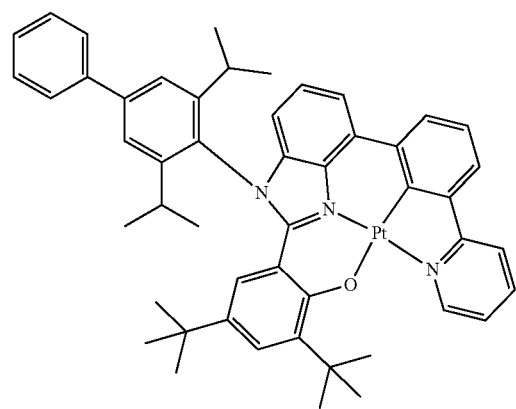
198
-continued
3-553
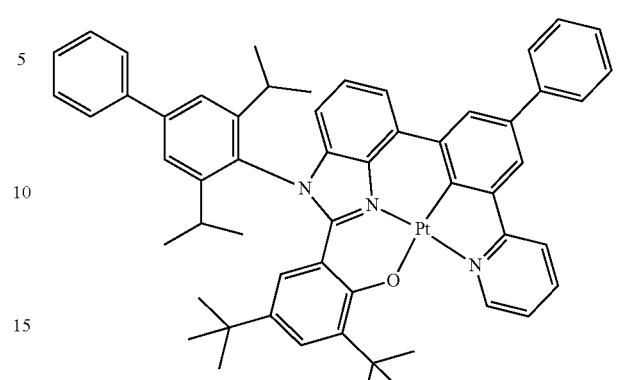
3-554
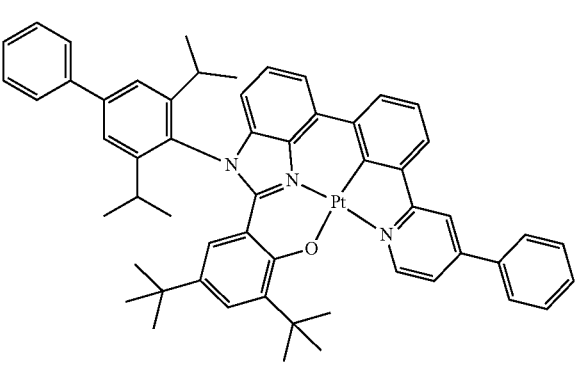
3-555
3-556
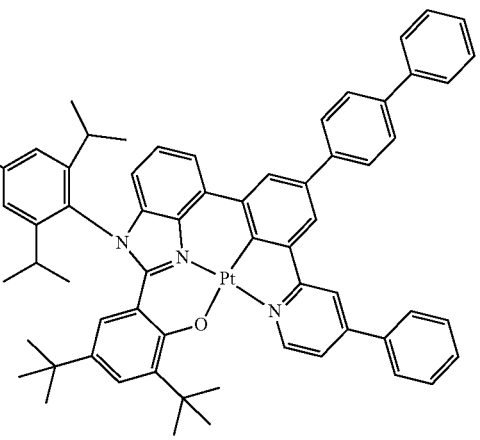

199
-continued
3-557
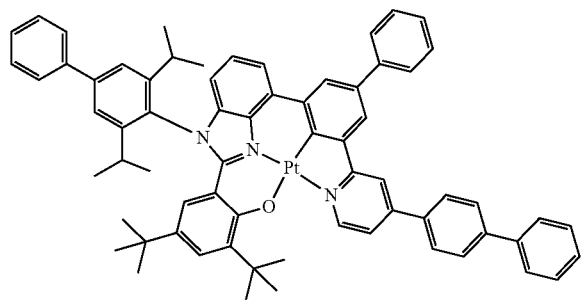
3-558
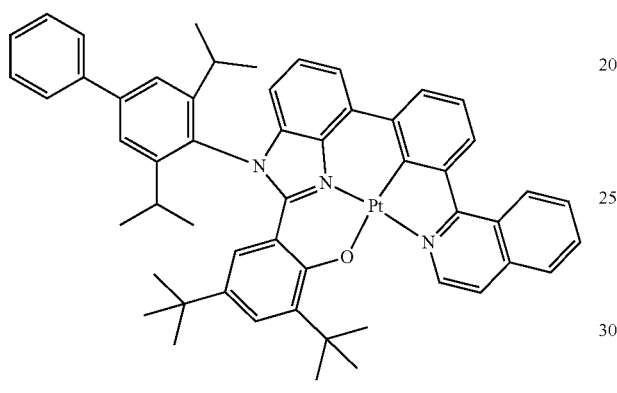
3-559
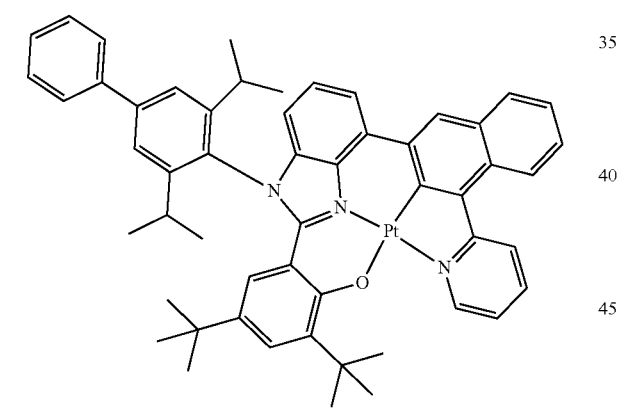
3-560
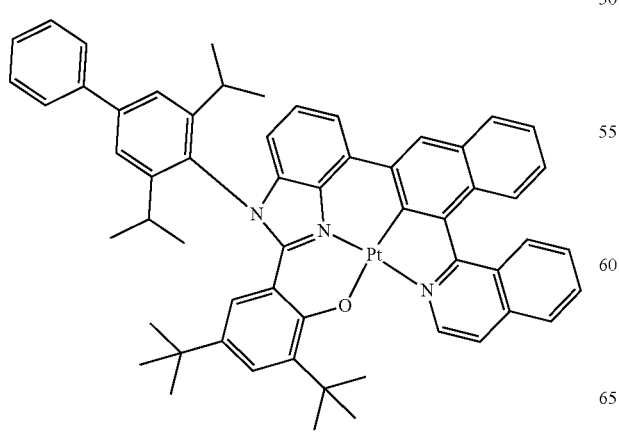
200
-continued
3-561
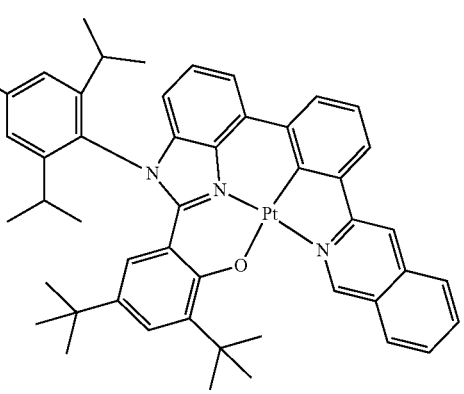
3-562
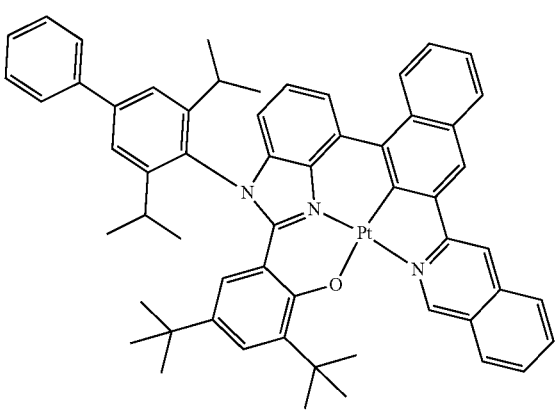
3-563

3-564
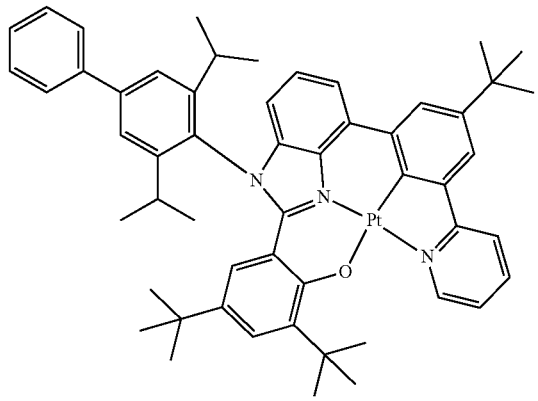
3-565
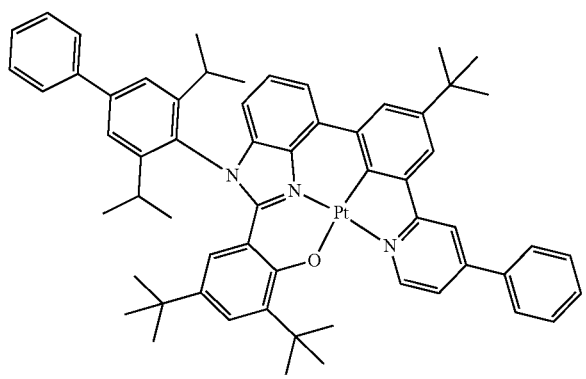
3-566
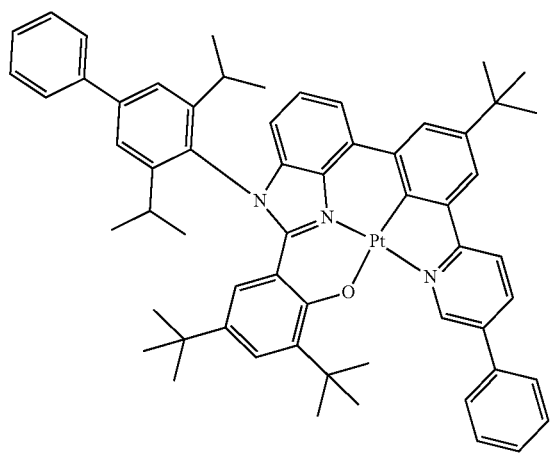
3-567
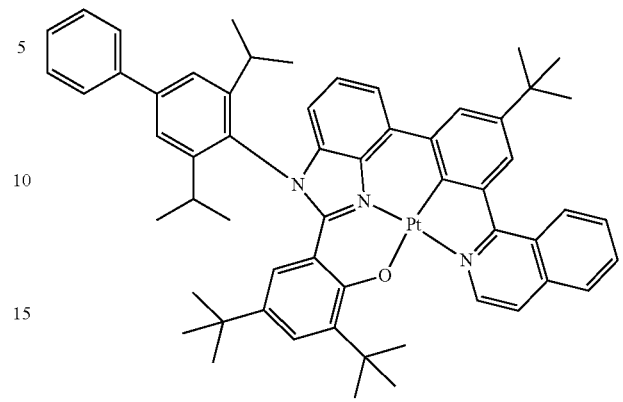
3-568
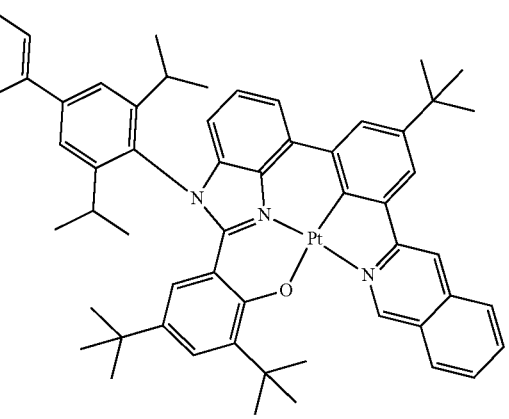
3-569
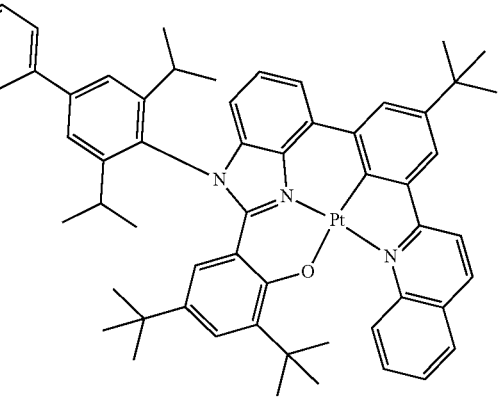

3-570
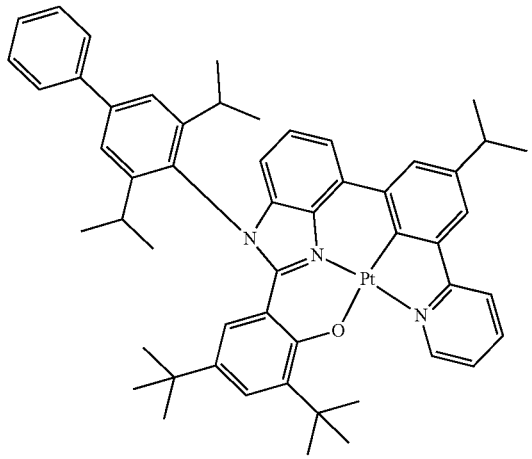
3-571
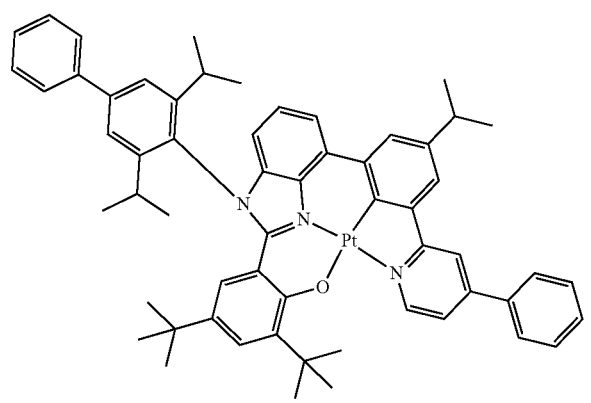
3-572
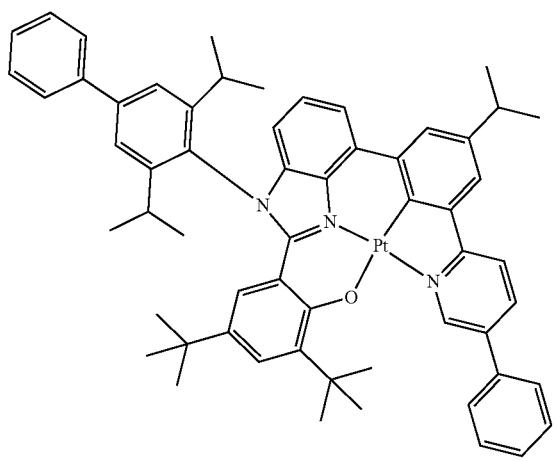
3-573
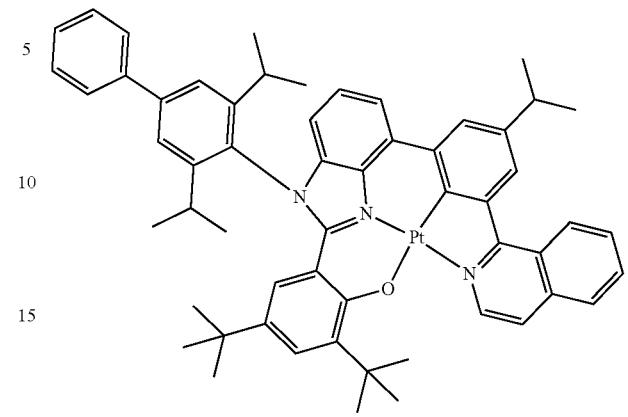
3-574
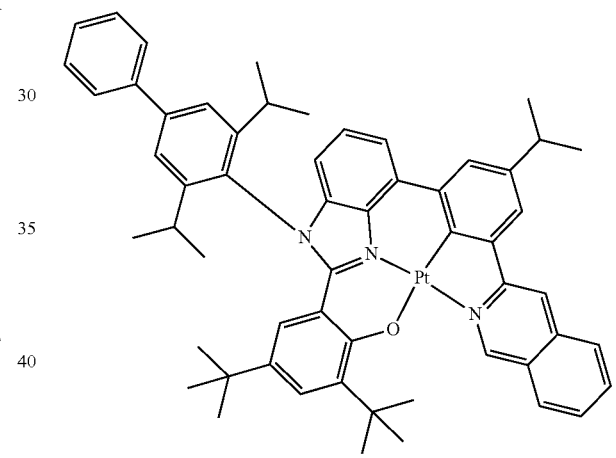
3-575
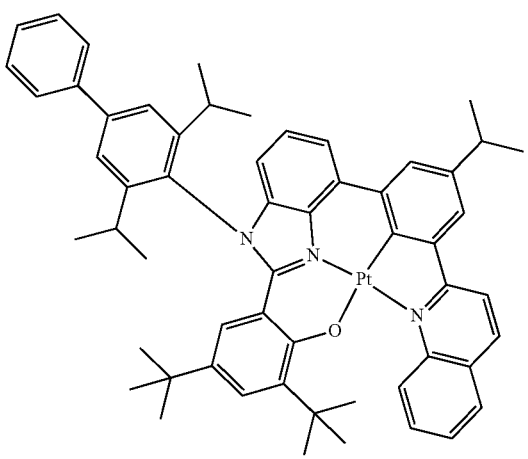

3-576
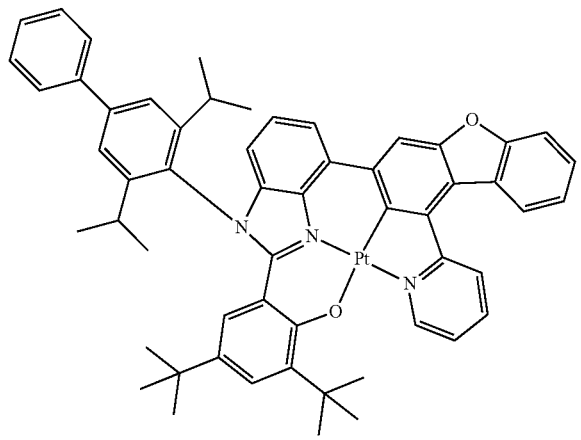
3-579
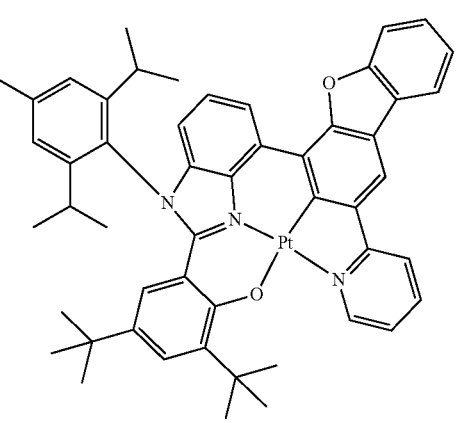
3-577
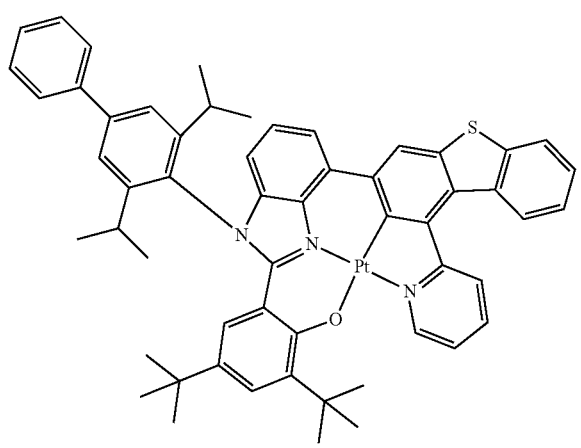
3-580
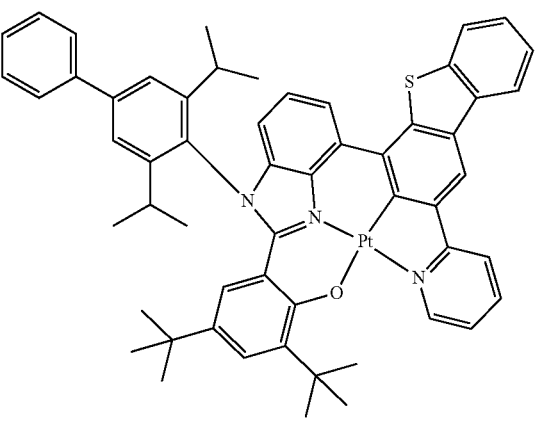
3-378
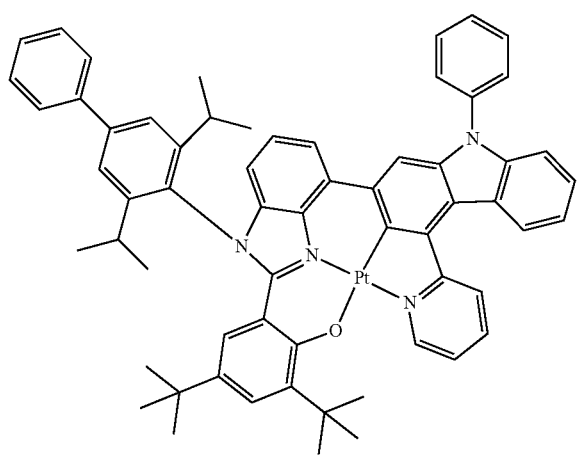
3-581
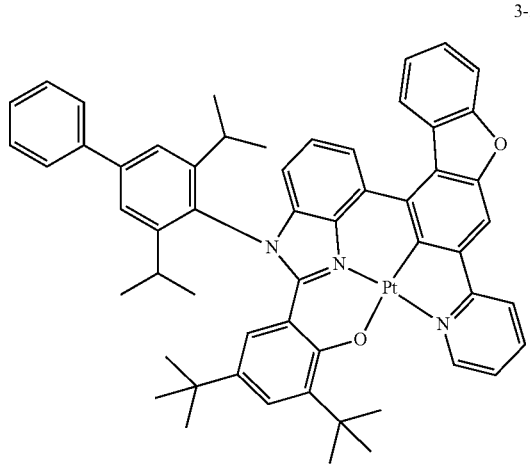

-continued 3-582

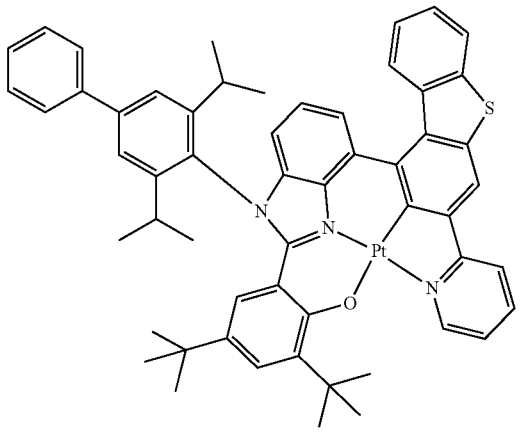

3-583

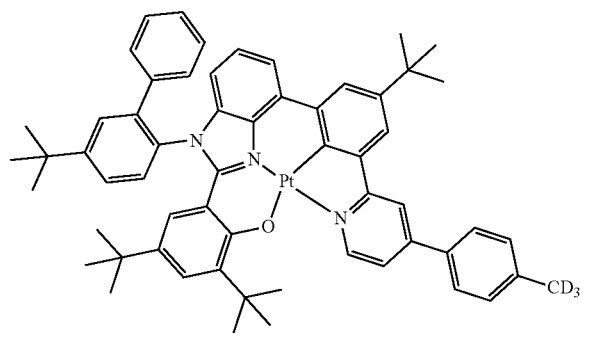

Host in Emission Layer 15

A host in the emission layer 15 may include, for example consist essentially of, or for example consist of, one type of compound or may be a mixture of two or more different types of compounds.

The host in the emission layer 15 may include a first host.

In one or more embodiments, the emission layer 15 may include a first host and a second host, the second host may be a hole transport host, and the second host may be an electron transport host including an electron transport moiety.

The "electron transport moiety" as used herein may be a cyano group, a 7 electron-deficient nitrogen-containing cyclic group, or a group represented by one of the following formulae:

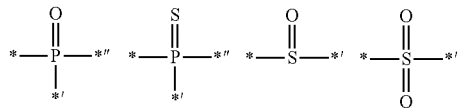

In the formulae above, *, *', and *'' each indicates a binding site to a neighboring atom.

The term "n electron-deficient nitrogen-containing cyclic group" as used herein refers to a $C_1$-$C_{60}$ heterocyclic group having at least one *—N=*' moiety, and examples thereof include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzo- quinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, diazabenzofuran, diazabenzothiophene, and diazabenzopyrrole.

In an embodiment, the electron transport moiety may be a group selected from groups represented by Formulae 3-1 to 3-3:

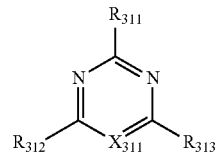

3-1

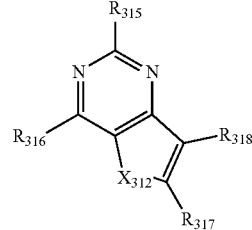

3-2

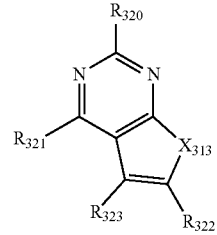

3-3

In Formulae 3-1 to 3-3,
$X_{311}$ may be N or C($R_{314}$),
$X_{312}$ may be O, S, or N($R_{319}$),
$X_{313}$ may be O, S, or N($R_{324}$),
$R_{311}$ to $R_{324}$ may each independently be a binding site to a neighboring atom, hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —C(=O)(Q$_1$), —S(=O)$_2$(Q$_1$), or —P(=O)(Q$_1$)(Q$_2$), at least one of R$_{311}$ to R$_{314}$ may be a binding site to a neighboring atom, at least one of R$_{315}$ to R$_{318}$ may be a binding site to a neighboring atom, and at least one of R$_{320}$ to R$_{323}$ may be a binding site to a neighboring atom.

First Host in Emission Layer 15

In an embodiment, the first host may be a carbazole-containing compound that does not include an electron transport moiety.

In one or more embodiments, the first host may be a carbazole-containing compound including an electron transport moiety, and the electron transport moiety may be a 7 electron-deficient nitrogen-containing cyclic group.

In one or more embodiments, the first host may be a carbazole-containing compound including an electron transport moiety, and the electron transport moiety may be one or more groups represented by Formulae 3-1 to 3-3:

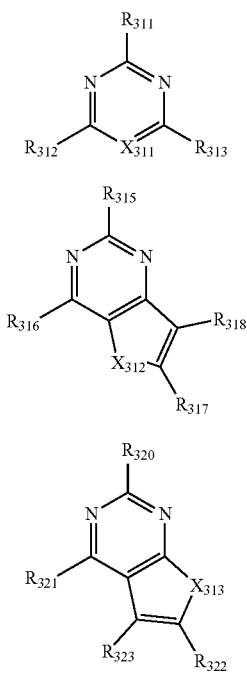

In Formulae 3-1 to 3-3,

X$_{311}$ may be N or C(R$_{314}$),

X$_{312}$ may be O, S, or N(R$_{319}$),

X$_{313}$ may be O, S, or N(R$_{324}$),

R$_{311}$ to R$_{324}$ may each independently be a binding site to a neighboring atom, hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_7$-C$_{60}$ arylalkyl group, a substituted or unsubstituted C$_1$-C$_{60}$ heteroaryl group, a substituted or unsubstituted C$_1$-C$_{60}$ heteroaryloxy group, a substituted or unsubstituted C$_1$-C$_{60}$ heteroarylthio group, a substituted or unsubstituted C$_2$-C$_{60}$ heteroarylalkyl group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —N(Q$_1$)(Q$_2$), —B(Q$_1$)(Q$_2$), —C(=O)(Q$_1$), —S(=O)$_2$ (Q$_1$), or —P(=O)(Q$_1$)(Q$_2$), at least one of R$_{311}$ to R$_{314}$ may be a binding site to a neighboring atom, at least one of R$_{315}$ to R$_{318}$ may be a binding site to a neighboring atom, and at least one of R$_{320}$ to R$_{323}$ may be a binding site to a neighboring atom.

In an embodiment, the first host may be a carbazole-based compound represented by Formula 4:

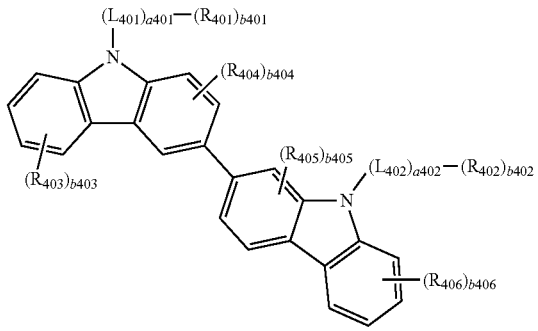

In Formula 4,

L$_{401}$ to L$_{402}$ may each independently be a substituted or unsubstituted C$_5$-C$_{60}$ carbocyclic group or a substituted or unsubstituted C$_1$-C$_{60}$ heterocyclic group, a401 to a402 may each independently be an integer from 0 to 5, R$_{401}$ and R$_{402}$ may each independently be a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group, R$_{403}$ to R$_{406}$ may each independently be hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$), b401 and b402 may each independently be an integer from 1 to 5, b403 and b406 may each independently be an integer from 1 to 4, and b404 and b405 may each independently be an integer from 1 to 3.

wherein $Q_1$ to $Q_3$ are the same as described in connection with $Q_{31}$ in the present disclosure.

In an embodiment, $L_{401}$, $L_{402}$, $R_{401}$, and $R_{402}$ do not include an electron transport moiety.

In one or more embodiments, at least one of $L_{401}$, $L_{402}$, $R_{401}$, and $R_{402}$ may include an electron transport moiety, and the electron transport moiety may be a t electron-deficient nitrogen-containing cyclic group.

In one or more embodiments, at least one of $L_{401}$, $L_{402}$, $R_{401}$, and $R_{402}$ may include an electron transport moiety, and the electron transport moiety may be one or more groups represented by Formulae 3-1 to 3-3.

The first host may be, for example, one or more the following compounds, but embodiments of the present disclosure are not limited thereto:

H-HT1

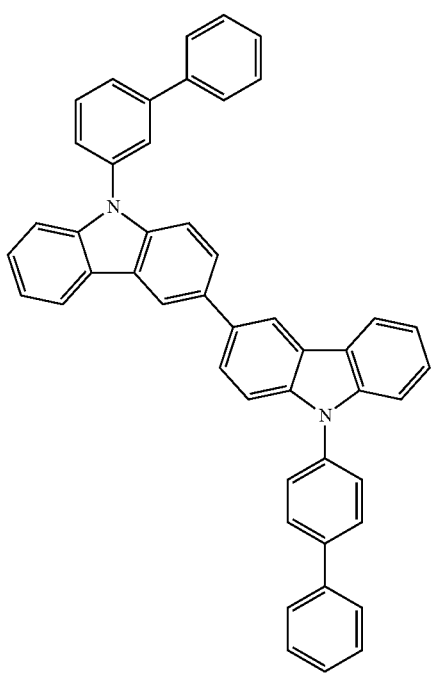

H-HT2

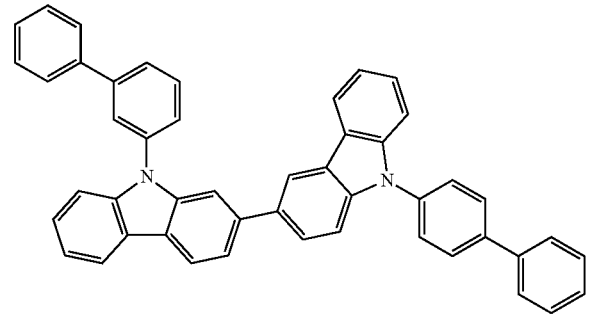

Second Host in Emission Layer 15

In an embodiment, an electron transport moiety in the second host may be a 71 electron-deficient nitrogen-containing cyclic group.

In one or more embodiments, an electron transport moiety in the second host may one or more groups represented by Formulae 3-1 to 3-3:

3-1

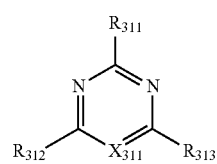

3-2

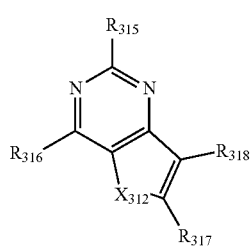

3-3

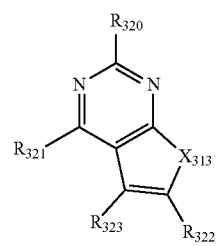

In Formulae 3-1 to 3-3, $X_{311}$ may be N or C($R_{314}$), $X_{312}$ may be O, S, or N($R_{319}$), $X_{313}$ may be O, S, or N($R_{324}$), $R_{311}$ to $R_{324}$ may each independently be a binding site to a neighboring atom, hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$), at least one of $R_{311}$ to $R_{313}$ may be a binding site to a neighboring atom, at least one of $R_{315}$ to $R_{318}$ may be a binding site to a neighboring atom, and at least one of $R_{320}$ to $R_{323}$ may be a binding site to a neighboring atom.

In one or more embodiments, the electron transport host may be selected from compounds represented by Formula 301:

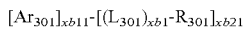    Formula 301

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may each independently be a single bond, a group represented by one of the following formulae, a substituted or unsubstituted $C_5$-$C_{60}$ carbocyclic group, or a substituted or unsubstituted $C_1$-$C_{60}$ heterocyclic group, and*, *' and *'' in the following formulae are each a binding site to a neighboring atom,

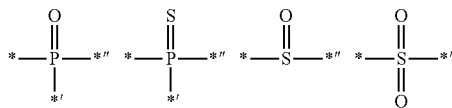

xb1 may be an integer from 1 to 5, $R_{301}$ may be deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), —S(=O)($Q_{301}$), —P(=O)($Q_{301}$)($Q_{302}$), or —P(=S)($Q_{301}$)($Q_{302}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, xb21 may be an integer from 1 to 5, and at least one of $Ar_{301}$, $L_{301}$, and $R_{301}$ may each independently include a 7 electron-deficient nitrogen-containing cyclic group, or $L_{301}$ may be a group represented by one of the following formulae

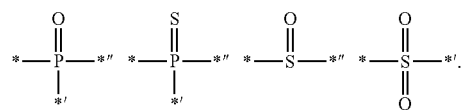

For example, in Formula 301, at least one of $Ar_{301}$, $L_{301}$, and $R_{301}$ may each independently include a 7 electron-deficient nitrogen-containing cyclic group.

In one or more embodiments, in Formula 301, at least one of $Ar_{31}$, $L_{301}$, and $R_{301}$ may each independently be groups represented by Formulae 3-1 to 3-3.

The second host may be, for example, the following compound, but embodiments of the present disclosure are not limited thereto:

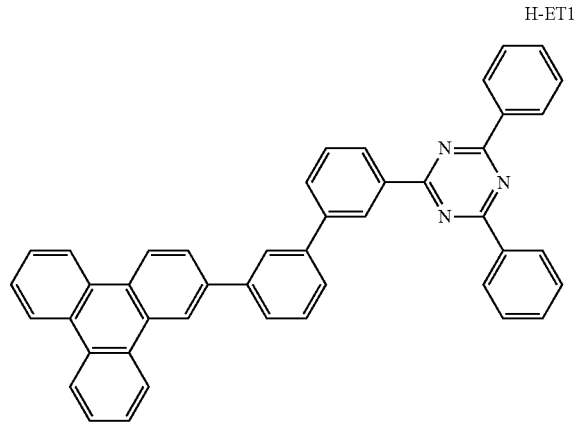 [SMILES: c1ccc(-c2nc(-c3ccccc3)nc(-c3cccc(-c4cccc(-c5ccc6c7ccccc7c7ccccc7c6c5)c4)c3)n2)cc1]

H-ET1

Hole Transport Region 13

The hole transport region 13 may be disposed between the first electrode 11 and the emission layer 15 of the organic light-emitting device 10.

The hole transport region 13 may have a single-layered structure or a multi-layered structure.

For example, the hole transport region 13 may have a hole injection layer, a hole transport layer, a hole injection layer/hole transport layer structure, a hole injection layer/first hole transport layer/second hole transport layer structure, a hole transport layer/interlayer structure, a hole injection layer/hole transport layer/interlayer structure, a hole transport layer/electron blocking layer structure, or a hole injection layer/hole transport layer/electron blocking layer structure, but embodiments of the present disclosure are not limited thereto.

The hole transport region 13 may include any compound having hole transport characteristics.

In an embodiment, a first hole transport material included in the hole transport region 13 may be selected from any material that satisfies T1(HT1)≥T1(D).

For example, the hole transport region 13 may include an amine-based compound.

In an embodiment, the hole transport region 13 may include at least one of a compound represented by Formula 201 to a compound represented by Formula 205, but embodiments of the present disclosure are not limited thereto:

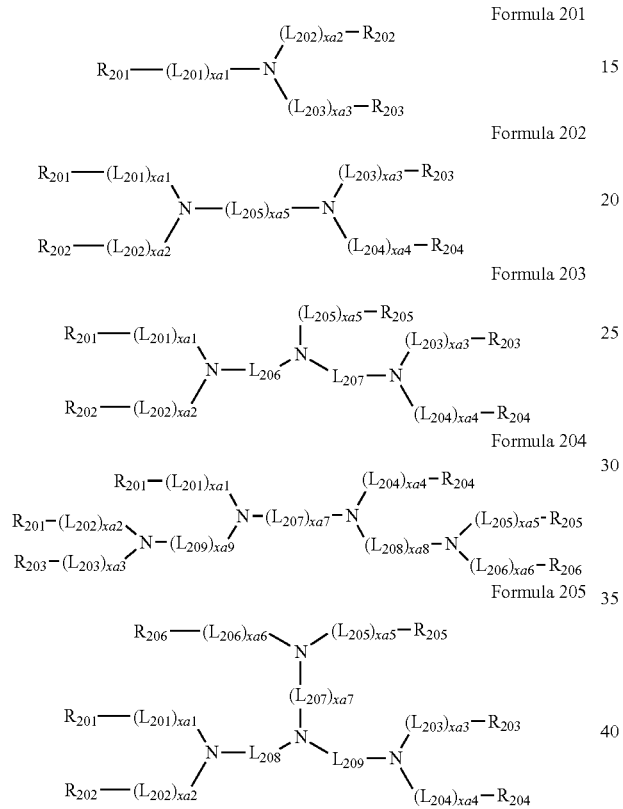

In Formulae 201 to 205, $L_{201}$ to $L_{209}$ may each independently *-be O—*', * —S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

For example, $L_{201}$ to $L_{209}$ may each independently be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group, each unsubstituted or substituted with at least one selected from deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or —$S(Q_{11})(Q_{12})(Q_{13})$, xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with at least one of deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), or —N($Q_{31}$)($Q_{32}$), wherein $Q_{31}$ to $Q_{33}$ are as defined herein.

In an embodiment, the hole transport region 13 may include a carbazole-containing amine-based compound.

In one or more embodiments, the hole transport region 13 may include a carbazole-containing amine-based compound and a carbazole-free amine-based compound.

The carbazole-containing amine-based compound may be, for example, compounds represented by Formula 201 including a carbazole group and further including at least one of a dibenzofuran group, a dibenzothiophene group, a fluorene group, a spiro-fluorene group, an indenocarbazole group, an indolocarbazole group, a benzofurocarbazole group, or a benzothienocarbazole group.

The carbazole-free amine-containing compound may be, for example, compounds represented by Formula 201 which do not include a carbazole group and which include at least one of a dibenzofuran group, a dibenzothiophene group, a fluorene group, a spiro-fluorene group, an indenocarbazole group, an indolocarbazole group, a benzofurocarbazole group, or a benzothienocarbazole group.

In one or more embodiments, the hole transport region 13 may include at least one of the compounds represented by Formulae 201 or 202.

In an embodiment, the hole transport region 13 may include at least one of the compounds represented by Formulae 201-1, 202-1, and 201-2, but embodiments of the present disclosure are not limited thereto:

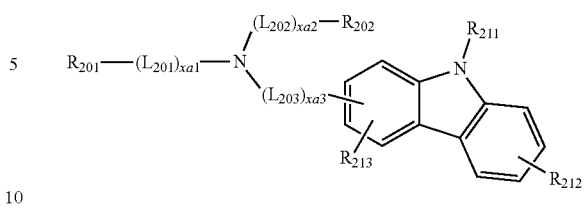

Formula 201-2

In Formulae 201-1, 202-1, and 201-2, $L_{201}$ to $L_{203}$, $L_{205}$, xa1 to xa3, xa5, $R_{201}$, and $R_{202}$ are the same as described above, and $R_{211}$ to $R_{213}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole transport region 13 may include at least one of Compounds HT1 to HT39, but embodiments of the present disclosure are not limited thereto.

Formula 201-1

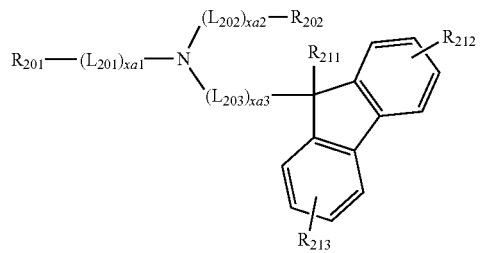

Formula 202-1

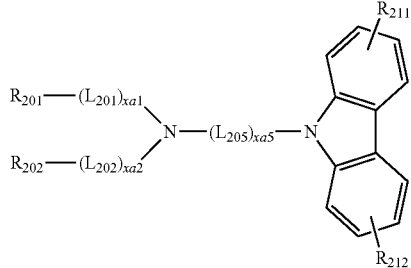

HT1

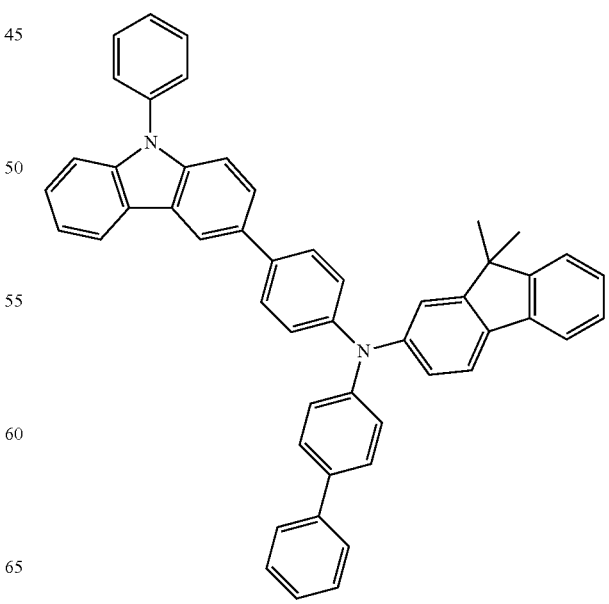

HT2
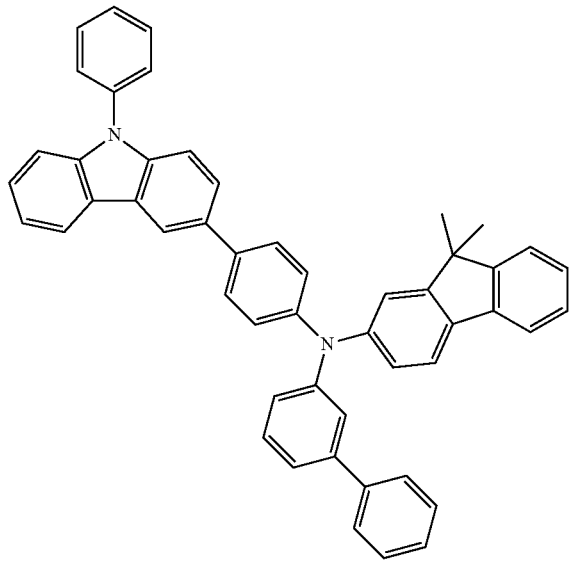
HT3
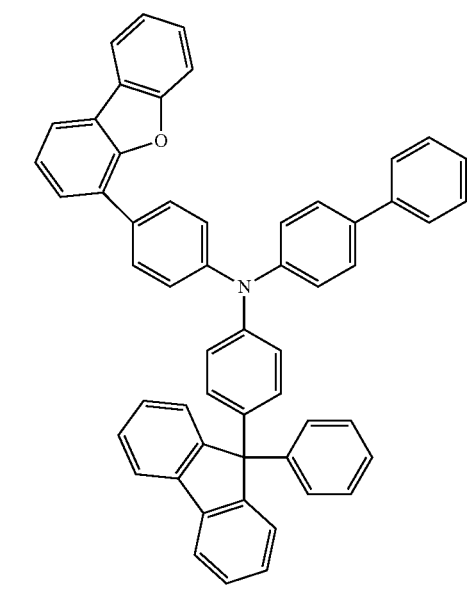
HT4
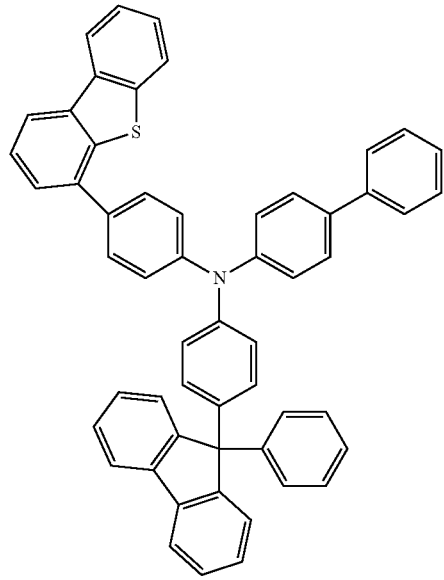
HT5
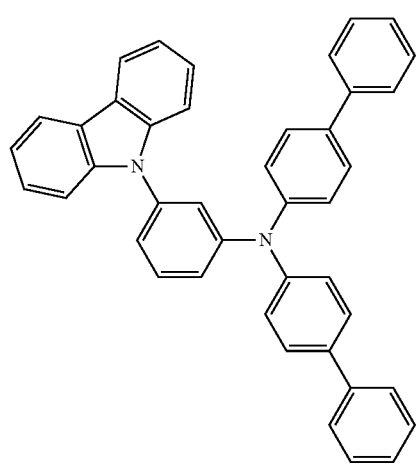
HT6
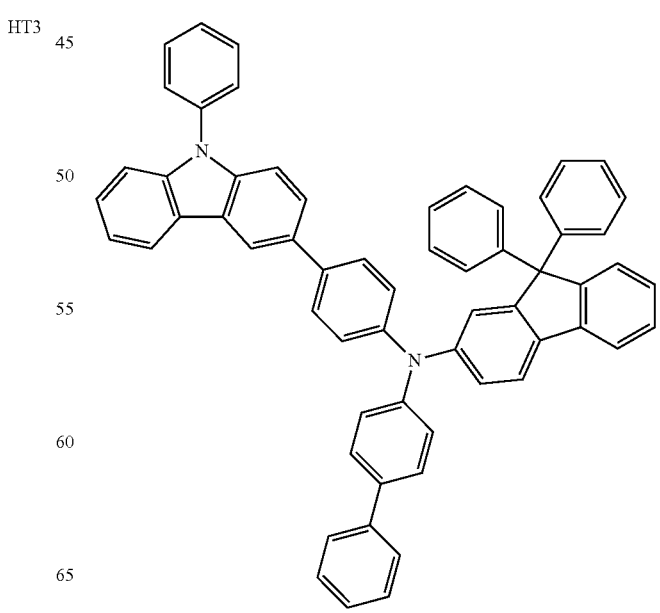

HT7
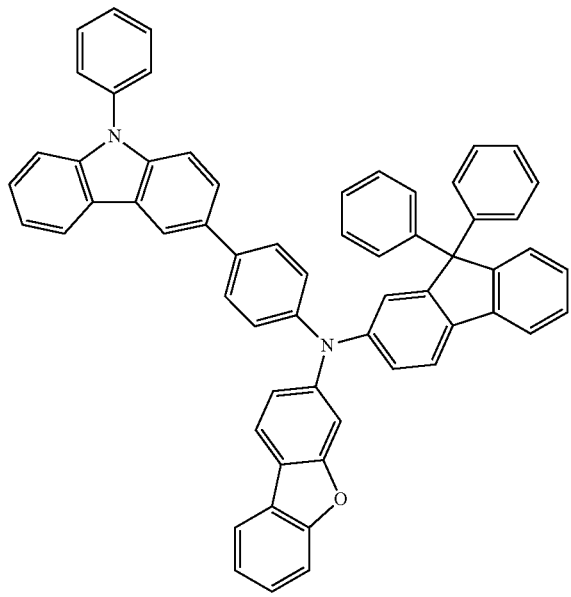
HT9
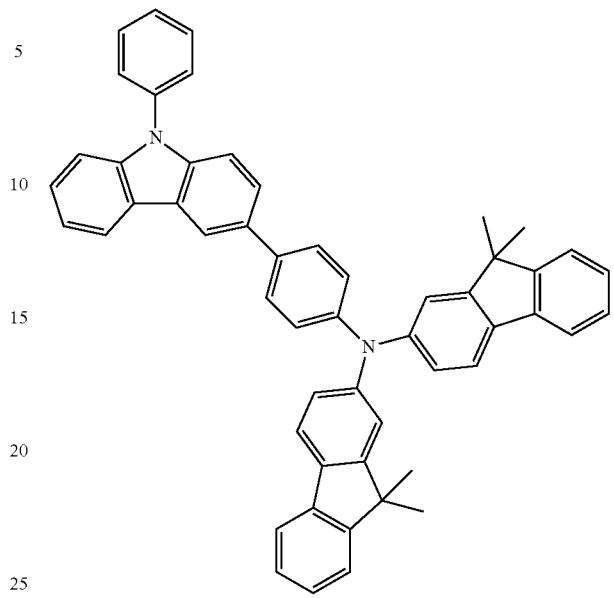
HT8
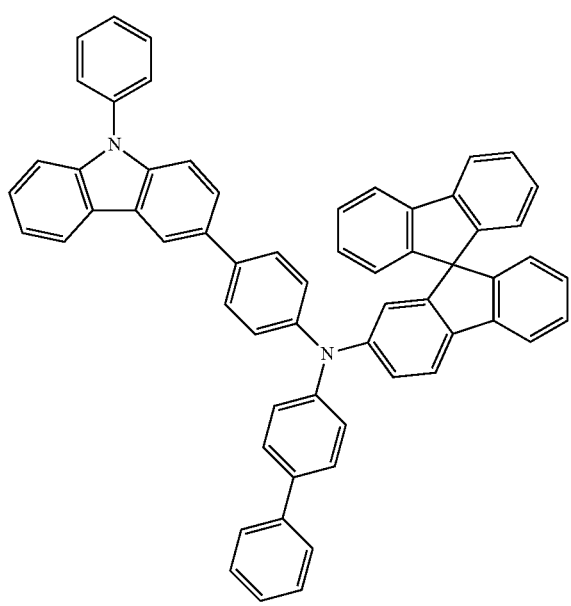
HT10
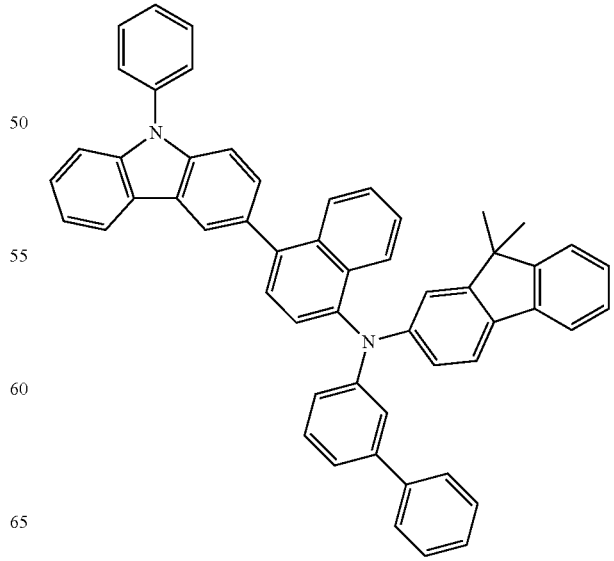

HT11
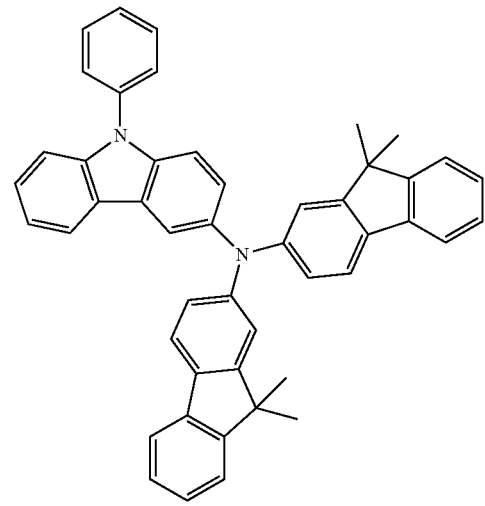
HT12
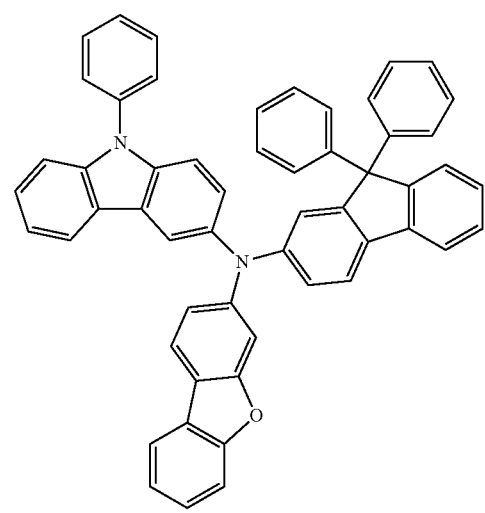
HT13
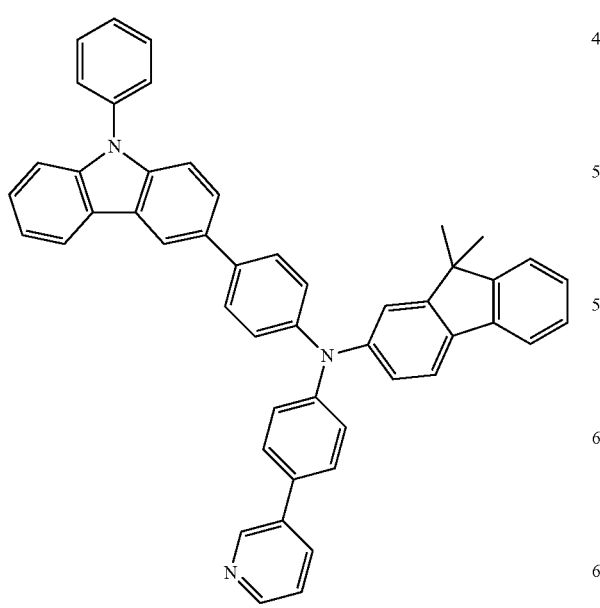
HT14
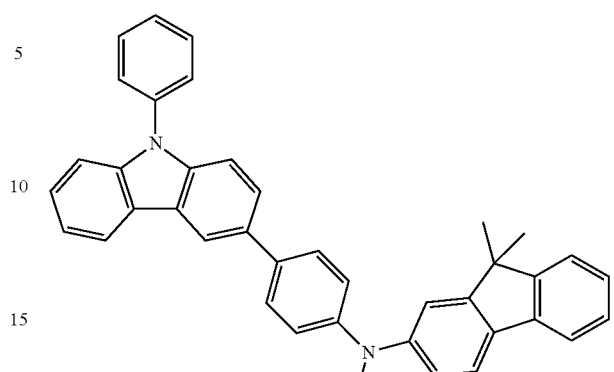
HT15
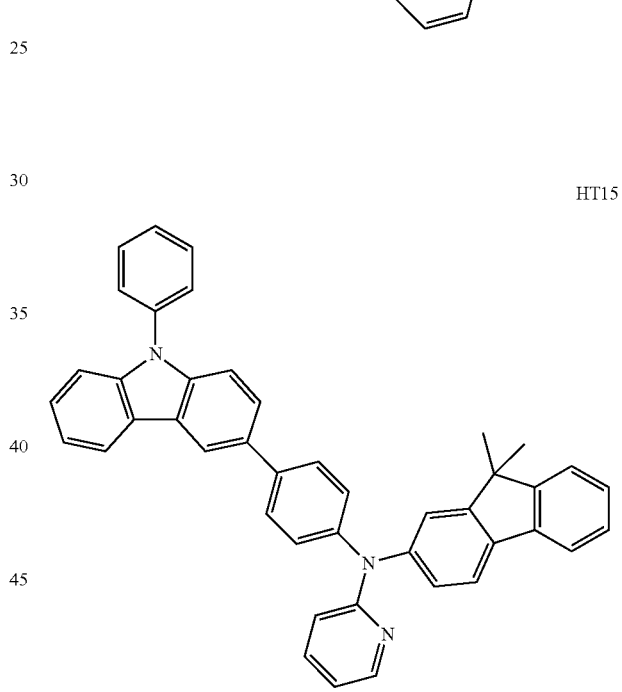
HT16
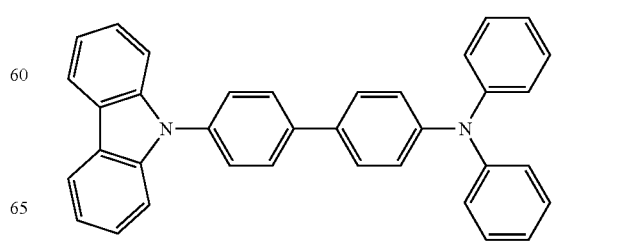

HT17
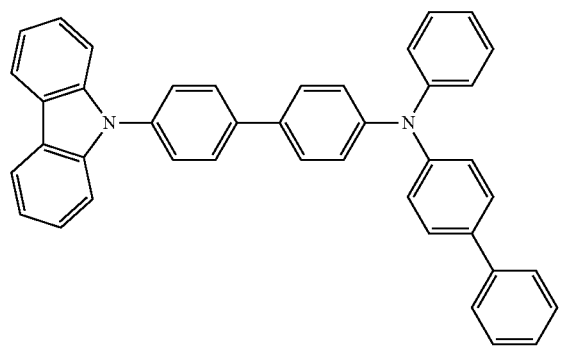
HT18
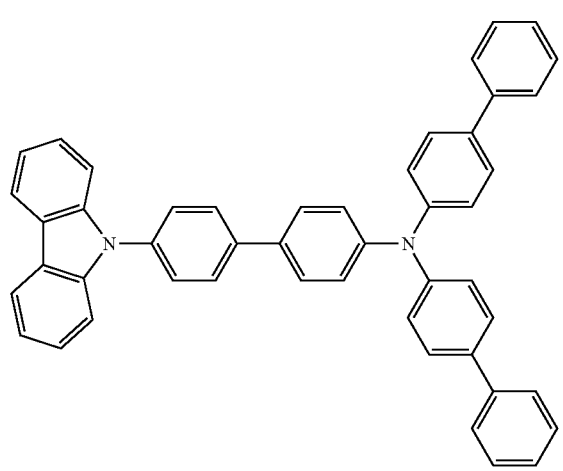
HT19
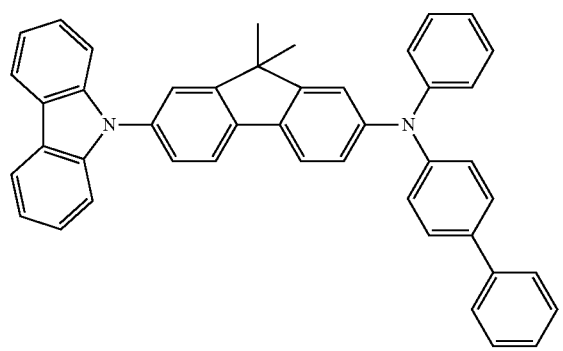
HT20
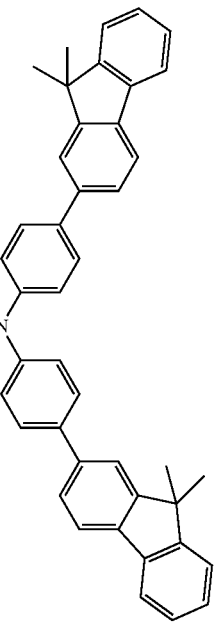
HT21
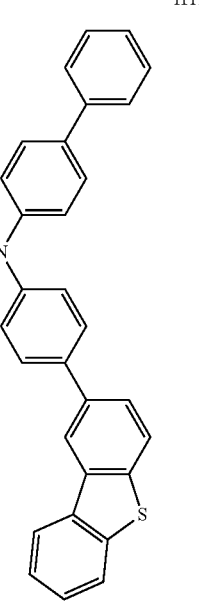
HT22
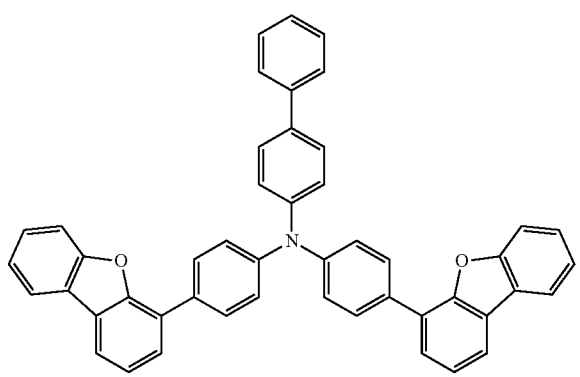

HT23
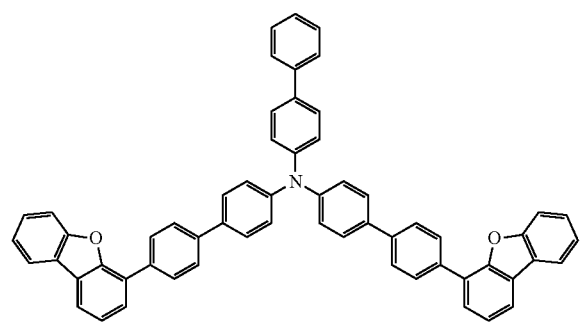
HT24
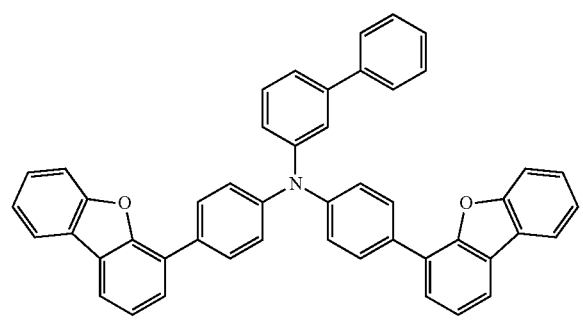
HT25
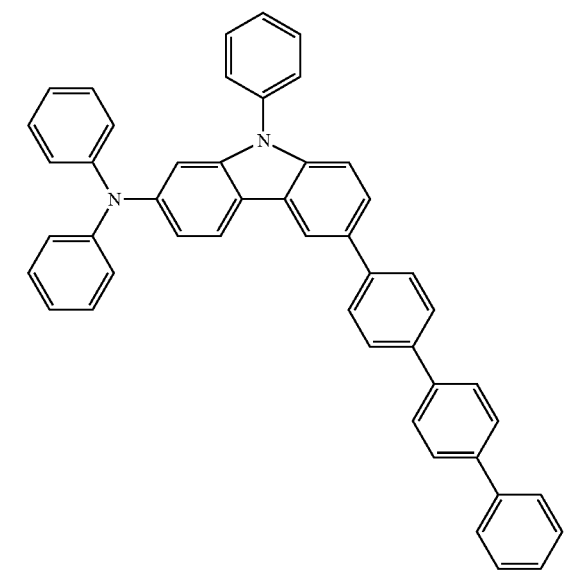
HT26
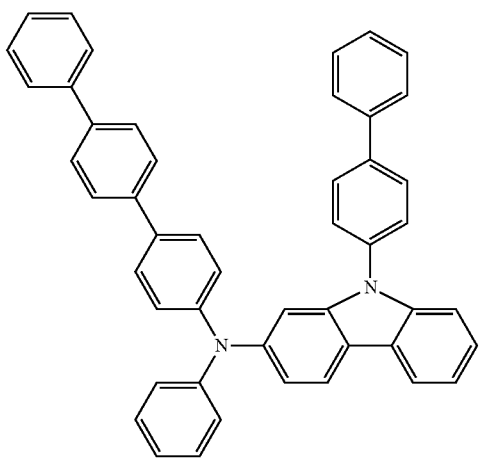
HT27
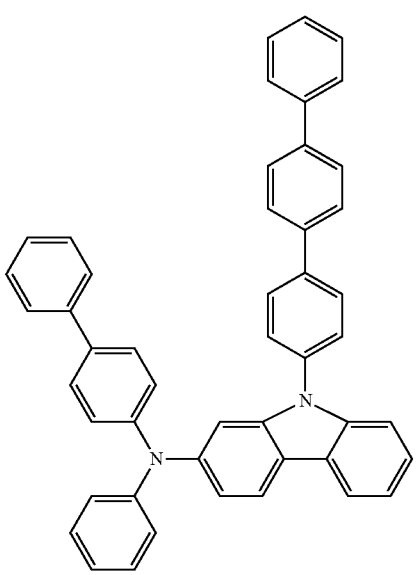
HT28
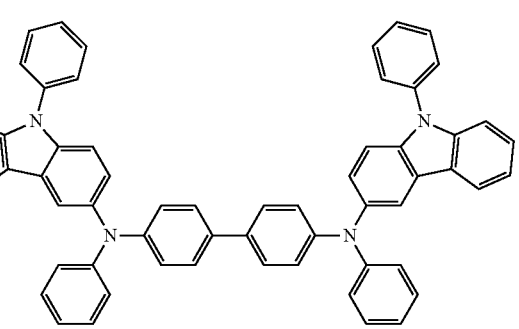

HT29
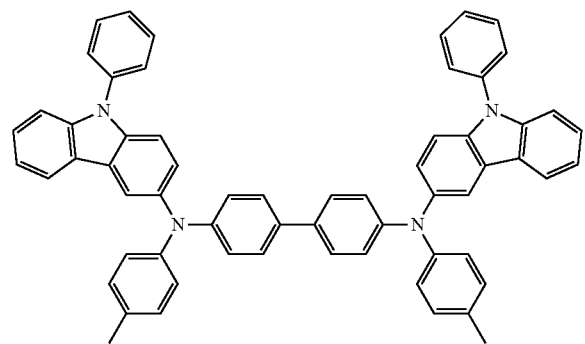
HT33
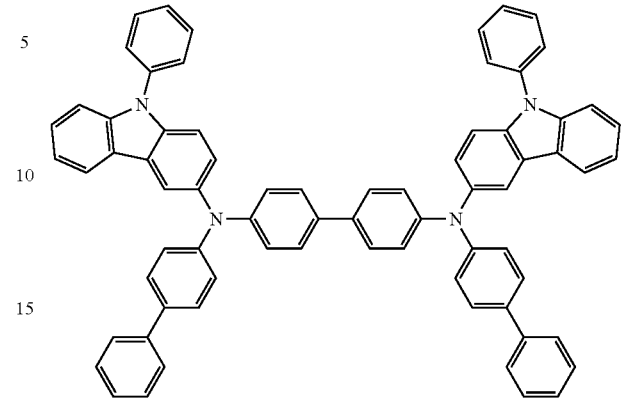
HT30
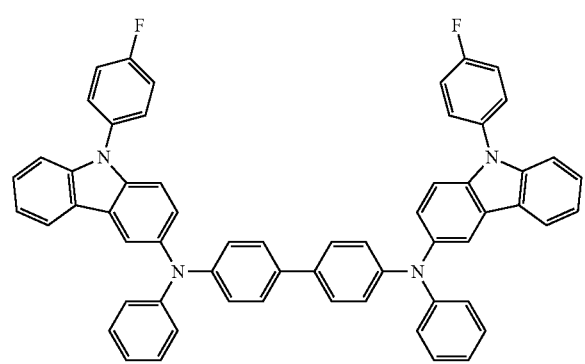
HT34
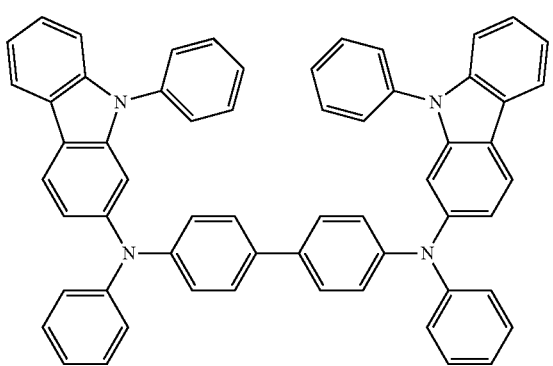
HT31
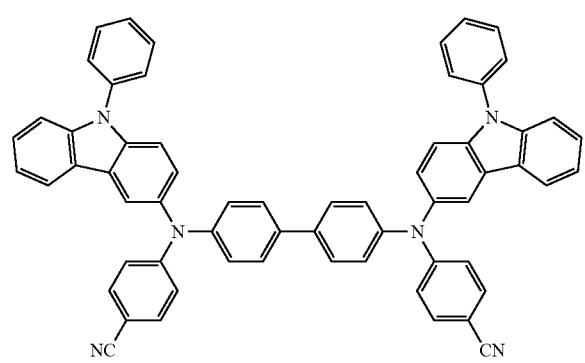
HT35
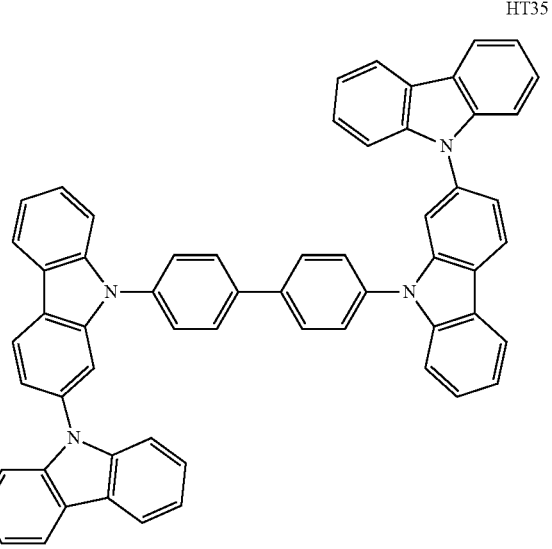
HT32
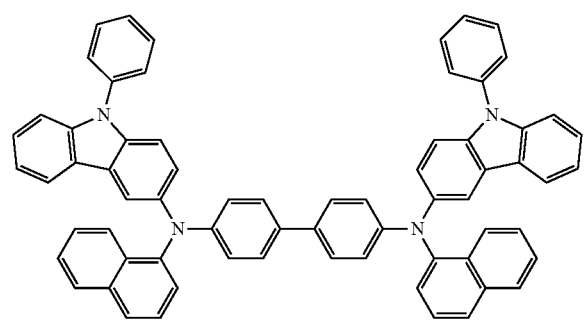

HT36

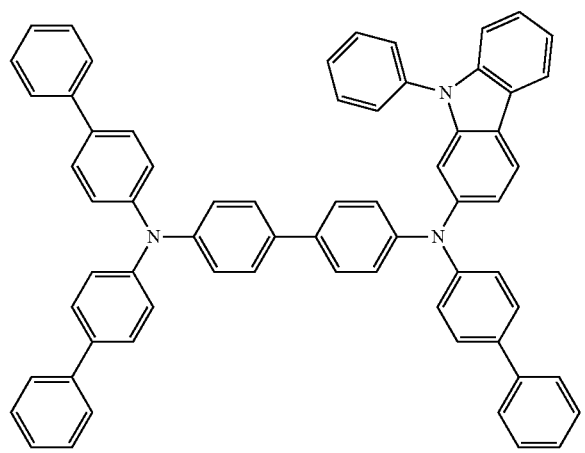

HT37

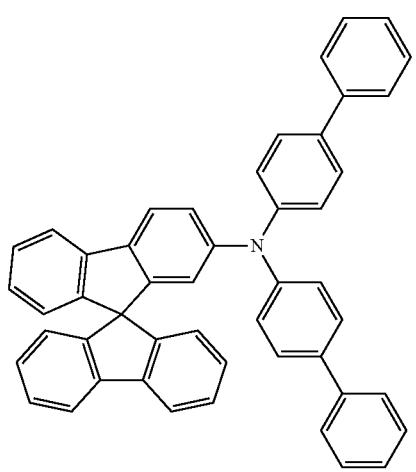

HT38

HT39

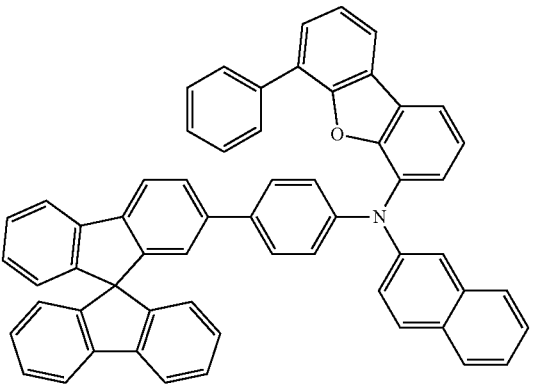

In one or more embodiments, the hole transport region 13 of the organic light-emitting device 10 may further include a p-dopant. When the hole transport region 13 further includes a p-dopant, the hole transport region 13 may have a matrix (for example, at least one of compounds represented by Formulae 201 to 205) and a p-dopant included in the matrix. The p-dopant may be uniformly or non-uniformly doped in the hole transport region 13.

In an embodiment, a lowest unoccupied molecular orbital (LUMO) energy level of the p-dopant may be −3.5 eV or less.

The p-dopant may include at least one selected from a quinone derivative, a metal oxide, and a cyano group-containing compound, but embodiments of the present disclosure are not limited thereto.

In an embodiment, the p-dopant may include at least one of: a quinone derivative, such as tetracyanoquinodimethane (TCNQ), 2,3,5,6-tetrafluoro-7,7,8,8-tetracyanoquinodimethane (F4-TCNQ), or F6-TCNNQ;
a metal oxide, such as a tungsten oxide or a molybdenum oxide; 1,4,5,8,9,12-hexaazatriphenylene-hexacarbonitrile (HAT-CN); or
a compound represented by Formula 221 below; but embodiments of the present disclosure are not limited thereto:

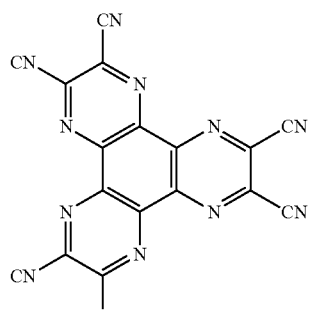

HAT-CN

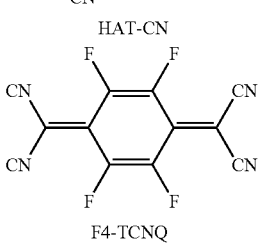

F4-TCNQ

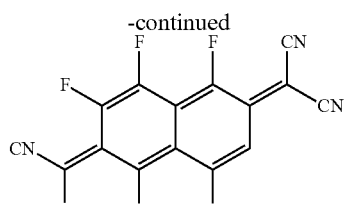

F6-TCNNQ

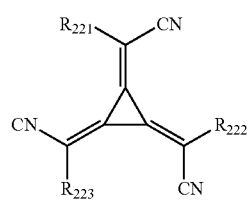

Formula 221

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $R_{221}$ to $R_{223}$ may have at least one substituent that may be a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, or a $C_1$-$C_{20}$ alkyl group substituted with —I.

The hole transport region 13 may have a thickness of about 100 Angstrom (Å) to about 10,000 Å, for example, about 400 Å to about 2,000 Å, and the emission layer 15 may have a thickness of about 100 Å to about 3,000 Å, for example, about 300 Å to about 1,000 Å. When the thickness of each of the hole transport region 13 and the emission layer 15 is within the range described above, satisfactory hole transportation characteristics and/or luminescent characteristics may be obtained without a substantial increase in driving voltage.

Electron Transport Region 17

The electron transport region 17 is disposed between the emission layer 15 and the second electrode 19 of the organic light-emitting device 10.

The electron transport region 17 may have a single-layered structure or a multi-layered structure.

For example, the electron transport region 17 may have an electron transport layer, an electron transport layer/electron injection layer structure, a buffer layer/electron transport layer structure, hole blocking layer/electron transport layer structure, a buffer layer/electron transport layer/electron injection layer structure, or a hole blocking layer/electron transport layer/electron injection layer structure, but embodiments of the present disclosure are not limited thereto.

The electron transport region 17 may include known electron transport materials.

The electron transport region 17 (for example, a buffer layer, a hole blocking layer, an electron control layer, or an electron transport layer in the electron transport region 17 may include a metal-free compound containing at least one 7 electron-deficient nitrogen-containing cyclic group. The 71 electron-deficient nitrogen-containing cyclic group is the same as described above.

For example, the electron transport region 17 may include a compound represented by Formula 601 below:

$$[Ar_{601}]_{xe11}\text{-}[(L_{601})_{xe1}\text{-}R_{601}]_{xe21}$$ Formula 601

In Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —S($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the 7 electron-deficient nitrogen-containing cyclic group.

In an embodiment, ring $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one of deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(=O)$_2$($Q_{31}$), or —P(=O)($Q_{31}$)($Q_{32}$), wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}(s)$ may be linked to each other via a single bond.

In one or more embodiments, $Ar_{601}$ in Formula 601 may be an anthracene group.

In one or more embodiments, the compound represented by Formula 601 may be represented by Formula 601-1 below:

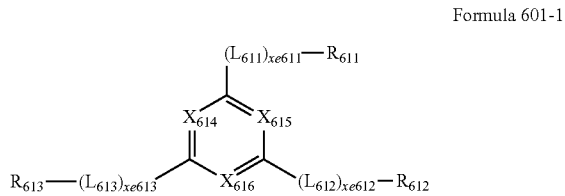

Formula 601-1

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with at least one of deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, or —$S(=O)_2(Q_{601})$ and —$P(=O)(Q_{601})(Q_{602})$, wherein $Q_{601}$ and $Q_{602}$ are the same as described above.

The electron transport region 17 may include at least one compound that may be Compounds ET1 to ET36, but embodiments of the present disclosure are not limited thereto:

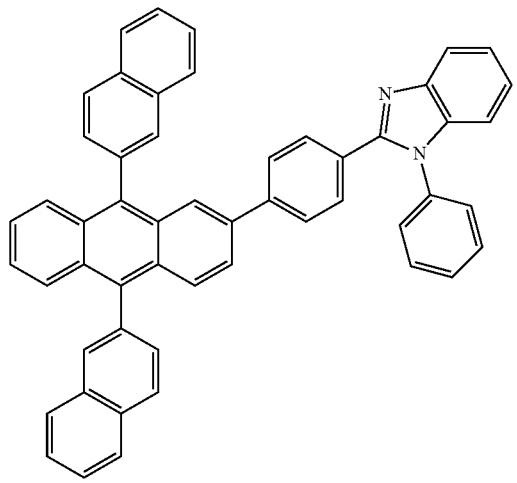

ET1

ET2
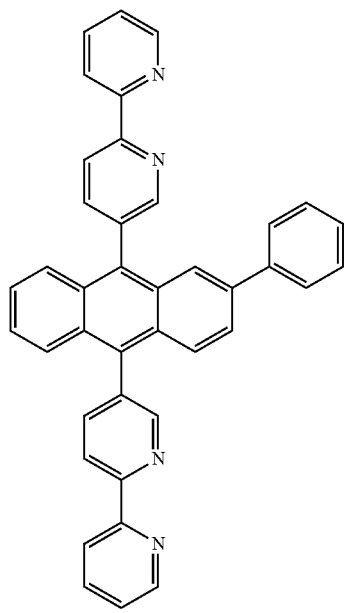
ET3
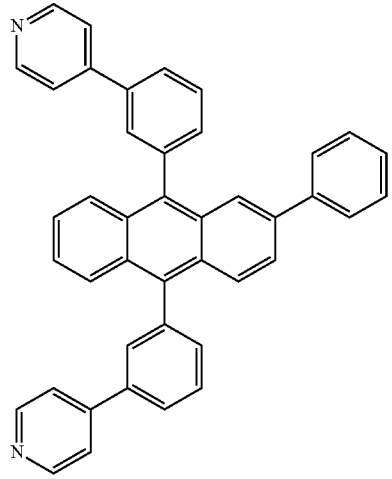
ET4
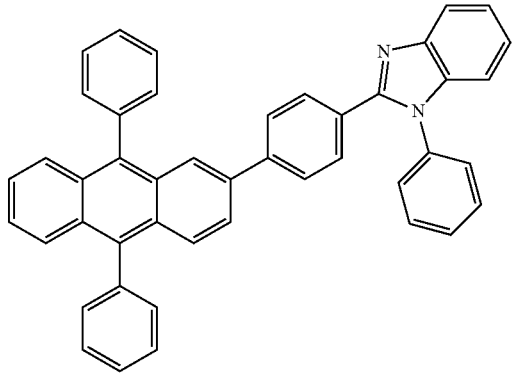
ET5
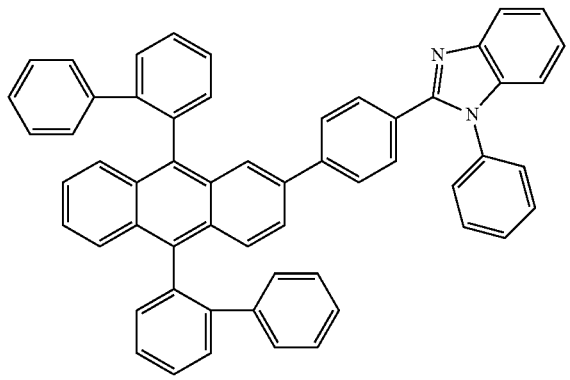
ET6
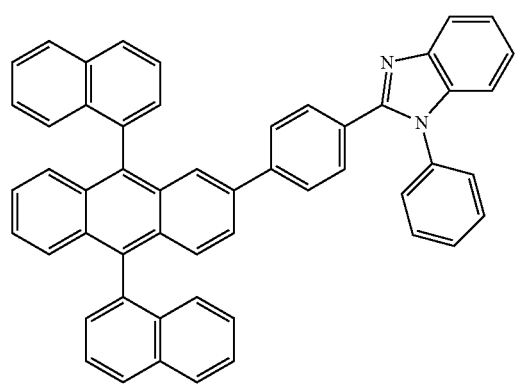
ET7
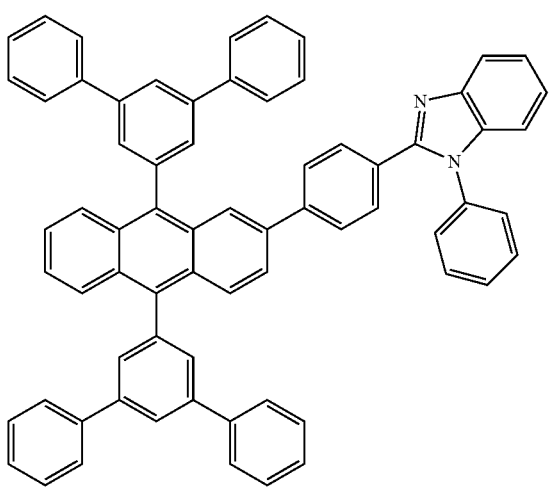

ET8
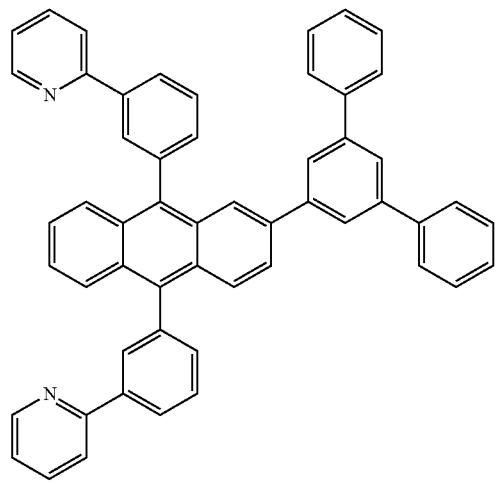
ET10
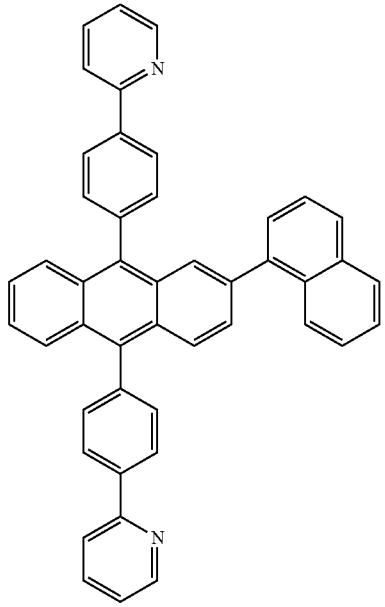
ET11
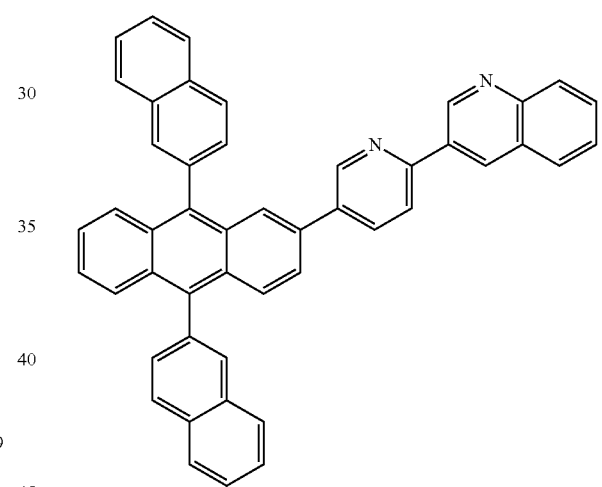
ET9
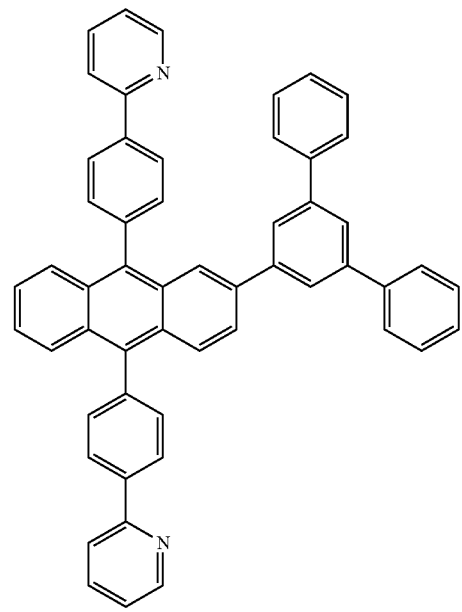
ET12
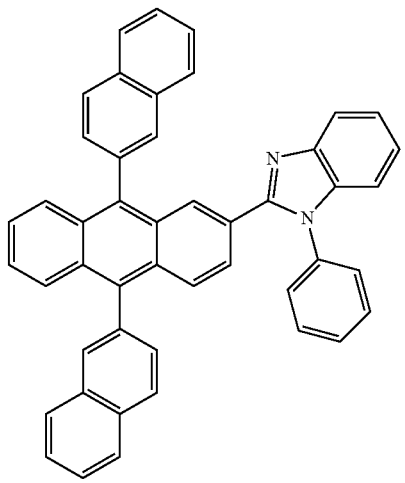

ET13
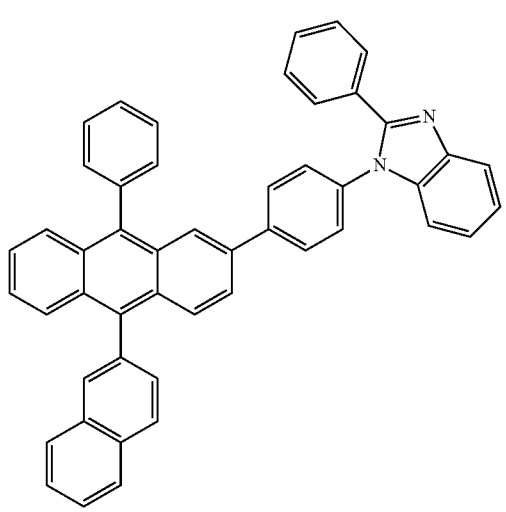
ET14
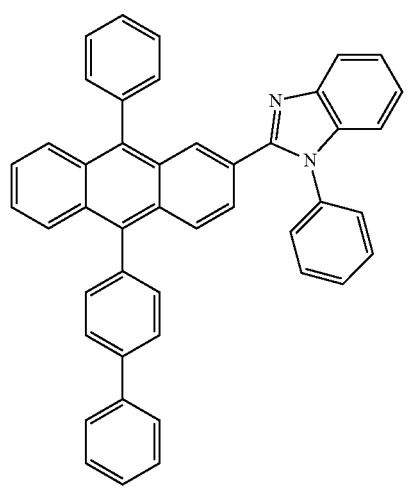
ET15
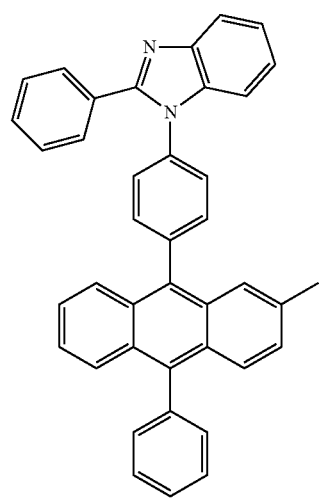
ET16
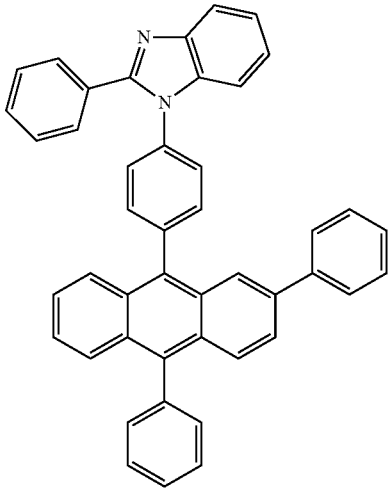
ET17
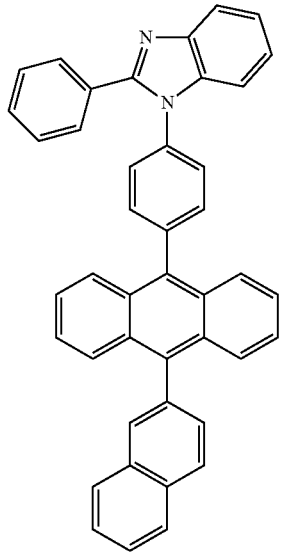
ET18
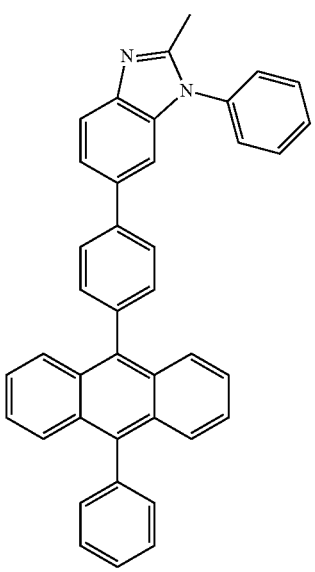

ET19
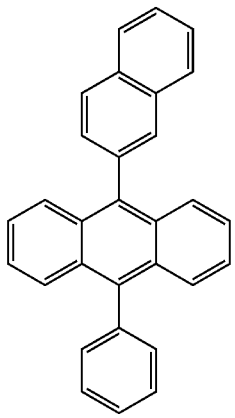
ET22
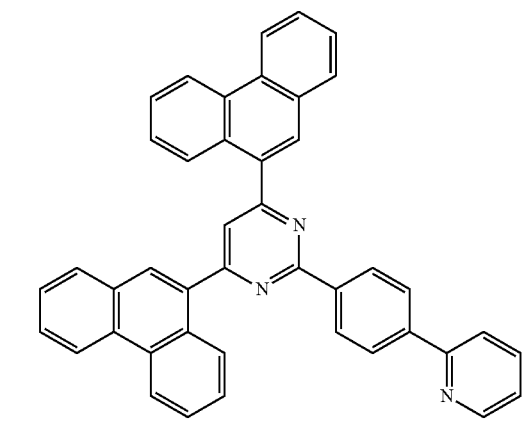
ET20
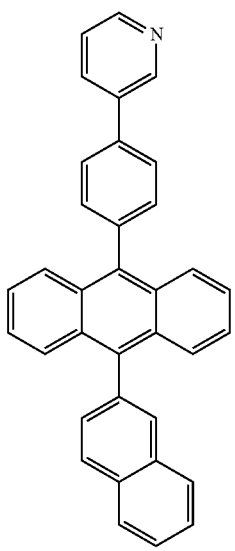
ET23
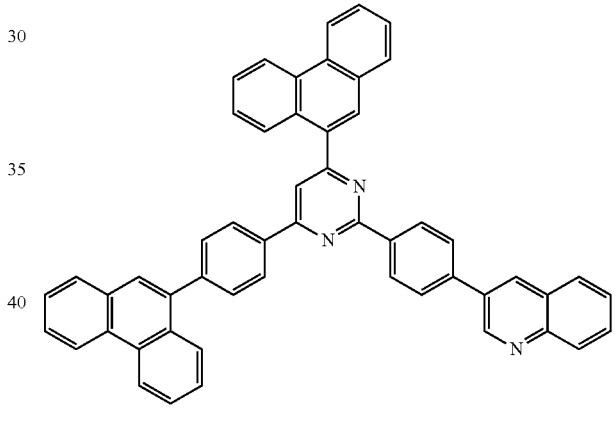
ET21
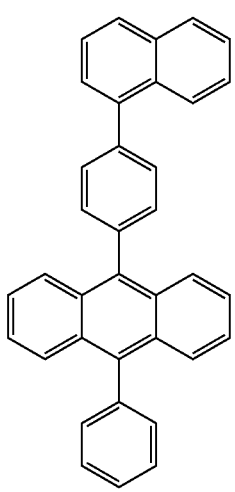
ET24
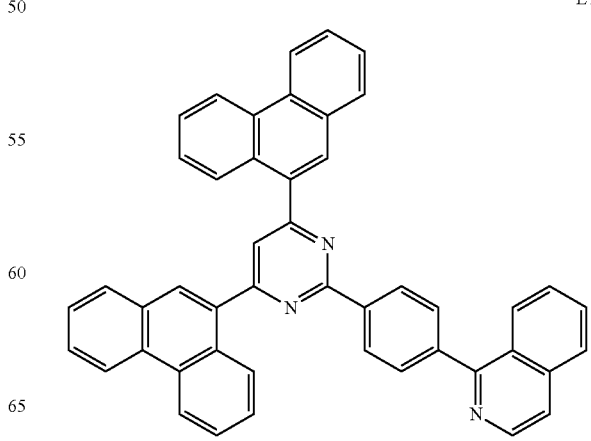

ET25
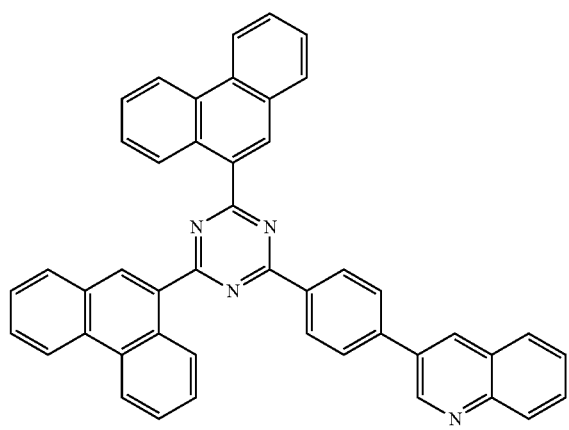
ET26
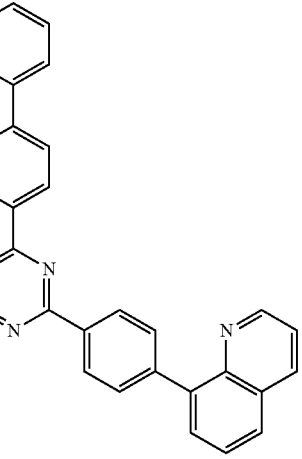
ET27
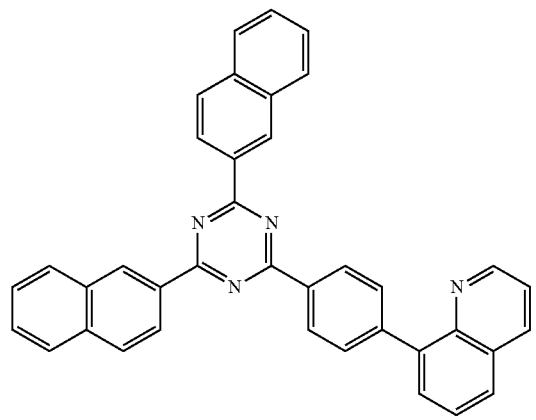
ET28
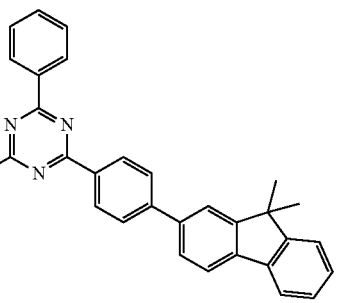
ET29
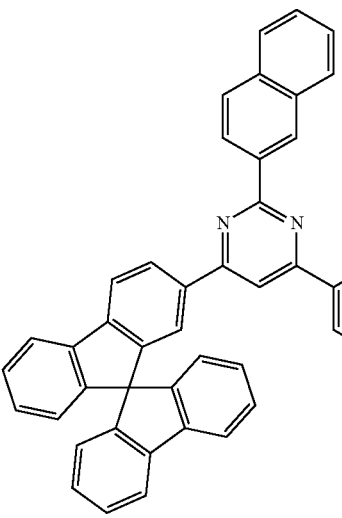
ET30
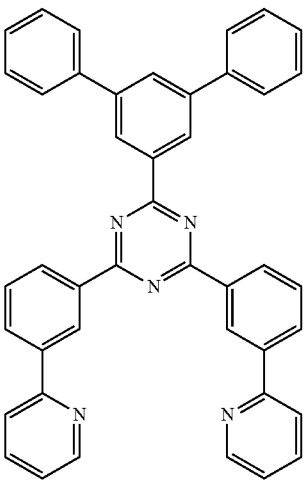

ET31
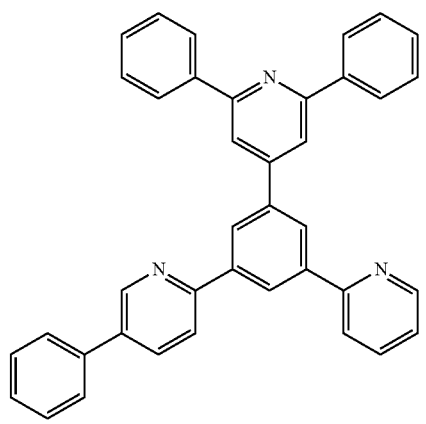
ET34
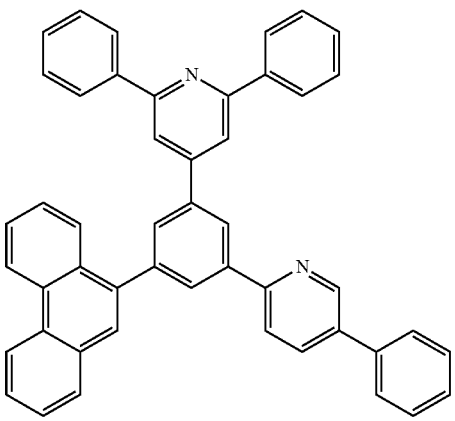
ET32
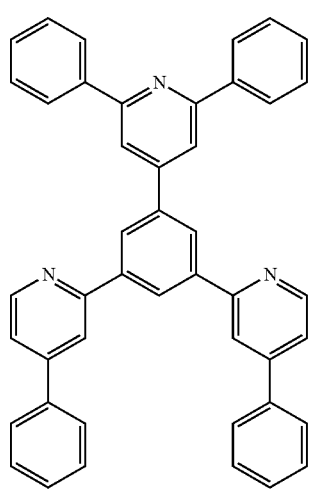
ET35
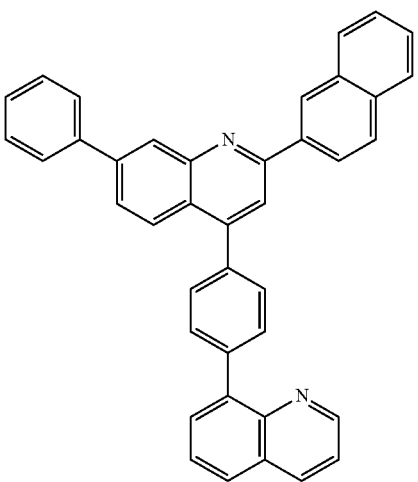
ET33
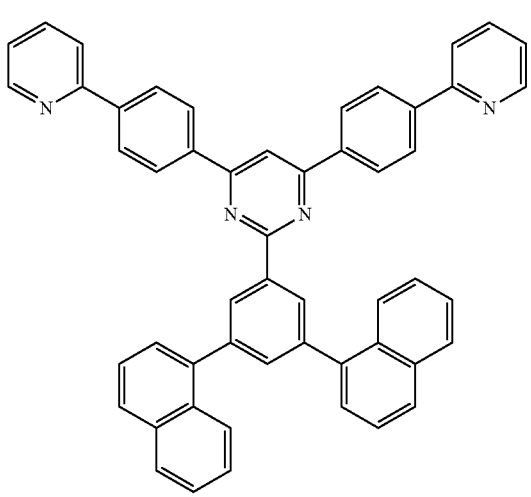
ET36
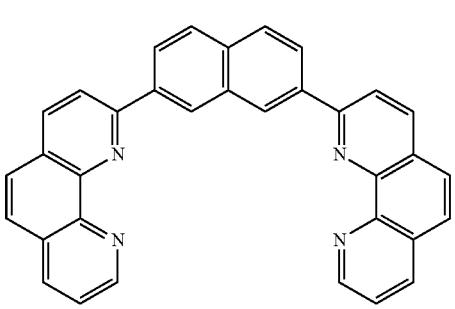
In an embodiment, the electron transport region 17 may include at least one compound from 2,9-dimethyl-4,7-diphenyl-1,10-phenanthroline (BCP), 4,7-biphenyl-1,10-phenanthroline (Bphen), Alq3, BAlq, 3-(biphenyl-4-yl)-5-(4-tert-butylphenyl)-4-phenyl-4H-1,2,4-triazole (TAZ), or NTAZ.

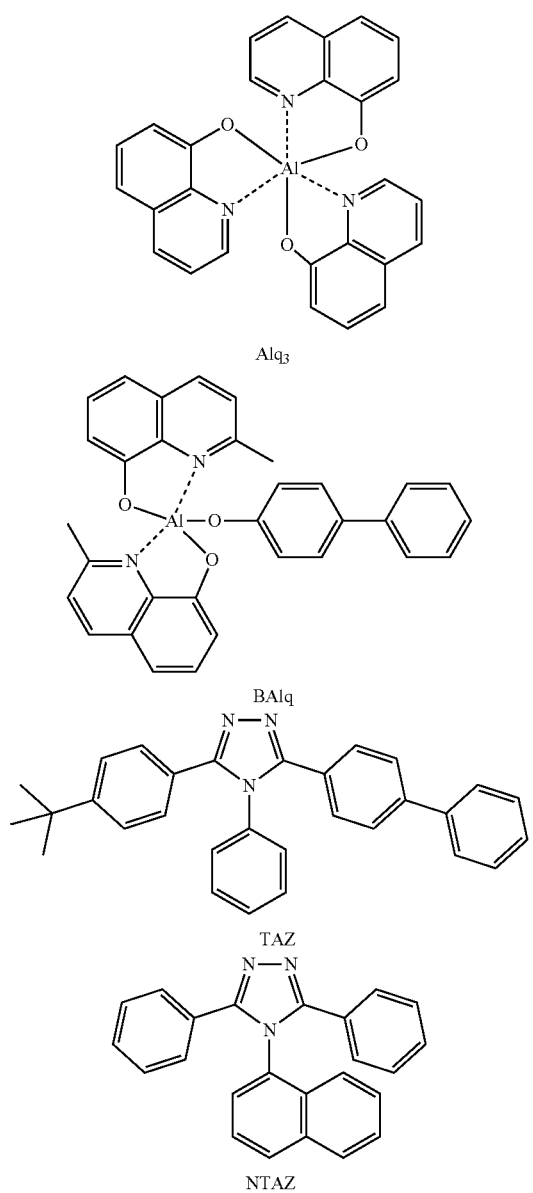

Alq₃

BAlq

TAZ

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

The electron transport region 17 (for example, the electron transport layer in the electron transport region) may further include, in addition to the materials described above, a metal-containing material.

The metal-containing material may include at least one of an alkali metal complex or an alkaline earth-metal complex. The alkali metal complex may include a metal ion that may be a Li ion, a Na ion, a K ion, a Rb ion, or a Cs ion, and the alkaline earth-metal complex may include a metal ion that is a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, or a cyclopentadiene, but embodiments of the present disclosure are not limited thereto.

For example, the metal-containing material may include a Li complex. The Li complex may include, for example, Compound ET-D1 (lithium quinolate, LiQ) or ET-D2.

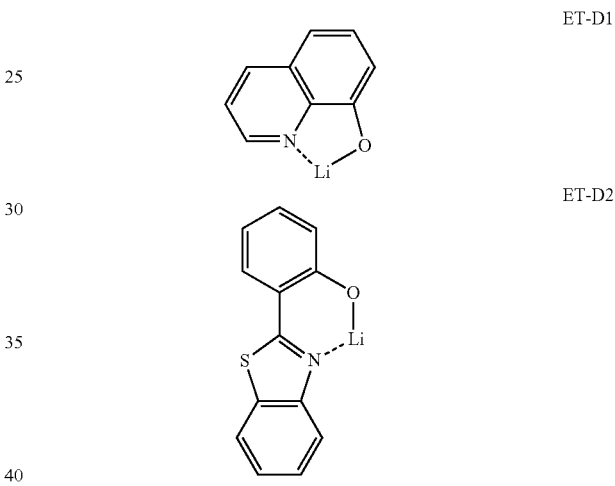

ET-D1

ET-D2

The electron transport region 17 may include an electron injection layer that facilitates injection of electrons from the second electrode 19. The electron injection layer may directly contact the second electrode 19.

The electron injection layer may have i) a single-layered structure consisting of a single layer consisting of a single material, ii) a single-layered structure consisting of a single layer consisting of a plurality of different materials, or iii) a multi-layered structure having a plurality of layers consisting of a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof.

The alkali metal may be Li, Na, K, Rb, and Cs. In an embodiment, the alkali metal may be Li, Na, or Cs. In one or more embodiments, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be oxides or halides (for example, fluorides, chlorides, bromides, or iodides) of the alkali metal, the alkaline earth-metal, or the rare earth metal.

The alkali metal compound may be an alkali metal oxide, such as $Li_2O$, $Cs_2O$, or $K_2O$, or an alkali metal halide, such as LiF, NaF, CsF, KF, LiI, NaI, CsI, or KI. In an embodiment, the alkali metal compound may be LiF, $Li_2O$, NaF, LiI, NaI, CsI, or KI, but embodiments of the present disclosure are not limited thereto.

The alkaline earth-metal compound may be an alkaline earth-metal oxide such as BaO, SrO, CaO, $Ba_xSr_{1-x}O$ (0<x<1), or $Ba_xCa_{1-x}O$ (0<x<1). In an embodiment, the alkaline earth-metal compound may be BaO, SrO, or CaO, but embodiments of the present disclosure are not limited thereto.

The rare earth metal compound may be $YbF_3$, $ScF_3$, $Sc_2O_3$, $Sc_2O_3$, $Y_2O_3$, $Ce_2O_3$, $GdF_3$, or $TbF_3$. In an embodiment, the rare earth metal compound may be $YbF_3$, $ScF_3$, $TbF_3$, $Yb_3$, $ScI_3$, or $Tb_3$, but embodiments of the present disclosure are not limited thereto.

The alkali metal complex, the alkaline earth-metal complex, and the rare earth metal complex may include an ion of an alkali metal, an alkaline earth-metal, and a rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may include, for example consist essentially of or consist of, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix include, for example consisting essentially of or consisting of, the organic material.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

Second Electrode 19

The second electrode 19 may be located on the organic layer 10A having such a structure. The second electrode 19 may be a cathode which may be an electron injection electrode, and in this regard, a material for forming the second electrode 19 may be a metal, an alloy, an electrically conductive compound, or a combination thereof, which have a relatively low work function.

The second electrode 19 may include at least one of lithium (Li), silver (Ag), magnesium (Mg), aluminum (Al), aluminum-lithium (Al—Li), calcium (Ca), magnesium-indium (Mg—In), magnesium-silver (Mg—Ag), indium tin oxide (ITO), or indium zinc oxide (IZO), but embodiments of the present disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Figure 2:
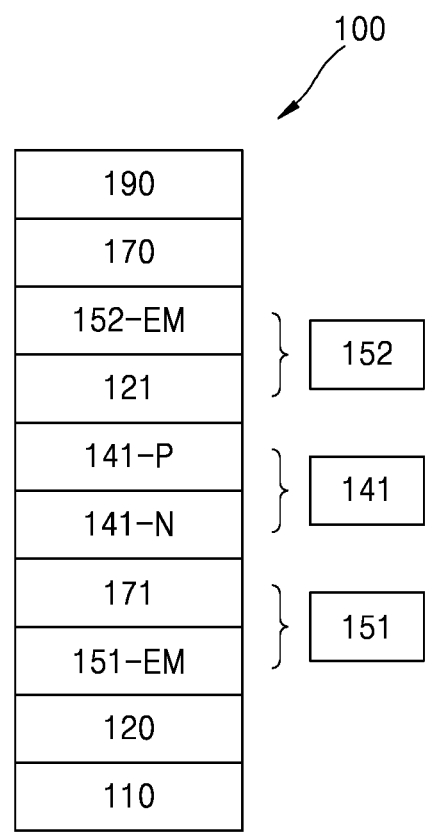
FIG. 2 is a schematic cross-sectional view of an organic light-emitting device according to one or more embodiments.

Description of FIG. 2

FIG. 2 is a schematic cross-sectional view of an organic light-emitting device 100 according to another embodiment.

The organic light-emitting device 100 of FIG. 2 includes a first electrode 110, a second electrode 190 facing the first electrode 110, and a first emission unit 151 and a second emission unit 152 that are stacked between the first electrode 110 and the second electrode 190. A charge generating layer 141 is disposed between the first emission unit 151 and the second emission unit 152, and the charge generating layer 141 includes an n-type charge generating layer 141-N and a p-type charge generating layer 141-P. The charge generating layer 141 is a layer that generates charge and supplies the charge to neighboring emission units, and any known material may be used therefor.

The first emission unit 151 includes a first emission layer 151-EM, and the second emission unit 152 includes a second emission layer 152-EM. The maximum emission wavelength of light emitted from the first emission unit 151 may be different from the maximum emission wavelength of light emitted from the second emission unit 152. For example, the mixed light of the light emitted from the first emission unit 151 and the light emitted from the second emission unit 152 may be white light, but embodiments of the present disclosure are not limited thereto.

A hole transport region 120 is disposed between the first emission unit 151 and the first electrode 110, and the second emission unit 152 may include a first hole transport region 121 located on the side of the first electrode 110.

An electron transport region 170 is disposed between the second emission unit 152 and the second electrode 190, and the first emission unit 151 may include a first electron transport region 171 disposed between the charge generating layer 141 and the first emission layer 151-EM.

The first emission layer 151-EM may include a first host and a dopant, the dopant may be an organometallic compound including platinum (Pt), and the organic light-emitting device 100 satisfies a condition of HOMO(D)−HOMO (Host1)≥0.2 eV. Here, HOMO(D) is a HOMO energy level (eV) of the dopant, HOMO(Host 1) is a HOMO energy level (eV) of the first host, and HOMO(D) and HOMO(Host 1) are each measured using a photoelectron spectrometer, for example a photoelectron spectrometer AC-3, in an ambient atmosphere.

The first emission layer 152-EM may include a first host and a dopant, the dopant may be an organometallic compound including platinum (Pt), and the organic light-emitting device 100 satisfies a condition of HOMO(D)−HOMO (Host1)≥0.2 eV may be satisfied. Here, HOMO(D) is a HOMO energy level (eV) of the dopant, HOMO(Host 1) is a HOMO energy level (eV) of the first host, and HOMO(D) and HOMO(Host 1) are each measured using a photoelectron spectrometer, for example photoelectron spectrometer AC-3, in an ambient atmosphere.

Without being bound by theory, since the organic light-emitting device 100 satisfies HOMO(Host1)≤−5.65 eV, a hole injection voltage to the emission layer decreases, and hole carrier accumulation occurs at an interface of the emission layer on the first electrode side. Furthermore, since the organic light-emitting device 10 satisfies HOMO(D)−HOMO(Host1)≥0.2 eV, as a trap depth increases, a dopant included in the emission layer 15 may act as a trap site with respect to a hole injected to the emission layer 15. Since a hole trap easily occurs in the emission layer 15, hole mobility in the emission layer 15 decreases. Accordingly, the organic light-emitting device according to an embodiment decreases hole mobility, thereby suppressing change in charge balance in the emission layer, resulting in improvement of lifespan.

The first electrode 110, the hole transport region 120, and the second electrode 190 illustrated in FIG. 2 are respectively the same as described in connection with the first electrode 11, the hole transport region 13, and the second electrode 19 illustrated in FIG. 1.

The first emission layer 151-EM and the second emission layer 152-EM illustrated in FIG. 2 are each the same as described in connection with the emission layer 15 illustrated in FIG. 1.

The electron transport region 170 and the first electron transport region 171 illustrated in FIG. 2 are each the same as described in connection with the electron transport region 17 illustrated in FIG. 1.

Hereinbefore, both the first emission unit 151 and the second emission unit 152 illustrated in FIG. 2 are described to include, as a dopant, a platinum-containing organometallic compound and satisfy HOMO(D)−HOMO(Host1)≥0.2 eV. However, one of the first emission unit 151 and the second emission unit 152 may be replaced with any known emission unit, and various modifications thereof.

Description of Terminology

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group. Examples thereof include a methylene group, an ethylene group, a propylene group, an isobutylene group, a sec-butylene group, a tert-butylene group, a pentylene group, an isoamylene group, and a hexylene group.

The term "$C_1$-$C_{60}$ alkoxy group" used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein has a structure including at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group. Examples thereof include an ethenylene group, a propenylene group, and a butenylene group.

The term "$C_2$-$C_{60}$ alkynyl group" as used herein has a structure including at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group. Examples thereof include an ethynylene group and a propynylene group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group. Examples thereof include a cyclopropylene group, a cyclobutylene group, a cyclopentylene group, and a cyclohexylene group.

The term "$C_1$-$C_{10}$ heterocycloalkyl group" as used herein refers to a monovalent monocyclic group having at least one heteroatom selected from N, O, P, Si, and S as a ring-forming atom and 1 to 10 carbon atoms, and examples thereof include a tetrahydrofuranyl group and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms, at least one carbon-carbon double bond in the ring thereof, and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group. Examples thereof include a cyclopentenylene group, a cyclohexenylene group, and a cycloheptenylene group.

The term "$C_1$-$C_{10}$ heterocycloalkenyl group" as used herein refers to a monovalent monocyclic group that has at least one hetero atom selected from N, O, P, Si, and S as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. Examples of the $C_6$-$C_{60}$ arylene group include a phenylene group, a naphthylene group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_7$-$C_{60}$ arylalkyl group" as used herein refers to a monovalent alkyl group substituted with an aryl group.

The term "$C_1$-$C_{60}$ heteroaryl group" as used herein refers to a monovalent group having at least one hetero atom selected from N, O, P, Si, and S as a ring-forming atom and a cyclic aromatic system having 1 to 60 carbon atoms, and the term "$C_1$-$C_{60}$ heteroarylene group" as used herein refers to a divalent group having at least one hetero atom selected from N, O, P, Si, and S as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. Examples of the $C_1$-$C_{60}$ heteroarylene group include a pyridinylene group, a pyrimidinylene group, a pyrazinylene group, a pyridazinylene group, a triazinylene group, a quinolinylene group, and an isoquinolinylene group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_1$-$C_{60}$ heteroaryloxy group" as used herein indicates —$OA_{103}$ (wherein $A_{103}$ is the $C_6$-$C_{60}$ heteroaryl group). The term "$C_1$-$C_{60}$ heteroarylthio group" as used herein indicates —$SA_{104}$ (wherein $A_{104}$ is the $C_6$-$C_{60}$ heteroaryl group). The term "$C_2$-$C_{60}$ heteroarylalkyl group" as used herein indicates a monovalent alkyl group substituted with a heteroaryl group.

The term "monovalent non-aromatic condensed polycyclic group" as used herein refers to a monovalent group (for example, having 8 to 60 carbon atoms) having two or more rings condensed to each other, only carbon atoms as ring-forming atoms, and non-aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, a heteroatom selected from N, O, P, Si, and S, other than carbon atoms, as a ring-forming atom, and non-aromaticity in its entire molecular structure. The monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{60}$ carbocyclic group" as used herein refers to a saturated or unsaturated cyclic group having, as a ring-forming atom, 5 to 60 carbon atoms only. The $C_5$-$C_{60}$ carbocyclic group may be a monocyclic group or a polycyclic group.

The term "$C_1$-$C_{60}$ heterocyclic group" as used herein refers to a saturated or unsaturated cyclic group having, as a ring-forming atom, at least one heteroatom selected from N, O, P, Si, and S other than 1 to 60 carbon atoms. The $C_1$-$C_{60}$ heterocyclic group may be a monocyclic group or a polycyclic group.

At least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, or —$P(=O)(Q_{28})(Q_{29})$; or —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one of deuterium, a $C_1$-$C_{60}$ alkyl group, or a $C_6$-$C_{60}$ aryl group; a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of deuterium, a $C_1$-$C_{60}$ alkyl group, or a $C_6$-$C_{60}$ aryl group; a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group.

The terms "a biphenyl group, a terphenyl group, and a tetraphenyl group" used herein respectively refer to monovalent groups in which two, three, or four phenyl groups which are linked together via a single bond.

The terms "a cyano-containing phenyl group, a cyano-containing biphenyl group, a cyano-containing terphenyl group, and a cyano-containing tetraphenyl group" used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and the "cyano-containing phenyl group, the cyano-containing biphenyl group, the cyano-containing terphenyl group, and the cyano-containing tetraphenyl group" may further include substituents other than a cyano group. For example, "a cyano-containing phenyl group" may refer to both a phenyl group substituted with a cyano group and a phenyl group substituted with a cyano group and a methyl group.

Hereinafter, compounds and organic light-emitting devices according to exemplary embodiments are described in additional detail with reference to Synthesis Examples and Examples, but embodiments of the present disclosure are not limited thereto.

EXAMPLES

The wording "B was used instead of A" used in describing Synthesis Examples means that an amount of A used was identical to an amount of B used, in terms of a molar equivalent.

Synthesis Example 1

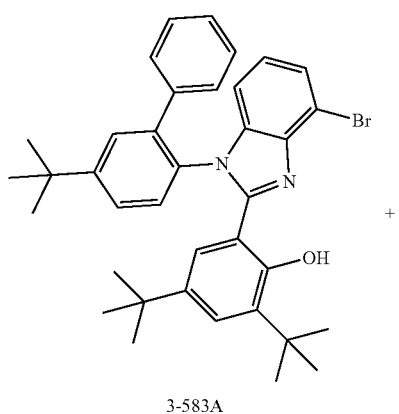

3-583A

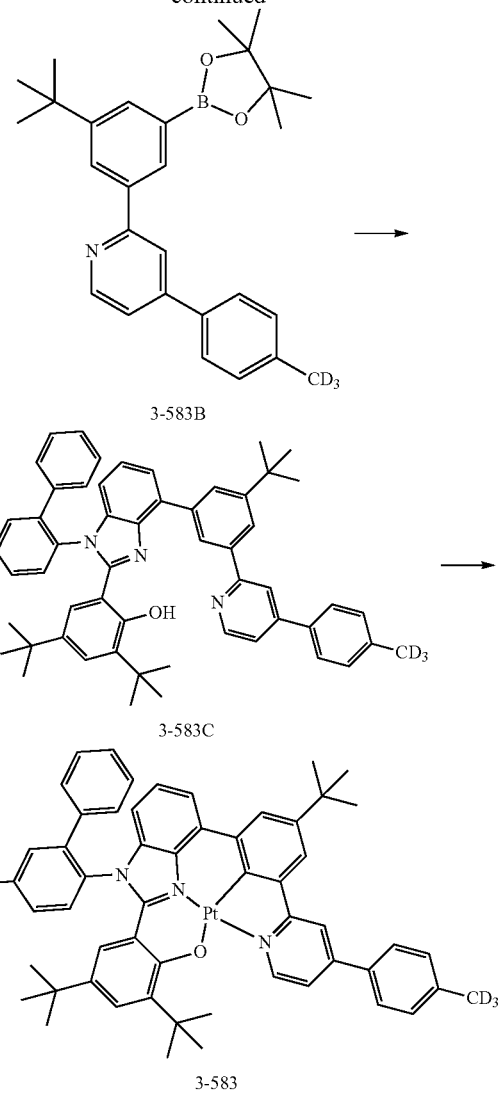

3-583B 3-583C 3-583

(1) Synthesis of Ligand 3-583C 2.2 grams (g) (0.005 millimoles (mmol), 1.2 equivalents (equiv.)) of Intermediate 3-583B, 2.4 g (0.004 mol, 1 equiv.) of Intermediate 3-583A (2-(4-bromo-1-(5-(tert-butyl)-[1,1'-biphenyl]-2-yl)-1H-benzo[d]imidazol-2-yl)-4,6-di-tert-butylphenol), 1.2 g (0.001 mmol, 0.07 equiv.) of tetrakis(triphenylphosphine)palladium(0), and 2.0 g (0.015 mmol, 3.7 equiv.) of potassium carbonate were dissolved in 80 mL of a solvent in which tetrahydrofuran (THF) and distilled water ($H_2O$) were mixed at a ratio of 3:1, and then heated at reflux for 12 hours. The obtained result was cooled to room temperature, and then, the precipitate was removed therefrom to obtain a filtrate. The filtrate was washed with an ethyl acetate/water (EA/$H_2O$) solution, and column chromatography (eluent: EA/hexanes (Hex) ratio increased from 20% to 35%) was performed thereon to complete the production of 2.2 g (yield of 68%) of Ligand 3-583C. Ligand 3-583C was confirmed by mass chromatography and high performance liquid chromatography (HPLC) analysis.

High resolution mass spectrometry-matrix assisted laser desorption ionization (HRMS(MALDI)): calcd. for $C_{59}H_{60}D_3N_3O$: m/z 832.5159, Found: 832.5161.

(2) Synthesis of Compound 3-583

2.2 g (2.26 mmol) of Ligand 3-583C and 1.1 g (2.26 mmol, 1.0 equiv.) of $K_2PtCl_4$ were dissolved in a solvent (80 mL) in which 60 mL of acetic acid (AcOH) and 20 mL of $H_2O$ were mixed, and then refluxed for 16 hours. The obtained result was cooled to room temperature, and a precipitate was filtered therefrom. The precipitate was dissolved again in methylene chloride (MC), and then washed with $H_2O$. Then, column chromatography (eluent: MC 40%, ethyl acetate (EA) 1%, and Hex 59%) was performed thereon to obtain 1.0 g (purity of 99% or more, actual yield of 68%) of Compound 3-583. Compound 3-583 was confirmed by mass chromatography and HPLC analysis.

HRMS(MALDI): calcd. for $C_{59}H_{58}D_3N_3OPt$: m/z 1025.4651, Found: 1025.4653.

Evaluation Example 1: Evaluation of HOMO Energy Level

HOMO energy levels of the following Compounds were measured using a photoelectron spectrometer AC-3 (manufactured by RIKEN KEIKI Co., Ltd.) in an ambient atmosphere, and results thereof are shown in Table 1.

TABLE 1

| Compound | HOMO energy level (eV) |
|---|---|
| H-HT1 | −5.58 |
| H-HT2 | −5.65 |
| H-ET1 | −6.07 |
| 3-583 | −5.43 |

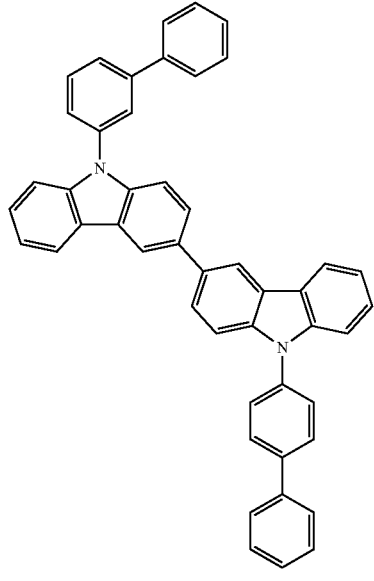

H-HT1

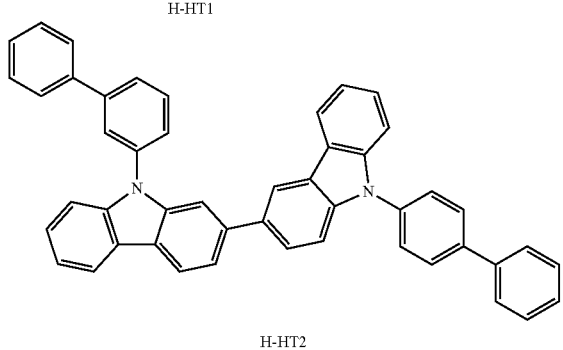

H-HT2

Evaluation Example 2: Evaluation of Current Density of Hole Only Device (HOD) and Electron Only Device (EOD)

Manufacture of Comparative Device HOD-1

An ITO glass substrate was cut to a size of 50 mm×50 mm×0.5 mm, sonicated separately in acetone, isopropyl alcohol, and deionized water, each for 15 minutes, and then, cleaned by exposure to Ultraviolet (UV) light and ozone for 30 minutes.

Subsequently, F6-TCNNQ was deposited on an ITO electrode (anode) on the glass substrate to form a hole injection layer having a thickness of 100 Å, and HT1 was deposited on the hole injection layer to form a hole transport layer having a thickness of 1,000 Å, thereby completing the formation of a hole transport region.

Subsequently, H-HT1 as a hole transport host and H-ET1 as an electron transport host (wherein a weight ratio of the hole transport host to the electron transport host is 5:5) as hosts and Compound 3-583 as a dopant were co-deposited (wherein a weight ratio of the hosts to the dopant is 10:1) on the hole transport layer to form an emission layer having a thickness of 500 Å.

Subsequently, Al was vacuum-deposited on the emission layer to form a second electrode (cathode) having a thickness of 1,200 Å, thereby completing the manufacture of an HOD-1 having a structure of ITO/F6-TCNNQ (100 Å)/HT1 (1,000 Å)/(H-HT1+H-ET1):3-583 (10 wt %) (500 Å)/Al (1,200 Å).

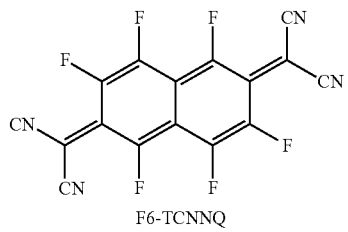

F6-TCNNQ

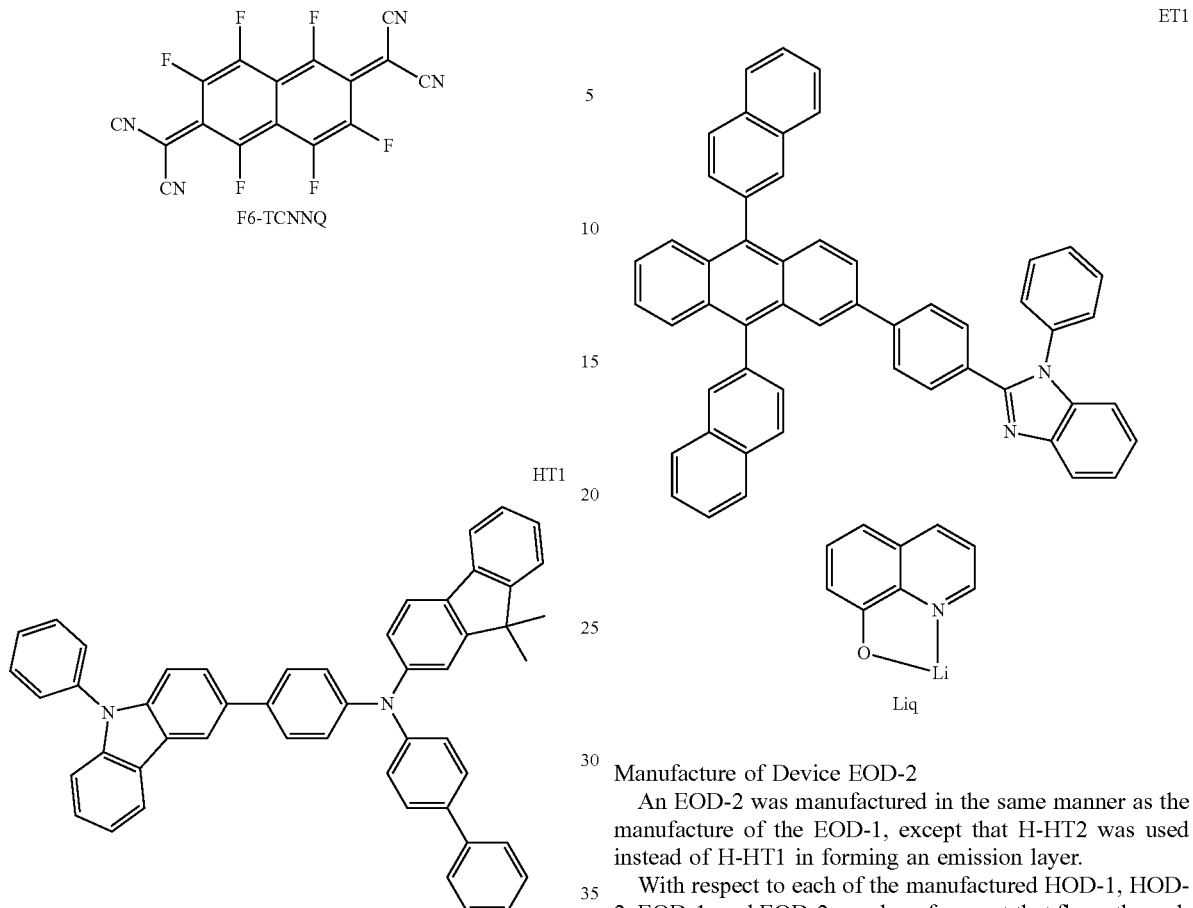

HT1

ET1

Liq

Manufacture of Device HOD-2

An HOD-2 was manufactured in the same manner as the manufacture of the HOD-1, except that H-HT2 was used instead of H-HT1 in forming an emission layer.

Manufacture of Comparative Device EOD-1

An ITO glass substrate was cut to a size of 50 mm×50 mm×0.5 mm, sonicated separately in acetone, isopropyl alcohol, and pure water, each for 15 minutes, and then, cleaned by exposure to UV light and ozone for 30 minutes.

Subsequently, Compound ET1 and Liq were co-deposited at a weight ratio of 5:5 on an ITO electrode (anode) on the glass substrate to form an electron transport layer having a thickness of 500 Å, H-HT1 as a hole transport host and H-ET1 as an electron transport host (wherein a weight ratio of a hole transport host to an electron transport host is 5:5) as hosts and Compound 3-583 as a dopant were co-deposited (wherein a weight ratio of the hosts to the dopant is 10:1) thereon to form an emission layer having a thickness of 500 Å, and then Compound ET1 and Liq were co-deposited at a weight ratio of 5:5 to form an electron transport layer having a thickness of 500 Å.

Subsequently, Al was vacuum-deposited on the emission layer to form a second electrode (cathode) having a thickness of 1,200 Å, thereby completing the manufacture of an EOD-1 having a structure of ITO/ET1:Liq (500 Å)/(H-HT1+H-ET1):3-583 (10 wt %) (500 Å)/ET1:Liq (500 Å)/Al (1,200 Å).

Manufacture of Device EOD-2

An EOD-2 was manufactured in the same manner as the manufacture of the EOD-1, except that H-HT2 was used instead of H-HT1 in forming an emission layer.

With respect to each of the manufactured HOD-1, HOD-2, EOD-1, and EOD-2, a value of current that flows through each device while increasing a voltage was measured using a current-voltage meter (Keithley 2400). Then, current density obtained by dividing the measured value of current by an emission area was calculated and results thereof are shown in FIGS. 3 and 4.

Figure 3:
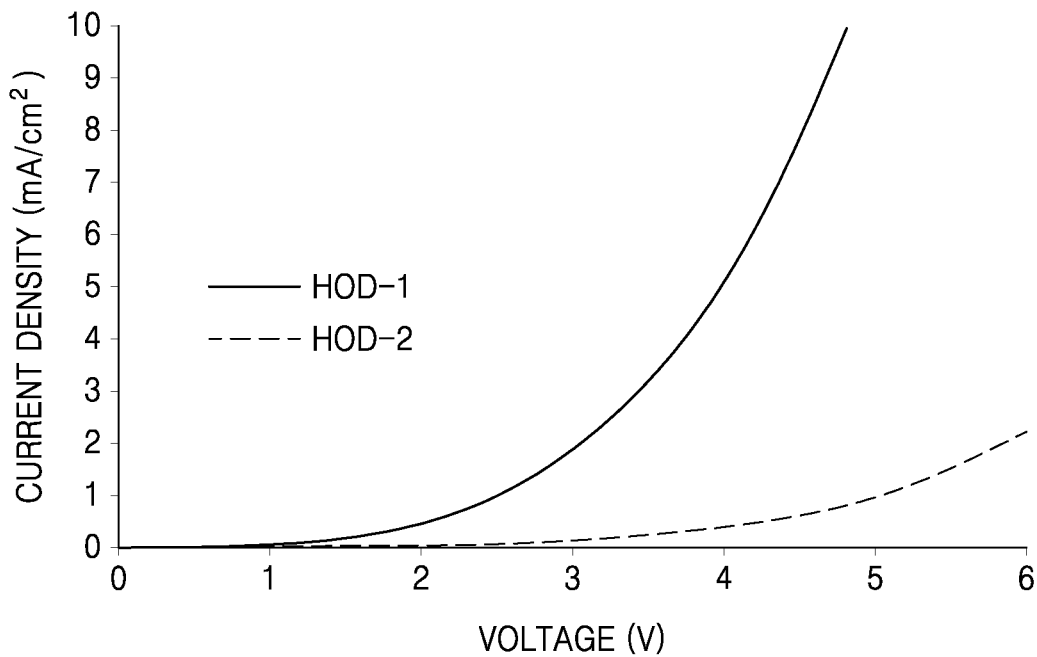
FIG. 3 is a graph of current density (milliamps per square centimeter, mA/cm$^2$) versus voltage (Volts, V) that shows a current density-voltage (J-V) curve of HOD devices manufactured according to Comparative Preparation Example 1 and Preparation Example 1.

FIG. 3 shows a current density versus voltage (J-V) curve of the HOD-1 and the HOD-2. As shown in FIG. 3, in the case of the HOD-2 in which satisfies HOMO(D)−HOMO (Host 1)≥0.2 eV, current density significantly decreases, compared to the HOD-1 that does not satisfy the energy relationship.

Figure 4:
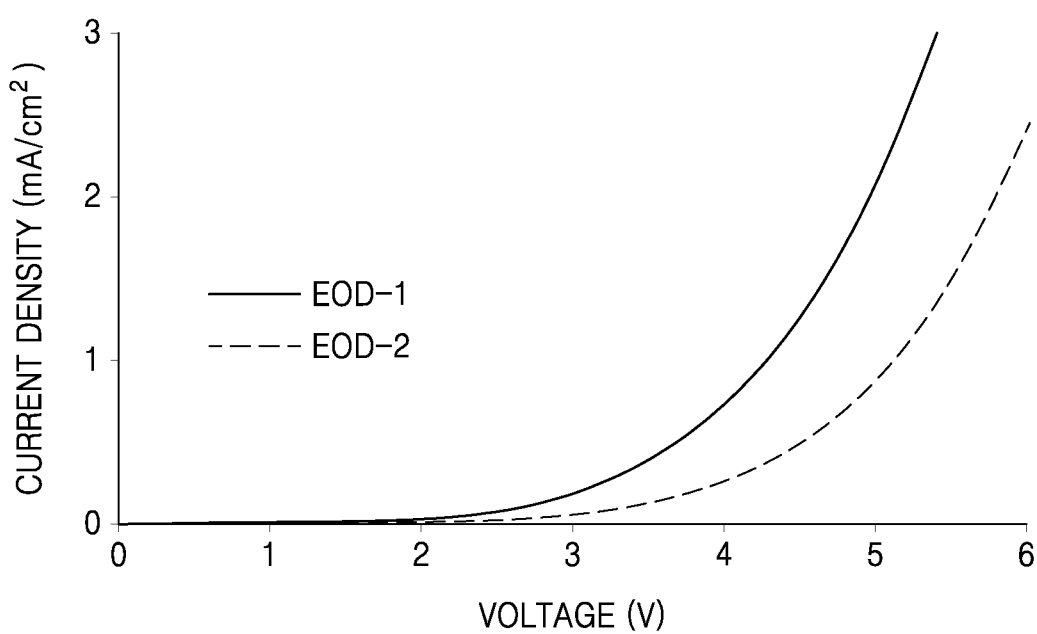
FIG. 4 is a graph of current density (mA/cm$^2$) versus voltage (V) that shows a current density-voltage (J-V) curve of EOD devices manufactured according to Comparative Preparation Example 2 and Preparation Example 2.

FIG. 4 shows a current density versus voltage (J-V) curve of the EOD-1 and EOD-2. As shown in FIG. 4, in the case of the EOD-2 in which satisfies HOMO(D)−HOMO(Host 1)≥0.2 eV, current density slightly decreases, compared to the EOD-1 that does not satisfy the energy relationship.

Meanwhile, it is confirmed that when current density reduction rates of HOD-2 and EOD-2 are compared in a voltage range of 0 V to 6 V in the J-V curves of FIGS. 3 and 4, the current density reduction rate in the HOD is greater than the current density reduction rate in the EOD.

Evaluation Example of Device

Comparative Example 1

An ITO glass substrate was cut to a size of 50 mm×50 mm×0.5 mm, sonicated separately in acetone, isopropyl alcohol, and pure water, each for 15 minutes, and then, cleaned by exposure to UV light and ozone for 30 minutes.

Subsequently, F6-TCNNQ was deposited on an ITO electrode (anode) on the glass substrate to form a hole injection layer having a thickness of 100 Å, and HT1 was deposited on the hole injection layer to form a hole transport layer having a thickness of 1,200 Å, thereby completing the formation of a hole transport region.

Subsequently, H-HT1 as a hole transport host and H-ET1 as an electron transport host (wherein a weight ratio of the hole transport host to the electron transport host is 5:5) as hosts and Compound 3-583 as a dopant were co-deposited (wherein a weight ratio of the hosts to the dopant is 10:1) on the hole transport layer to form an emission layer having a thickness of 500 Å.

Subsequently, Compound ET1 and Liq were co-deposited at a weight ratio of 5:5 on the emission layer to form an electron transport layer having a thickness of 500 Å, LiF was deposited on the electron transport layer to form an electron injection layer having a thickness of 10 Å, and then Al was vacuum-deposited on the electron injection layer to form a second electrode (cathode) having a thickness of 1,200 Å, thereby completing the manufacture of an organic light-emitting device having a structure of ITO/F6-TCNNQ (100 Å)/HT1 (1,200 Å)/(H-HT1+H-ET1):3-583 (10 wt %) (500 Å)/ET1:Liq (50 wt %) (500 Å)/LiF (10 Å)/Al (1,200 Å).

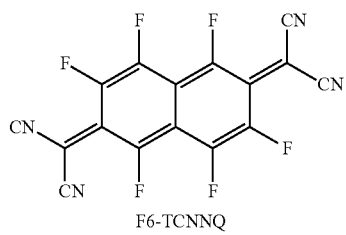

F6-TCNNQ

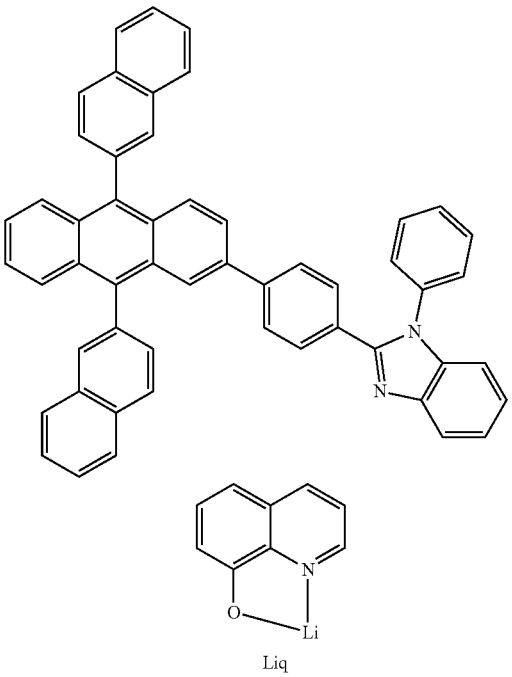

HT1

ET1

Liq

Comparative Example 2

An organic light-emitting device was manufactured in the same manner as in Comparative Example 1, except that, in forming an emission layer, H-HT2 was used instead of H-HT1, and Ir(ppy)$_3$ was used instead of Compound 3-583.

Example 1

An organic light-emitting device was manufactured in the same manner as in Comparative Example 1, except that H-HT2 was used instead of H-HT1 in forming an emission layer.

Figure 5:
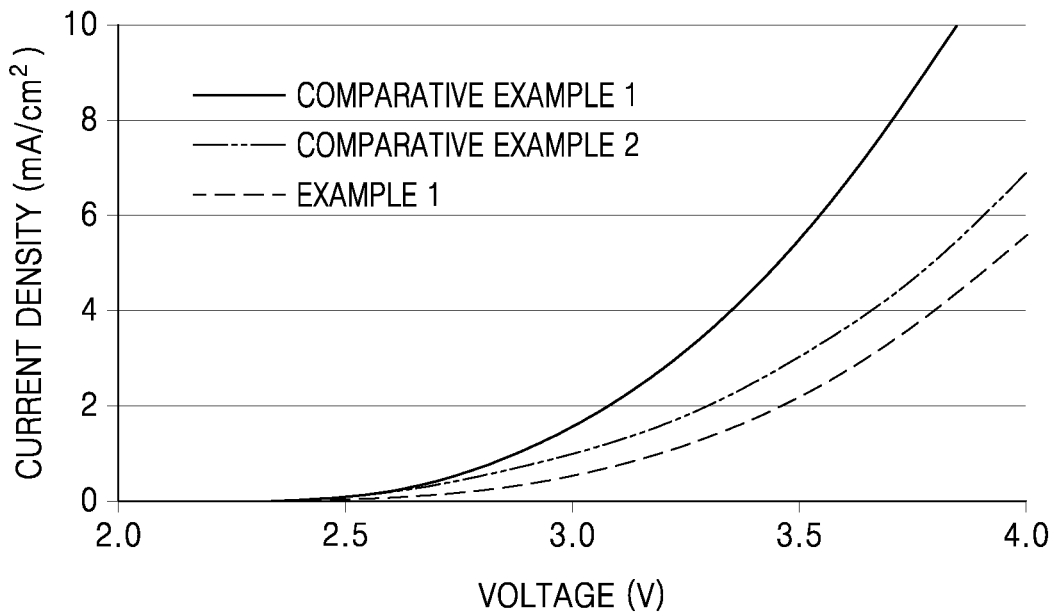
FIG. 5 is a graph of current density (mA/cm$^2$) versus voltage (V) that shows a current density-voltage (J-V) curve of organic light-emitting devices manufactured according to Comparative Examples 1 and 2 and Example 1.

With respect to each of the organic light-emitting devices manufactured according to Comparative Examples 1 and 2 and Example 1, a current density according to a voltage was measured, and the J-V curve is shown in FIG. 5.

Figure 6:
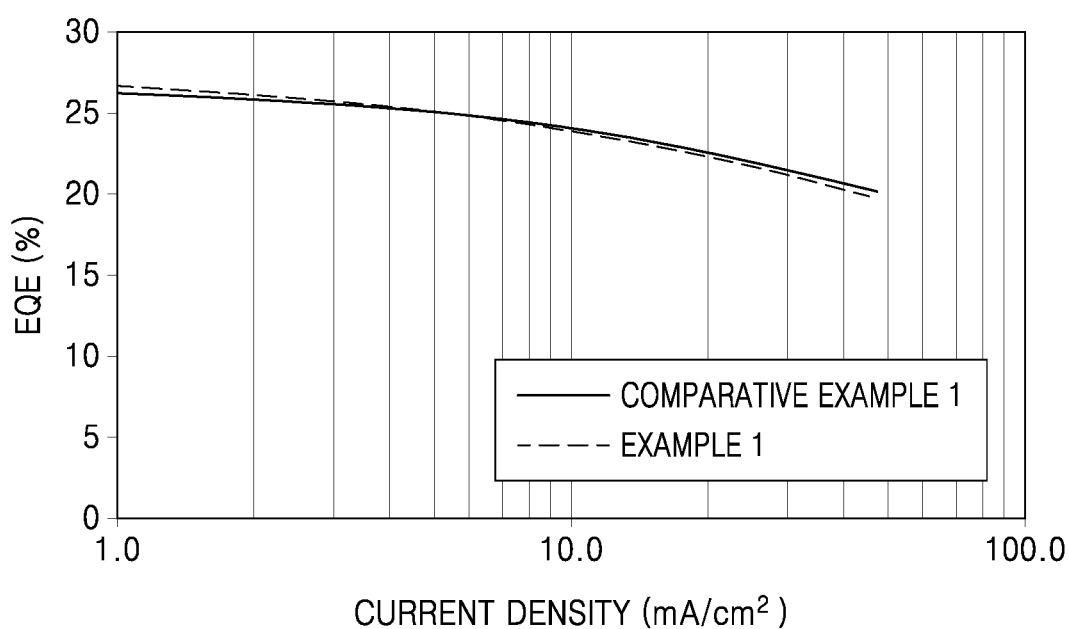
FIG. 6 is a graph of external quantum efficiency (EQE, %) versus current density (mA/cm$^2$) and shows an external quantum efficiency-current density graph of organic light-emitting devices manufactured according to Comparative Example 1 and Example 1.
Figure 7:
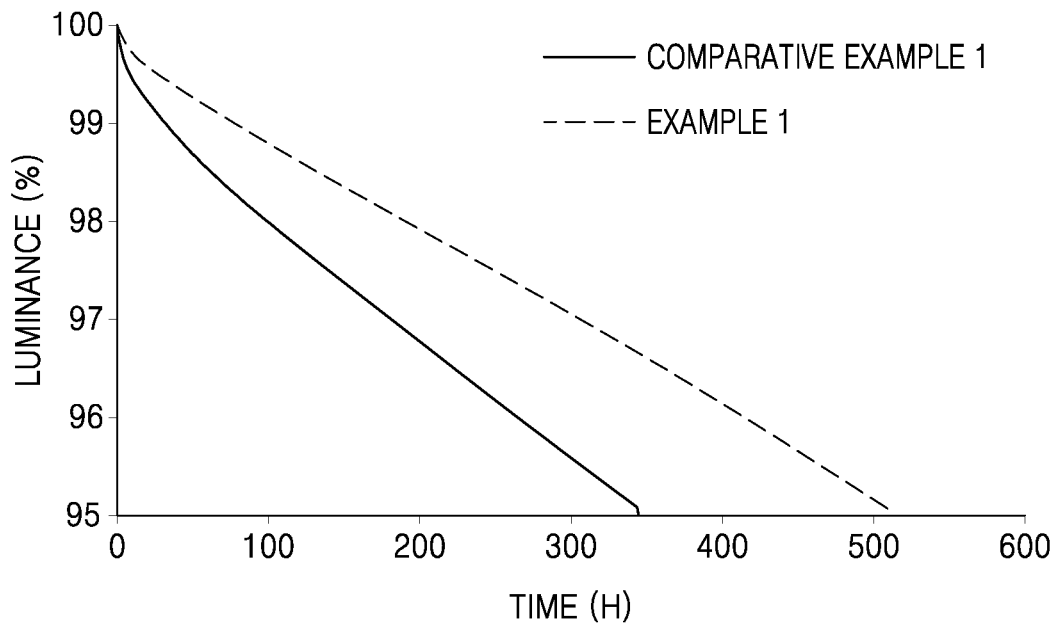
FIG. 7 is a graph of luminance (%) versus time (hours, H) and shows a lifespan graph of organic light-emitting devices manufactured according to Comparative Example 1 and Example 1.

With respect to each of the organic light-emitting devices manufactured according to Comparative Example 1 and example 1, external quantum efficiency (EQE) according to a current density and lifespan were evaluated. Then, an EQE-current density graph is shown in FIG. 6, and a lifespan graph is shown in FIG. 7. As evaluation apparatuses, a current-voltage meter (Keithley 2400) and a luminance meter (Minolta Cs-1000A) were used. Lifespan ($T_{95}$) refers to a time that is taken for the luminance to become 95% compared to the initial luminance of 100%.

As shown in FIG. 5, in the case of the organic light-emitting device manufactured according to Example 1, current density decreases when the same voltage is applied, compared to the organic light-emitting devices manufactured according to Comparative Examples 1 and 2. However, referring to FIG. 6, the organic light-emitting device manufactured according to Example 1 and the organic light-emitting device manufactured according to Comparative Example 1 have substantially no difference in external quantum efficiency under the same current density.

As shown in FIG. 7, when each of the organic light-emitting devices was driven with the same initial luminance of 6,000 candela per square meter (cd/m$^2$), lifespan T$_{95}$ of the device manufactured according to Example 1 was significantly improved compared to that of the device manufactured according to Comparative Example 1. That is, it is confirmed that the organic light-emitting device manufactured according to Example 1 has improved lifespan compared to the organic light-emitting device manufactured according to Comparative Example 1.

Figure 8:
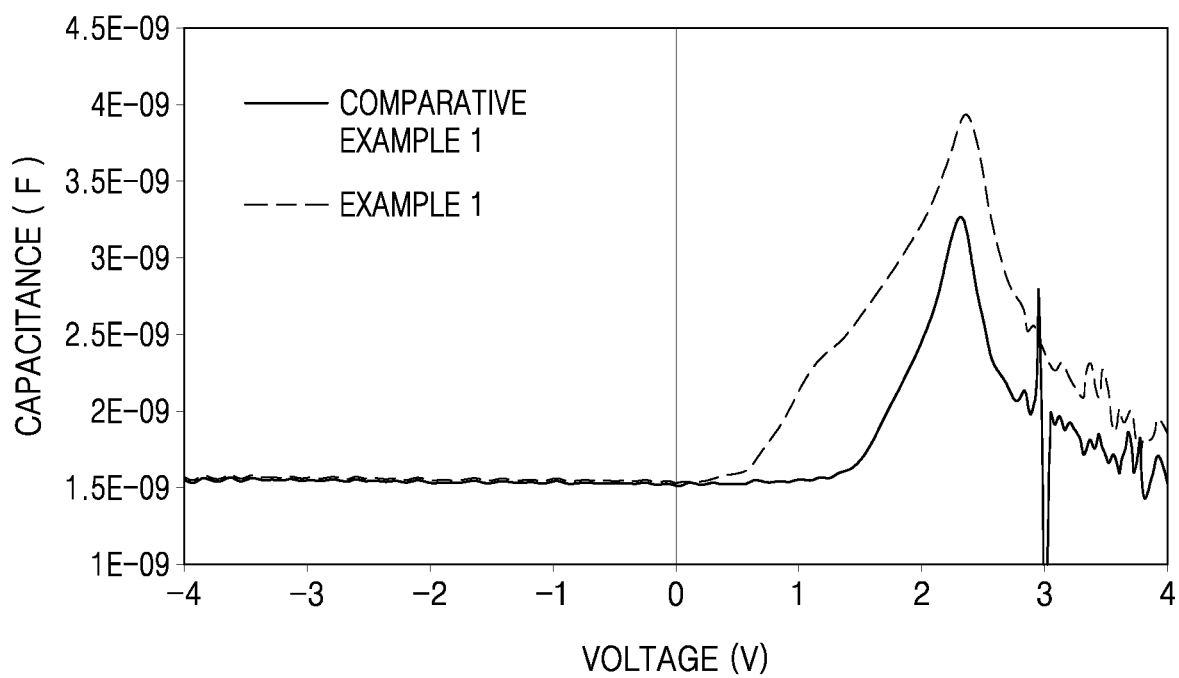
FIG. 8 is a graph of capacitance (Faradays, F) versus voltage (V) and shows a capacitance-voltage graph, measured with a 100 Hertz (Hz) of alternating current (A/C), of organic light-emitting devices manufactured according to Comparative Example 1 and Example 1.

FIG. 8 shows a capacitance-voltage (C-V) graph of the organic light-emitting devices manufactured according to Comparative Example 1 and Example 1. C-V measurement was measured at 100 Hz A/C current using an impedance/gain-phase analyzer (HP 4194A). As shown in FIG. 8, in the case of the organic light-emitting device manufactured according to Example 1 that satisfies HOMO(D)−HOMO(Host1)≥0.2 eV, an onset voltage which is a driving voltage at which charge starts to be injected decreases compared to the organic light-emitting device manufactured according to Comparative Example 1. That is, compared to the organic light-emitting device manufactured according to Comparative Example 1, in the organic light-emitting device manufactured according to Example 1, a hole injection voltage decreases, resulting in hole carrier accumulation at an interface of the emission layer on the first electrode side.

With respect to each of the organic light-emitting devices manufactured according to Comparative Example 2 and Example 1, external quantum efficiency (EQE) according to luminance and light-emission lifespan were evaluated. Then, an EQE-luminance graph is shown in FIG. 9, and a lifespan graph is shown in FIG. 10.

Figure 9:
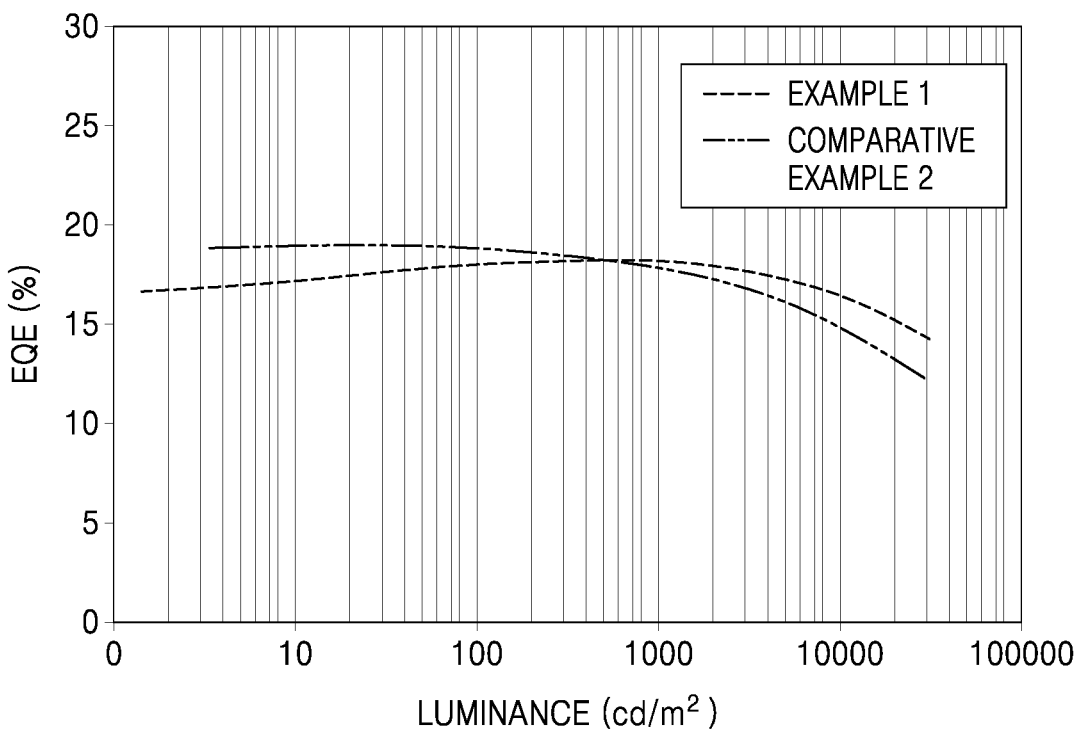
FIG. 9 is a graph of external quantum efficiency (EQE, %) versus luminance (candela per square meter, $cd/m^2$) and shows an EQE-luminance graph of organic light-emitting devices manufactured according to Comparative Example 2 and Example 1.

As shown in FIG. 9, in the case of the organic light-emitting device manufactured according to Comparative Example 2, in a range of 1,000 cd/m$^2$ or greater, efficiency significantly decreases as luminance increases, whereas, in the case of the organic light-emitting device manufactured according to Example 1, in a range of 1,000 cd/m$^2$ or greater, change in efficiency is relatively small.

Figure 10:
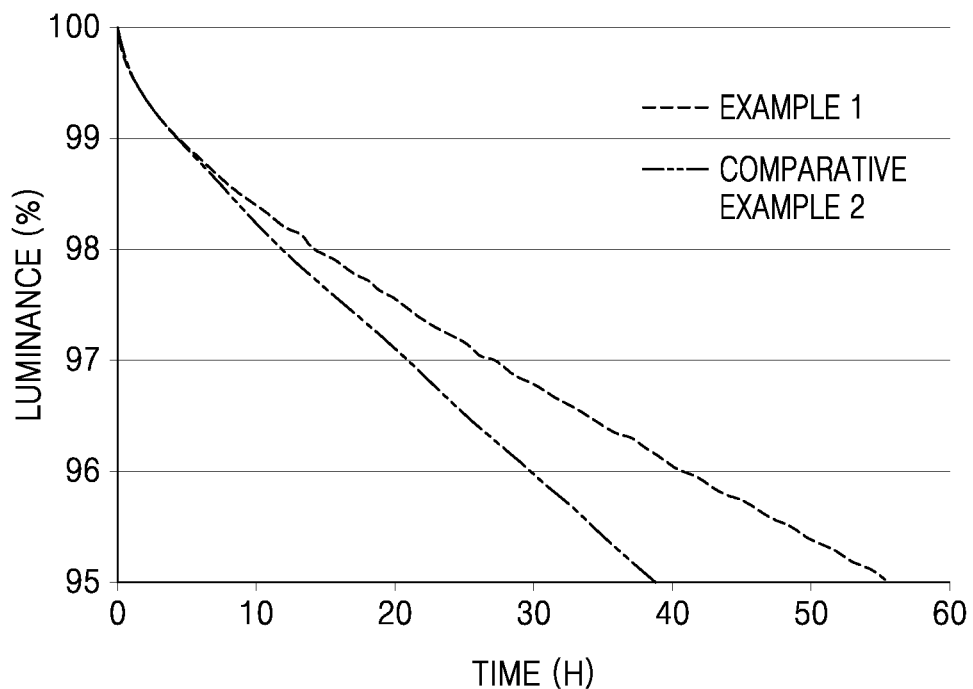
FIG. 10 is a graph of luminance (%) versus time (H) and shows a lifespan graph of organic light-emitting devices manufactured according to Comparative Example 2 and Example 1.

As shown in FIG. 10, the organic light-emitting device manufactured according to Example 1 has improved lifespan T$_{95}$ compared to the organic light-emitting device manufactured according to Comparative Example 2 in which an iridium-based dopant was used.

According to an aspect, the organic light-emitting device has long lifespan.

It should be understood that the exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the drawings, it will be understood by those of ordinary skill in the art that various changes in form and details may be made therein without departing from the spirit and scope as defined by the following claims.

What is claimed is:

1. An organic light-emitting device comprising:
a first electrode; a second electrode facing the first electrode; and an organic layer disposed between the first electrode and the second electrode,
wherein the organic layer comprises an emission layer,
the emission layer comprises a first host and a dopant,
the dopant is an organometallic compound including platinum,
the organic light-emitting device satisfies a condition of: HOMO(D)−HOMO(Host 1)≥0.2 electron volts,
HOMO(D) is a highest occupied molecular orbital (HOMO) energy level of the dopant in electron volts,
HOMO(Host 1) is a HOMO energy level of the first host in electron volts, and
HOMO(D) and HOMO(Host 1) are each measured using a photoelectron spectrometer in an ambient atmosphere,
wherein the emission layer further comprises a second host,
the first host is a hole transport host,
the second host is an electron transport host comprising an electron transport moiety, and
the electron transport moiety in the second host is a π-electron-deficient nitrogen-containing cyclic group.

2. The organic light-emitting device of claim 1, wherein the organic light-emitting device satisfies a condition of HOMO(D)−HOMO(Host 1)≥0.22 electron volts.

3. The organic light-emitting device of claim 1, wherein the organic light-emitting device satisfies a condition of HOMO(Host1)≤−5.65 electron volts.

4. The organic light-emitting device of claim 1, wherein the organic light-emitting device satisfies a condition of HOMO(Host1)−HOMO(Host2)≥0,
HOMO(Host 2) is a HOMO energy level of the second host in electron volts, and
HOMO(Host 2) is measured using a photoelectron spectrometer in an ambient atmosphere.

5. The organic light-emitting device of claim 4, wherein the electron transport moiety in the second host is a group represented by one of Formulae 3-1 to 3-3:

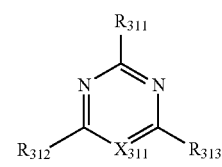

3-1

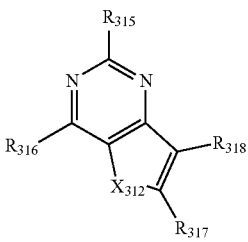

3-2

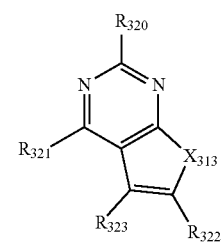

3-3 wherein, in Formulae 2-1 to 2-3,
X$_{311}$ is N or C(R$_{314}$),
X$_{312}$ is O, S, or N(R$_{319}$),
X$_{313}$ is O, S, or N(R$_{324}$), $R_{311}$ to $R_{324}$ are each independently a binding site to a neighboring atom, hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$ ($Q_1$), or —P(=O)($Q_1$)($Q_2$), $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one of deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a substituted or unsubstituted $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a monovalent non-aromatic condensed polycyclic group, or a monovalent non-aromatic condensed heteropolycyclic group, at least one of $R_{311}$ to $R_{313}$ is a binding site to a neighboring atom, at least one of $R_{315}$ to $R_{318}$ is a binding site to a neighboring atom, and at least one of $R_{320}$ to $R_{323}$ is a binding site to a neighboring atom.

6. The organic light-emitting device of claim 1, wherein the first host is a carbazole-containing compound that does not comprise an electron transport moiety.

7. The organic light-emitting device of claim 1, wherein the first host is a carbazole-containing compound comprising an electron transport moiety, and the electron transport moiety is a π electron-deficient nitrogen-containing cyclic group.

8. The organic light-emitting device of claim 1, wherein the first host is a carbazole-containing compound represented by Formula 4:

Formula 4

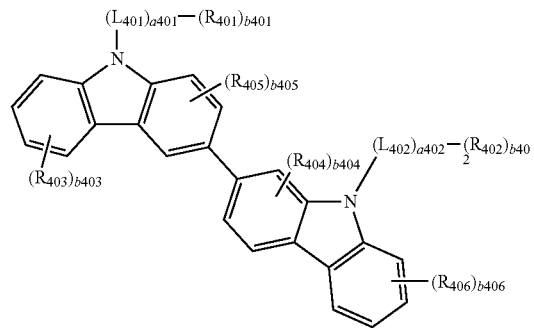

wherein, in Formula 4, $L_{401}$ to $L_{402}$ are each independently a substituted or unsubstituted $C_5$-$C_{60}$ carbocyclic group or a substituted or unsubstituted $C_1$-$C_{60}$ heterocyclic group, a401 to a402 are each independently an integer from 0 to 5, $R_{401}$ and $R_{402}$ are each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $R_{403}$ to $R_{406}$ are each independently selected from hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one of deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a substituted or unsubstituted $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a monovalent non-aromatic condensed polycyclic group, or a monovalent non-aromatic condensed heteropolycyclic group, b401 and b402 are each independently an integer from 1 to 5, b403 and b406 are each independently an integer from 1 to 4, and b404 and b405 are each independently an integer from 1 to 3.

9. The organic light-emitting device of claim 8, wherein $L_{401}$, $L_{402}$, $R_{401}$, and $R_{402}$ do not comprise an electron transport moiety.

10. The organic light-emitting device of claim 9, wherein at least one of $L_{401}$, $L_{402}$, $R_{401}$, and $R_{402}$ comprises an electron transport moiety, and the electron transport moiety is represented by one of Formulae 3-1 to 3-3:

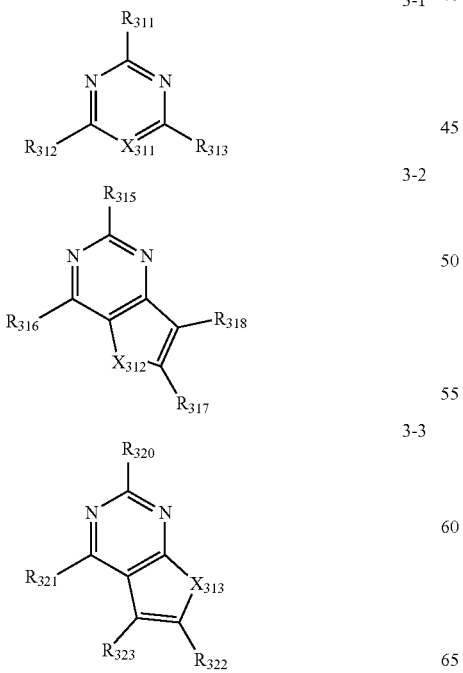

wherein, in Formulae 3-1 to 3-3, $X_{311}$ is N or $C(R_{314})$, $X_{312}$ is O, S, or $N(R_{319})$, $X_{313}$ is O, S, or $N(R_{324})$, $R_{311}$ to $R_{324}$ are each independently selected from a binding site to a neighboring atom, hydrogen, deuterium, —F —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —N$(Q_1)(Q_2)$, —B$(Q_1)(Q_2)$, —C(=O)$(Q_1)$, —S(=O)$_2$ $(Q_1)$, or —P(=O)$(Q_1)(Q_2)$, $Q_1$ to $Q_3$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one of deuterium, a $C_1$-$C_{60}$ alkyl group, and a $C_6$-$C_{60}$ aryl group, a $C_2$-$C_{60}$ alkenyl group, a $C_2$-$C_{60}$ alkynyl group, a $C_1$-$C_{60}$alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of deuterium, a $C_1$-$C_{60}$ alkyl group, and a $C_6$-$C_{60}$ aryl group, a $C_6$-$C_{60}$ aryloxy group, a $C_6$-$C_{60}$ arylthio group, a substituted or unsubstituted $C_7$-$C_{60}$ arylalkyl group, a $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a monovalent non-aromatic condensed polycyclic group, or a monovalent non-aromatic condensed heteropolycyclic group at least one of $R_{311}$ to $R_{313}$ is a binding site to a neighboring atom, at least one of $R_{315}$ to $R_{318}$ is a binding site to a neighboring atom, and at least one of $R_{320}$ to $R_{323}$ is a binding site to a neighboring atom.

11. The organic light-emitting device of claim 1, wherein the dopant is an organometallic compound comprising platinum and an organic ligand, and the platinum and the organic ligand form one cyclometalated ring, two cyclometalated rings, or three cyclometalated rings.

12. The organic light-emitting device of claim 1, wherein the dopant is an organometallic compound comprising platinum and an organic ligand, and
the organic ligand is a tetradentate ligand coordinated to the platinum, wherein the platinum and the organic ligand form three cyclometalated rings or four cyclometalated rings.

13. The organic light-emitting device of claim 1, wherein the dopant is an organometallic compound including platinum and an organic ligand,
the organic ligand is a tetradentate ligand coordinated to the platinum, wherein the platinum and the organic ligand form three cyclometalated rings or four cyclometalated rings, and
the tetradentate organic ligand comprises at least one of benzimidazole, benzoxazole, or benzothiazole.

14. The organic light-emitting device of claim 1, wherein the first electrode is an anode,
the second electrode is a cathode,
the organic layer further comprises a hole transport region disposed between the first electrode and the emission layer,
an electron transport region disposed between the emission layer and the second electrode,
the hole transport region comprises a hole injection layer, a hole transport layer, an emission auxiliary layer, an electron blocking layer, or a combination thereof, and
the electron transport region comprises a hole blocking layer, an electron transport layer, an electron injection layer, or a combination thereof.

15. The organic light-emitting device of claim 14, wherein the hole transport region comprises a first hole transport material and satisfies $T1(HT1) \geq T1(D)$,
wherein $T1(HT1)$ is a triplet energy level of the first hole transport material,
$T1(D)$ is a triplet energy level of the dopant in electron volts, and
$T1(HT1)$ and $T1(D)$ are each measured using a density functional theory (DFT) method of a Gaussian program structurally optimized at a B3LYP level and a 6-31G (d,p) level.

16. The organic light-emitting device of claim 14, wherein the hole transport region comprises a hole transport layer or interlayer,
the hole transport layer or interlayer comprises a first hole transport material,
the hole transport layer or interlayer is in direct contact with the emission layer,
the organic light-emitting device satisfies a condition of $T1(HT1) \geq T1(D)$,
$T1(HT1)$ is a T1 energy level of the first hole transport material in electron volts,
$T1(D)$ is a T1 energy level of the dopant in electron volts, and
$T1(HT1)$ and $T1(D)$ are each measured using a density functional theory (DFT) method of a Gaussian program structurally optimized at a B3LYP level and a 6-31G (d,p) level.

17. The organic light-emitting device of claim 14, wherein the hole transport region further comprises a p-dopant.

18. An organic light-emitting device comprising:
a first electrode;
a second electrode facing the first electrode;
m emission units stacked between the first electrode and the second electrode and comprising at least one emission layer; and
m-1 charge generating layers disposed between two adjacent emission units, wherein the emission units are the m emission units, wherein each of the charge generating layers comprises a n-type charge generating layer and a p-type charge generating layer,
wherein m is an integer of 2 or more,
a maximum emission wavelength of light emitted from at least one first emission unit among the m emission units is different from a maximum emission wavelength of light emitted from at least one second emission unit among the other emission units,
the at least one emission layer comprises a first host and a dopant,
the dopant is an organometallic compound including platinum,
the organic light-emitting device satisfies a condition of $HOMO(D) - HOMO(Host\ 1) \geq 0.2$ electron volts,
$HOMO(D)$ is a HOMO energy level of the dopant in electron volts,
$HOMO(Host\ 1)$ is a HOMO energy level of the first host in electron volts, and
$HOMO(D)$ and $HOMO(Host\ 1)$ are each measured using a photoelectron spectrometer in an ambient atmosphere,
wherein the at least one emission layer further comprises a second host,
the first host is a hole transport host,
the second host is an electron transport host comprising an electron transport moiety, and
the electron transport moiety in the second host is a π-electron-deficient nitrogen-containing cyclic group.

* * * * *